United States Patent
Onishi et al.

(10) Patent No.: US 11,181,822 B2
(45) Date of Patent: *Nov. 23, 2021

(54) RESIST COMPOSITION AND METHOD OF FORMING RESIST PATTERN

(71) Applicant: TOKYO OHKA KOGYO CO., LTD., Kawasaki (JP)

(72) Inventors: Koshi Onishi, Kawasaki (JP); KhanhTin Nguyen, Kawasaki (JP); Masatoshi Arai, Kawasaki (JP); Yoshitaka Komuro, Kawasaki (JP)

(73) Assignee: Tokyo Ohka Kogyo Co., Ltd., Kawasaki (JP)

( * ) Notice: Subject to any disclaimer, the term of this patent is extended or adjusted under 35 U.S.C. 154(b) by 231 days.

This patent is subject to a terminal disclaimer.

(21) Appl. No.: 16/420,947

(22) Filed: May 23, 2019

(65) Prior Publication Data
US 2019/0361343 A1 Nov. 28, 2019

(30) Foreign Application Priority Data

May 28, 2018 (JP) .............................. JP2018-101873
May 28, 2018 (JP) .............................. JP2018-101878

(51) Int. Cl.
| | | |
|---|---|---|
| *G03F 7/004* | (2006.01) | |
| *G03F 7/039* | (2006.01) | |
| *G03F 7/30* | (2006.01) | |
| *G03F 7/38* | (2006.01) | |
| *G03F 7/20* | (2006.01) | |

(52) U.S. Cl.
CPC .......... *G03F 7/0045* (2013.01); *G03F 7/0392* (2013.01); *G03F 7/30* (2013.01); *G03F 7/0397* (2013.01); *G03F 7/2004* (2013.01); *G03F 7/38* (2013.01)

(58) Field of Classification Search
CPC .... G03F 7/0045; G03F 7/0392; G03F 7/0397; G03F 7/30; G03F 7/38
See application file for complete search history.

(56) References Cited

U.S. PATENT DOCUMENTS

| | | | | |
|---|---|---|---|---|
| 10,649,330 | B2* | 5/2020 | Arai ........... | C07C 309/12 |
| 2004/0110085 | A1* | 6/2004 | Iwai ............ | G03F 7/0397 |
| | | | | 430/270.1 |
| 2007/0100159 | A1* | 5/2007 | Yoshida ...... | C07C 309/17 |
| | | | | 560/149 |
| 2010/0113818 | A1 | 5/2010 | Oh et al. | |
| 2015/0198879 | A1 | 7/2015 | Mori et al. | |
| 2019/0361342 | A1 | 11/2019 | Maehashi et al. | |

FOREIGN PATENT DOCUMENTS

| | | | |
|---|---|---|---|
| JP | 2008-290980 A | | 12/2008 |
| JP | 2008290980 A | * | 12/2008 |
| JP | 5149236 B | | 2/2013 |
| JP | 2017-102267 A | | 6/2017 |
| JP | 2017102267 A | * | 6/2017 |

OTHER PUBLICATIONS

Restriction Requirement in Related U.S. Appl. No. 16/420,828 dated Mar. 8, 2021.
Office Action in Related U.S. Appl. No. 16/420,828 dated Apr. 15, 2021.
Notice of Allowance in Related U.S. Pat. No. 10,649,330 dated Jan. 10, 2020.
Final Office Action in Related U.S. Pat. No. 10,649,330 dated Oct. 7, 2019.
Office Action in Related U.S. Pat. No. 10,649,330 dated Apr. 1, 2019.
English translation of JP, 2017-102267, A (2017) from machine translation from AIPN Japan Patent Office National Center for Industrial Property Information and Training, generated Mar. 27, 2019, 55 pages (Year: 2017).

* cited by examiner

*Primary Examiner* — John S Chu
(74) *Attorney, Agent, or Firm* — Knobbe Martens Olson & Bear LLP

(57) ABSTRACT

A resist composition including a compound represented by formula (bd1), a total amount of the acid-generator component and the basic component being 20 to 70 parts by weight, relative to 100 parts by weight of the base material component. In the formula, $Rx^1$ to $Rx^4$ represents a hydrogen atom or a hydrocarbon group, or two or more of $Rx^1$ to $Rx^4$ may be mutually bonded to form a ring structure; $Ry^1$ and $Ry^2$ represents a hydrogen atom or a hydrocarbon group, or $Ry^1$ and $Ry^2$ may be mutually bonded to form a ring structure; $Rz^1$ to $Rz^4$ represents a hydrogen atom or a hydrocarbon group, or two or more of $Rz^1$ to $Rz^4$ may be mutually bonded to form a ring structure; provided that at least one of $Rx^1$ to $Rx^4$, $Ry^1$, $Ry^2$ and $Rz^1$ to $Rz^4$ has an anionic group; and $M^{m+}$ represents an m-valent organic cation).

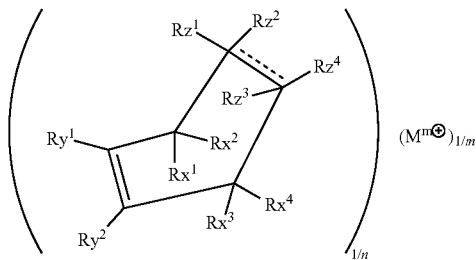

15 Claims, 2 Drawing Sheets

RESIST COMPOSITION AND METHOD OF FORMING RESIST PATTERN

TECHNICAL FIELD

The present invention relates to a resist composition and a method of forming a resist pattern.

Priority is claimed on Japanese Patent Application Nos. 2018-101873 and 2018-101878, filed May 28, 2018, the contents of which are incorporated herein by reference.

DESCRIPTION OF RELATED ART

In lithography techniques, for example, a resist film composed of a resist material is formed on a substrate, and the resist film is subjected to selective exposure, followed by development, thereby forming a resist pattern having a predetermined shape on the resist film. A resist material in which the exposed portions of the resist film become soluble in a developing solution is called a positive-type, and a resist material in which the exposed portions of the resist film become insoluble in a developing solution is called a negative-type.

In recent years, in the production of semiconductor elements and liquid crystal display elements, advances in lithography techniques have led to rapid progress in the field of pattern miniaturization. Typically, these miniaturization techniques involve shortening the wavelength (increasing the energy) of the exposure light source. Conventionally, ultraviolet radiation typified by g-line and i-line radiation has been used, but nowadays KrF excimer lasers and ArF excimer lasers are used in mass production. Furthermore, research is also being conducted into lithography techniques that use an exposure light source having a wavelength shorter (energy higher) than these excimer lasers, such as electron beam (EB), extreme ultraviolet radiation (EUV), and X ray.

Resist materials for use with these types of exposure light sources require lithography properties such as a high resolution capable of reproducing patterns of minute dimensions, and a high level of sensitivity to these types of exposure light sources.

As a resist material that satisfies these conditions, a chemically amplified composition is used, which includes a base material component that exhibits a changed solubility in a developing solution under the action of acid and an acid-generator component that generates acid upon exposure.

For example, in the case where the developing solution is an alkali developing solution (alkali developing process), a chemically amplified positive resist which contains, as a base component (base resin), a resin which exhibits increased solubility in an alkali developing solution under action of acid, and an acid generator is typically used. If a resist film formed using such a resist composition is selectively exposed at the time of forming a resist pattern, in exposed areas, acid is generated from the acid generator component, and the polarity of the base resin increases by the action of the generated acid, thereby making the exposed areas of the resist film soluble in the alkali developing solution. Thus, by conducting alkali developing, the unexposed portions of the resist film remain to form a positive resist pattern.

On the other hand, when such a base resin is applied to a solvent developing process using a developing solution containing an organic solvent (organic developing solution), the solubility of the exposed portions in an organic developing solution is decreased. As a result, the unexposed portions of the resist film are dissolved and removed by the organic developing solution, and a negative resist pattern in which the exposed portions of the resist film are remaining is formed. Such a solvent developing process for forming a negative-tone resist composition is sometimes referred to as "negative-tone developing process".

In general, the base resin used for a chemically amplified resist composition contains a plurality of structural units for improving lithography properties and the like.

For example, in the case of a resin composition which exhibits increased solubility in an alkali developing solution by the action of acid, a structural unit containing an acid decomposable group which is decomposed by the action of acid generated from an acid generator component and exhibits increased polarity. Further, a structural unit containing a lactone-containing cyclic group or a structural unit containing a polar group such as a hydroxy group is used in combination.

Further, in the formation of a resist pattern, the behavior of acid generated from the acid generator component upon exposure is one of the factors which has large influence on the lithography properties.

As the acid generator used in a chemically amplified resist composition, various kinds have been proposed. For example, onium salt acid generators such as iodonium salts and sulfonium salts; oxime sulfonate acid generators; diazomethane acid generators; nitrobenzylsulfonate acid generators; iminosulfonate acid generators; and disulfone acid generators are known.

As onium salt acid generators, those which have an onium ion such as triphenylsulfonium in the cation moiety are mainly used. Generally, as the anion moiety for onium salt acid generators, an alkylsulfonate ion or a fluorinated alkylsulfonate ion in which part or all of the hydrogen atoms within the aforementioned alkylsulfonate ion has been substituted with fluorine atoms is typically used.

Further, in order to improve lithography properties in the formation of a resist pattern, an onium salt acid generator having an anion with a specific structure containing an aromatic ring as the anion moiety has been proposed (for example, see Patent Literature 1).

DOCUMENTS OF RELATED ART

Patent Literature

[Patent Literature 1] Japanese Patent No. 5149236

SUMMARY OF THE INVENTION

As the lithography technique further progresses and the miniaturization of the resist pattern progresses more and more, for example, a target of the lithography performed by electron beams and EUV is to form fine resist patterns of several tens of nanometers. As the size of the resist pattern becomes smaller, the resist composition is required to have a high sensitivity to the exposure dose, and good lithography properties such as reduced roughness.

However, in a resist composition containing a conventional onium salt acid generator as described above, when it is attempted to improve the sensitivity to an exposure does such as EUV, there was a problem that a resist pattern having a desired shape could not be reliably obtained, and it was difficult to satisfy all of such lithography properties. On the other hand, by increasing the amount of acid generator added, although the lithography properties could be improved, film thickness loss of the pattern becomes more likely to occur.

The present invention takes the above circumstances into consideration, with an object of providing a resist composition which is capable of improving lithography properties such as reduced roughness, as well as improving sensitivity, and forming a pattern which is unlikely to have occurrence of film thickness loss, and a method of forming a resist pattern using the resist composition.

For solving the above-mentioned problems, the present invention employs the following aspects.

A first aspect of the present invention is a resist composition which generates acid upon exposure and exhibits changed solubility in a developing solution under action of acid, and which includes a base material component (A) which exhibits changed solubility in a developing solution under action of acid, an acid-generator component (B) which generates acid upon exposure, and a basic component (D), at least one of the acid-generator component (B) and the basic component (D) including a compound (BD1) having an anion moiety and a cation moiety and being represented by general formula (bd1) shown below, and a total amount of the acid-generator component (B) and the basic component (D) being 20 to 70 parts by weight, relative to 100 parts by weight of the base material component (A).

[Chemical Formula 1.]

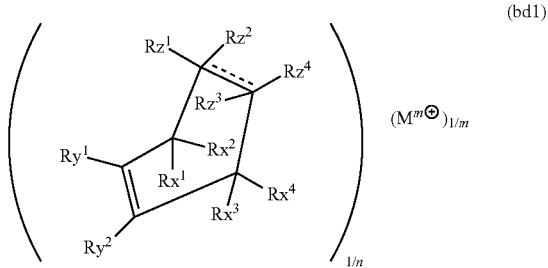

(bd1)

In the formula, $Rx^1$ to $Rx^4$ each independently represents a hydrogen atom or a hydrocarbon group which may have a substituent, or two or more of $Rx^1$ to $Rx^4$ may be mutually bonded to form a ring structure; $Ry^1$ and $Ry^2$ each independently represents a hydrogen atom or a hydrocarbon group which may have a substituent, or $Ry^1$ and $Ry^2$ may be mutually bonded to form a ring structure;

[Chemical Formula 2.]

- - - - - represents a double bond or a single bond; $Rz^1$ to $Rz^4$ each independently represents, where valence allows, a hydrogen atom or a hydrocarbon group which may have a substituent, or two or more of $Rz^1$ to $Rz^4$ may be mutually bonded to form a ring structure; provided that at least one of $Rx^1$ to $Rx^4$, $Ry^1$, $Ry^2$ and $Rz^1$ to $Rz^4$ has an anionic group, and the whole anion moiety is an n-valent anion; n represents an integer of 1 or more; m represents an integer of 1 or more; and $M^m$ represents an m-valent organic cation.

A second aspect of the present invention is a method of forming a resist pattern, including: using a resist composition according to the first aspect to form a resist film, exposing the resist film, and developing the exposed resist film to form a resist pattern.

According to the present invention, there are provided a resist composition which is capable of improving lithography properties such as reduced roughness, as well as improving sensitivity, and forming a pattern which is unlikely to have occurrence of film thickness loss, and a method of forming a resist pattern using the resist composition.

DETAILED DESCRIPTION OF THE INVENTION

Figure 1:
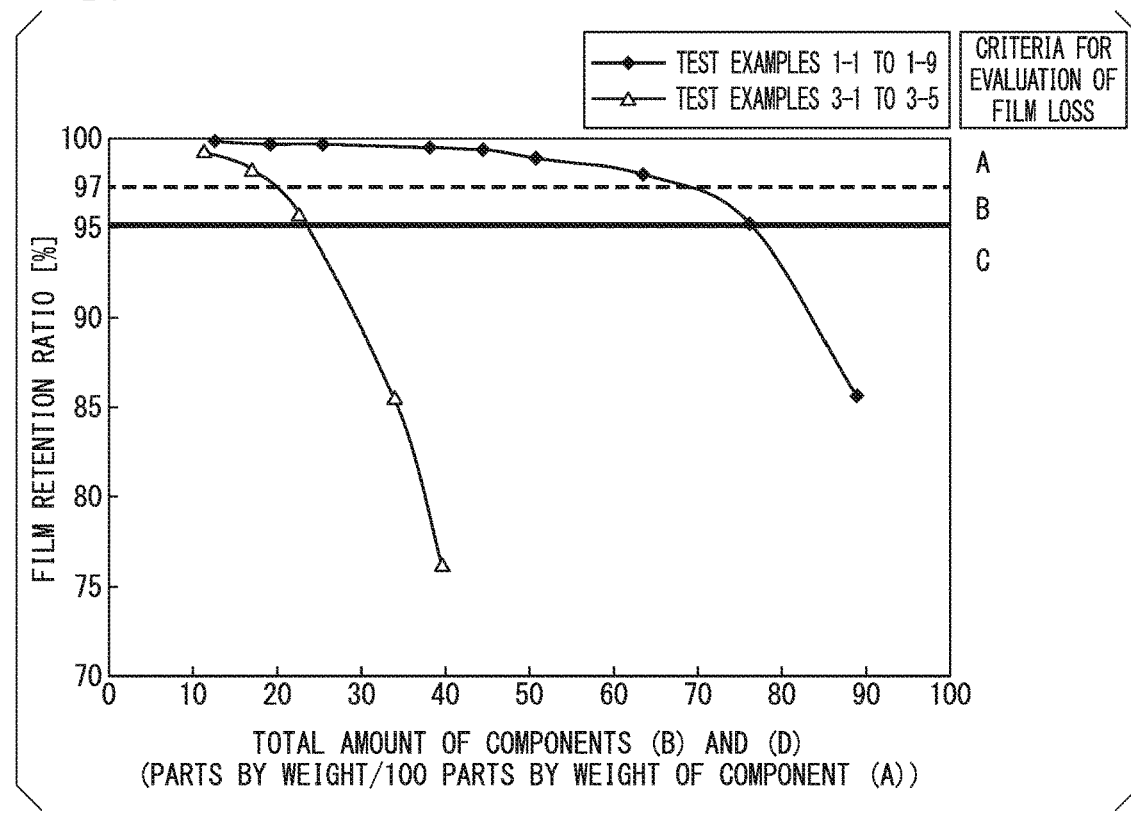
FIG. 1 is a graph showing the change in the film retention ratio relative to the total amount of the components (B) and (D).

In the present description and claims, the term "aliphatic" is a relative concept used in relation to the term "aromatic", and defines a group or compound that has no aromaticity.

The term "alkyl group" includes linear, branched or cyclic, monovalent saturated hydrocarbon, unless otherwise specified. The same applies for the alkyl group within an alkoxy group.

The term "alkylene group" includes linear, branched or cyclic, divalent saturated hydrocarbon, unless otherwise specified.

A "halogenated alkyl group" is a group in which part or all of the hydrogen atoms of an alkyl group is substituted with a halogen atom. Examples of the halogen atom include a fluorine atom, a chlorine atom, a bromine atom and an iodine atom.

A "fluorinated alkyl group" or a "fluorinated alkylene group" is a group in which part or all of the hydrogen atoms of an alkyl group or an alkylene group have been substituted with a fluorine atom.

The term "structural unit" refers to a monomer unit that contributes to the formation of a polymeric compound (resin, polymer, copolymer).

The case of describing "may have a substituent" includes both of the case where the hydrogen atom (—H) is substituted with a monovalent group and the case where the methylene group (—CH$_2$—) is substituted with a divalent group.

The term "exposure" is used as a general concept that includes irradiation with any form of radiation.

A "structural unit derived from an acrylate ester" refers to a structural unit that is formed by the cleavage of the ethylenic double bond of an acrylate ester.

An "acrylate ester" refers to a compound in which the terminal hydrogen atom of the carboxy group of acrylic acid (CH$_2$=CH—COOH) has been substituted with an organic group.

The acrylate ester may have the hydrogen atom bonded to the carbon atom on the α-position substituted with a substituent. The substituent ($R^{\alpha 0}$) that substitutes the hydrogen atom bonded to the carbon atom on the α-position is an atom other than hydrogen or a group, and examples thereof include an alkyl group of 1 to 5 carbon atoms and a halogenated alkyl group of 1 to 5 carbon atoms. Further, an acrylate ester having the hydrogen atom bonded to the carbon atom on the α-position substituted with a substituent ($R^{\alpha 0}$) in which the substituent has been substituted with a substituent containing an ester bond (e.g., an itaconic acid diester), or an acrylic acid having the hydrogen atom bonded to the carbon atom on the α-position substituted with a substituent ($R^{\alpha 0}$) in which the substituent has been substituted with a hydroxyalkylgroup or a group in which the hydroxy group within a hydroxyalkyl group has been modified (e.g., α-hydroxyalkyl acrylate ester) can be mentioned as an acrylate ester having the hydrogen atom bonded to the carbon atom on the α-position substituted with a substituent. A carbon atom on the α-position of an acrylate ester refers to the carbon atom bonded to the carbonyl group, unless specified otherwise.

Hereafter, an acrylate ester having the hydrogen atom bonded to the carbon atom on the α-position substituted with a substituent is sometimes referred to as "α-substituted acrylate ester". Further, acrylate esters and α-substituted acrylate esters are collectively referred to as "(α-substituted) acrylate ester".

A "structural unit derived from acrylamide" refers to a structural unit that is formed by the cleavage of the ethylenic double bond of acrylamide.

The acrylamide may have the hydrogen atom bonded to the carbon atom on the α-position substituted with a substituent, and may have either or both terminal hydrogen atoms on the amino group of acrylamide substituted with a substituent. A carbon atom on the α-position of an acrylamide refers to the carbon atom bonded to the carbonyl group, unless specified otherwise.

As the substituent which substitutes the hydrogen atom on the α-position of acrylamide, the same substituents as those described above for the substituent ($R^{\alpha 0}$) on the α-position of the aforementioned α-position of the aforementioned α-substituted acrylate ester can be mentioned.

A "structural unit derived from hydroxystyrene" refers to a structural unit that is formed by the cleavage of the ethylenic double bond of hydroxystyrene. A "structural unit derived from a hydroxystyrene derivative" refers to a structural unit that is formed by the cleavage of the ethylenic double bond of a hydroxystyrene derivative.

The term "hydroxystyrene derivative" includes compounds in which the hydrogen atom at the α-position of hydroxystyrene has been substituted with another substituent such as an alkyl group or a halogenated alkyl group; and derivatives thereof. Examples of the derivatives thereof include hydroxystyrene in which the hydrogen atom of the hydroxy group has been substituted with an organic group and may have the hydrogen atom on the α-position substituted with a substituent; and hydroxystyrene which has a substituent other than a hydroxy group bonded to the benzene ring and may have the hydrogen atom on the α-position substituted with a substituent. Here, the α-position (carbon atom on the α-position) refers to the carbon atom having the benzene ring bonded thereto, unless specified otherwise.

As the substituent which substitutes the hydrogen atom on the α-position of hydroxystyrene, the same substituents as those described above for the substituent on the α-position of the aforementioned α-substituted acrylate ester can be mentioned.

A "structural unit derived from vinylbenzoic acid or a vinylbenzoic acid derivative" refers to a structural unit that is formed by the cleavage of the ethylenic double bond of vinylbenzoic acid or a vinylbenzoic acid derivative.

The term "vinylbenzoic acid derivative" includes compounds in which the hydrogen atom at the α-position of vinylbenzoic acid has been substituted with another substituent such as an alkyl group or a halogenated alkyl group; and derivatives thereof. Examples of the derivatives thereof include benzoic acid in which the hydrogen atom of the carboxy group has been substituted with an organic group and may have the hydrogen atom on the α-position substituted with a substituent; and benzoic acid which has a substituent other than a hydroxy group and a carboxy group bonded to the benzene ring and may have the hydrogen atom on the α-position substituted with a substituent. Here, the α-position (carbon atom on the α-position) refers to the carbon atom having the benzene ring bonded thereto, unless specified otherwise.

The term "styrene derivative" includes compounds in which the hydrogen atom at the α-position of styrene has been substituted with another substituent such as an alkyl group or a halogenated alkyl group; and derivatives thereof. Examples of the derivatives thereof include hydroxystyrene which has a substituent other than a hydroxy group bonded to the benzene ring and may have the hydrogen atom on the α-position substituted with a substituent. Here, the α-position (carbon atom on the α-position) refers to the carbon atom having the benzene ring bonded thereto, unless specified otherwise.

A "structural unit derived from styrene" or "structural unit derived from a styrene derivative" refers to a structural unit that is formed by the cleavage of the ethylenic double bond of styrene or a styrene derivative.

As the alkyl group as a substituent on the α-position, a linear or branched alkyl group is preferable, and specific examples include alkyl groups of 1 to 5 carbon atoms, such as a methyl group, an ethyl group, a propyl group, an isopropyl group, an n-butyl group, an isobutyl group, a tert-butyl group, a pentyl group, an isopentyl group and a neopentyl group.

Specific examples of the halogenated alkyl group as the substituent on the α-position include groups in which part or all of the hydrogen atoms of the aforementioned "alkyl group as the substituent on the α-position" are substituted with halogen atoms. Examples of the halogen atom include a fluorine atom, a chlorine atom, a bromine atom and an iodine atom, and a fluorine atom is particularly desirable.

Specific examples of the hydroxyalkyl group as the substituent on the α-position include groups in which part or all of the hydrogen atoms of the aforementioned "alkyl group as the substituent on the α-position" are substituted with a hydroxy group. The number of hydroxy groups within the hydroxyalkyl group is preferably 1 to 5, and most preferably 1.

In the present specification and claims, some structures represented by chemical formulae may have an asymmetric carbon, such that an enantiomer or a diastereomer may be present. In such a case, the one formula represents all isomers. The isomers may be used individually, or in the form of a mixture.

(Resist Composition)

The resist composition according to a first aspect of the present invention is a resist composition which generates acid upon exposure and exhibits changed solubility in a developing solution under action of acid, the resist composition including a base material component (A) which exhibits changed solubility in a developing solution under action of acid (hereafter, also referred to as "component (A)"), an acid generator component (B) which generates acid upon exposure (hereafter, also referred to as "component (B)"), and a basic component which traps acid generated from the component (B) upon exposure (hereafter, also referred to as "component (D)").

In the resist composition of the present embodiment, at least one of the component (B) and the component (D) includes a compound (BD1) represented by general formula (bd1) (hereafter, also is referred to as "component (BD1)"). In the resist composition of the present embodiment, the component (BD1) may be used as the component (B) or as the component (D) by selecting an anionic group in the molecule.

When a resist film is formed using the resist composition according to the present embodiment and the formed resist film is subjected to a selective exposure, acid is generated at exposed portions, and the generated acid acts on the component (A) to change the solubility of the component (A) in a developing solution, whereas the solubility of the component (A) in a developing solution is not changed at unexposed portions, thereby generating difference in solubility in a developing solution between exposed portions and unexposed portions. Therefore, by subjecting the resist film to development, the exposed portions of the resist film are dissolved and removed to form a positive-tone resist pattern in the case of a positive resist, whereas the unexposed portions of the resist film are dissolved and removed to form a negative-tone resist pattern in the case of a negative resist.

In the present specification, a resist composition which forms a positive resist pattern by dissolving and removing the exposed portions of the resist film is called a positive resist composition, and a resist composition which forms a negative resist pattern by dissolving and removing the unexposed portions of the resist film is called a negative resist composition.

The resist composition of the present embodiment may be either a positive resist composition or a negative resist composition. Further, in the present embodiment, the resist composition may be applied to an alkali developing process using an alkali developing solution in the developing treatment, or a solvent developing process using a developing solution containing an organic solvent (organic developing solution) in the developing treatment, and preferably a solvent developing process.

The resist composition of the present embodiment has a function of generating acid upon exposure, and the component (A) may generate acid upon exposure, in addition to the component (B).

In the case where the component (A) generates acid upon exposure, the component (A) is a "base component which generates acid upon exposure and exhibits changed solubility in a developing solution under action of acid".

In the case where the component (A) is a base component which generates acid upon exposure and exhibits changed solubility in a developing solution under action of acid, the component (A1) described later is preferably a polymeric compound which generates acid upon exposure and exhibits changed solubility in a developing solution under action of acid. As the polymeric compound, a resin having a structural unit which generates acid upon exposure may be mentioned. As the structural unit which generates acid upon exposure, any conventionally known structural unit may be used.

<Component (A)>

In the resist composition of the present embodiment, the component (A) is a base component which exhibits changed solubility in a developing solution under action of acid.

In the present invention, the term "base component" refers to an organic compound capable of forming a film, and is preferably an organic compound having a molecular weight of 500 or more. When the organic compound has a molecular weight of 500 or more, the film-forming ability is improved, and a resist pattern of nano level can be easily formed.

The organic compound used as the base component is broadly classified into non-polymers and polymers.

In general, as a non-polymer, any of those which have a molecular weight in the range of 500 to less than 4,000 is used. Hereafter, a "low molecular weight compound" refers to a non-polymer having a molecular weight in the range of 500 to less than 4,000.

As a polymer, any of those which have a molecular weight of 1,000 or more is generally used. Hereafter, a "resin" or a "polymer" refers to a polymer having a molecular weight of 1,000 or more.

As the molecular weight of the polymer, the weight average molecular weight in terms of the polystyrene equivalent value determined by gel permeation chromatography (GPC) is used.

In the case where the resist composition of the present embodiment is a "negative resist composition for alkali developing process" which forms a negative resist pattern in an alkali developing process, or a "positive resist composition for solvent developing process", as the component (A), a base component (A-2) which is soluble in an alkali developing solution (hereafter, referred to as "component (A-2)") may be preferably used, and a cross-linking agent is blended. In such a resist composition, for example, when acid is generated from the component (B) upon exposure, the action of the acid causes cross-linking between the component (A-2) and the cross-linking component. As a result, the solubility of the resist composition in an alkali developing solution is decreased (the solubility of the resist composition in an organic developing solution is increased).

Therefore, in the formation of a resist pattern, by conducting selective exposure of a resist film formed by applying the resist composition to a substrate, the exposed portions of the resist film become insoluble in an alkali developing solution (soluble in an organic developing solution), whereas the unexposed portions of the resist film remain soluble in an alkali developing solution (insoluble in an organic developing solution), and hence, a negative resist pattern is formed by conducting development using an alkali developing solution. Alternatively, in such a case, by developing using an organic developing solution, a positive resist pattern is formed.

As the component (A-2), a resin that is soluble in an alkali developing solution (hereafter, referred to as "alkali-soluble resin") is preferably used.

Examples of the alkali soluble resin include a resin having a structural unit derived from at least one of α-(hydroxyalkyl)acrylic acid and an alkyl ester of α-(hydroxyalkyl)acrylic acid (preferably an alkyl ester having 1 to 5 carbon atoms), as disclosed in Japanese Unexamined Patent Application, First Publication No. 2000-206694; an acrylic resin which has a sulfonamide group and may have the hydrogen atom bonded to the carbon atom on the α-position substituted with a substituent or polycycloolefin resin having a sulfoneamide group, as disclosed in U.S. Pat. No. 6,949,325; an acrylic resin which may have the hydrogen atom bonded to the carbon atom on the α-position substituted with a substituent and having a fluorinated alcohol, as disclosed in U.S. Pat. No. 6,949,325, Japanese Unexamined Patent Application, First Publication No. 2005-336452 or Japanese Unexamined Patent Application, First Publication No. 2006-317803; and a polycyclolefin resin having a fluorinated alcohol, as disclosed in Japanese Unexamined Patent Application, First Publication No. 2006-259582. These resins are preferable in that a resist pattern can be formed with minimal swelling.

Here, the term "α-(hydroxyalkyl)acrylic acid" refers to one or both of acrylic acid in which a hydrogen atom is bonded to the carbon atom on the α-position having the carboxyl group bonded thereto, and α-hydroxyalkylacrylic acid in which a hydroxyalkyl group (preferably a hydroxyalkyl group of 1 to 5 carbon atoms) is bonded to the carbon atom on the α-position.

As the cross-linking agent, typically, an amino-based cross-linking agent such as a glycoluril having a methylol group or alkoxymethyl group, or a melamine-based cross-linking agent is preferable, as it enables formation of a resist pattern with minimal swelling. The amount of the cross-linker added is preferably within a range from 1 to 50 parts by weight, relative to 100 parts by weight of the alkali-soluble resin.

In the case where the resist composition of the present embodiment is a "positive resist composition for alkali developing process" which forms a positive resist pattern in an alkali developing process, or a "negative resist composition for solvent developing process", as the component (A), a base component (A-1) which exhibits increased polarity by the action of acid (hereafter, referred to as "component (A-1)") may be preferably used. By using the component (A-1), since the polarity of the base component changes prior to and after exposure, an excellent development contrast can be obtained not only in an alkali developing process, but also in a solvent developing process.

More specifically, in the case of applying an alkali developing process, the component (A-1) is substantially insoluble in an alkali developing solution prior to exposure, but when acid is generated from the component (B) upon exposure, the action of this acid causes an increase in the polarity of the base component, thereby increasing the solubility of the component (A-1) in an alkali developing solution. Therefore, in the formation of a resist pattern, by conducting selective exposure of a resist film formed by applying the resist composition to a substrate, the exposed portions of the resist film change from an insoluble state to a soluble state in an alkali developing solution, whereas the unexposed portions of the resist film remain insoluble in an alkali developing solution, and hence, a positive resist pattern is formed by alkali developing.

On the other hand, in the case of a solvent developing process, the component (A-1) exhibits high solubility in an organic developing solution prior to exposure, and when acid is generated from the component (B) upon exposure, the polarity of the component (A-1) is increased by the action of the generated acid, thereby decreasing the solubility of the component (A-1) in an organic developing solution. Therefore, in the formation of a resist pattern, by conducting selective exposure of a resist film formed by applying the resist composition to a substrate, the exposed portions of the resist film changes from an soluble state to an insoluble state in an organic developing solution, whereas the unexposed portions of the resist film remain soluble in an organic developing solution. As a result, by conducting development using an organic developing solution, a contrast can be made between the exposed portions and unexposed portions, thereby forming a negative resist pattern.

In the resist composition of the present embodiment, as the component (A), one kind of compound may be used, or two or more kinds of compounds may be used in combination.

In the resist composition of the present embodiment, the component (A) is preferably a component (A-1). That is, the resist composition of the present embodiment is preferably a resist composition which forms a positive pattern in an alkali developing process (i.e, a positive resist compound for alkali developing process) or a resist composition which forms a negative pattern in a solvent developing process (i.e., a negative type resist composition for solvent developing process). As the component (A), at least one of a polymeric compound and a low molecular weight compound may be used.

In the case where the component (A) is a component (A-1), the component (A-1) preferably contains a resin component (A1) (hereafter, referred to as "component (A1)").

Component (A1)

The component (A1) is a resin component preferably containing a polymeric compound having a structural unit (a1) containing an acid decomposable group that exhibits increased polarity by the action of acid.

The component (A1) preferably has, in addition to the structural unit (a1), a structural unit (a10) containing a hydroxystyrene skeleton.

Further, the component (A1) may have, in addition to the structural unit (a1), a structural unit (a2) containing a lactone-containing cyclic group, an —$SO_2$— containing cyclic group or a carbonate-containing cyclic group.

Further, the component (A1) may have, in addition to the structural unit (a1), a structural unit (a3) containing a polar group-containing aliphatic hydrocarbon group (provided that the structural units that fall under the definition of structural units (a1) and (a2) are excluded).

The component (A1) may further include a structural unit other than the structural units (a1), (a2), (a3) and (a10).

<<Structural Unit (a1)>>

The structural unit (a1) is a structural unit containing an acid decomposable group that exhibits increased polarity by the action of acid.

The term "acid decomposable group" refers to a group in which at least a part of the bond within the structure thereof is cleaved by the action of an acid.

Examples of acid decomposable groups which exhibit increased polarity by the action of an acid include groups which are decomposed by the action of an acid to form a polar group.

Examples of the polar group include a carboxy group, a hydroxy group, an amino group and a sulfo group (—$SO_3H$). Among these, a polar group containing —OH in the structure thereof (hereafter, referred to as "OH-containing polar group") is preferable, a carboxy group or a hydroxy group is more preferable, and a carboxy group is particularly desirable.

More specifically, as an example of an acid decomposable group, a group in which the aforementioned polar group has been protected with an acid dissociable group (such as a group in which the hydrogen atom of the OH-containing polar group has been protected with an acid dissociable group) can be given.

The "acid dissociable group" refers to both (i) a group in which the bond between the acid dissociable group and the adjacent atom is cleaved by the action of acid; and (ii) a group in which one of the bonds is cleaved by the action of acid, and then a decarboxylation reaction occurs, thereby cleaving the bond between the acid dissociable group and the adjacent atom.

It is necessary that the acid dissociable group that constitutes the acid decomposable group is a group which exhibits a lower polarity than the polar group generated by the dissociation of the acid dissociable group. Thus, when the acid dissociable group is dissociated by the action of acid, a polar group exhibiting a higher polarity than that of the acid dissociable group is generated, thereby increasing the polarity. As a result, the polarity of the entire component (A1) is increased. By the increase in the polarity, the solubility in an alkali developing solution changes, and the solubility in an alkali developing solution is relatively increased, whereas the solubility in an organic developing solution is relatively decreased.

Examples of the acid dissociable group include groups which have been proposed as acid dissociable groups for the base resin of a conventional chemically amplified resist composition.

Specific examples of acid dissociable groups for the base resin of a conventional chemically amplified resist composition include "acetal-type acid dissociable group", "tertiary alkyl ester-type acid dissociable group" and "tertiary alkyloxycarbonyl acid dissociable group" described below.

Acetal-Type Acid Dissociable Group

Examples of the acid dissociable group for protecting the carboxy group or hydroxy group as a polar group include the acid dissociable group represented by general formula (a1-r-1) shown below (hereafter, referred to as "acetal-type acid dissociable group").

[Chemical Formula 3.]

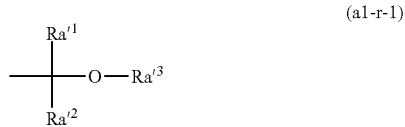

(a1-r-1)

In the formula, $Ra'^1$ and $Ra'^2$ each independently represents a hydrogen atom or an alkyl group; $Ra'^3$ represents a hydrocarbon group, provided that $Ra'^3$ may be bonded to $Ra'^1$ or $Ra'^2$ to form a ring.

In the formula (a1-r-1), it is preferable that at least one of $Ra'^1$ and $Ra'^2$ represents a hydrogen atom, and it is more preferable that both of $Ra'^1$ and $Ra'^2$ represent a hydrogen atom.

In the case where $Ra'^1$ or $Ra'^2$ is an alkyl group, as the alkyl group, the same alkyl groups as those described above the for the substituent which may be bonded to the carbon atom on the α-position of the aforementioned α-substituted acrylate ester can be mentioned, and an alkyl group of 1 to 5 carbon atoms is preferable. Specific examples include linear or branched alkyl groups. Specific examples of the alkyl group include a methyl group, an ethyl group, a propyl group, an isopropyl group, an n-butyl group, an isobutyl group, a tert-butyl group, a pentyl group, an isopentyl group and a neopentyl group. Of these, a methyl group or an ethyl group is preferable, and a methyl group is particularly preferable.

In formula (a1-r-1), examples of the hydrocarbon group for $Ra'^3$ include a linear or branched alkyl group and a cyclic hydrocarbon group.

The linear alkyl group preferably has 1 to 5 carbon atoms, more preferably 1 to 4 carbon atoms, and still more preferably 1 or 2 carbon atoms. Specific examples include a methyl group, an ethyl group, an n-propyl group, an n-butyl group and an n-pentyl group. Among these, a methyl group, an ethyl group or an n-butyl group is preferable, and a methyl group or an ethyl group is more preferable.

The branched alkyl group preferably has 3 to 10 carbon atoms, and more preferably 3 to 5 carbon atoms. Specific examples include an isopropyl group, an isobutyl group, a tert-butyl group, an isopentyl group, a neopentyl group a 1,1-diethylpropyl group and a 2,2-dimethylbutyl group. Among these, an isopropyl group is preferable.

In the case where $Ra'^3$ represents a cyclic hydrocarbon group, the cyclic hydrocarbon group may be an aliphatic hydrocarbon group or an aromatic hydrocarbon group, and may be polycyclic or monocyclic.

As the monocyclic aliphatic hydrocarbon group, a group in which 1 hydrogen atom has been removed from a monocycloalkane is preferable. The monocycloalkane preferably has 3 to 6 carbon atoms, and specific examples thereof include cyclopentane and cyclohexane.

As the polycyclic aliphatic hydrocarbon group, a group in which 1 hydrogen atom has been removed from a polycycloalkane is preferable, and the polycyclic group preferably has 7 to 12 carbon atoms. Examples of the polycycloalkane include adamantane, norbornane, isobornane, tricyclodecane and tetracyclododecane.

When the monovalent hydrocarbon group for $Ra'^3$ is an aromatic hydrocarbon group, the aromatic hydrocarbon group is a hydrocarbon group having at least one aromatic ring.

The aromatic ring is not particularly limited, as long as it is a cyclic conjugated compound having $(4n+2)\pi$ electrons, and may be either monocyclic or polycyclic. The aromatic ring preferably has 5 to 30 carbon atoms, more preferably 5 to 20 carbon atoms, and still more preferably 6 to 15 carbon atoms, and most preferably 6 to 12 carbon atoms.

Examples of the aromatic ring include aromatic hydrocarbon rings, such as benzene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom. Specific examples of the aromatic hetero ring include a pyridine ring and a thiophene ring.

Specific examples of the aromatic hydrocarbon group for $Ra'^3$ include a group in which one hydrogen atom has been removed from the aforementioned aromatic hydrocarbon ring or aromatic hetero ring (aryl group or heteroaryl group); a group in which one hydrogen atom has been removed from an aromatic compound having two or more aromatic rings (biphenyl, fluorene or the like); and a group in which one hydrogen atom of the aforementioned aromatic hydrocarbon ring or aromatic hetero ring has been substituted with an alkylene group (an arylalkyl group such as a benzyl group, a phenethyl group, a 1-naphthylmethyl group, a 2-naphthylmethyl group, a 1-naphthylethyl group, or a 2-naphthylethyl group). The alkylene group bonded to the aforementioned aromatic hydrocarbon ring or the aromatic hetero ring preferably has 1 to 4 carbon atoms, more preferably 1 or 2 carbon atoms, and most preferably 1 carbon atom.

The cyclic hydrocarbon group for $Ra'^3$ may have a substituent. Examples of the substituent include $-R^{P1}$, $-R^{P2}-O-R^{P1}$, $-R^{P2}-CO-R^{P1}$, $-R^{P2}-CO-OR^{P1}$, $-R^{P2}-O-CO-R^{P1}$, $-R^{P2}-OH$, $-R^{P2}-CN$ or $-R^{P2}-COOH$ (hereafter, these substituents are sometimes collectively referred to as "$Ra^{05}$").

Here, $R^{P1}$ is a monovalent chain saturated hydrocarbon group having 1 to 10 carbon atoms, a monovalent aliphatic cyclic saturated hydrocarbon group having 3 to 20 carbon atoms, or a monovalent aromatic hydrocarbon group having 6 to 30 carbon atoms. Further, $R^{P2}$ is a single bond, a divalent chain saturated hydrocarbon group having 1 to 10 carbon atoms, a divalent aliphatic cyclic saturated hydrocarbon group having 3 to 20 carbon atoms, or a divalent aromatic hydrocarbon group having 6 to 30 carbon atoms.

Here, a portion or all of the hydrogen atoms having the chain saturated hydrocarbon group, the aliphatic cyclic saturated hydrocarbon group, and the aromatic hydrocarbon group for $R^{P1}$ and $R^{P2}$ may be substituted with a fluorine atom. The aliphatic cyclic hydrocarbon group may have 1 or more substituents of 1 kind, or 1 or more substituents of a plurality of kinds.

Examples of the monovalent chain saturated hydrocarbon group having 1 to 10 carbon atoms include a methyl group, an ethyl group, a propyl group, a butyl group, a pentyl group, a hexyl group, a heptyl group, an octyl group, and a decyl group.

Examples of the monovalent aliphatic cyclic saturated hydrocarbon group having 3 to 20 carbon atoms include a monocyclic aliphatic saturated hydrocarbon group such as a cyclopropyl group, a cyclobutyl group, a cyclopentyl group, a cyclohexyl group, a cycloheptyl group, a cyclooctyl group, a cyclodecyl group, and a cyclododecyl group; and a polycyclic aliphatic saturated hydrocarbon group such as a bicyclo[2.2.2]octanyl group, a tricyclo[5.2.1.0$^{2,6}$]decanyl group, a tricyclo[3.3.1.1$^{3,7}$]decanyl group, a tetracyclo[6.2.1.1$^{3,6}$.0$^{2,7}$]dodecanyl group, and an adamantyl group.

Examples of the monovalent aromatic hydrocarbon group having 6 to 30 carbon atoms include a group obtained by removing one hydrogen atom from the aromatic hydrocarbon ring such as benzene, biphenyl, fluorene, naphthalene, anthracene, and phenanthrene.

In the case where $Ra'^3$ is bonded to $Ra'^1$ or $Ra'^2$ to form a ring, the cyclic group is preferably a 4 to 7-membered ring, and more preferably a 4 to 6-membered ring. Specific examples of the cyclic group include tetrahydropyranyl group and tetrahydrofuranyl group.

Tertiary Alkyl Ester-Type Acid Dissociable Group

Examples of the acid dissociable group for protecting the carboxy group as a polar group include the acid dissociable group represented by general formula (a1-r-2) shown below.

Among the acid dissociable groups represented by general formula (a1-r-2), for convenience, a group which is constituted of alkyl groups is referred to as "tertiary ester-type acid dissociable group".

[Chemical Formula 4.]

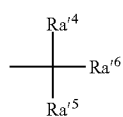

(a1-r-2)

In the formula, $Ra'^4$ to $Ra'^6$ each independently represents a hydrocarbon group, provided that $Ra'^5$ and $Ra'^6$ may be mutually bonded to form a ring.

Examples of the hydrocarbon group for $Ra'^4$ include a linear or branched alkyl group, a chain or cyclic alkenyl group, and a cyclic hydrocarbon group.

The linear or branched alkyl group and the cyclic hydrocarbon group (monocyclic aliphatic hydrocarbon group, polycyclic aliphatic hydrocarbon group or aromatic hydrocarbon group) for $Ra'^4$ are the same as defined for $Ra'^3$.

The chain or cyclic alkenyl group for $Ra'^4$ is preferably an alkenyl group having 2 to 10 carbon atoms.

The hydrocarbon group for $Ra'^5$ and $Ra'^6$ is the same as defined for $Ra'^3$.

In the case where $Ra'^5$ and $Ra'^6$ are mutually bonded to form a ring, a group represented by general formula (a1-r2-1) shown below, a group represented by general formula (a1-r2-2) shown below, and a group represented by general formula (a1-r2-3) shown below may be given as preferable examples.

On the other hand, in the case where $Ra'^4$ to $Ra'^6$ are not mutually bonded and independently represent a hydrocarbon group, the group represented by general formula (a1-r2-4) shown below may be given as a preferable example.

[Chemical Formula 5.]

(a1-r2-1)

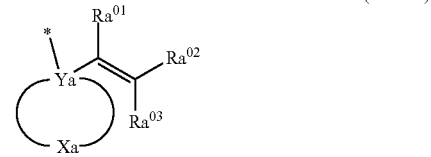

(a1-r2-2)

(a1-r2-3)

(a1-r2-4)

In formula (a1-r2-1), $Ra'^{10}$ represents an alkyl group of 1 to 10 carbon atoms, or a group represented by general formula (a1-r2-r1) shown below; $Ra'^{11}$ is a group which forms an aliphatic cyclic group together with a carbon atom having $Ra'^{10}$ bonded thereto. In formula (a1-r2-2), Ya represents a carbon atom; Xa represents a group which forms a cyclic hydrocarbon group together with Ya, provided that part or all of the hydrogen atoms of the cyclic hydrocarbon group may be substituted; $Ra^{01}$ to $Ra^{03}$ each independently represents a hydrogen atom, a monovalent saturated chain hydrocarbon group of 1 to 10 carbon atoms or a monovalent saturated aliphatic cyclic hydrocarbon group of 3 to 20 carbon atoms, provided that part or all of the hydrogen atoms of the saturated chain hydrocarbon or the saturated aliphatic cyclic hydrocarbon may be substituted; two or more of $Ra^{01}$ to $Ra^{03}$ may be mutually bonded to form a cyclic structure. In formula (a1-r2-3), Yaa represents a carbon atom; Xaa represents a group which forms an aliphatic cyclic group together with Yaa; $Ra^{04}$ represents an aromatic hydrocarbon group which may have a substituent. In formula (a1-r2-4), $Ra'^{12}$ and $Ra'^{13}$ each independently represents a hydrogen atom or a monovalent saturated hydrocarbon group of 1 to 10 carbon atoms, provided that part or all of the hydrogen atoms of the saturated hydrocarbon group may be substituted; $Ra'^{14}$ represents a hydrocarbon group which may have a substituent; and * represents a valence bond (the same definition hereafter).

[Chemical Formula 6.]

(a1-r2-r1)

In the formula, $Ya^0$ represents a quaternary carbon atom; $Ra^{031}$, $Ra^{032}$ and $Ra^{033}$ each independently represents a hydrocarbon group which may have a substituent; provided that at least one $Ra^{031}$, $Ra^{032}$ and $Ra^{033}$ is a hydrocarbon group having a polar group.

In the formula (a1-r2-1), as the alkyl group of 1 to 10 carbon atoms for $Ra'^{10}$, the same groups as described above for the linear or branched alkyl group for $Ra^{t3}$ in the formula (a1-r-1) are preferable. $Ra'^{10}$ is preferably an alkyl group of 1 to 5 carbon atoms.

In formula (a1-r2-r1), $Ya^0$ represents a quaternary carbon atom. That is, the number of carbon atoms bonded to $Ya^0$ (carbon atom) is 4.

In formula (a1-r2-r1), $Ra^{031}$, $Ra^{032}$ and $Ra^{033}$ each independently represents a hydrocarbon group which may have a substituent. Examples of the hydrocarbon group for $Ra^{031}$, $Ra^{032}$ and $Ra^{033}$ include a linear or branched alkyl group, a chain or cyclic alkenyl group, and a cyclic hydrocarbon group.

The linear alkyl group for $Ra^{031}$, $Ra^{032}$ and $Ra^{033}$ preferably has 1 to 5 carbon atoms, more preferably 1 to 4 carbon atoms, and still more preferably 1 or 2 carbon atoms. Specific examples include a methyl group, an ethyl group, an n-propyl group, an n-butyl group and an n-pentyl group. Among these, a methyl group, an ethyl group or an n-butyl group is preferable, and a methyl group or an ethyl group is more preferable.

The branched alkyl group for $Ra^{031}$, $Ra^{032}$ and $Ra^{033}$ preferably has 3 to 10 carbon atoms, and more preferably 3 to 5 carbon atoms. Specific examples include an isopropyl group, an isobutyl group, a tert-butyl group, an isopentyl group, a neopentyl group a 1,1-diethylpropyl group and a 2,2-dimethylbutyl group. Among these, an isopropyl group is preferable.

The chain or cyclic alkenyl group for $Ra^{031}$, $Ra^{032}$ and $Ra^{033}$ is preferably an alkenyl group having 2 to 10 carbon atoms.

The cyclic hydrocarbon group for $Ra^{031}$, $Ra^{032}$ and $Ra^{033}$ may be an aliphatic hydrocarbon group or an aromatic hydrocarbon group, and may be polycyclic or monocyclic.

As the monocyclic aliphatic hydrocarbon group, a group in which 1 hydrogen atom has been removed from a monocycloalkane is preferable. The monocycloalkane preferably has 3 to 6 carbon atoms, and specific examples thereof include cyclopentane and cyclohexane.

As the polycyclic aliphatic hydrocarbon group, a group in which 1 hydrogen atom has been removed from a polycycloalkane is preferable, and the polycyclic group preferably has 7 to 12 carbon atoms. Examples of the polycycloalkane include adamantane, norbornane, isobornane, tricyclodecane and tetracyclododecane.

The aromatic hydrocarbon group for $Ra^{031}$, $Ra^{032}$ and $Ra^{033}$ is a hydrocarbon group having at least one aromatic ring. The aromatic ring is not particularly limited, as long as it is a cyclic conjugated compound having (4n+2) π electrons, and may be either monocyclic or polycyclic. The aromatic ring preferably has 5 to 30 carbon atoms, more preferably 5 to 20, still more preferably 6 to 15, and most preferably 6 to 12. Examples of the aromatic ring include aromatic hydrocarbon rings, such as benzene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom. Specific examples of the aromatic hetero ring include a pyridine ring and a thiophene ring. Specific examples of the aromatic hydrocarbon group include a group in which one hydrogen atom has been removed from the aforementioned aromatic hydrocarbon ring or aromatic hetero ring (aryl group or heteroaryl group); a group in which one hydrogen atom has been removed from an aromatic compound having two or more aromatic rings (biphenyl, fluorene or the like); and a group in which one hydrogen atom of the aforementioned aromatic hydrocarbon ring or aromatic hetero ring has been substituted with an alkylene group (an arylalkyl group such as a benzyl group, a phenethyl group, a 1-naphthylmethyl group, a 2-naphthylmethyl group, a 1-naphthylethyl group, or a 2-naphthylethyl group). The alkylene group bonded to the aforementioned aromatic hydrocarbon ring or the aromatic hetero ring preferably has 1 to 4 carbon atoms, more preferably 1 or 2 carbon atoms, and most preferably 1 carbon atom.

In the case where the hydrocarbon group for $Ra^{031}$, $Ra^{032}$ and $Ra^{033}$ is substituted, examples of the substituent include a hydroxy group, a carboxy group, a halogen atom (such as a fluorine atom, a chlorine atom or a chlorine atom), an alkoxy group (such as a methoxy group, an ethoxy group, a propoxy group or a butoxy group), and an alkyloxycarbonyl group.

Among these examples, as the hydrocarbon group (which may have a substituent) for $Ra^{031}$, $Ra^{032}$ and $Ra^{033}$, a linear or branched alkyl group which may have a substituent is preferable, and a linear alkyl group is more preferable.

However, at least one of $Ra^{031}$, $Ra^{032}$ and $Ra^{033}$ is a hydrocarbon group having a polar group.

The "hydrocarbon group having a polar group" includes a group in which a methylene group (—$CH_2$—) constituting the hydrocarbon group is substituted with a polar group, and a group in which at least one hydrogen atom constituting the hydrocarbon group has been substituted with a polar group.

Examples of the "hydrocarbon group having a polar group" include a functional group represented by general formula (a1-p1) shown below.

[Chemical Formula 7.]

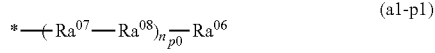

(a1-p1)

In the formula, $Ra^{07}$ represents a divalent hydrocarbon group having 2 to 12 carbon atoms; $Ra^{08}$ represents a divalent linking group containing a hetero atom; $Ra^{06}$ represents a monovalent hydrocarbon group having 1 to 12 carbon atoms; and $n_{p0}$ represents an integer of 1 to 6.

In formula (a1-p1), $Ra^{07}$ represents a divalent hydrocarbon group having 2 to 12 carbon atoms.

$Ra^{07}$ has 2 to 12 carbon atoms, preferably 2 to 8 carbon atoms, more preferably 2 to 6 carbon atoms, still more preferably 2 to 4 carbon atoms, and most preferably 2 carbon atoms.

The hydrocarbon group for $Ra^{07}$ is preferably a chain or cyclic aliphatic hydrocarbon group, and more preferably a chain hydrocarbon group.

Examples of $Ra^{07}$ include a linear alkanediyl group, such as an ethylene group, a propane-1,3-diyl group, butane-1,4-diyl group, a pentane-1,5-diyl group, a hexane-1,6-diyl group, a heptane-1,7-diyl group, an octane-1,8-diyl group, a nonane-1,9-diyl group, a decane-1,10-diyl group, an undecane-1,11-diyl group, and a dodecane-1,12-diyl group; a branched alkanediyl group, such as a propane-1,2-diyl group, a 1-methylbutane-1,3-diyl group, a 2-methylpropane-1,3-diyl group, a pentane-1,4-diyl group, and a 2-methylbutane-1,4-diyl group; a cycloalkanediyl group, such as a cyclobutane-1,3-diyl group, a cyclopentane-1,3-diyl group, a cyclohexane-1,4-diyl group, and a cyclooctane-1,5-diyl group; and a polycyclic divalent alicyclic hydrocarbon group, such as a norbornane-1,4-diyl group, a norbornane-2,5-diyl group, an adamantane-1,5-diyl group, and an adamantane-2,6-diyl group.

Among these examples, an alkanediyl group is preferable, and a linear alkanediyl group is more preferable.

In formula (a1-p1), $Ra^{08}$ represents a divalent linking group containing a hetero atom.

Examples of $Ra^{08}$ include —O—, —C(=O)—O—, —C(=O)—, —O—C(=O)—O—, —C(=O)—NH—, —NH—, —NH—C(=NH)— (H may be substituted with a substituent such as an alkyl group or an acyl group), —S—, —S(=O)$_2$—, and —S(=O)$_2$—O—.

Among these examples, in terms of solubility in a developing solution, —O—, —C(=O)—O—, —C(=O)—, or —O—C(=O)—O— are preferable, and —O— or —C(=O)— is most preferable.

In formula (a1-p1), $Ra^{06}$ represents a monovalent hydrocarbon group having 1 to 12 carbon atoms.

$Ra^{06}$ has 1 to 12 carbon atoms. In terms of solubility in a developing solution, $Ra^{06}$ preferably has 1 to 8 carbon atoms, more preferably 1 to 5 carbon atoms, still more preferably 1 to 3 carbon atoms, still more preferably 1 or 2 carbon atoms, and most preferably 1 carbon atoms.

Examples of the hydrocarbon group for $Ra^{06}$ include a chain hydrocarbon group, a cyclic hydrocarbon group, and a combination of a chain hydrocarbon group and a cyclic hydrocarbon group.

Examples of the chain hydrocarbon group include a methyl group, an ethyl group, an n-propyl group, an isopropyl group, an n-butyl group, a sec-butyl group, a tert-butyl group, an n-pentyl group, an n-hexyl group, an n-heptyl group, a 2-ethylhexyl group, an n-octyl group, an n-nonyl group, an n-decyl group, an n-undecyl group and an n-dodecyl group.

The cyclic hydrocarbon group may be an alicyclic hydrocarbon group or an aromatic hydrocarbon group.

The alicyclic hydrocarbon group may be monocyclic or polycyclic. Examples of monocyclic alicyclic hydrocarbon groups include cycloalkyl groups, such as a cyclopropyl group, a cyclobutyl group, a cyclopentyl group, a cyclohexyl group, a dimethylcyclohexyl group, a cycloheptyl group, a cyclooctyl group, a cycloheptyl group, and a cyclodecyl group. Examples of polycyclic alicyclic hydrocarbon groups include a decahydronaphthyl group, an adamantyl group, a 2-alkyladamantan-2-yl group, a 1-(adamantan-1-yl)alkan-1-yl group, a norbornyl group, a methylnorbornyl group, and an isonorbornyl group.

Examples of aromatic hydrocarbon groups include a phenyl group, a naphthyl group, an anthryl group, a p-methylphenyl group, a p-tert-butylphenyl group, a p-adamantylphenyl group, a tolyl group, a xylyl group, a cumenyl group, a mesityl group, a biphenyl group, a phenanthryl group, 2,6-diethylphenyl group, and 2-methyl-6-ethyl phenyl group.

In terms of solubility in a developing solution, $Ra^{06}$ is preferably a chain hydrocarbon group, more preferably an alkyl group, and still more preferably a linear alkyl group.

In formula (a1-p1), $n_{p0}$ is an integer of 1 to 6, preferably an integer of 1 to 3, more preferably 1 or 2, and still more preferably 1.

Specific examples of the hydrocarbon group having a polar group are shown below.

In the following formulae, * represents a valence bond which is bonded to the quaternary carbon atom ($Ya^0$).

[Chemical Formula 8.]

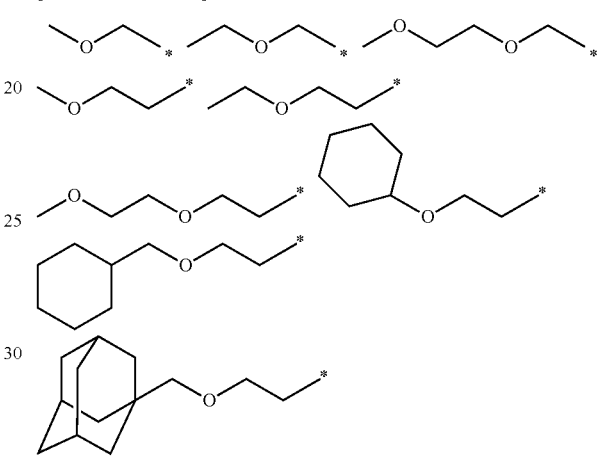

In formula (a1-r2-r1), at least one of $Ra^{031}$, $Ra^{032}$ and $Ra^{033}$ is a hydrocarbon group having a polar group. However, the number of hydrocarbon groups having a polar group may be appropriately selected depending on the solubility in the developing solution used in the formation of a resist pattern. For example, it is preferable that one or two of $Ra^{031}$, $Ra^{032}$ and $Ra^{033}$ is a hydrocarbon group having a polar group, and it is more preferable that one of $Ra^{031}$, $Ra^{032}$ and $Ra^{033}$ is hydrocarbon group having a polar group.

The hydrocarbon group having a polar group may have a substituent other than a polar group.

Examples of such substituent include a halogen atom (such as a fluorine atom, a chlorine atom or a bromine atom), and a halogenated alkyl group having 1 to 5 carbon atoms.

In formula (a1-r2-1), the aliphatic cyclic group which is formed by $Ra'^{11}$ together with the carbon atom bonded to $Ra'^{10}$, the same groups as those described above for the monocyclic or polycyclic aliphatic hydrocarbon group for $Ra^{i3}$ in formula (a1-r-1) are preferable.

In formula (a1-r2-2), as the cyclic hydrocarbon group formed by Xa together with Ya, a group in which 1 or more hydrogen atoms have been removed from the monovalent cyclic hydrocarbon group (aliphatic hydrocarbon group) for $Ra^{i3}$ in the aforementioned formula (a1-r-1) may be mentioned.

The cyclic hydrocarbon group which Xa forms with Ya may have a substituent. Examples of substituents include the same substituents as those which the cyclic hydrocarbon group for $Ra^{i3}$ may have.

In formula (a1-r2-2), examples of the monovalent saturated chain hydrocarbon group of 1 to 10 carbon atoms for $Ra^{01}$ to $Ra^{03}$ include a methyl group, an ethyl group, a propyl group, a butyl group, a pentyl group, a hexyl group, a heptyl group, an octyl group, and a decyl group.

Examples of the monovalent aliphatic cyclic saturated hydrocarbon group having 3 to 20 carbon atoms for $Ra^{o1}$ to $Ra^{o3}$ include a monocyclic aliphatic saturated hydrocarbon group such as a cyclopropyl group, a cyclobutyl group, a cyclopentyl group, a cyclohexyl group, a cycloheptyl group, a cyclooctyl group, a cyclodecyl group, and a cyclododecyl group; and a polycyclic aliphatic saturated hydrocarbon group such as a bicyclo[2.2.2]octanyl group, a tricyclo[5.2.1.0²,⁶]decanyl group, a tricyclo[3.3.1.1³,⁷]decanyl group, a tetracyclo[6.2.1.1³,⁶.0²,⁷]dodecanyl group, and an adamantyl group.

Among these examples, as $Ra^{o1}$ to $Ra^{o3}$, in terms of ease in synthesis of the monomeric compound which derives the structural unit (a1), a hydrogen atom or a saturated chain hydrocarbon group having 1 to 10 carbon atoms is preferable, a hydrogen atom, a methyl group or an ethyl group is more preferable, and a hydrogen atom is most preferable.

As the substituent for the saturated chain hydrocarbon group or saturated cyclic aliphatic hydrocarbon group represented by $Ra^{o1}$ to $Ra^{o3}$, for example, the same substituents as those described above for $Ra^{o5}$ may be mentioned.

Examples of the group containing a carbon-carbon double bond which is generated by forming a cyclic structure in which two or more of $Ra^{o1}$ to $Ra^{o3}$ are bonded to each other include a cyclopentenyl group, a cyclohexenyl group, a methyl cyclopentenyl group, a methyl cyclohexenyl group, a cyclopentylideneethenyl group, and a cyclohexylideneethenyl group. Among these examples, from the viewpoint of the ease of synthesis of the monomer compound which derives the structural unit (a1), a cyclopentenyl group, a cyclohexenyl group, and a cyclopentylideneethenyl group are preferable.

In formula (a1-r2-3), an aliphatic cyclic group which is formed of Xaa together with Yaa is preferably a group exemplified as an aliphatic hydrocarbon group which is a monocyclic group or a polycyclic group of $Ra'^{3}$ in general formula (a1-r-1).

In general formula (a1-r2-3), examples of the aromatic hydrocarbon group for $Ra^{o4}$ include a group obtained by removing one or more hydrogen atoms from an aromatic hydrocarbon ring having 5 to 30 carbon atoms. Among these examples, $Ra^{o4}$ is preferably a group obtained by removing one or more hydrogen atoms from an aromatic hydrocarbon ring having 6 to 15 carbon atoms, a group obtained by removing one or more hydrogen atoms from benzene, naphthalene, anthracene, or phenanthrene is further preferable, a group obtained by removing one or more hydrogen atoms from benzene, naphthalene, or anthracene is still further preferable, a group obtained by removing one or more hydrogen atoms from benzene and naphthalene is particularly preferable, and a group obtained by removing one or more hydrogen atoms from benzene is most preferable.

Examples of the substituent that $Ra^{o4}$ in general formula (a1-r2-3) may have include a methyl group, an ethyl group, a propyl group, a hydroxyl group, a carboxyl group, a halogen atom (a fluorine atom, a chlorine atom, a bromine atom, or the like), an alkoxy group (a methoxy group, an ethoxy group, a propoxy group, a butoxy group, or the like), and an alkyloxycarbonyl group.

In general formula (a1-r2-4), $Ra'^{12}$ and $Ra'^{13}$ each independently represent a monovalent chain saturated hydrocarbon group having 1 to 10 carbon atoms or a hydrogen atom. With respect to $Ra'^{12}$ and $Ra'^{13}$, examples of the monovalent chain saturated hydrocarbon group having 1 to 10 carbon atoms include the same monovalent chain saturated hydrocarbon group having 1 to 10 carbon atoms as that for $Ra^{o1}$ to $Ra^{o3}$, provided that part or all of the hydrogen atoms of the saturated hydrocarbon group may be substituted;

Among these examples, as $Ra'^{12}$ and $Ra'^{13}$, a hydrogen atom and an alkyl group having 1 to 5 carbon atoms are preferable, an alkyl group having 1 to 5 carbon atoms is further preferable, a methyl group and an ethyl group are still further preferable, and a methyl group is particularly preferable.

In the case where the chain saturated hydrocarbon group represented by $Ra'^{12}$ and $Ra'^{13}$ is substituted, examples of the substituent include the same group as that of $Ra^{5}$.

In general formula (a1-r2-4), $Ra'^{14}$ is a hydrocarbon group which may have a substituent. Examples of the hydrocarbon group for $Ra'^{14}$ include a linear or branched alkyl group and a cyclic hydrocarbon group.

The linear alkyl group for $Ra'^{14}$ preferably has 1 to 5 carbon atoms, more preferably 1 to 4 carbon atoms, and still more preferably 1 or 2 carbon atoms. Specific examples include a methyl group, an ethyl group, an n-propyl group, an n-butyl group and an n-pentyl group. Among these, a methyl group, an ethyl group or an n-butyl group is preferable, and a methyl group or an ethyl group is more preferable.

The branched alkyl group for $Ra'^{14}$ preferably has 3 to 10 carbon atoms, and more preferably 3 to 5 carbon atoms. Specific examples include an isopropyl group, an isobutyl group, a tert-butyl group, an isopentyl group, a neopentyl group a 1,1-diethylpropyl group and a 2,2-dimethylbutyl group. Among these, an isopropyl group is preferable.

In the case where $Ra'^{14}$ represents a cyclic hydrocarbon group, the cyclic hydrocarbon group may be an aliphatic hydrocarbon group or an aromatic hydrocarbon group, and may be polycyclic or monocyclic.

As the monocyclic aliphatic hydrocarbon group, a group in which 1 hydrogen atom has been removed from a monocycloalkane is preferable. The monocycloalkane preferably has 3 to 6 carbon atoms, and specific examples thereof include cyclopentane and cyclohexane.

As the polycyclic aliphatic hydrocarbon group, a group in which 1 hydrogen atom has been removed from a polycycloalkane is preferable, and the polycyclic group preferably has 7 to 12 carbon atoms. Examples of the polycycloalkane include adamantane, norbornane, isobomane, tricyclodecane and tetracyclododecane.

Examples of the aromatic hydrocarbon group for $Ra'^{14}$ include the same aromatic hydrocarbon groups as those described above for $Ra^{o4}$. Among these examples, $Ra'^{14}$ is preferably a group formed by removing one or more hydrogen atoms from an aromatic hydrocarbon ring having 6 to 15 carbon atoms, more preferably a group formed by removing one or more hydrogen atoms from benzene, naphthalene, anthracene, or phenanthrene, still more preferably a group formed by removing one or more hydrogen atoms from benzene, naphthalene, or anthracene, still more preferably a group formed by removing one or more hydrogen atoms from naphthalene or anthracene, and most preferably a group formed by removing one or more hydrogen atoms from naphthalene.

Examples of the substituent that $Ra'^{14}$ may have include the same group as the substituent that $Ra^{o4}$ may have.

In the case where $Ra'^{14}$ in general formula (a1-r2-4) is a naphthyl group, a position which is bonded to a tertiary carbon atom in general formula (a1-r2-4) may be 1-position and 2-position of the naphthyl group.

In the case where $Ra'^{14}$ in general formula (a1-r2-4) is an anthryl group, a position which is bonded to a tertiary carbon atom in general formula (a1-r2-4) may be any one of 1-position, 2-position, and 9-position of the anthryl group.
Specific examples of the group represented by the aforementioned formula (a1-r2-1) are shown below.
[Chemical Formula 9.]
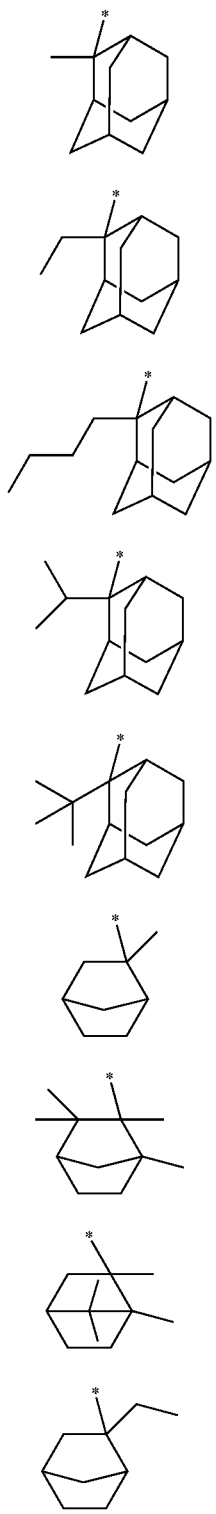
(r-pr-m1)
(r-pr-m2)
(r-pr-m3)
(r-pr-m4)
(r-pr-m5)
(r-pr-m6)
(r-pr-m7)
(r-pr-m8)
(r-pr-m9)
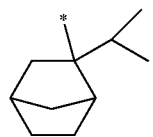
(r-pr-m10)
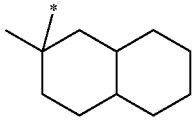
(r-pr-m11)
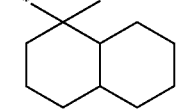
(r-pr-m12)
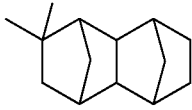
(r-pr-m13)
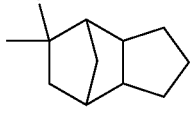
(r-pr-m14)
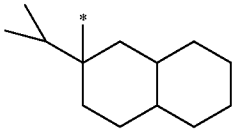
(r-pr-m15)
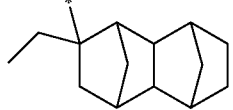
(r-pr-m16)
(r-pr-m17)
[Chemical Formula 10.]
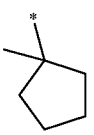
(r-pr-s1)
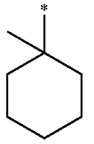
(r-pr-s2)
(r-pr-s3)

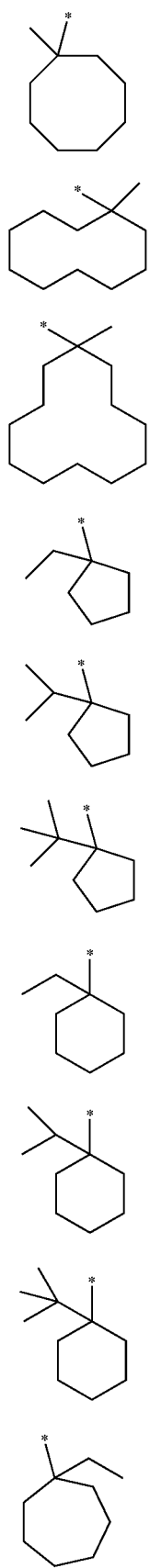
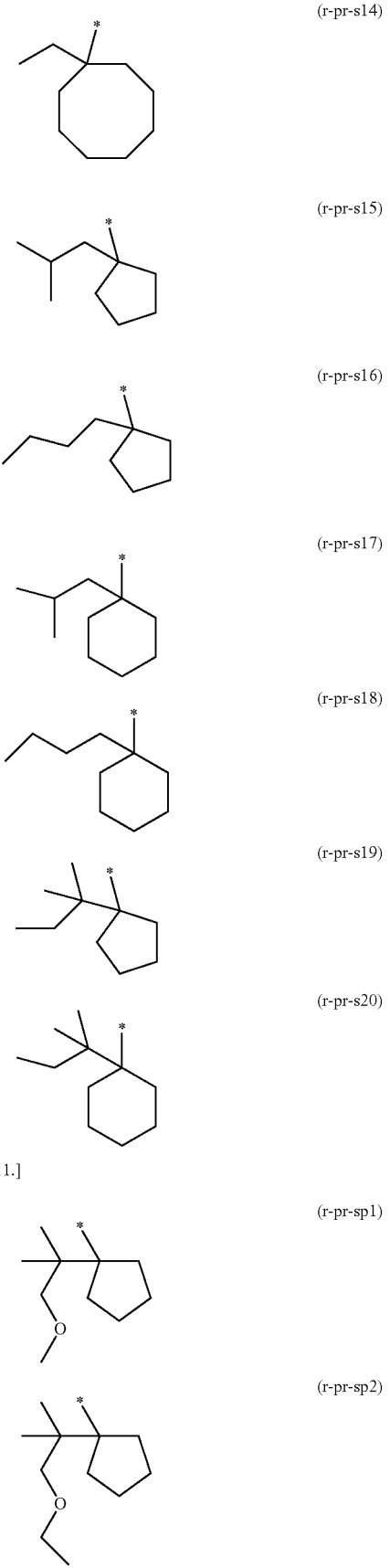
[Chemical Formula 11.]

(r-pr-sp3)
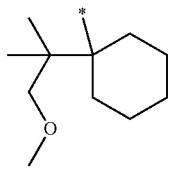
(r-pr-sp4)
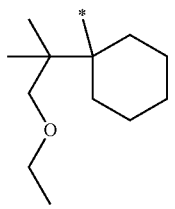
(r-pr-mp1)
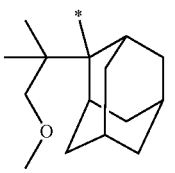
(r-pr-mp2)
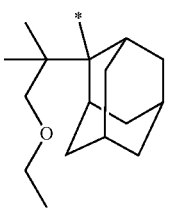
Specific examples of the group represented by the aforementioned formula (a1-r2-2) are shown below.
[Chemical Formula 12.]
(r-pr-sv1)
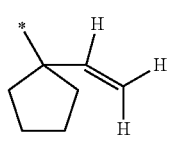
(r-pr-sv2)
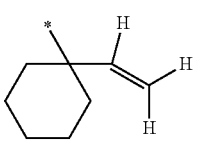
(r-pr-sv3)
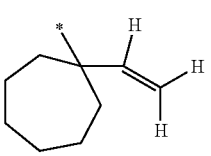
(r-pr-sv4)
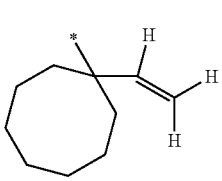
(r-pr-sv5)
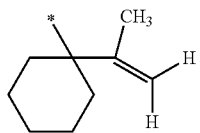
(r-pr-sv6)
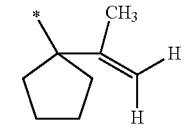
(r-pr-sv7)
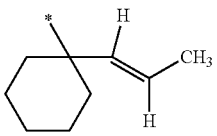
(r-pr-sv8)
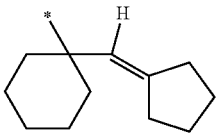
(r-pr-sv9)
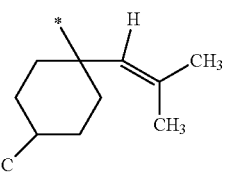
(r-pr-sv10)
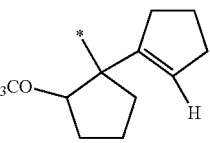
(r-pr-sv11)
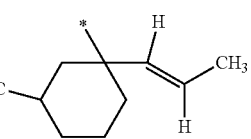
(r-pr-sv12)
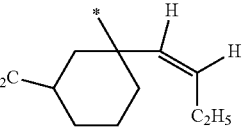
[Chemical Formula 13.]
(r-pr-mv1)
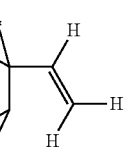
(r-pr-mv2)
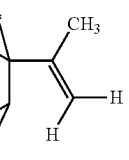

-continued
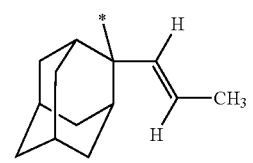 (r-pr-mv3)
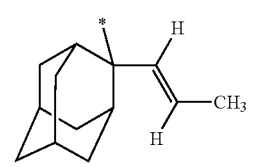 (r-pr-mv4)
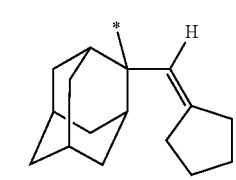 (r-pr-mv5)
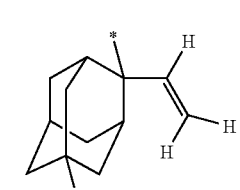 (r-pr-mv6)
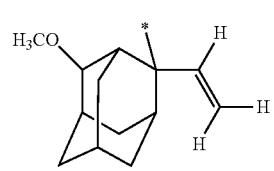 (r-pr-mv7)
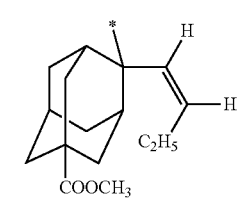 (r-pr-mv8)
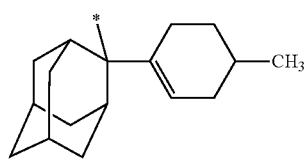 (r-pr-mv9)
[Chemical Formula 14.]
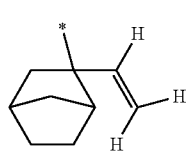 (r-pr-mv10)
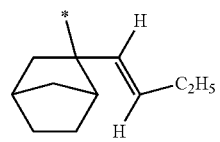 (r-pr-mv11)
-continued
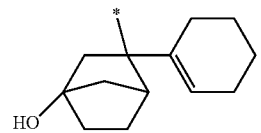 (r-pr-mv12)
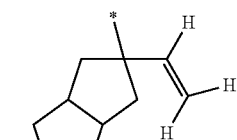 (r-pr-mv13)
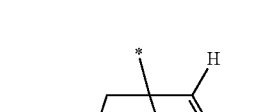 (r-pr-mv14)
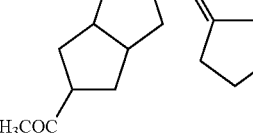 (r-pr-mv15)
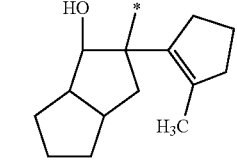 (r-pr-mv16)
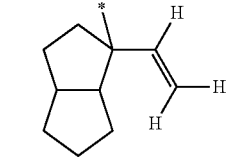 (r-pr-mv17)
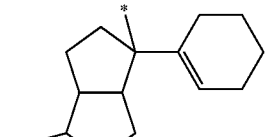 (r-pr-mv18)
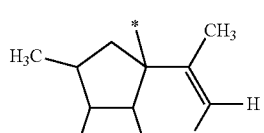 (r-pr-mv19)
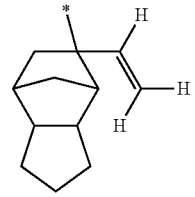

(r-pr-mv20)
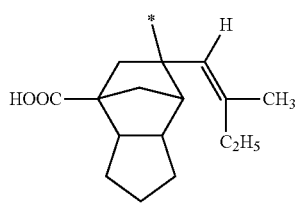
(r-pr-mv21)
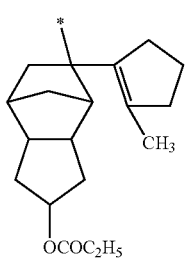
Specific examples of the group represented by the aforementioned formula (a1-r2-3) are shown below.
[Chemical Formula 15.]
(r-pr-sa1)
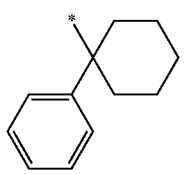
(r-pr-sa2)
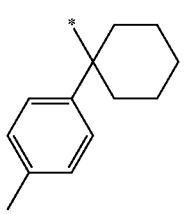
(r-pr-sa3)
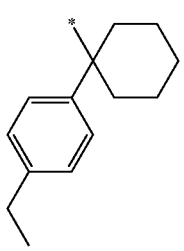
(r-pr-sa4)
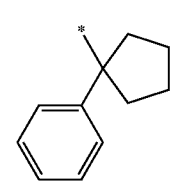
(r-pr-sa5)
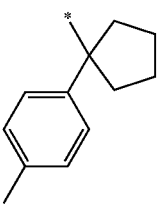
(r-pr-sa6)
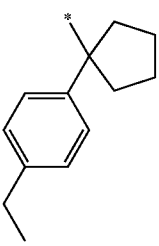
(r-pr-sa7)
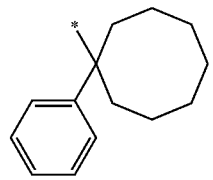
(r-pr-sa8)
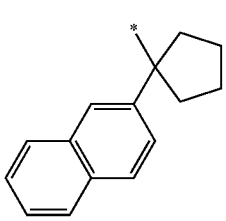
(r-pr-sa9)
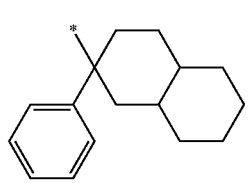
(r-pr-ma1)
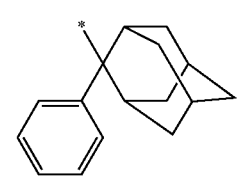
(r-pr-ma2)

Specific examples of the group represented by the aforementioned formula (a1-r2-4) are shown below.
[Chemical Formula 16.]
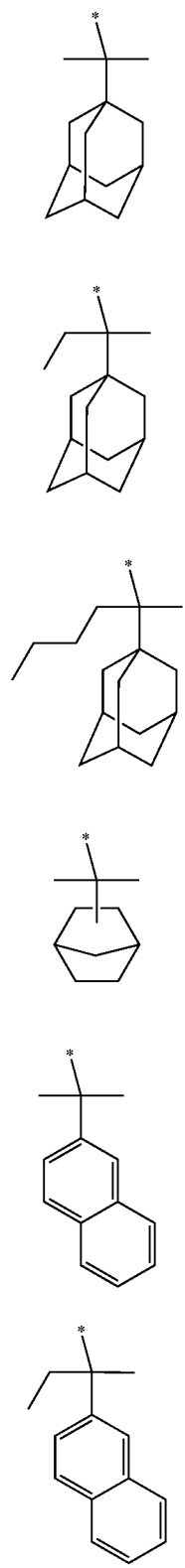
(r-pr-cm1)
(r-pr-cm2)
(r-pr-cm3)
(r-pr-cm4)
(r-pr-cm5)
(r-pr-cm6)
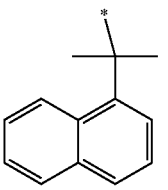 (r-pr-cm7)
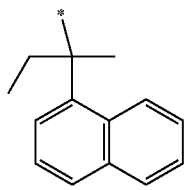 (r-pr-cm8)
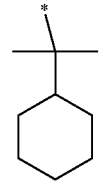 (r-pr-cs1)
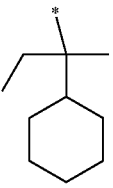 (r-pr-cs2)
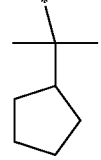 (r-pr-cs3)
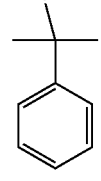 (r-pr-cs4)
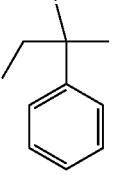 (r-pr-cs5)
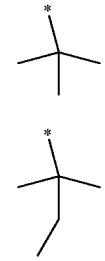 (r-pr-c1)
(r-pr-c2)

(r-pr-c3)

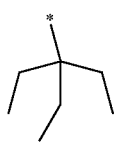

Tertiary Alkyloxycarbonyl Acid Dissociable Group

Examples of the acid dissociable group for protecting a hydroxy group as a polar group include the acid dissociable group represented by general formula (a1-r-3) shown below (hereafter, for convenience, referred to as "tertiary alkyloxycarbonyl-type acid dissociable group").

[Chemical Formula 17.]

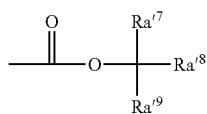

(a1-r-3)

In the formula, $Ra'^7$ to $Ra'^9$ each independently represents an alkyl group.

In formula (a1-r-3), each of $Ra'^7$ to $Ra'^9$ is preferably an alkyl group having 1 to 5 carbon atoms, and more preferably an alkyl group having 1 to 3 carbon atoms.

Further, the total number of carbon atoms in the alkyl groups is preferably 3 to 7, more preferably 3 to 5, and still more preferably 3 or 4.

Examples of the structural unit (a1) include a structural unit derived from an acrylate ester which may have the hydrogen atom bonded to the carbon atom on the α-position substituted with a substituent; a structural unit derived from an acrylamide; a structural unit derived from hydroxystyrene or a hydroxystyrene derivative in which at least a part of the hydrogen atom of the hydroxy group is protected with a substituent containing an acid decomposable group; and a structural unit derived from vinylbenzoic acid or a vinylbenzoic acid derivative in which at least a part of the hydrogen atom within —C(═O)—OH is protected with a substituent containing an acid decomposable group.

As the structural unit (a1), a structural unit derived from an acrylate ester which may have the hydrogen atom bonded to the carbon atom on the α-position substituted with a substituent is preferable.

Specific examples of preferable structural units for the structural unit (a1) include structural units represented by general formula (a1-1) or (a1-2) shown below.

[Chemical Formula 18.]

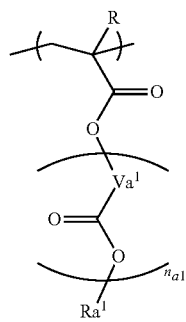

(a1-1)

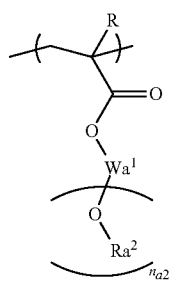

(a1-2)

In the formula, R represents a hydrogen atom, an alkyl group of 1 to 5 carbon atoms or a halogenated alkyl group of 1 to 5 carbon atoms; $Va^1$ represents a divalent hydrocarbon group optionally having an ether bond; $n_{a1}$ represents an integer of 0 to 2; $Ra^1$ represents an acid dissociable group represented by the aforementioned formula (a1-r-1) or (a1-r-2); $Wa^1$ represents a hydrocarbon group having a valency of $n_{a2}+1$; $n_{a2}$ represents an integer of 1 to 3; and $Ra^2$ represents an acid dissociable group represented by the aforementioned general formula (a1-r-1) or (a1-r-3).

In the aforementioned formula (a1-1), as the alkyl group of 1 to 5 carbon atoms for R, a linear or branched alkyl group of 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group and a neopentyl group. The halogenated alkyl group of 1 to 5 carbon atoms represented by R is a group in which part or all of the hydrogen atoms of the aforementioned alkyl group of 1 to 5 carbon atoms have been substituted with halogen atoms. Examples of the halogen atom include a fluorine atom, a chlorine atom, a bromine atom and an iodine atom, and a fluorine atom is particularly desirable.

As R, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

In formula (a1-1), the divalent hydrocarbon group for $V^1$ may be either an aliphatic hydrocarbon group or an aromatic hydrocarbon group.

The aliphatic hydrocarbon group as the divalent hydrocarbon group for $Va^1$ may be either saturated or unsaturated. In general, the aliphatic hydrocarbon group is preferably saturated.

As specific examples of the aliphatic hydrocarbon group, a linear or branched aliphatic hydrocarbon group, and an aliphatic hydrocarbon group containing a ring in the structure thereof can be given.

The linear aliphatic hydrocarbon group preferably has 1 to 10 carbon atoms, more preferably 1 to 6 carbon atoms, still more preferably 1 to 4 carbon atoms, and most preferably 1 to 3 carbon atoms.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

The branched aliphatic hydrocarbon group preferably has 2 to 10 carbon atoms, more preferably 3 to 6, still more preferably 3 or 4, and most preferably 3.

As the branched aliphatic hydrocarbon group, branched alkylene groups are preferred, and specific examples include various alkylalkylene groups, including alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)—, and —C(CH$_2$CH$_3$)$_2$—; alkylethylene groups such as —CH(CH$_3$)CH$_2$—, —CH(CH$_3$)CH(CH$_3$)—, —C(CH$_3$)$_2$CH$_2$—, —CH(CH$_2$CH$_3$)CH$_2$—, and —C(CH$_2$CH$_3$)$_2$—CH$_2$—; alkyltrimethylene groups such as —CH(CH$_3$)CH$_2$CH$_2$—, and —CH$_2$CH(CH$_3$)CH$_2$—; and alkyltetramethylene groups such as —CH(CH$_3$)CH$_2$CH$_2$CH$_2$—, and —CH$_2$CH(CH$_3$)CH$_2$CH$_2$—. As the alkyl group within the alkylalkylene group, a linear alkyl group of 1 to 5 carbon atoms is preferable.

As examples of the hydrocarbon group containing a ring in the structure thereof, an alicyclic hydrocarbon group (a group in which two hydrogen atoms have been removed from an aliphatic hydrocarbon ring), a group in which the alicyclic hydrocarbon group is bonded to the terminal of the aforementioned chain-like aliphatic hydrocarbon group, and a group in which the alicyclic group is interposed within the aforementioned linear or branched aliphatic hydrocarbon group, can be given. The linear or branched aliphatic hydrocarbon group is the same as defined for the aforementioned linear aliphatic hydrocarbon group or the aforementioned branched aliphatic hydrocarbon group.

The alicyclic hydrocarbon group preferably has 3 to 20 carbon atoms, and more preferably 3 to 12 carbon atoms.

The alicyclic hydrocarbon group may be either a monocyclic group or a polycyclic group. As the monocyclic aliphatic hydrocarbon group, a group in which 2 hydrogen atoms have been removed from a monocycloalkane is preferable. The monocycloalkane preferably has 3 to 6 carbon atoms, and specific examples thereof include cyclopentane and cyclohexane. As the polycyclic group, a group in which two hydrogen atoms have been removed from a polycycloalkane is preferable, and the polycyclic group preferably has 7 to 12 carbon atoms. Examples of the polycycloalkane include adamantane, norbornane, isobornane, tricyclodecane and tetracyclododecane.

The aromatic hydrocarbon group as the divalent hydrocarbon group for Va$^1$ is a hydrocarbon group having an aromatic ring.

The aromatic hydrocarbon group preferably has 3 to 30 carbon atoms, more preferably 5 to 30, still more preferably 5 to 20, still more preferably 6 to 15, and most preferably 6 to 12. Here, the number of carbon atoms within a substituent(s) is not included in the number of carbon atoms of the aromatic hydrocarbon group.

Examples of the aromatic ring contained in the aromatic hydrocarbon group include aromatic hydrocarbon rings, such as benzene, biphenyl, fluorene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom.

Specific examples of the aromatic hydrocarbon group include a group in which two hydrogen atoms have been removed from the aforementioned aromatic hydrocarbon ring (arylene group); and a group in which one hydrogen atom has been removed from the aforementioned aromatic hydrocarbon ring (aryl group) and one hydrogen atom has been substituted with an alkylene group (such as a benzyl group, a phenethyl group, a 1-naphthylmethyl group, a 2-naphthylmethyl group, a 1-naphthylethyl group, or a 2-naphthylethyl group). The alkylene group (alkyl chain within the arylalkyl group) preferably has 1 to 4 carbon atom, more preferably 1 or 2, and most preferably 1.

In formula (a1-1), Ra$^1$ represents an acid dissociable group represented by the aforementioned formula (a1-r-1) or (a1-r-2).

In the aforementioned formula (a1-2), the hydrocarbon group for Wa$^1$ having a valency of $n_{a2}+1$ may be either an aliphatic hydrocarbon group or an aromatic hydrocarbon group. The aliphatic cyclic group refers to a hydrocarbon group that has no aromaticity, and may be either saturated or unsaturated, but is preferably saturated. Examples of the aliphatic hydrocarbon group include a linear or branched aliphatic hydrocarbon group, an aliphatic hydrocarbon group containing a ring in the structure thereof, and a combination of the linear or branched aliphatic hydrocarbon group and the aliphatic hydrocarbon group containing a ring in the structure thereof.

The valency of $n_{a2}+1$ is preferably divalent, trivalent or tetravalent, and divalent or trivalent is more preferable.

In formula (a1-2), Ra$^2$ represents an acid dissociable group represented by the aforementioned formula (a1-r-1) or (a1-r-3).

Specific examples of structural unit represented by formula (a1-1) are shown below. In the formulae shown below, R$^\alpha$ represents a hydrogen atom, a methyl group or a trifluoromethyl group.

[Chemical Formula 19.]

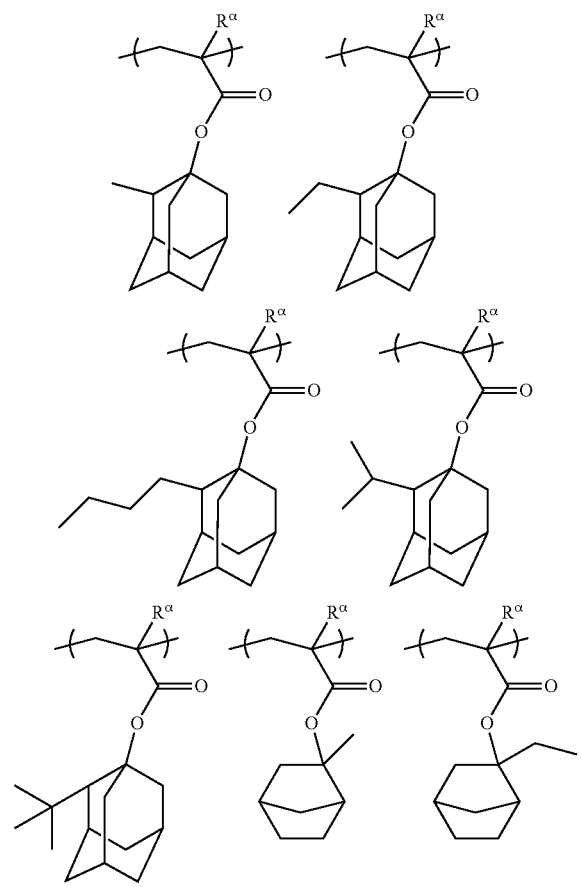

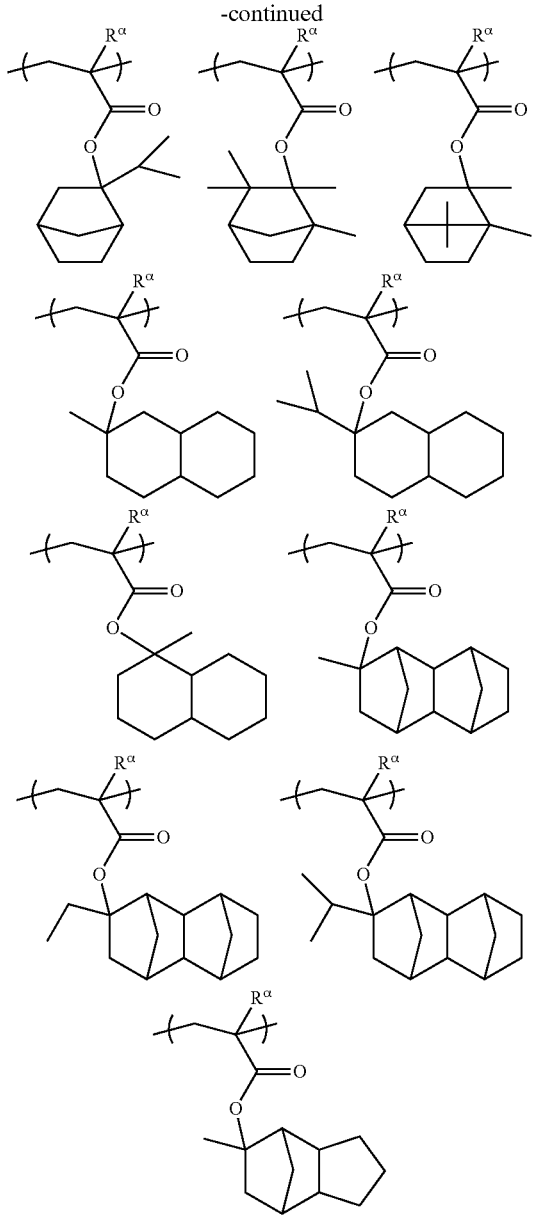
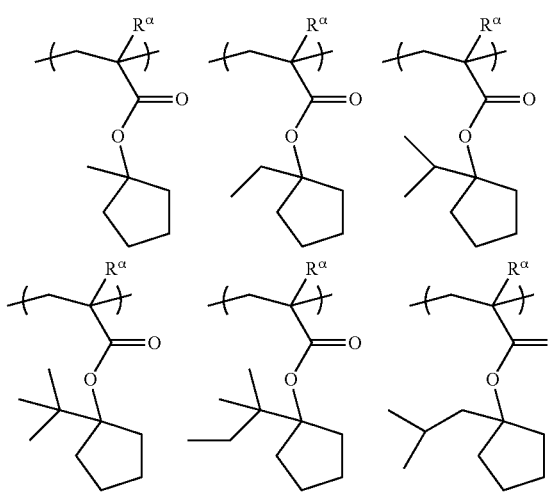
[Chemical Formula 20.]
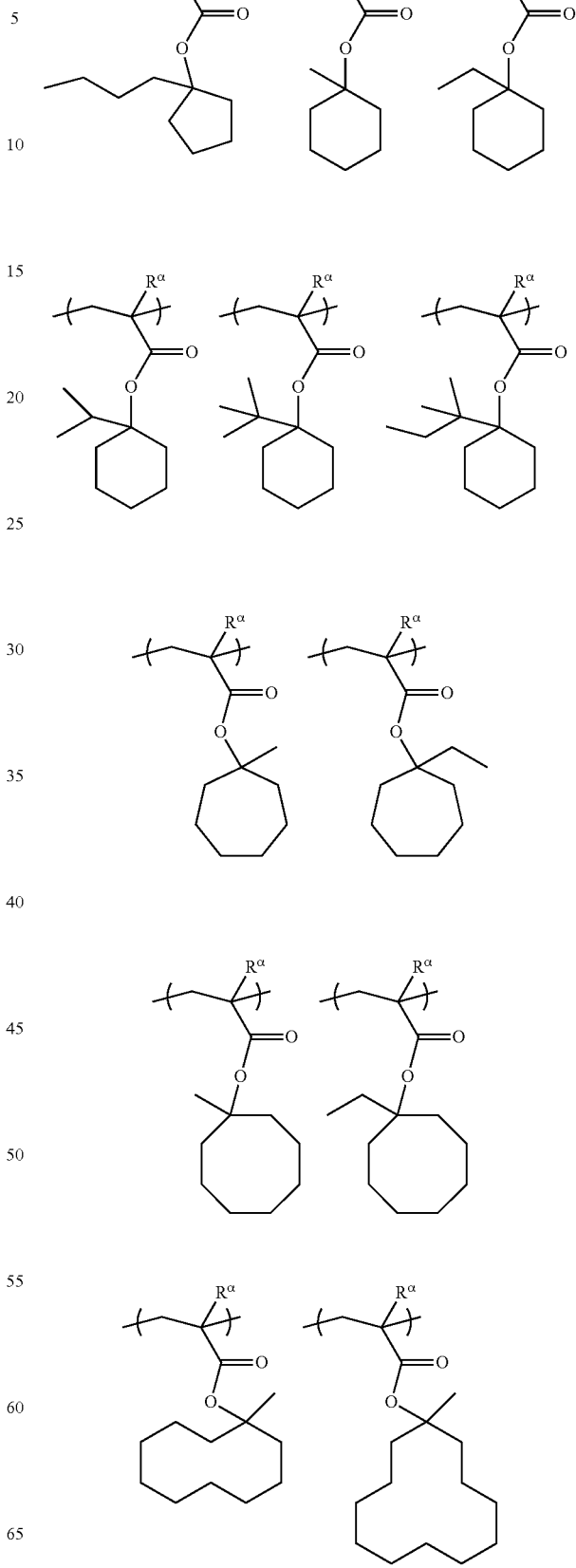
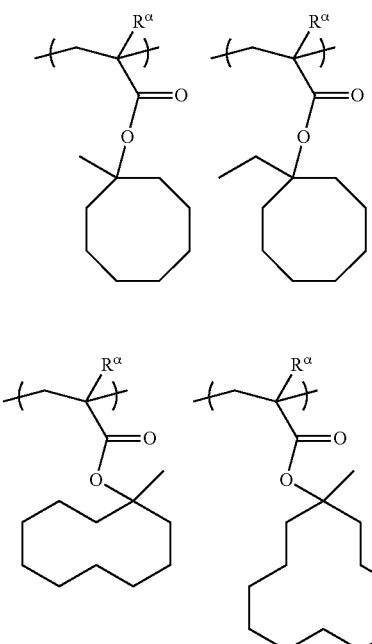

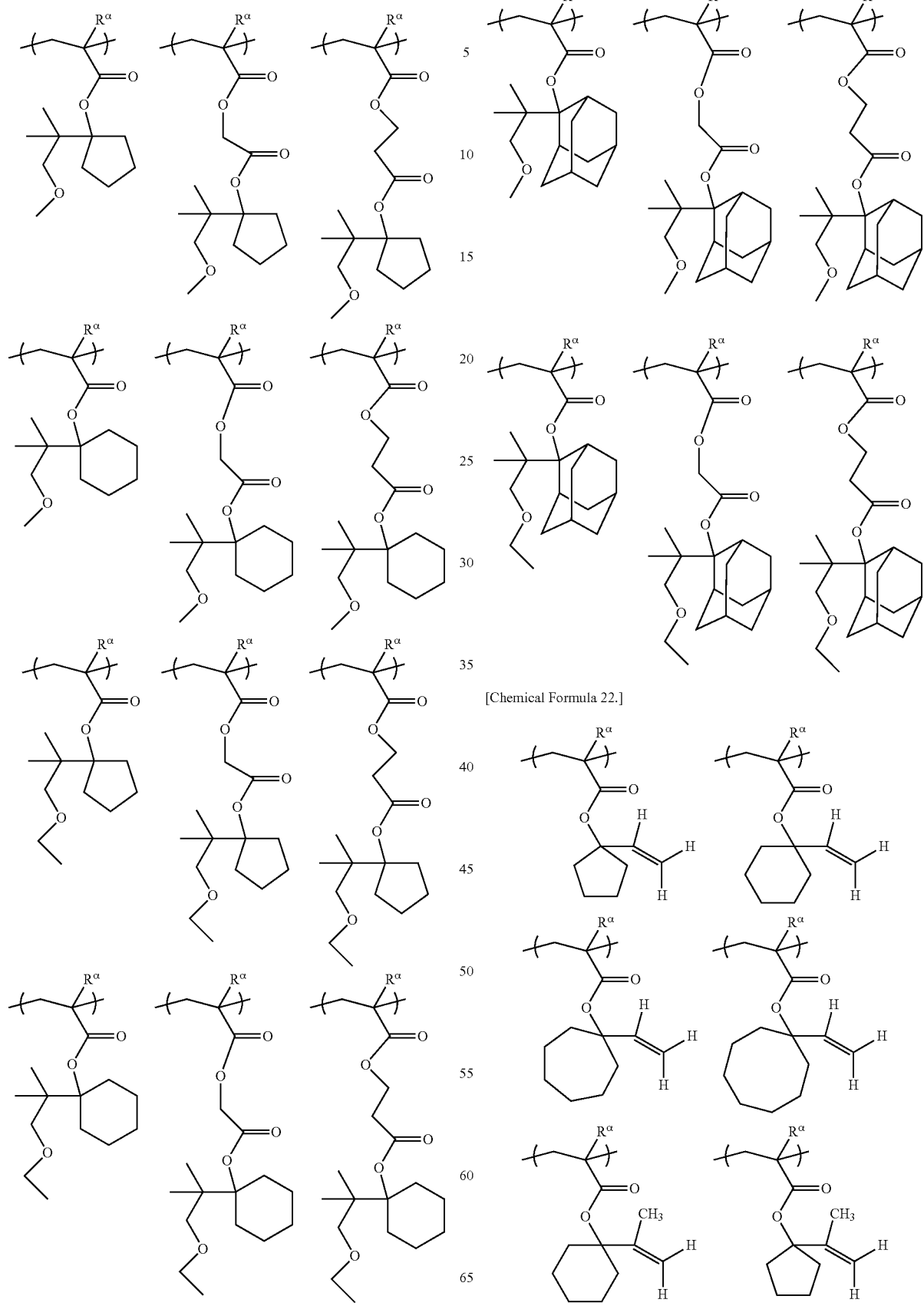

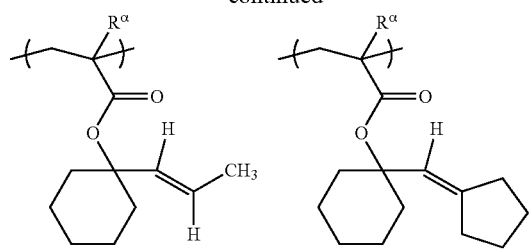
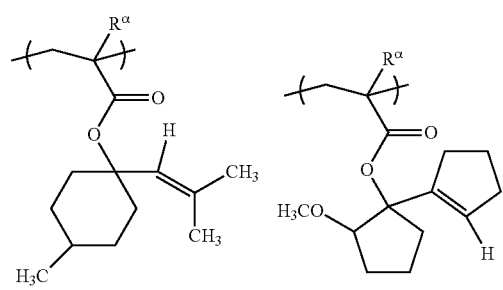
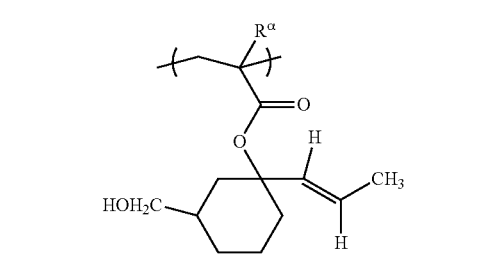
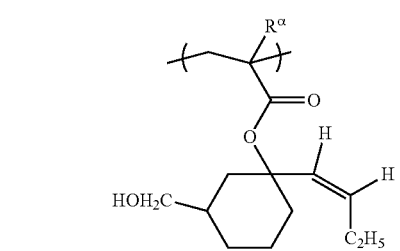
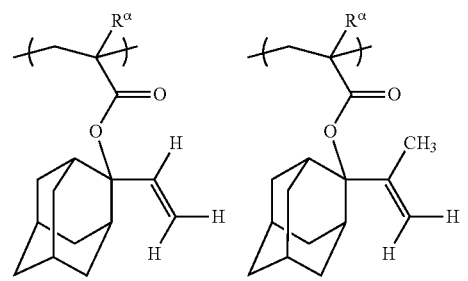
[Chemical Formula 23.]
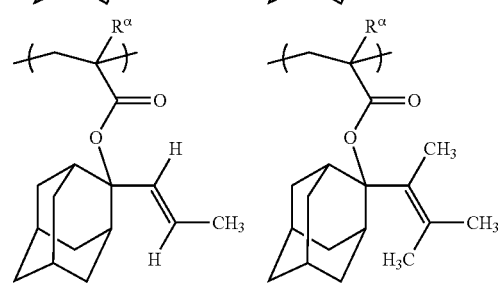
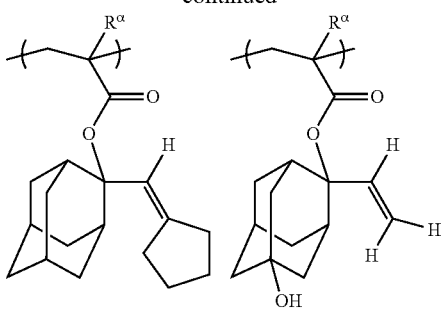
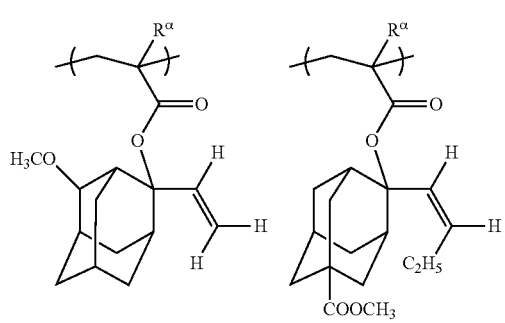
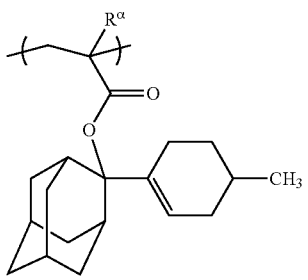
[Chemical Formula 24.]
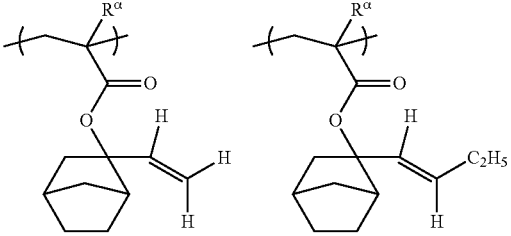
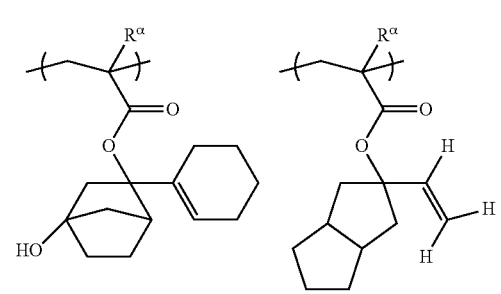

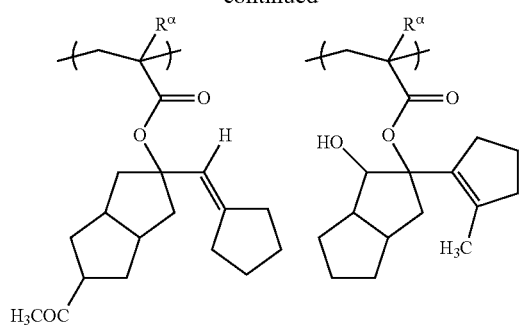
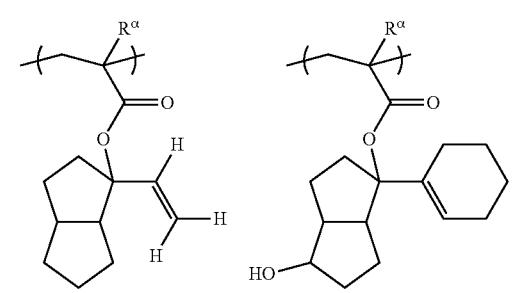
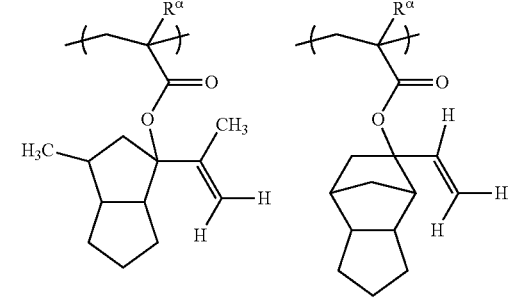
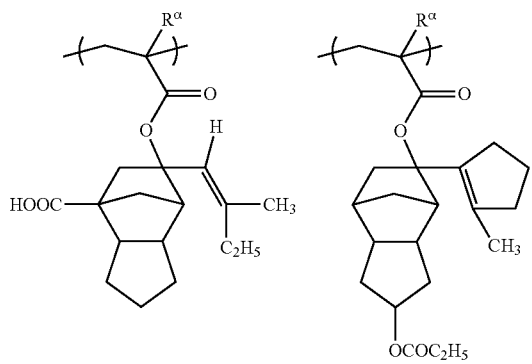
[Chemical Formula 25.]
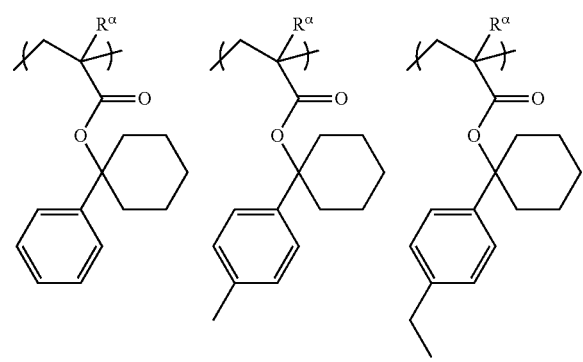
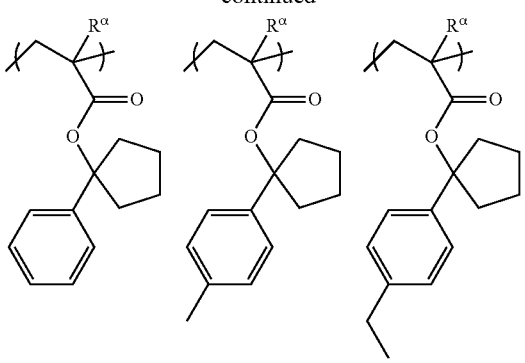
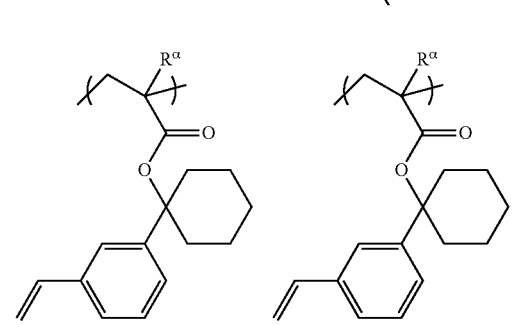
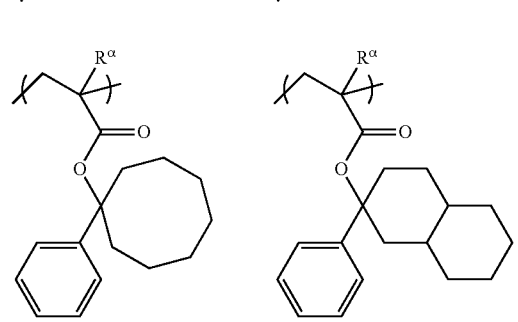
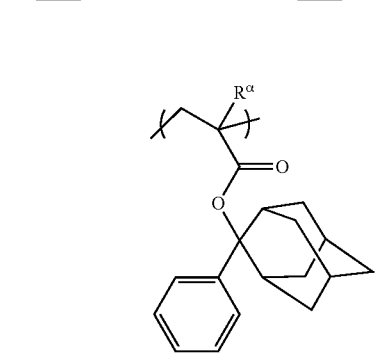
[Chemical Formula 26.]
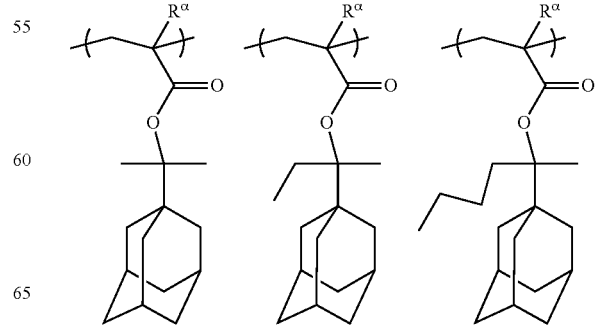

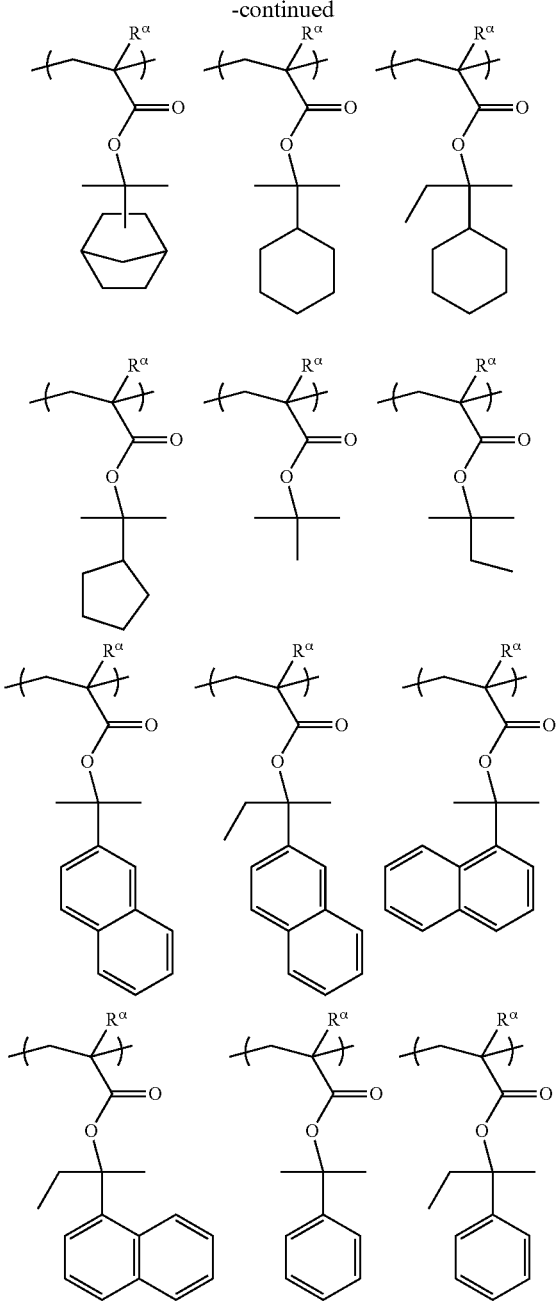
[Chemical Formula 27.]
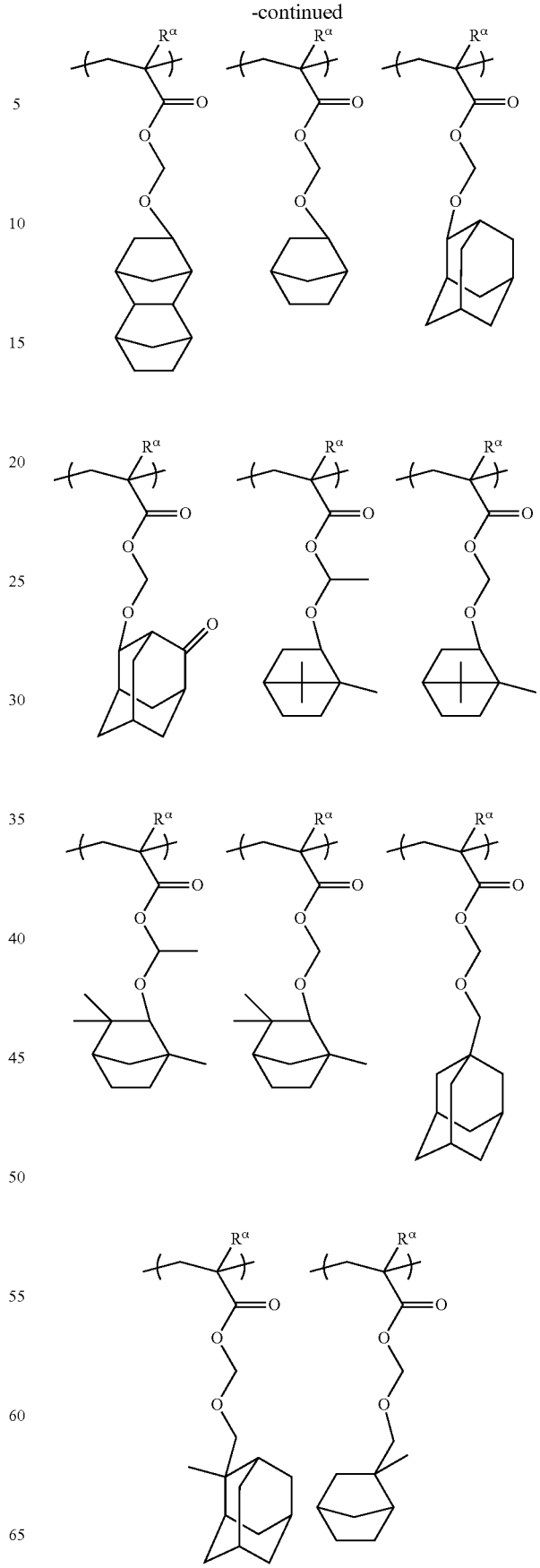

[Chemical Formula 28.]
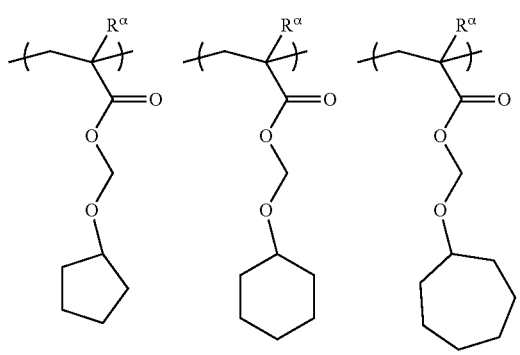
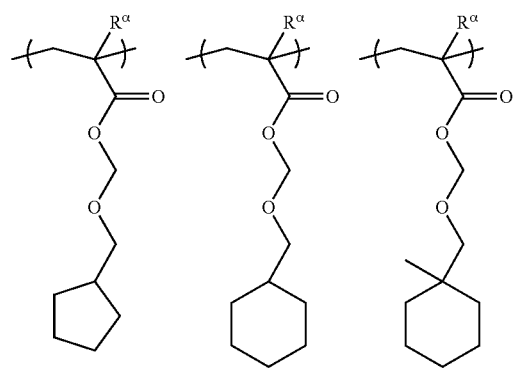
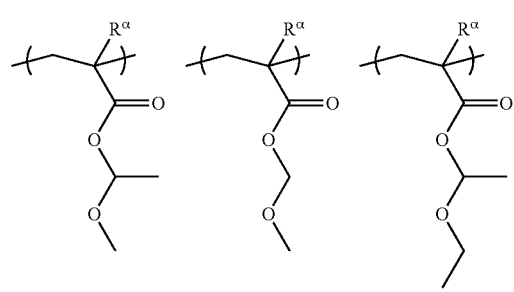
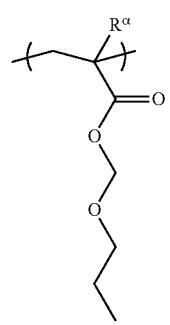
[Chemical Formula 29.]
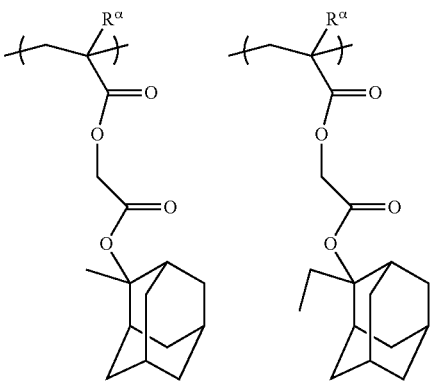
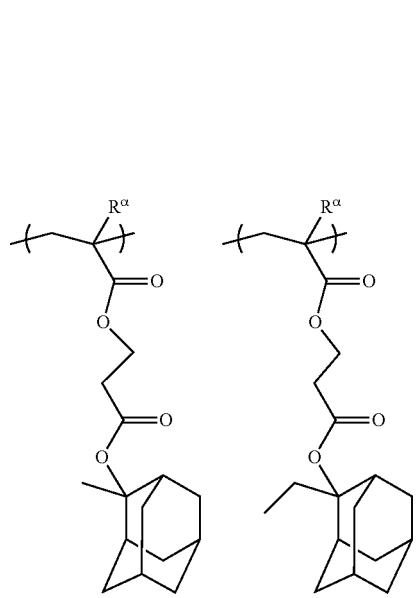
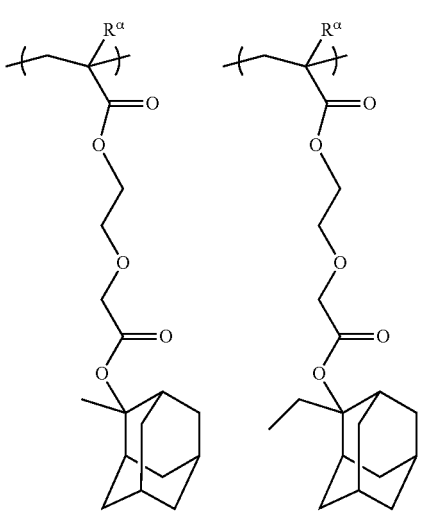

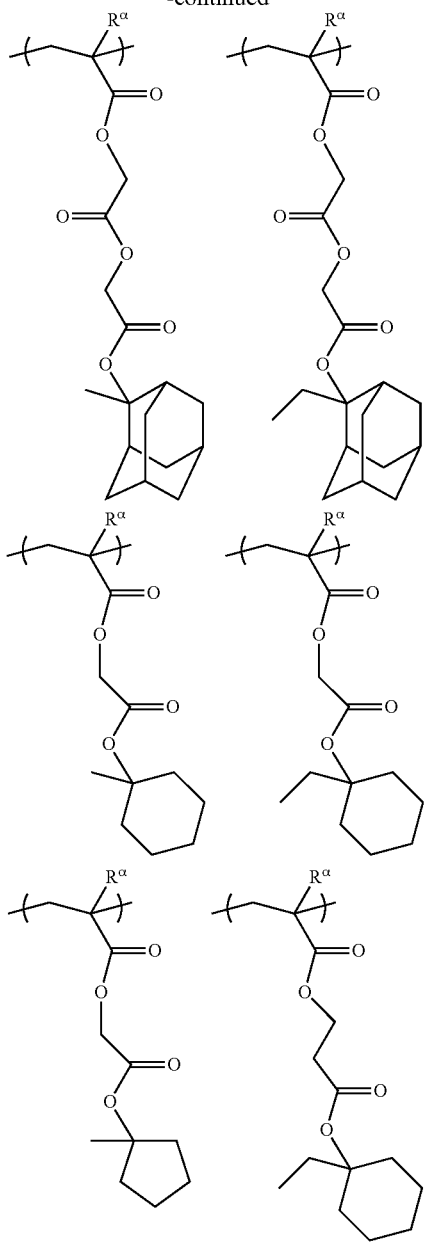
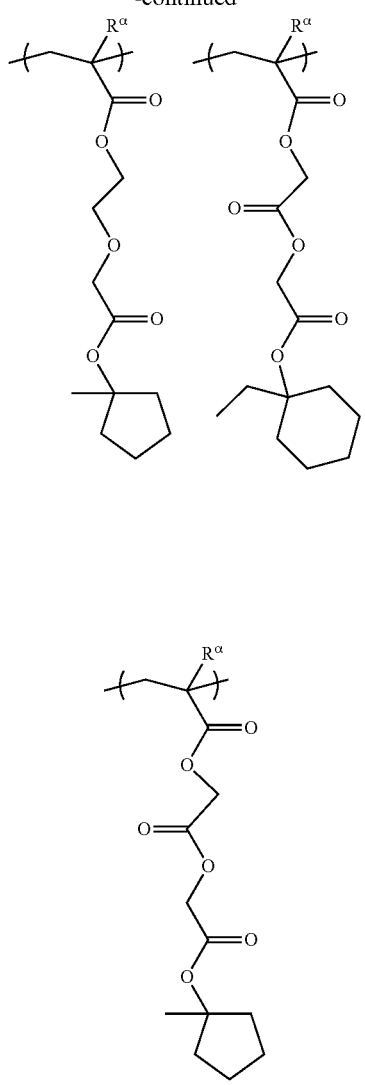
Specific examples of structural unit represented by formula (a1-2) are shown below.
[Chemical Formula 30.]
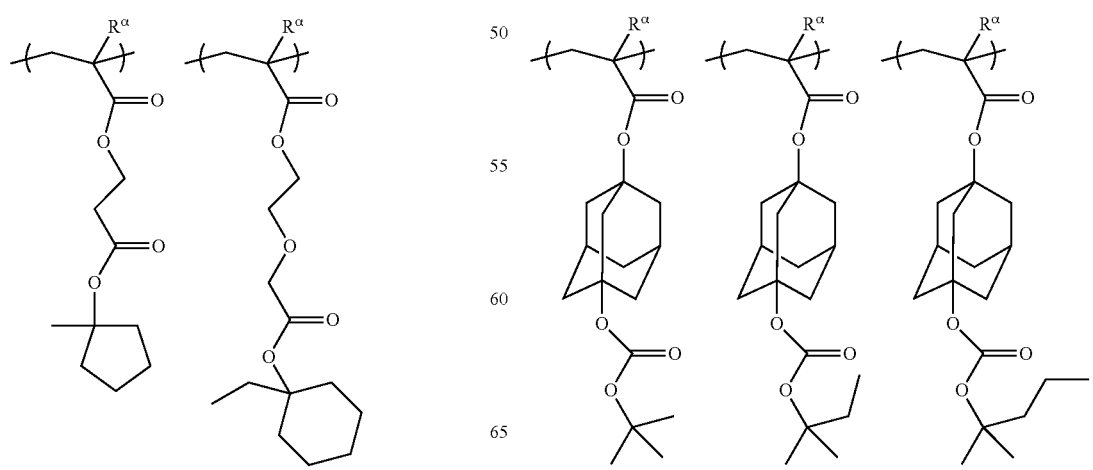

-continued

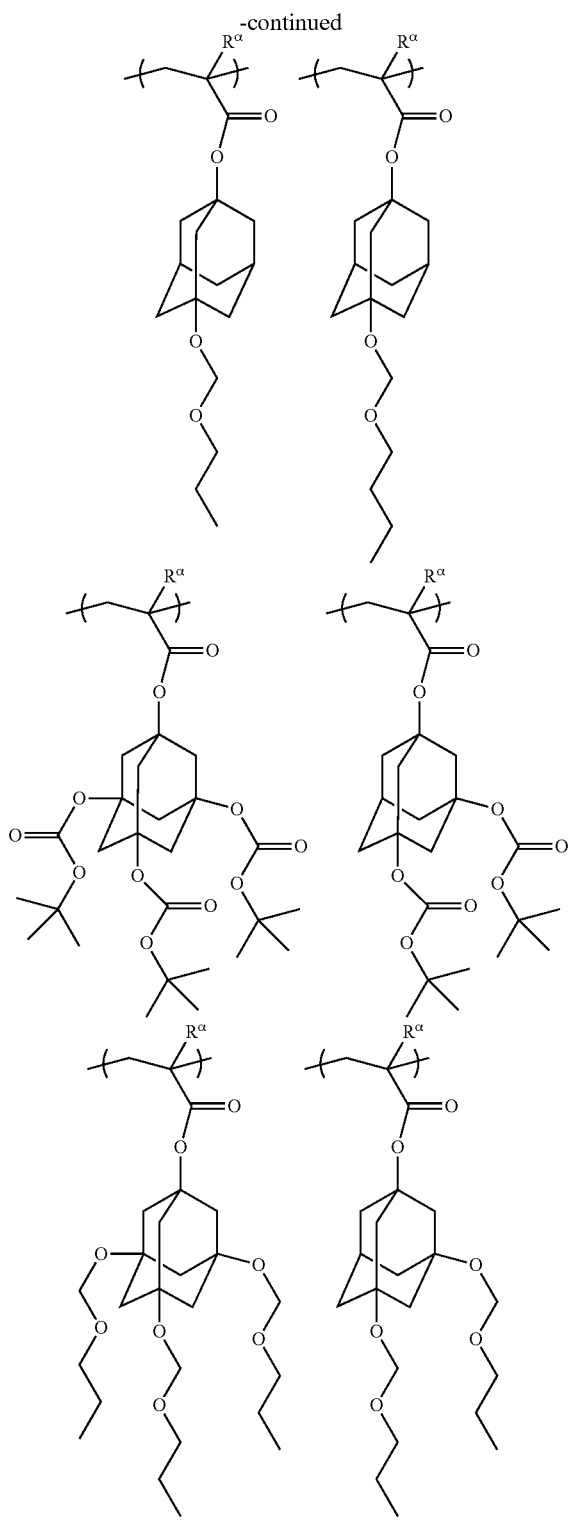

As the structural unit (a1) contained in the component (A1), 1 type of structural unit may be used, or 2 or more types may be used.

From the viewpoint that the properties of the lithography (sensitivity, shape, and the like) by electron beam and EUV are more likely to be enhanced, the structural unit (a1) is further preferably a structural unit represented by general formula (a1-1).

Among these examples, as the structural unit (a1), a structural unit represented by general formula (a1-1-1) is particularly preferable.

[Chemical Formula 31.]

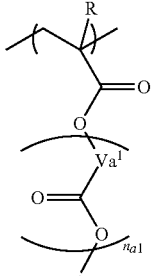

(a1-1-1)

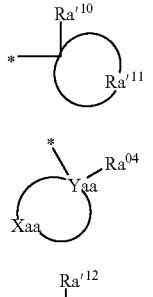

(a1-r2-1)

(a1-r2-3)

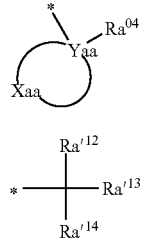

(a1-r2-4)

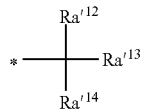

In the formula, $Ra^{1\prime\prime\prime}$ is an acid dissociable group represented by general formula (a1-r2-1), (a1-r2-3), or (a1-r2-4).

In general formula (a1-1-1), R, $Va^1$ and $n_{a1}$ are the same as defined for R, $Va^1$ and $n_{a1}$ in general formula (a1-1).

The description of the acid dissociable group represented by general formula (a1-r2-1), (a1-r2-3), or (a1-r2-4) is the same as described above.

In the component (A1), the amount of the structural unit (a1) based on the combined total (100 mol %) of all structural units constituting the component (A1) is preferably 5 to 80 mol %, more preferably 10 to 75 mol %, and still more preferably 30 to 70 mol %.

When the amount of the structural unit (a1) is at least as large as the lower limit of the above-mentioned preferable range, various lithography properties such as sensitivity, resolution and roughness may be improved. On the other hand, when the amount of the structural unit (a1) is no more than the upper limit of the above-mentioned preferable range, a good balance may be achieved with the other structural units, and the lithography properties may be improved.

<<Structural Unit (a10) Containing Hydroxystyrene Skeleton>>

The component (A1) preferably has, in addition to the structural unit (a1), a structural unit (a10) containing a hydroxystyrene skeleton.

Preferable examples of the structural unit (a10) include a structural unit represented by general formula (a10-1) shown below.

[Chemical Formula 32.]

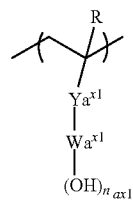

(a10-1)

In the formula, R represents a hydrogen atom, an alkyl group of 1 to 5 carbon atoms or a halogenated alkyl group of 1 to 5 carbon atoms; $Ya^{x1}$ represents a single bond or a divalent linking group; $Wa^{x1}$ represents an aromatic hydrocarbon group having a valency of ($n_{ax1}$+1); and $n_{ax1}$ represents an integer of 1 to 3.

In general formula (a10-1), R represents a hydrogen atom, an alkyl group of 1 to 5 carbon atoms or a halogenated alkyl group of 1 to 5 carbon atoms.

As the alkyl group of 1 to 5 carbon atoms for R, a linear or branched alkyl group of 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group and a neopentyl group. The halogenated alkyl group of 1 to 5 carbon atoms represented by R is a group in which part or all of the hydrogen atoms of the aforementioned alkyl group of 1 to 5 carbon atoms have been substituted with halogen atoms. Examples of the halogen atom include a fluorine atom, a chlorine atom, a bromine atom and an iodine atom, and a fluorine atom is particularly desirable.

As R, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

In formula (a10-1), $Ya^{x1}$ represents a single bond or a divalent linking group.

Preferable examples of the divalent linking group for $Ya^{x1}$ include a divalent hydrocarbon group which may have a substituent, and a divalent linking group containing a hetero atom.

Divalent Hydrocarbon Group which May have a Substituent:

In the case where $Ya^{x1}$ is a divalent linking group which may have a substituent, the hydrocarbon group may be either an aliphatic hydrocarbon group or an aromatic hydrocarbon group.

Aliphatic Hydrocarbon Group for $Ya^{x1}$

The "aliphatic hydrocarbon group" refers to a hydrocarbon group that has no aromaticity. The aliphatic hydrocarbon group may be saturated or unsaturated. In general, the aliphatic hydrocarbon group is preferably saturated.

Examples of the aliphatic hydrocarbon group include a linear or branched aliphatic hydrocarbon group, and an aliphatic hydrocarbon group containing a ring in the structure thereof can be given.

Linear or Branched Aliphatic Hydrocarbon Group

The linear aliphatic hydrocarbon group preferably has 1 to 10 carbon atoms, more preferably 1 to 6, still more preferably 1 to 4, and most preferably 1 to 3.

As the linear aliphatic hydrocarbon group, a linear alkylene group is preferable. Specific examples thereof include a methylene group [—$CH_2$—], an ethylene group [—($CH_2$)$_2$—], a trimethylene group [—($CH_2$)$_3$—], a tetramethylene group [—($CH_2$)$_4$—] and a pentamethylene group [—($CH_2$)$_5$—].

The branched aliphatic hydrocarbon group preferably has 2 to 10 carbon atoms, more preferably 3 to 6, still more preferably 3 or 4, and most preferably 3.

As the branched aliphatic hydrocarbon group, branched alkylene groups are preferred, and specific examples include various alkylalkylene groups, including alkylmethylene groups such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)—, and —C($CH_2CH_3$)$_2$—; alkylethylene groups such as —CH($CH_3$)$CH_2$—, —CH($CH_3$)CH($CH_3$)—, —C($CH_3$)$_2CH_2$—, —CH($CH_2CH_3$)$CH_2$—, and —C($CH_3$)$_2$—$CH_2$—; alkyltrimethylene groups such as —CH($CH_3$)$CH_2CH_2$—, and —$CH_2$CH($CH_3$)$CH_2$—; and alkyltetramethylene groups such as —CH($CH_3$)$CH_2CH_2CH_2$—, and —$CH_2$CH($CH_3$)$CH_2CH_2$—. As the alkyl group within the alkylalkylene group, a linear alkyl group of 1 to 5 carbon atoms is preferable.

The linear or branched aliphatic hydrocarbon group may or may not have a substituent. Examples of the substituent include a fluorine atom, a fluorinated alkyl group of 1 to 5 carbon atoms, and a carbonyl group.

Aliphatic Hydrocarbon Group Containing a Ring in the Structure Thereof

As examples of the hydrocarbon group containing a ring in the structure thereof, a cyclic aliphatic hydrocarbon group containing a hetero atom in the ring structure thereof and may have a substituent (a group in which two hydrogen atoms have been removed from an aliphatic hydrocarbon ring), a group in which the cyclic aliphatic hydrocarbon group is bonded to the terminal of the aforementioned chain-like aliphatic hydrocarbon group, and a group in which the cyclic aliphatic group is interposed within the aforementioned linear or branched aliphatic hydrocarbon group, can be given. As the linear or branched aliphatic hydrocarbon group, the same groups as those described above can be used.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group. As the monocyclic aliphatic hydrocarbon group, a group in which 2 hydrogen atoms have been removed from a monocycloalkane is preferable. The monocycloalkane preferably has 3 to 6 carbon atoms, and specific examples thereof include cyclopentane and cyclohexane. As the polycyclic group, a group in which 2 hydrogen atoms have been removed from a polycycloalkane is preferable, and the polycyclic group preferably has 7 to 12 carbon atoms. Examples of the polycycloalkane include adamantane, norbornane, isobornane, tricyclodecane and tetracyclododecane.

The cyclic aliphatic hydrocarbon group may or may not have a substituent. Examples of the substituent include an alkyl group, an alkoxy group, a halogen atom, a halogenated alkyl group, a hydroxyl group and a carbonyl group.

The alkyl group as the substituent is preferably an alkyl group of 1 to 5 carbon atoms, and a methyl group, an ethyl group, a propyl group, an n-butyl group or a tert-butyl group is particularly desirable.

The alkoxy group as the substituent is preferably an alkoxy group having 1 to 5 carbon atoms, more preferably a methoxy group, ethoxy group, n-propoxy group, isopropoxy group, n-butoxy group or tert-butoxy group, and most preferably a methoxy group or an ethoxy group.

Examples of the halogen atom for the substituent include a fluorine atom, a chlorine atom, a bromine atom and an iodine atom, and a fluorine atom is preferable.

Examples of the halogenated alkyl group for the substituent include groups in which part or all of the hydrogen atoms within the aforementioned alkyl groups has been substituted with the aforementioned halogen atoms.

The cyclic aliphatic hydrocarbon group may have part of the carbon atoms constituting the ring structure thereof substituted with a substituent containing a hetero atom. As the substituent containing a hetero atom, —O—, —C(=O)—O—, —S—, —S(=O)$_2$— or —S(=O)$_2$—O— is preferable.

Aromatic Hydrocarbon Group for Ya$^{x1}$

The aromatic hydrocarbon group is a hydrocarbon group having at least one aromatic ring.

The aromatic ring is not particularly limited, as long as it is a cyclic conjugated compound having (4n+2)π electrons, and may be either monocyclic or polycyclic. The aromatic ring preferably has 5 to 30 carbon atoms, more preferably 5 to 20 carbon atoms, and still more preferably 6 to 15 carbon atoms, and most preferably 6 to 12 carbon atoms. Here, the number of carbon atoms within a substituent(s) is not included in the number of carbon atoms of the aromatic hydrocarbon group. Examples of the aromatic ring include aromatic hydrocarbon rings, such as benzene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom. Specific examples of the aromatic hetero ring include a pyridine ring and a thiophene ring.

Specific examples of the aromatic hydrocarbon group include a group in which two hydrogen atoms have been removed from the aforementioned aromatic hydrocarbon ring or aromatic hetero ring (arylene group or heteroarylene group); a group in which two hydrogen atoms have been removed from an aromatic compound having two or more aromatic rings (biphenyl, fluorene or the like); and a group in which one hydrogen atom of the aforementioned aromatic hydrocarbon ring or aromatic hetero ring has been substituted with an alkylene group (a group in which one hydrogen atom has been removed from the aryl group within the aforementioned arylalkyl group such as a benzyl group, a phenethyl group, a 1-naphthylmethyl group, a 2-naphthylmethyl group, a 1-naphthylethyl group, or a 2-naphthylethyl group, or a heteroarylalkyl group). The alkylene group which is bonded to the aforementioned aryl group or heteroaryl group preferably has 1 to 4 carbon atoms, more preferably 1 or 2 carbon atoms, and most preferably 1 carbon atom.

With respect to the aromatic hydrocarbon group, the hydrogen atom within the aromatic hydrocarbon group may be substituted with a substituent. For example, the hydrogen atom bonded to the aromatic ring within the aromatic hydrocarbon group may be substituted with a substituent. Examples of substituents include an alkyl group, an alkoxy group, a halogen atom, a halogenated alkyl group, and a hydroxyl group.

The alkyl group as the substituent is preferably an alkyl group of 1 to 5 carbon atoms, and a methyl group, an ethyl group, a propyl group, an n-butyl group or a tert-butyl group is particularly desirable.

As the alkoxy group, the halogen atom and the halogenated alkyl group for the substituent, the same groups as the aforementioned substituent groups for substituting a hydrogen atom within the cyclic aliphatic hydrocarbon group can be used.

Divalent Linking Group Containing a Hetero Atom

In the case where Ya$^{x1}$ represents a divalent linking group containing a hetero atom, preferable examples of the linking group include —O—, —C(=O)—O—, —C(=O)—, —O—C(=O)—O—, —C(=O)—NH—, —NH—, —NH—C(=NH)— (may be substituted with a substituent such as an alkyl group, an acyl group or the like), —S—, —S(=O)$_2$—, —S(=O)$_2$—O—, and a group represented by general formula: —Y$^{21}$—O—Y$^{22}$—, —Y$^{21}$—O—, —Y$^{21}$—C(=O)—O—, —C(=O)—O—Y$^{21}$—, —[Y$^{21}$—C(=O)—O]$_{m'}$—Y$^{22}$—, —Y$^{21}$—O—C(=O)—Y$^{22}$— or —Y$^{21}$—S(=O)$_2$—O—Y$^{22}$— [in the formulae, Y$^{21}$ and Y$^{22}$ each independently represents a divalent hydrocarbon group which may have a substituent, O represents an oxygen atom, and m' represents an integer of 0 to 3].

In the case where the divalent linking group containing a hetero atom is —C(=O)—NH—, —C(=O)—NH—C(=O)—, —NH— or —NH—C(=NH)—, H may be substituted with a substituent such as an alkyl group, an acyl group or the like. The substituent (an alkyl group, an acyl group or the like) preferably has 1 to 10 carbon atoms, more preferably 1 to 8, and most preferably 1 to 5.

In general formulae —Y$^{21}$—O—Y$^{22}$—, —Y$^{21}$—O—, —Y$^{21}$—C(=O)—O—, —C(=O)—O—Y$^{21}$—, —[Y$^{21}$—C(=O)—O]$_{m'}$—Y$^{22}$—, —Y$^{21}$—O—C(=O)—Y$^{22}$— or —Y$^{21}$—S(=O)$_2$—O—Y$^{22}$—, Y$^{21}$ and Y$^{22}$ each independently represents a divalent hydrocarbon group which may have a substituent. Examples of the divalent hydrocarbon group include the same groups as those described above as the "divalent hydrocarbon group which may have a substituent" in the explanation of the aforementioned divalent linking group.

As Y$^{21}$, a linear aliphatic hydrocarbon group is preferable, more preferably a linear alkylene group, still more preferably a linear alkylene group of 1 to 5 carbon atoms, and a methylene group or an ethylene group is particularly desirable.

As Y$^{22}$, a linear or branched aliphatic hydrocarbon group is preferable, and a methylene group, an ethylene group or an alkylmethylene group is more preferable. The alkyl group within the alkylmethylene group is preferably a linear alkyl group of 1 to 5 carbon atoms, more preferably a linear alkyl group of 1 to 3 carbon atoms, and most preferably a methyl group.

In the group represented by the formula —[Y$^{21}$—C(=O)—O]$_{m''}$-Y$^{22}$—, m'' represents an integer of 0 to 3, preferably an integer of 0 to 2, more preferably 0 or 1, and most preferably 1. Namely, it is particularly desirable that the group represented by the formula —[Y$^{21}$—C(=O)—O]$_{m''}$—Y$^{22}$— is a group represented by the formula —Y$^{21}$—C(=O)—O—Y$^{22}$—. Among these, a group represented by the formula —(CH$_2$)$_{a'}$-C(=O)—O—(CH$_2$)$_{b'}$— is preferable. In the formula, a' is an integer of 1 to 10, preferably an integer of 1 to 8, more preferably an integer of 1 to 5, still more preferably 1 or 2, and most preferably 1. b' is an integer of 1 to 10, preferably an integer of 1 to 8, more preferably an integer of 1 to 5, still more preferably 1 or 2, and most preferably 1.

Ya$^{x1}$ preferably represents an ester bond [—C(=O)—O—], an ether bond (—O—), —C(=O)—NH—, a linear or branched alkylene group, a combination of these, or a single bond, and more preferably a single bond.

In formula (a10-1), Wa$^{x1}$ represents an aromatic hydrocarbon group having a valency of ($n_{ax1}$+1).

Examples of the aromatic hydrocarbon group for $Wa^{x1}$ include a group obtained by removing $(n_{ax1}+1)$hydrogen atoms from an aromatic ring. The aromatic ring is not particularly limited, as long as it is a cyclic conjugated compound having $(4n+2)\pi$ electrons, and may be either monocyclic or polycyclic. The aromatic ring preferably has 5 to 30 carbon atoms, more preferably 5 to 20 carbon atoms, and still more preferably 6 to 15 carbon atoms, and most preferably 6 to 12 carbon atoms. Examples of the aromatic ring include aromatic hydrocarbon rings, such as benzene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom. Specific examples of the aromatic hetero ring include a pyridine ring and a thiophene ring.

In formula (a10-1), $n_{ax1}$ is an integer of 1 to 3, preferably 1 or 2, and more preferably 1.

Specific examples of the structural unit represented by general formula (a10-1) are shown below.

In the following formulae, $R^{\alpha}$ represents a hydrogen atom, a methyl group or a trifluoromethyl group.

[Chemical Formula 33.]

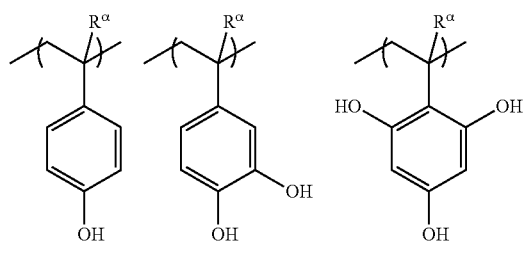

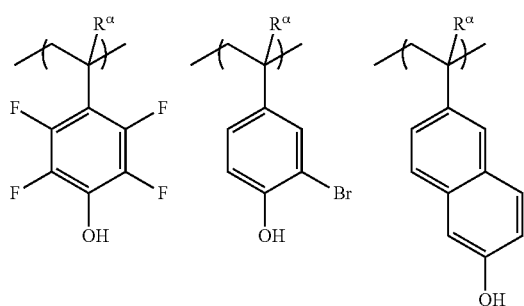

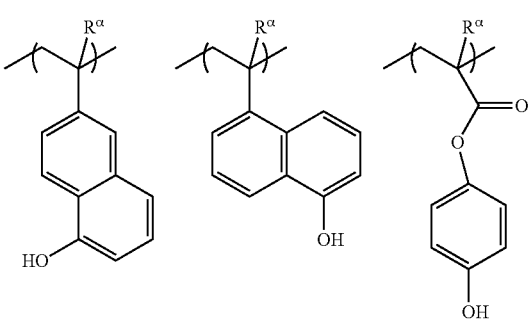

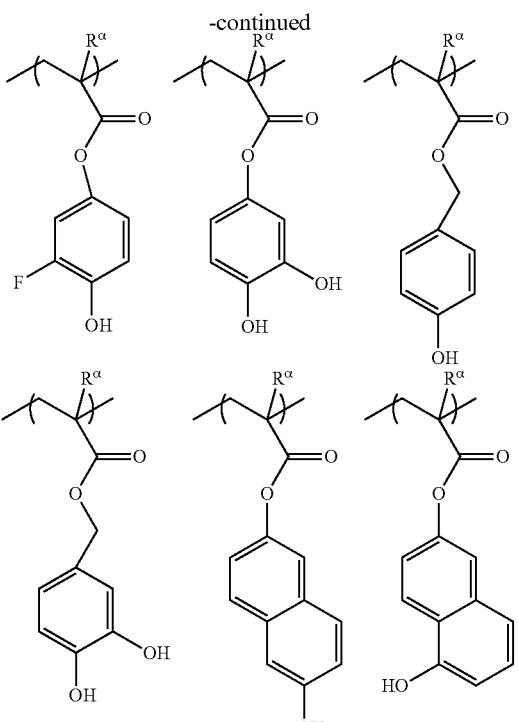

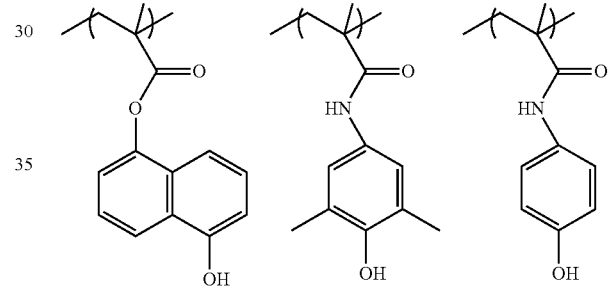

As the structural unit (a10) contained in the component (A1), 1 kind of structural unit may be used, or 2 or more kinds may be used.

In the component (A1), the amount of the structural unit (a10) based on the combined total (100 mol %) of all structural units constituting the component (A1) is, for example, 0 to 80 mol %, preferably 10 to 80 mol %, more preferably 20 to 70 mol %, and still more preferably 30 to 60 mol %.

When the amount of the structural unit (a10) is at least as large as the lower limit of the above-mentioned preferable range, various lithography properties such as sensitivity, resolution and roughness may be improved. On the other hand, when the amount of the structural unit (a10) is no more than the upper limit of the above-mentioned preferable range, a good balance may be achieved with the other structural units, and the lithography properties may be improved.

<<Structural Unit (a2)>>

The component (A1) preferably has, in addition to the structural unit (a1), a structural unit (a2) containing a lactone-containing cyclic group, an —$SO_2$— containing cyclic group or a carbonate-containing cyclic group (provided that structural units which fall under the definition of the structural unit (a1) are excluded).

When the component (A1) is used for forming a resist film, the lactone-containing cyclic group, the —$SO_2$— containing cyclic group or the carbonate-containing cyclic group within the structural unit (a2) is effective in improving the adhesion between the resist film and the substrate. In addition, by virtue of containing the structural unit (a2), for example, the acid diffusion length is appropriately adjusted, the adhesion of the resist film to the substrate is enhanced, or the solubility during development is appropriately adjusted. As a result, the lithography properties are enhanced.

The term "lactone-containing cyclic group" refers to a cyclic group including a ring containing a —O—C(=O)— structure (lactone ring). The term "lactone ring" refers to a single ring containing a —O—C(O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings. The lactone-containing cyclic group may be either a monocyclic group or a polycyclic group.

The lactone-containing cyclic group for the structural unit (a2) is not particularly limited, and an arbitrary structural unit may be used. Specific examples include groups represented by general formulae (a2-r-1) to (a2-r-7) shown below.

[Chemical Formula 34.]

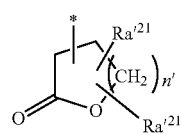
(a2-r-1)

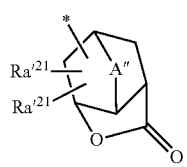
(a2-r-2)

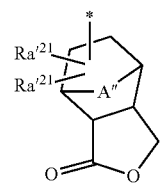
(a2-r-3)

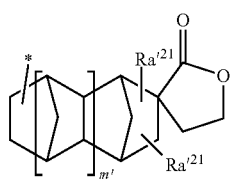
(a2-r-4)

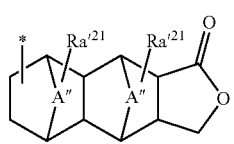
(a2-r-5)

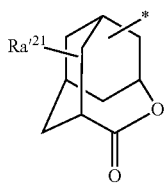
(a2-r-6)

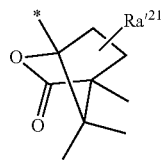
(a2-r-7)

In the formulae, each $Ra'^{21}$ independently represents a hydrogen atom, an alkyl group, an alkoxy group, a halogen atom, a halogenated alkyl group, a hydroxy group, —COOR", —OC(=O)R", a hydroxyalkyl group or a cyano group; R" represents a hydrogen atom, an alkyl group, a lactone-containing cyclic group, a carbonate-containing cyclic group or an —$SO_2$— containing cyclic group; A" represents an oxygen atom (—O—), a sulfur atom (—S—) or an alkylene group of 1 to 5 carbon atoms which may contain an oxygen atom or a sulfur atom; n' represents an integer of 0 to 2; and m' represents 0 or 1.

In formulae (a2-r-1) to (a2-r-7), the alkyl group for $Ra'^{21}$ is preferably an alkyl group of 1 to 6 carbon atoms. Further, the alkyl group is preferably a linear alkyl group or a branched alkyl group. Specific examples include a methyl group, an ethyl group, a propyl group, an isopropyl group, an n-butyl group, an isobutyl group, a tert-butyl group, a pentyl group, an isopentyl group, a neopentyl group and a hexyl group. Among these, a methyl group or ethyl group is preferable, and a methyl group is particularly desirable.

The alkoxy group for $Ra'^{21}$ is preferably an alkoxy group of 1 to 6 carbon atoms.

Further, the alkoxy group is preferably a linear or branched alkoxy group. Specific examples of the alkoxy groups include the aforementioned alkyl groups for $Ra'^{21}$ having an oxygen atom (—O—) bonded thereto.

As examples of the halogen atom for $Ra'^{21}$, a fluorine atom, chlorine atom, bromine atom and iodine atom can be given. Among these, a fluorine atom is preferable.

Examples of the halogenated alkyl group for $Ra'^{21}$ include groups in which part or all of the hydrogen atoms within the aforementioned alkyl group for $Ra'^{21}$ has been substituted with the aforementioned halogen atoms. As the halogenated alkyl group, a fluorinated alkyl group is preferable, and a perfluoroalkyl group is particularly desirable.

With respect to —COOR" and —OC(=O)R" for $Ra'^{21}$, R" represents a hydrogen atom, an alkyl group, a lactone-containing cyclic group, a carbonate-containing cyclic group or an —$SO_2$— containing cyclic group.

The alkyl group for R" may be linear, branched or cyclic, and preferably has 1 to 15 carbon atoms.

When R" represents a linear or branched alkyl group, it is preferably an alkyl group of 1 to 10 carbon atoms, more preferably an alkyl group of 1 to 5 carbon atoms, and most preferably a methyl group or an ethyl group.

When R" is a cyclic alkyl group (cycloalkyl group), it preferably has 3 to 15 carbon atoms, more preferably 4 to 12 carbon atoms, and most preferably 5 to 10 carbon atoms. Specific examples include groups in which one or more hydrogen atoms have been removed from a monocycloalkane or a polycycloalkane such as a bicycloalkane, tricycloalkane or tetracycloalkane which may or may not be substituted with a fluorine atom or a fluorinated alkyl group. Specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobomane, tricyclodecane or tetracyclododecane.

Examples of the lactone-containing cyclic group for R" include groups represented by the aforementioned general formulae (a2-r-1) to (a2-r-7).

The carbonate-containing cyclic group for R" is the same as defined for the carbonate-containing cyclic group described later. Specific examples of the carbonate-containing cyclic group include groups represented by general formulae (ax3-r-1) to (ax3-r-3).

The —SO$_2$— containing cyclic group for R" is the same as defined for the —SO$_2$-containing cyclic group described later. Specific examples of the —SO$_2$— containing cyclic group include groups represented by general formulae (a5-r-1) to (a5-r-4).

The hydroxyalkyl group for Ra'$^{21}$ preferably has 1 to 6 carbon atoms, and specific examples thereof include the alkyl groups for Ra'$^{21}$ in which at least one hydrogen atom has been substituted with a hydroxy group.

In formulae (a2-r-2), (a2-r-3) and (a2-r-5), as the alkylene group of 1 to 5 carbon atoms represented by A", a linear or branched alkylene group is preferable, and examples thereof include a methylene group, an ethylene group, an n-propylene group and an isopropylene group. Examples of alkylene groups that contain an oxygen atom or a sulfur atom include the aforementioned alkylene groups in which —O— or —S— is bonded to the terminal of the alkylene group or present between the carbon atoms of the alkylene group. Specific examples of such alkylene groups include —O—CH$_2$—, —CH$_2$—O—CH$_2$—, —S—CH$_2$— and —CH$_2$—S—CH$_2$—. As A", an alkylene group of 1 to 5 carbon atoms or —O— is preferable, more preferably an alkylene group of 1 to 5 carbon atoms, and most preferably a methylene group.

Specific examples of the groups represented by the aforementioned general formulae (a2-r-1) to (a2-r-7) are shown below.

[Chemical Formula 35.]

(r-Ic-1-1)

(r-Ic-1-2)

(r-Ic-1-3)

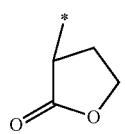
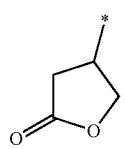

(r-Ic-1-4)

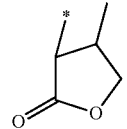

(r-Ic-1-5)

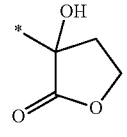

(r-Ic-1-6)

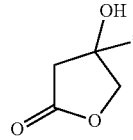

(r-Ic-1-7)

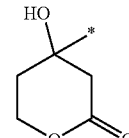

(r-Ic-2-1)

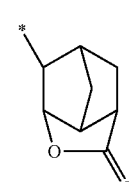

(r-Ic-2-2)

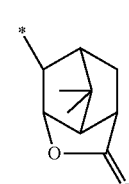

(r-Ic-2-3)

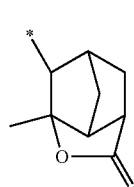

(r-Ic-2-4)

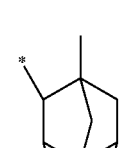

(r-Ic-2-5)

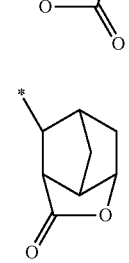

-continued
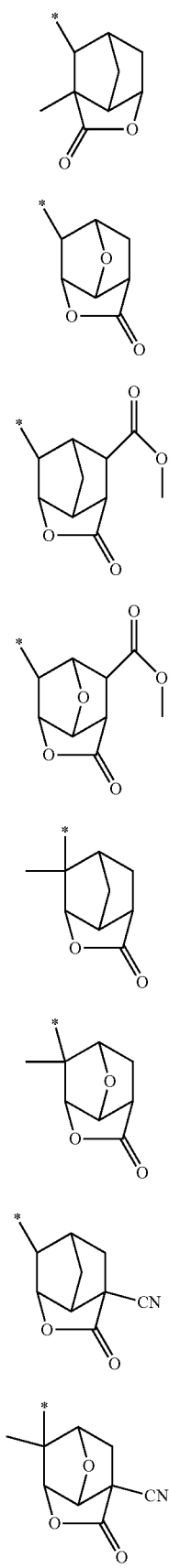
(r-Ic-2-6)
(r-Ic-2-7)
(r-Ic-2-8)
(r-Ic-2-9)
(r-Ic-2-10)
(r-Ic-2-11)
(r-Ic-2-12)
(r-Ic-2-13)
-continued
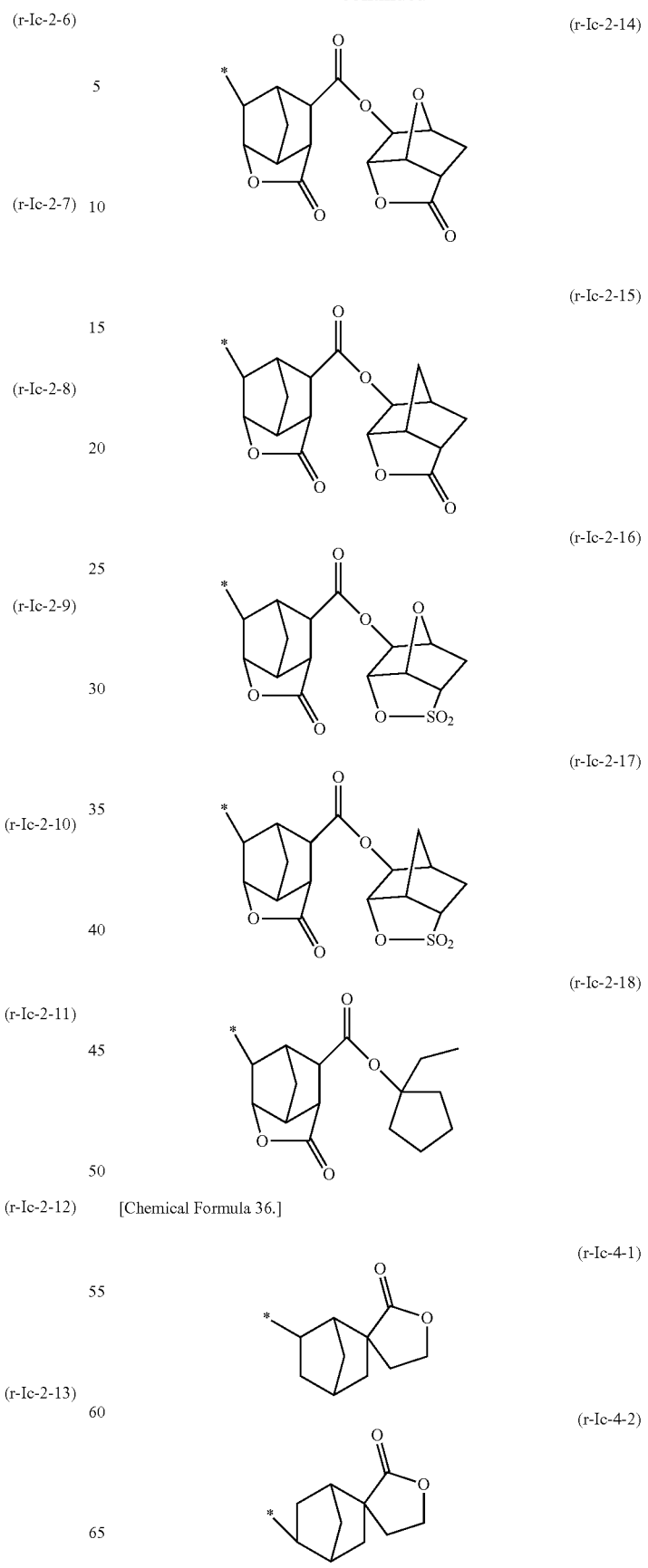
(r-Ic-2-14)
(r-Ic-2-15)
(r-Ic-2-16)
(r-Ic-2-17)
(r-Ic-2-18)
[Chemical Formula 36.]
(r-Ic-4-1)
(r-Ic-4-2)

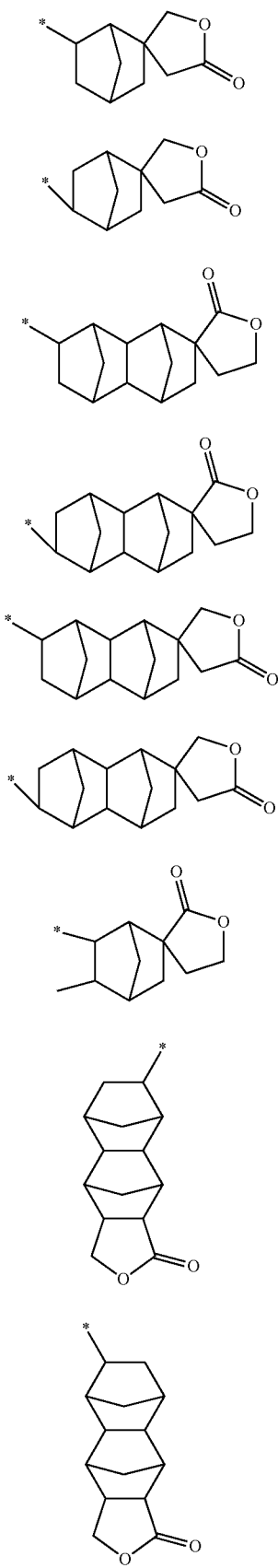
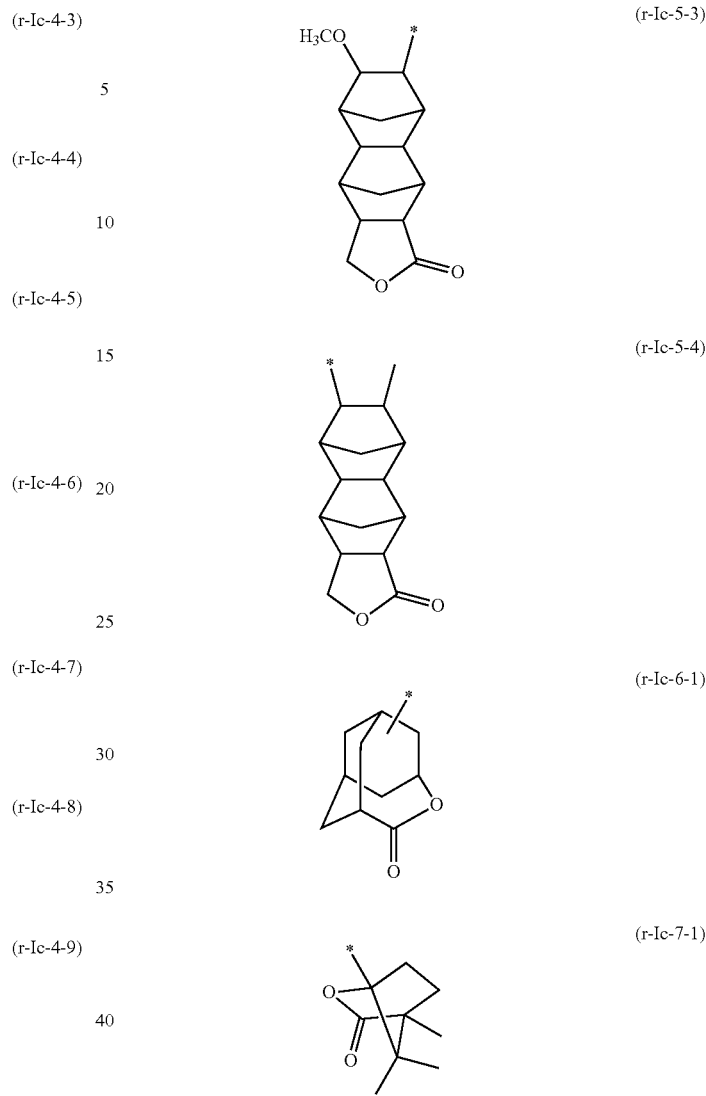

An "—SO₂— containing cyclic group" refers to a cyclic group having a ring containing —SO₂— within the ring structure thereof, i.e., a cyclic group in which the sulfur atom (S) within —SO₂— forms part of the ring skeleton of the cyclic group. The ring containing —SO₂— within the ring skeleton thereof is counted as the first ring. A cyclic group in which the only ring structure is the ring that contains —SO₂— in the ring skeleton thereof is referred to as a monocyclic group, and a group containing other ring structures is described as a polycyclic group regardless of the structure of the other rings. The —SO₂— containing cyclic group may be either a monocyclic group or a polycyclic group.

As the —SO₂— containing cyclic group, a cyclic group containing —O—SO₂— within the ring skeleton thereof, i.e., a cyclic group containing a sultone ring in which —O—S— within the —O—SO₂— group forms part of the ring skeleton thereof is particularly desirable.

More specific examples of the —SO₂— containing cyclic group include groups represented by general formulas (a5-r-1) to (a5-r-4) shown below.

[Chemical Formula 37.]

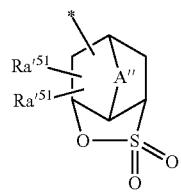
(a5-r-1)

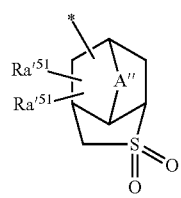
(a5-r-2)

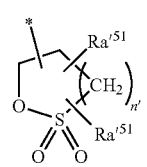
(a5-r-3)

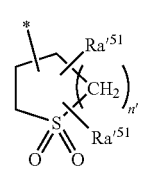
(a5-r-4)

In the formulae, each $Ra'^{51}$ independently represents a hydrogen atom, an alkyl group, an alkoxy group, a halogen atom, a halogenated alkyl group, a hydroxy group, —COOR", —OC(=O)R", a hydroxyalkyl group or a cyano group; R" represents a hydrogen atom, an alkyl group, a lactone-containing cyclic group, a carbonate-containing cyclic group or an —SO$_2$— containing cyclic group; A" represents an oxygen atom, a sulfur atom or an alkylene group of 1 to 5 carbon atoms which may contain an oxygen atom or a sulfur atom; and n' represents an integer of 0 to 2.

In general formulae (a5-r-1) and (a5-r-2), A" is the same as defined for A" in general formulae (a2-r-2), (a2-r-3) and (a2-r-5).

Examples of the alkyl group, alkoxy group, halogen atom, halogenated alkyl group, —COOR", —OC(=O)R" and hydroxyalkyl group for $Ra'^{51}$ include the same groups as those described above in the explanation of $Ra'^{21}$ in the general formulas (a2-r-1) to (a2-r-7).

Specific examples of the groups represented by the aforementioned general formulae (a5-r-1) to (a5-r-4) are shown below. In the formulae shown below, "Ac" represents an acetyl group.

[Chemical Formula 38.]

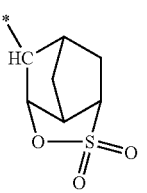
(r-s1-1-1)

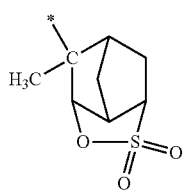
(r-s1-1-2)

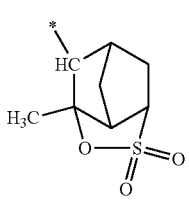
(r-s1-1-3)

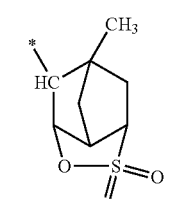
(r-s1-1-4)

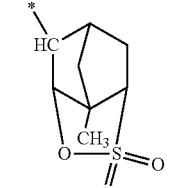
(r-s1-1-5)

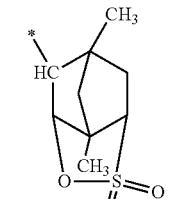
(r-s1-1-6)

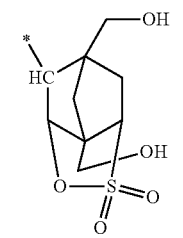
(r-s1-1-7)

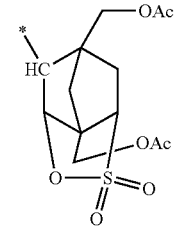
(r-s1-1-8)

(r-s1-1-9)
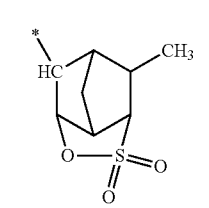
(r-s1-1-10)
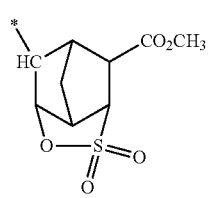
(r-s1-1-11)
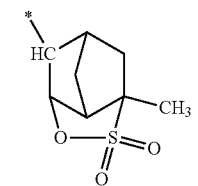
(r-s1-1-12)
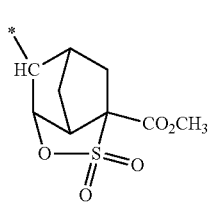
(r-s1-1-13)
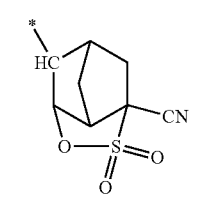
(r-s1-1-14)
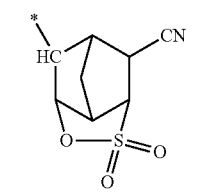
(r-s1-1-15)
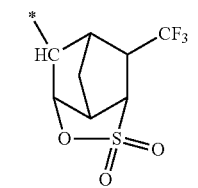
(r-s1-1-16)
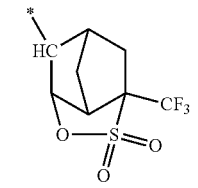
(r-s1-1-17)
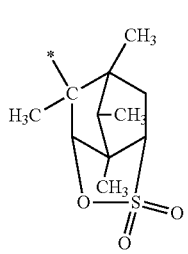
(r-s1-1-18)
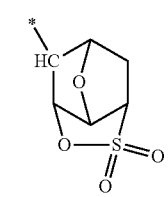
(r-s1-1-19)
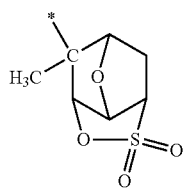
(r-s1-1-20)
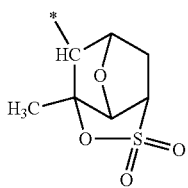
(r-s1-1-21)
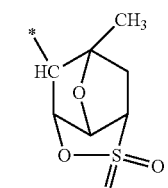
[Chemical Formula 39.]
(r-s1-1-22)
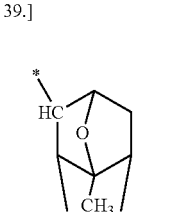
(r-s1-1-23)
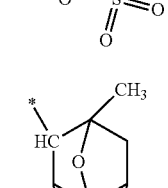

(r-s1-1-24)
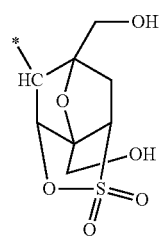

(r-s1-1-25)
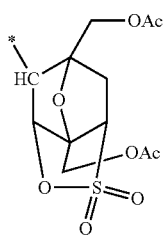

(r-s1-1-26)
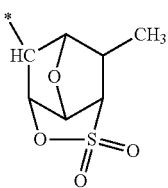

(r-s1-1-27)
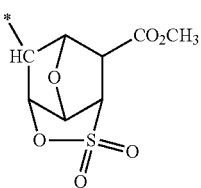

(r-s1-1-28)
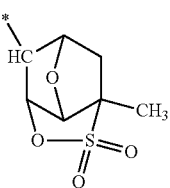

(r-s1-1-29)
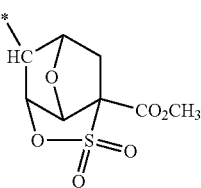

(r-s1-1-30)
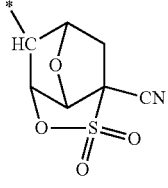

(r-s1-1-31)
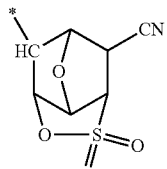

(r-s1-1-32)
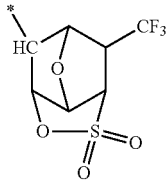

(r-s1-1-33)
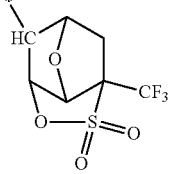

[Chemical Formula 40.]

(r-s1-2-1)
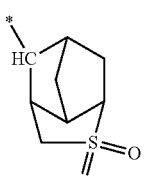

(r-s1-2-2)
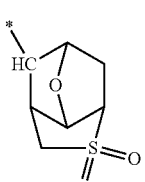

(r-s1-3-1)
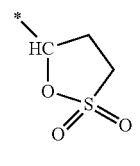

(r-s1-4-1)

The term "carbonate-containing cyclic group" refers to a cyclic group including a ring containing a —O—C(=O)—O— structure (carbonate ring). The term "carbonate ring" refers to a single ring containing a —O—C(=O)—O— structure, and this ring is counted as the first ring. A carbonate-containing cyclic group in which the only ring structure is the carbonate ring is referred to as a monocyclic group, and groups containing other ring structures are described as polycyclic groups regardless of the structure of the other rings. The carbonate-containing cyclic group may be either a monocyclic group or a polycyclic group.

The carbonate-containing cyclic group is not particularly limited, and an arbitrary group may be used. Specific examples include groups represented by general formulae (ax3-r-1) to (ax3-r-3) shown below.

[Chemical Formula 41.]

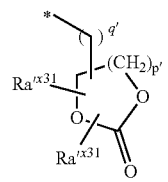
(ax3-r-1)

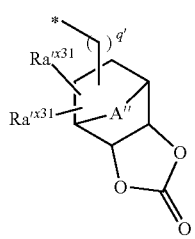
(ax3-r-2)

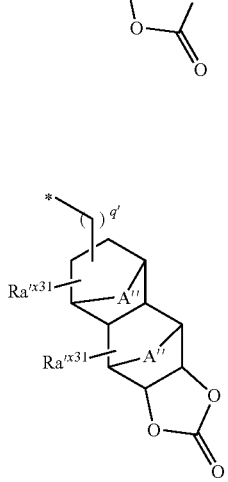
(ax3-r-3)

In the formulae, each $Ra'^{x31}$ independently represents a hydrogen atom, an alkyl group, an alkoxy group, a halogen atom, a halogenated alkyl group, a hydroxy group, —COOR", —OC(=O)R", a hydroxyalkyl group or a cyano group; R" represents a hydrogen atom, an alkyl group, a lactone-containing cyclic group, a carbonate-containing cyclic group or an —SO$_2$— containing cyclic group; A" represents an oxygen atom, a sulfur atom or an alkylene group of 1 to 5 carbon atoms which may contain an oxygen atom or a sulfur atom; p' represents an integer of 0 to 3; and q' represents 0 or 1.

In general formulae (ax3-r-2) and (ax3-r-3), A" is the same as defined for A" in general formulae (a2-r-2), (a2-r-3) and (a2-r-5).

Examples of the alkyl group, alkoxy group, halogen atom, halogenated alkyl group, —COOR", —OC(=O)R" and hydroxyalkyl group for $Ra'^{31}$ include the same groups as those described above in the explanation of $Ra'^{21}$ in the general formulas (a2-r-1) to (a2-r-7).

Specific examples of the groups represented by the aforementioned general formulae (ax3-r-1) to (ax3-r-3) are shown below.

[Chemical Formula 42.]

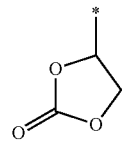
(r-cr-1-1)

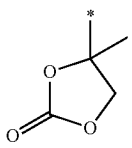
(r-cr-1-2)

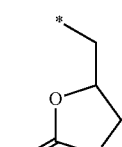
(r-cr-1-3)

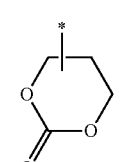
(r-cr-1-4)

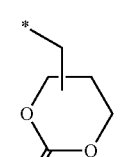
(r-cr-1-5)

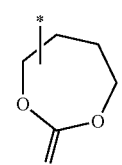
(r-cr-1-6)

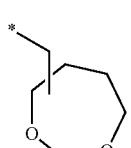
(r-cr-1-7)

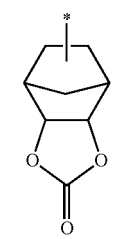
(r-cr-2-1)

(r-cr-2-2) 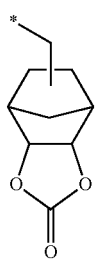

(r-cr-2-3) 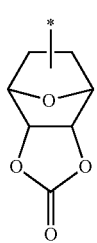

(r-cr-2-4) 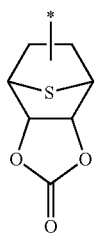

(r-cr-3-1) 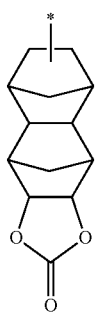

(r-cr-3-2) 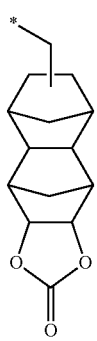

(r-cr-3-3) 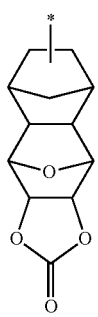

(r-cr-3-4) 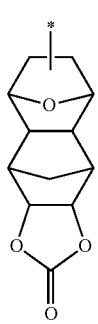

(r-cr-3-5) 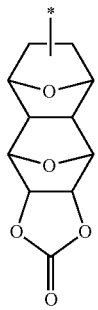

As the structural unit (a2), a structural unit derived from an acrylate ester which may have the hydrogen atom bonded to the carbon atom on the α-position substituted with a substituent is preferable.

The structural unit (a2) is preferably a structural unit represented by general formula (a2-1) shown below.

[Chemical Formul 43.]

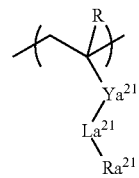

(a2-1)

In the formula, R represents a hydrogen atom, an alkyl group of 1 to 5 carbon atoms or a halogenated alkyl group of 1 to 5 carbon atoms; $Ya^{21}$ represents a single bond or a divalent linking group; $La^{21}$ represents —O—, —COO—, —CON(R')—, —OCO—, —CONHCO— or —CONHCS—; and R' represents a hydrogen atom or a methyl group; provided that, when $La^{21}$ represents —O—, $Ya^{21}$ does not represents —CO—; and $Ra^{21}$ represents a lactone-containing cyclic group, a carbonate-containing cyclic group or an —$SO_2$— containing cyclic group.

In the formula (a2-1), R is the same as defined above. As R, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

In the formula (a2-1), the divalent linking group for $Ya^{21}$ is not particularly limited, and preferable examples thereof include a divalent hydrocarbon group which may have a substituent and a divalent linking group containing a hetero atom. The divalent hydrocarbon group which may have a substituent and the divalent linking group containing a hetero atom for $Ya^{21}$ are the same as defined for the divalent hydrocarbon group which may have a substituent and the divalent linking group containing a hetero atom described above in relation to $Ya^{x1}$ in general formula (a10-1).

$Ya^{21}$ preferably represents an ester bond [—C(=O)—O—], an ether bond (—O—), a linear or branched alkylene group, a combination of these, or a single bond.

In the formula (a2-1), $R^{a21}$ represents a lactone-containing cyclic group, an —$SO_2$— containing cyclic group or a carbonate-containing cyclic group. Preferable examples of the lactone-containing cyclic group, the —$SO_2$— containing cyclic group and the carbonate-containing cyclic group for $R^{a21}$ include groups represented by general formulae (a2-r-1) to (a2-r-7), groups represented by general formulae (a5-r-1) to (a5-r-4) and groups represented by general formulae (ax3-r-1) to (ax3-r-3).

Among the above examples, a lactone-containing cyclic group or a —$SO_2$-containing cyclic group is preferable, and a group represented by general formula (a2-r-1), (a2-r-2), (a2-r-6) or (a5-r-1) is more preferable. Specifically, a group represented by any of chemical formulae (r-1c-1-1) to (r-1c-1-7), (r-1c-2-1) to (r-1c-2-18), (r-1c-6-1), (r-s1-1-1) and (r-s1-1-18) is still more preferable.

As the structural unit (a2) contained in the component (A1), 1 kind of structural unit may be used, or 2 or more kinds may be used.

When the component (A1) contains the structural unit (a2), the amount of the structural unit (a2) based on the combined total (100 mol %) of all structural units constituting the component (A1) is preferably 1 to 50 mol %, more preferably 5 to 45 mol %, still more preferably 10 to 40 mol %, and most preferably 10 to 30 mol %.

When the amount of the structural unit (a2) is at least as large as the lower limit of the above preferable range, the effect of using the structural unit (a2) may be satisfactorily achieved. On the other hand, when the amount of the structural unit (a2) is no more than the upper limit of the above preferable range, a good balance may be achieved with the other structural units, and various lithography properties may be improved.

<<Structural Unit (a3)>>

The component (A1) may have, in addition to the structural unit (a1), a structural unit (a3) containing a polar group-containing aliphatic hydrocarbon group (provided that the structural units that fall under the definition of structural units (a1) and (a2) are excluded). By virtue of the component (A1) including the structural unit (a3), various advantages may be obtained, such as appropriate adjustment of acid diffusion length, enhancement of adhesion of a resist film to a substrate, appropriate adjustment of solubility of the resist during developing, and improvement in etching resistance, which may lead to improvement in lithography properties.

Examples of the polar group include a hydroxyl group, cyano group, carboxyl group, or hydroxyalkyl group in which part of the hydrogen atoms of the alkyl group have been substituted with fluorine atoms, although a hydroxyl group is particularly desirable.

Examples of the aliphatic hydrocarbon group include linear or branched hydrocarbon groups (preferably alkylene groups) of 1 to 10 carbon atoms, and cyclic aliphatic hydrocarbon groups (cyclic groups). These cyclic groups can be selected appropriately from the multitude of groups that have been proposed for the resins of resist compositions designed for use with ArF excimer lasers. The cyclic group is preferably a polycyclic group, more preferably a polycyclic group of 7 to 30 carbon atoms.

Of the various possibilities, structural units derived from an acrylate ester that include an aliphatic polycyclic group that contains a hydroxyl group, cyano group, carboxyl group or a hydroxyalkyl group in which part of the hydrogen atoms of the alkyl group have been substituted with fluorine atoms are particularly desirable. Examples of the polycyclic group include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane or tetracyclododecane are preferred industrially.

As the structural unit (a3), there is no particular limitation as long as it is a structural unit containing a polar group-containing aliphatic hydrocarbon group, and an arbitrary structural unit may be used.

The structural unit (a3) is preferably a structural unit derived from an acrylate ester which may have the hydrogen atom bonded to the carbon atom on the α-position substituted with a substituent and contains a polar group-containing aliphatic hydrocarbon group.

When the aliphatic hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid.

On the other hand, in the structural unit (a3), when the hydrocarbon group within the polar group-containing aliphatic hydrocarbon group is a polycyclic group, structural units represented by formulas (a3-1), (a3-2), and (a3-3) shown below are preferable.

[Chemical Formula 44.]

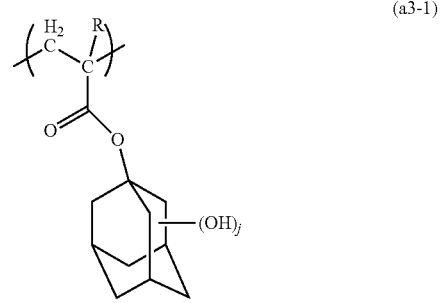

(a3-1)

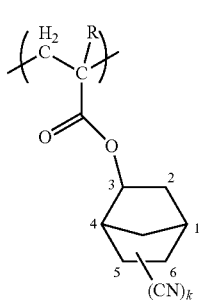

(a3-2)

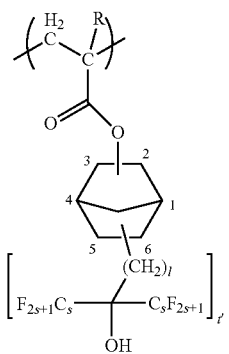

(a3-3)

In the formulas, R is the same as defined above; j is an integer of 1 to 3; k is an integer of 1 to 3; t' is an integer of 1 to 3; l is an integer of 1 to 5; and s is an integer of 1 to 3.

In formula (a3-1), j is preferably 1 or 2, and more preferably 1. When j is 2, it is preferable that the hydroxyl groups be bonded to the 3rd and 5th positions of the adamantyl group. When j is 1, it is preferable that the hydroxyl group be bonded to the 3rd position of the adamantyl group.

j is preferably 1, and it is particularly desirable that the hydroxyl group be bonded to the 3rd position of the adamantyl group.

In formula (a3-2), k is preferably 1. The cyano group is preferably bonded to the 5th or 6th position of the norbornyl group.

In formula (a3-3), t' is preferably 1. l is preferably 1. s is preferably 1. Further, it is preferable that a 2-norbornyl group or 3-norbornyl group be bonded to the terminal of the carboxy group of the acrylic acid. The fluorinated alkyl alcohol is preferably bonded to the 5th or 6th position of the norbornyl group.

As the structural unit (a3) contained in the component (A1), 1 type of structural unit may be used, or 2 or more types may be used.

When the component (A1) contains the structural unit (a3), the amount of the structural unit (a3) within the component (A1) based on the combined total of all structural units constituting the component (A1) is preferably 1 to 40 mol %, more preferably 2 to 30 mol %, still more preferably 5 to 25 mol %, and still more preferably 5 to 20 mol %.

When the amount of the structural unit (a3) is at least as large as the lower limit of the above preferable range, the effect of using the structural unit (a3) may be satisfactorily achieved. On the other hand, when the amount of the structural unit (a3) is no more than the upper limit of the above preferable range, a good balance may be achieved with the other structural units, and various lithography properties may be improved.

<<Other Structural Units>>

The component (A1) may be further include a structural unit other than the structural units (a10), (a1), (a2) and (a3).

Examples of other structural units include a structural unit (a9) represented by general formula (a9-1) described later, a structural unit derived from styrene (provided that the structural units that fall under the definition of structural unit (a10) are excluded).

(Structural Unit (a9)):

The structural unit (a9) is represented by general formula (a9-1) shown below.

[Chemical Formula 45.]

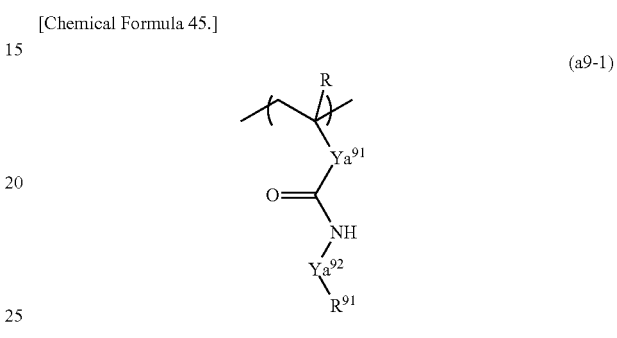

(a9-1)

In the formula, R represents a hydrogen atom, an alkyl group of 1 to 5 carbon atoms or a halogenated alkyl group of 1 to 5 carbon atoms; $Ya^{91}$ represents a single bond or a divalent linking group; $Ya^{92}$ represents a divalent linking group; and $R^{91}$ represents a hydrocarbon group which may have a substituent.

In the general formula (a9-1), R is the same as defined above.

As R, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

In general formula (a9-1), the divalent linking group for $Ya^{91}$ is the same as defined for the divalent linking group for $Ya^{x1}$ in the aforementioned general formula (a10-1). Among these, $Ya^{91}$ is preferably a single bond.

In general formula (a9-1), the divalent linking group for $Ya^{92}$ is the same as defined for the divalent linking group for $Ya^{x1}$ in the aforementioned general formula (a10-1).

With respect to the divalent linking group for $Ya^{92}$, as the divalent hydrocarbon group which may have a substituent, a linear or branched aliphatic hydrocarbon group is preferable.

In the case where $Ya^{92}$ represents a divalent linking group containing a hetero atom, examples of the linking group include —O—, —C(=O)—O—, —C(=O)—, —O—C(=O)—O—, —C(=O)—NH—, —NH—, —NH—C(=NH)— (wherein H may be substituted with a substituent such as an alkyl group or an acyl group), —S—, —S(=O)$_2$—, —S(=O)$_2$—O—, C(=S), a group represented by general formula —$Y^{21}$—O—$Y^{22}$—, —$Y^{21}$—O—, —$Y^{21}$—C(=O)—O—, —C(=O)—O—$Y^{21}$, —[$Y^{21}$—C(=O)—O]$_{m'}$-$Y^{22}$— or —$Y^{21}$—O—C(=O)—$Y^{22}$— [in the formulae, $Y^{21}$ and $Y^{22}$ each independently represents a divalent hydrocarbon group which may have a substituent, and O represents an oxygen atom; and m' represents an integer of 0 to 3. Among these examples, —C(=O)— and —C(=S)— are preferable.

In general formula (a9-1), examples of the hydrocarbon group for $R^{91}$ include an alkyl group, a monovalent alicyclic hydrocarbon group, an aryl group and an aralkyl group.

The alkyl group for $R^{91}$ preferably has 1 to 8 carbon atoms, more preferably 1 to 6 carbon atoms, and still more preferably 1 to 4 carbon atoms. The alkyl group may be linear or branched. Specific examples of preferable alkyl groups include a methyl group, an ethyl group, a propyl group, a butyl group, a hexyl group and an octyl group.

The monovalent alicyclic hydrocarbon group for $R^{91}$ preferably has 3 to 20 carbon atoms, and more preferably 3 to 12 carbon atoms. The monovalent alicyclic hydrocarbon group may be polycyclic or monocyclic. As the monocyclic alicyclic hydrocarbon group, a group in which one or more hydrogen atoms have been removed from a monocycloalkane is preferable. The monocycloalkane preferably has 3 to 6 carbon atoms, and specific examples thereof include cyclobutane, cyclopentane and cyclohexane. As the polycyclic alicyclic hydrocarbon group, a group in which one or more hydrogen atoms have been removed from a polycycloalkane is preferable, and the polycyclic group preferably has 7 to 12 carbon atoms. Examples of the polycycloalkane include adamantane, norbornane, isobornane, tricyclodecane and tetracyclododecane.

The aryl group for $R^{91}$ preferably has 6 to 18 carbon atoms, and more preferably 6 to 10 carbon atoms. Specifically, a phenyl group is particularly desirable.

As the aralkyl group for $R^{91}$, an aralkyl group in which an alkylene group having 1 to 8 carbon atoms has been bonded to the aforementioned "aryl group for $R^{91}$" is preferable, an aralkyl group in which an alkylene group of 1 to 6 carbon atoms has been bonded to the aforementioned "aryl group for $R^{91}$" is more preferable, and an aralkyl group in which an alkylene group having 1 to 4 carbon atoms has been bonded to the aforementioned "aryl group for $R^{91}$" is most preferable.

The hydrocarbon group for $R^{91}$ preferably has part or all of the hydrogen atoms within the hydrocarbon group substituted with fluorine, and the hydrocarbon group more preferably has 30 to 100% of the hydrogen atoms substituted with fluorine. Among these, a perfluoroalkyl group in which all of the hydrogen atoms within the alkyl group have been substituted with fluorine atoms is particularly desirable.

The hydrocarbon group for $R^{91}$ may have a substituent. Examples of the substituent include a halogen atom, an oxo group (=O), a hydroxy group (—OH), an amino group (—NH$_2$) and —SO$_2$—NH$_2$. Further, part of the carbon atoms constituting the hydrocarbon group may be substituted with a substituent containing a hetero atom. Examples of the substituent containing a hetero atom include —O—, —NH—, —N=, —C(=O)—O—, —S—, —S(=O)$_2$— and —S(=O)$_2$—O—.

As the hydrocarbon group for $R^{91}$, examples of the hydrocarbon group having a substituent include lactone-containing cyclic groups represented by the aforementioned general formulae (a2-r-1) to (a2-r-7).

Further, as $R^{91}$, examples of the hydrocarbon group having a substituent include —SO$_2$— containing cyclic groups represented by general formulae (a5-r-1) to (a5-r-4); and substituted aryl groups and monocyclic heterocyclic groups represented by chemical formulae shown below.

[Chemical Formula 46.]

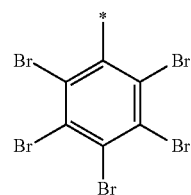

(r-ar-1)

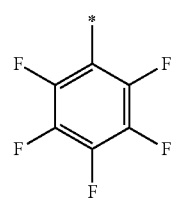

(r-ar-2)

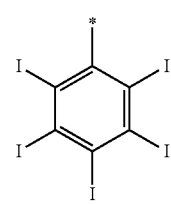

(r-ar-3)

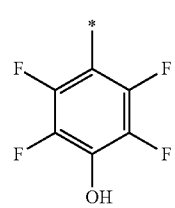

(r-ar-4)

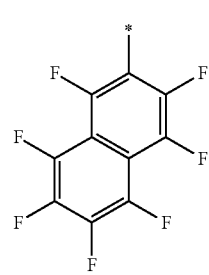

(r-ar-5)

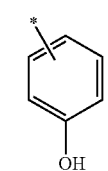

(r-ar-6)

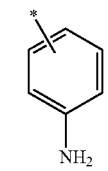

(r-ar-7)

(r-ar-8) 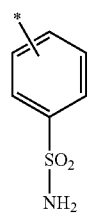

(r-hr-1) 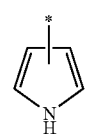

(r-hr-2) 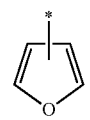

(r-hr-3) 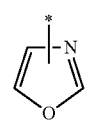

(r-hr-4) 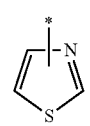

(r-hr-5) 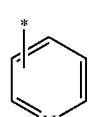

(r-hr-6) 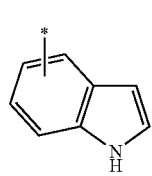

(r-hr-7) 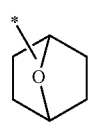

(r-hr-8) 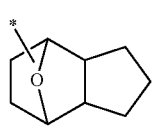

(r-hr-9) 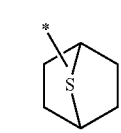

(r-hr-10) 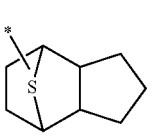

(r-hr-11) 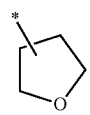

(r-hr-12) 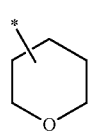

(r-hr-13) 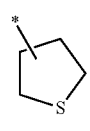

(r-hr-14) 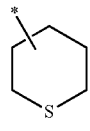

(r-hr-15) 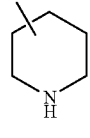

(r-hr-16) 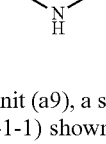

As the structural unit (a9), a structural unit represented by general formula (a9-1-1) shown below is preferable.

[Chemical Formul 47.]

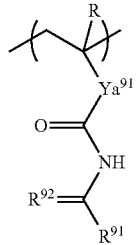

(a9-1-1)

In the formula, R is the same as defined above; $Ya^{91}$ represents a single bond or a divalent linking group; $R^{91}$ represents a hydrocarbon group optionally having a substituent; and $Ya^{92}$ represents an oxygen atom or a sulfur atom.

In general formula (a9-1-1), $Ya^{91}$, $R^{91}$ and R are the same as defined above.

$R^{92}$ represents an oxygen atom or a sulfur atom.

Specific examples of structural units represented by general formula (a9-1) or (a9-1-1) are shown below. In the following formulae, $R^{a}$ represents a hydrogen atom, a methyl group or a trifluoromethyl group.

[Chemical Formul 48.]
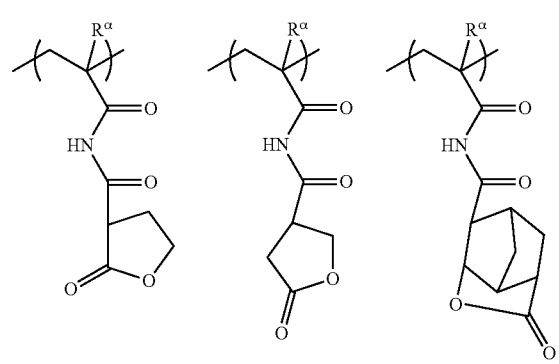
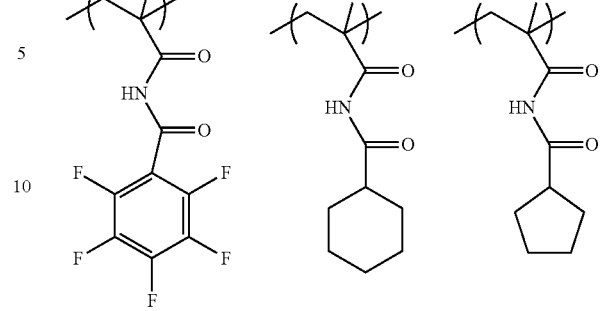
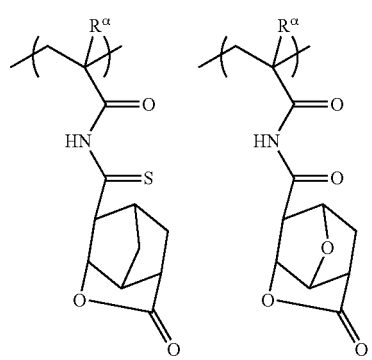
[Chemical Formula 49.]
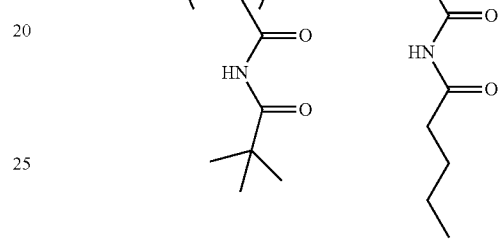
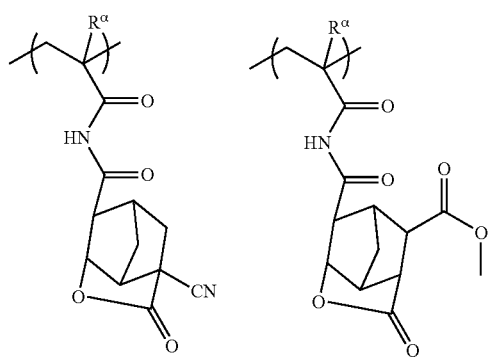
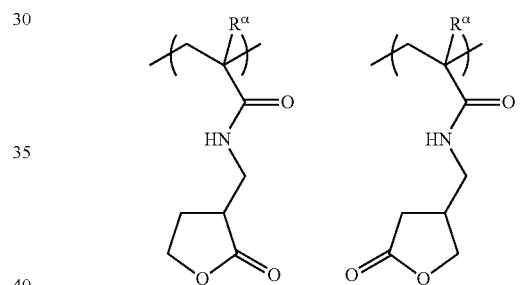
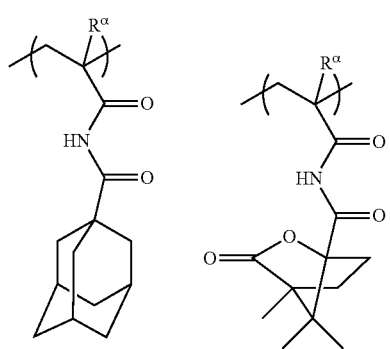
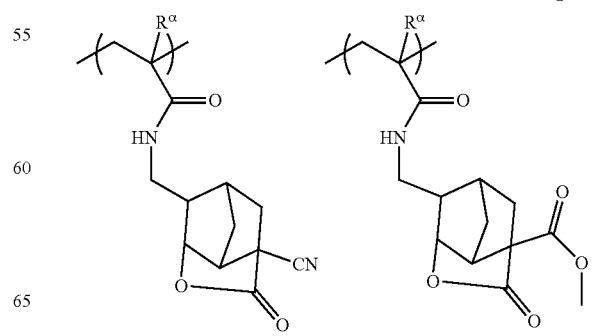

-continued

[Chemical Formula 50.]

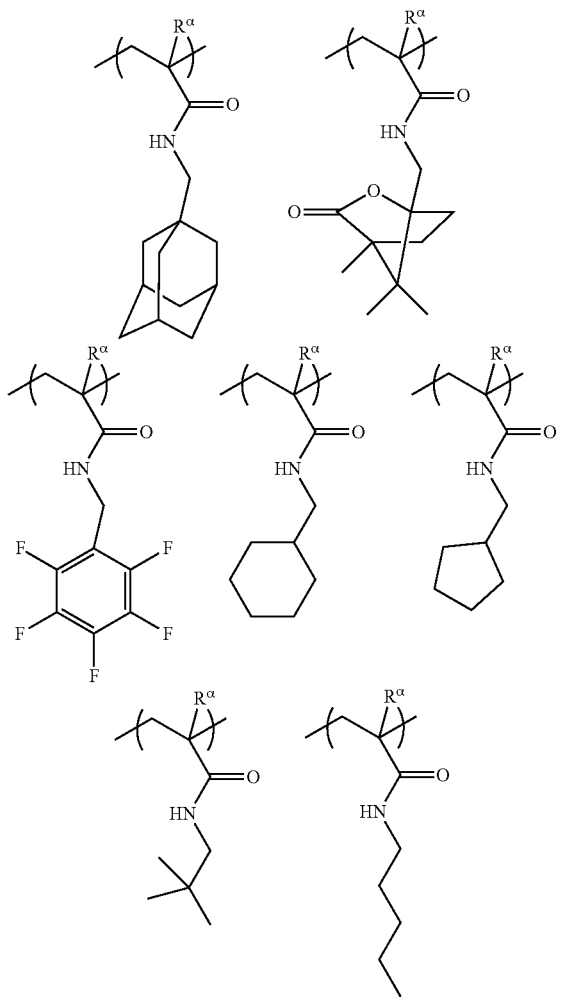

As the structural unit (a9) contained in the component (A1), 1 kind of structural unit may be used, or 2 or more kinds may be used.

When the component (A1) contains the structural unit (a9), the amount of the structural unit (a9) based on the combined total (100 mol %) of all structural units constituting the component (A1) is preferably 1 to 40 mol %, more preferably 3 to 30 mol %, still more preferably 5 to 25 mol %, and most preferably 10 to 20 mol %.

When the amount of the structural unit (a9) is at least as large as the lower limit of the above preferable range, various advantages may be obtained, such as appropriate adjustment of acid diffusion length, enhancement of adhesion of a resist film to a substrate, and appropriate adjustment of solubility of the resist during developing, which may lead to improvement in lithography properties. On the other hand, when the amount of the structural unit (a9) is no more than the upper limit of the above preferable range, a good balance may be achieved with the other structural units, and various lithography properties may be improved.

In the resist composition, as the component (A1), one kind of compound may be used, or two or more kinds of compounds may be used in combination.

The component (A1) preferably includes a polymeric compound (A1-1) having a structural unit (a1) (hereafter, sometimes referred to as "component (A1-1)").

Preferable examples of the component (A1-1) include a polymeric compound having a repeating structure of the structural units (a1) and (a2); and a polymeric compound having a repeating structure of the structural units (a1) and (a10).

In addition to the combination of the two structural units described above, the structural unit described above may be combined appropriately in order to obtain desired effects as a third structural unit, or alternatively, three or more of such structural units may be combined. The third structural unit is preferably at least one of the structural unit (a3) and the structural unit (a9).

The component (A1) can be produced, for example, by dissolving the monomers corresponding with each of the structural units in a polymerization solvent, followed by addition of a radical polymerization initiator such as azobisisobutyronitrile (AIBN) or dimethyl-2,2'-azobisisoutyrate (e.g., V-601). Alternatively, the component (A1) can be prepared by dissolving a monomer from which the structural unit (a1) is derived, and a precursor monomer (monomer for which the functional group is protected) from which the structural unit other than the structural unit (a1) is derived in a polymerization solvent, polymerizing the dissolved monomers using the radical polymerization initiator described above, followed by performing a deprotection reaction. In the polymerization, a chain transfer agent such as $HS-CH_2-CH_2-CH_2-C(CF_3)_2-OH$ may be used to introduce a $-C(CF_3)_2-OH$ group at the terminal(s) of the polymer. Such a copolymer having introduced a hydroxyalkyl group in which some of the hydrogen atoms of the alkyl group are substituted with fluorine atoms is effective in reducing developing defects and LER (line edge roughness: unevenness of the side walls of a line pattern).

The weight average molecular weight (Mw) (the polystyrene equivalent value determined by gel permeation chromatography (GPC)) of the component (A1) is not particularly limited, but is preferably 1,000 to 50,000, more preferably 2,000 to 30,000, and still more preferably 3,000 to 20,000.

When the Mw of the component (A1) is no more than the upper limit of the above-mentioned preferable range, the resist composition exhibits a satisfactory solubility in a resist solvent. On the other hand, when the Mw of the component (A1) is at least as large as the lower limit of the above-mentioned preferable range, dry etching resistance and the cross-sectional shape of the resist pattern becomes satisfactory.

The dispersity (Mw/Mn) of the component (A1) is not particularly limited, but is preferably 1.0 to 4.0, more preferably 1.0 to 3.0, and most preferably 1.1 to 2.0. Here, Mn is the number average molecular weight.

Component (A2)

In the resist composition of the present embodiment, as the component (A), "a base component which exhibits changed solubility in a developing solution under action of acid" other than the component (A1) (hereafter, referred to as "component (A2)") may be used in combination.

As the component (A2), there is no particular limitation, and any of the multitude of conventional base resins used within chemically amplified resist compositions may be arbitrarily selected for use.

As the component (A2), one kind of a polymer or a low molecular weight compound may be used, or a combination of two or more kinds may be used.

In the component (A), the amount of the component (A1) based on the total weight of the component (A) is preferably 25% by weight or more, more preferably 50% by weight or more, still more preferably 75% by weight or more, and may be even 100% by weight. When the amount of the component (A1) is 25% by weight or more, a resist pattern with improved lithography properties such as improvement in roughness may be reliably formed. Such effects are significant in lithography using electron beam or EUV.

In the resist composition of the present embodiment, the amount of the component (A) may be appropriately adjusted depending on the thickness of the resist film to be formed, and the like.

<Component (BD1)>

As described above, in the resist composition of the present embodiment, at least one of the component (B) and the component (D) includes a compound (BD1) represented by general formula (bd1). In the resist composition of the present embodiment, the component (BD1) may be used as the component (B) or as the component (D) by selecting an anionic group in the molecule.

[Chemical Formula 51.]

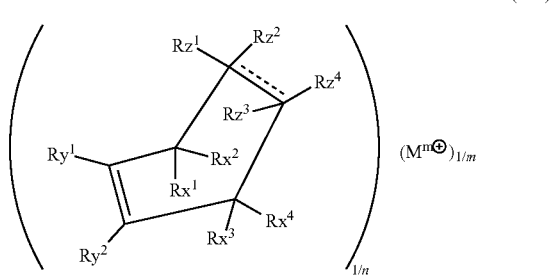

(bd1)

In the formula, $Rx^1$ to $Rx^4$ each independently represents a hydrogen atom or a hydrocarbon group which may have a substituent, or two or more of $Rx^1$ to $Rx^4$ may be mutually bonded to form a ring structure; $Ry^1$ and $Ry^2$ each independently represents a hydrogen atom or a hydrocarbon group which may have a substituent, or $Ry^1$ and $Ry^2$ may be mutually bonded to form a ring structure;

[Chemical Formula 52.]

----- represents a double bond or a single bond; $Rz^1$ to $Rz^4$ each independently represents, where valence allows, a hydrogen atom or a hydrocarbon group which may have a substituent, or two or more of $Rz^1$ to $Rz^4$ may be mutually bonded to form a ring structure; provided that at least one of $Rx^1$ to $Rx^4$, $Ry^1$, $Ry^2$ and $Rz^1$ to $Rz^4$ has an anionic group, and the whole anion moiety is an n-valent anion; n represents an integer of 1 or more; m represents an integer of 1 or more; and $M^m$ represents an m-valent organic cation having an electron-withdrawing group.

Anion Moiety

In formula (bd1), $Rx^1$ to $Rx^4$ each independently represents a hydrocarbon group which may have a substituent or a hydrogen atom, or alternatively, two or more of $Rx^1$ to $Rx^4$ may be bonded to each other to form a ring structure.

$Ry^1$ and $Ry^2$ each independently represents a hydrocarbon group which may have a substituent or a hydrogen atom, or alternatively, $Ry^1$ and $Ry^2$ may be bonded to each other to form a ring structure.

$Rz^1$ to $Rz^4$ each independently represents, where valence allows, a hydrogen atom or a hydrocarbon group which may have a substituent, or two or more of $Rz^1$ to $Rz^4$ may be mutually bonded to form a ring structure.

The hydrocarbon group as $Rx^1$ to $Rx^4$, $Ry^1$, $Ry^2$ and $Rz^1$ to $Rz^4$ may be an aliphatic hydrocarbon group or an aromatic hydrocarbon group, or may be a cyclic hydrocarbon group or a chain-like hydrocarbon group.

For example, examples of the hydrocarbon group, which may have a substituent as $Rx^1$ to $Rx^4$, $Ry^1$, $Ry^2$ and $Rz^1$ to $Rz^4$, include a cyclic group which may have a substituent, a chain-like alkyl group which may have a substituent, or a chain-like alkenyl group which may have a substituent.

Cyclic group which may have a substituent:

The cyclic group is preferably a cyclic hydrocarbon group, and the cyclic hydrocarbon group may be either an aromatic hydrocarbon group or an aliphatic hydrocarbon group. An "aliphatic hydrocarbon group" refers to a hydrocarbon group that has no aromaticity. The aliphatic hydrocarbon group may be either saturated or unsaturated, but in general, the aliphatic hydrocarbon group is preferably saturated. The cyclic hydrocarbon group as $Rx^1$ to $Rx^4$, $Ry^1$, $Ry^2$ and $Rz^1$ to $Rz^4$ may contain a hetero atom as in a case of a heterocyclic ring and the like.

The aromatic hydrocarbon group as $Rx^1$ to $Rx^4$, $Ry^1$, $Ry^2$ and $Rz^1$ to $Rz^4$ is a hydrocarbon group having an aromatic ring. The aromatic hydrocarbon group preferably has 3 to 30 carbon atoms, more preferably 5 to 30 carbon atoms, still more preferably 5 to 20 carbon atoms, still more preferably 6 to 15 carbon atoms, and most preferably 6 to 12 carbon atoms. Here, the number of carbon atoms within a substituent(s) is not included in the number of carbon atoms of the aromatic hydrocarbon group.

Specific examples of the aromatic ring contained in the aromatic hydrocarbon group as $Rx^1$ to $Rx^4$, $Ry^1$, $Ry^2$ and $Rz^1$ to $Rz^4$ include benzene, fluorene, naphthalene, anthracene, phenanthrene, biphenyl, or an aromatic heterocyclic ring in which some carbon atoms constituting any of these aromatic rings have been substituted with hetero atoms. Examples of the hetero atom within the aromatic hetero rings include an oxygen atom, a sulfur atom and a nitrogen atom. Specific examples of the aromatic ring contained in the aromatic hydrocarbon group as $Rx^1$ to $Rx^4$, $Ry^1$, $Ry^2$ and $Rz^1$ to $Rz^4$ include benzene, fluorene, naphthalene, anthracene, phenanthrene, biphenyl, an aromatic heterocyclic ring in which a part of carbon atoms constituting the aromatic ring is substituted with hetero atoms, and the like, from the viewpoint of compatibility with the component (A).

Specific examples of the aromatic hydrocarbon group as $Rx^1$ to $Rx^4$, $Ry^1$, $Ry^2$ and $Rz^1$ to $Rz^4$ include a group in which one hydrogen atom has been removed from the above-described aromatic ring (an aryl group such as a phenyl group, a naphthyl group or the like), and a group in which one hydrogen atom in the aromatic ring has been substituted with an alkylene group (an arylalkyl group such as a benzyl group, a phenethyl group, a 1-naphthylmethyl group, a 2-naphthylmethyl group, 1-naphthylethyl group, a 2-naphthylethyl group or the like). The alkylene group (alkyl chain within the arylalkyl group) preferably has 1 to 4 carbon atom, more preferably 1 or 2, and most preferably 1.

Examples of the cyclic aliphatic hydrocarbon group as $Rx^1$ to $Rx^4$, $Ry^1$, $Ry^2$ and $Rz^1$ to $Rz^4$ include aliphatic hydrocarbon groups containing a ring in the structure thereof.

As examples of the hydrocarbon group containing a ring in the structure thereof, an alicyclic hydrocarbon group (a group in which one hydrogen atom has been removed from an aliphatic hydrocarbon ring), a group in which the alicyclic hydrocarbon group is bonded to the terminal of the aforementioned chain-like aliphatic hydrocarbon group, and a group in which the alicyclic group is interposed within the aforementioned linear or branched aliphatic hydrocarbon group, can be given.

The alicyclic hydrocarbon group preferably has 3 to 20 carbon atoms, and more preferably 3 to 12 carbon atoms.

The alicyclic hydrocarbon group may be either a polycyclic group or a monocyclic group. As the monocyclic alicyclic hydrocarbon group, a group in which one or more hydrogen atoms have been removed from a monocycloalkane is preferable. The monocycloalkane preferably has 3 to 6 carbon atoms, and specific examples thereof include cyclopentane and cyclohexane. As the polycyclic alicyclic hydrocarbon group, a group in which one or more hydrogen atoms have been removed from a polycycloalkane is preferable, and the polycyclic group preferably has 7 to 30 carbon atoms. Among polycycloalkanes, a polycycloalkane having a bridged ring polycyclic skeleton, such as adamantane, norbornane, isobornane, tricyclodecane or tetracyclodpdecane, and a polycycloalkane having a condensed ring polycyclic skeleton, such as a cyclic group having a steroid skeleton are preferable.

Among these examples, as the cyclic aliphatic hydrocarbon group as $Rx^1$ to $Rx^4$, $Ry^1$, $Ry^2$ and $Rz^1$ to $Rz^4$, a group in which one or more hydrogen atoms have been removed from a monocycloalkane or a polycycloalkane is preferable, a group in which one hydrogen atom has been removed from a monocycloalkane is more preferable, and a group in which one hydrogen atom has been removed from cyclopentane or cyclohexane is particularly preferable.

The linear aliphatic hydrocarbon group which may be bonded to the alicyclic hydrocarbon group preferably has 1 to 10 carbon atoms, more preferably 1 to 6 carbon atoms, still more preferably 1 to 4 carbon atoms, and most preferably 1 to 3 carbon atoms. As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

The branched aliphatic hydrocarbon group which may be bonded to the alicyclic hydrocarbon group preferably has 2 to 10 carbon atoms, more preferably 3 to 6 carbon atoms, still more preferably 3 or 4 carbon atoms, and most preferably 3 carbon atoms. As the branched aliphatic hydrocarbon group, branched alkylene groups are preferred, and specific examples include various alkylalkylene groups, including alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group within the alkylalkylene group, a linear alkyl group of 1 to 5 carbon atoms is preferable.

Further, examples of the cyclic group as $Rx^1$ to $Rx^4$, $Ry^1$, $Ry^2$ and $Rz^1$ to $Rz^4$ also include —$COOR^{XYZ}$ and —$OC(=O)R^{XYZ}$, in which $R^{XYZ}$ is a lactone-containing cyclic group, a carbonate-containing cyclic group or —$SO_2$-containing cyclic group.

Examples of the substituent for the cyclic group as $Rx^1$ to $Rx^4$, $Ry^1$, $Ry^2$ and $Rz^1$ to $Rz^4$ include an alkyl group, an alkoxy group, a halogen atom, a halogenated alkyl group, a hydroxyl group, a nitro group, a carbonyl group and the like.

The alkyl group as the substituent is preferably an alkyl group of 1 to 5 carbon atoms, and a methyl group, an ethyl group, a propyl group, an n-butyl group or a tert-butyl group is particularly desirable.

The alkoxy group as the substituent is preferably an alkoxy group having 1 to 5 carbon atoms, more preferably a methoxy group, ethoxy group, n-propoxy group, isopropoxy group, n-butoxy group or tert-butoxy group, and most preferably a methoxy group or an ethoxy group.

Examples of the halogen atom for the substituent include a fluorine atom, a chlorine atom, a bromine atom and an iodine atom, and a fluorine atom is preferable.

Example of the aforementioned halogenated alkyl group includes a group in which a part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

The carbonyl group as the substituent is a group that substitutes a methylene group (—$CH_2$—) constituting the cyclic hydrocarbon group.

Among these, as the substituent in the cyclic group as $Rx^1$ to $Rx^4$, $Ry^1$, $Ry^2$ and $Rz^1$ to $Rz^4$, an alkyl group, a halogen atom, a halogenated alkyl group and the like are preferable from the viewpoint of compatibility with the component (A). An Alkyl group is more preferable.

Chain alkyl group which may have a substituent:

The chain alkyl group as $Rx^1$ to $Rx^4$, $Ry^1$, $Ry^2$ and $Rz^1$ to $Rz^4$ may be linear or branched.

The linear alkyl group preferably has 1 to 20 carbon atoms, more preferably 1 to 15 carbon atoms, and still more preferably 1 to 10 carbon atoms. Specific examples include a methyl group, an ethyl group, a propyl group, a butyl group, a pentyl group, a hexyl group, a heptyl group, an octyl group, a nonyl group, a decyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched alkyl group preferably has 3 to 20 carbon atoms, more preferably 3 to 15 carbon atoms, and still more preferably 3 to 10 carbon atoms. Specific examples thereof include a 1-methylethyl group, a 1,1-dimethylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, and a 4-methylpentyl group.

Chain alkenyl group which may have a substituent:

Such a chain alkenyl group as $Rx^1$ to $Rx^4$, $Ry^1$, $Ry^2$ and $Rz^1$ to $Rz^4$ may be linear or branched, and the number of carbon atoms thereof is preferably in a range of 2 to 10, more preferably in a range of 2 to 5, still more preferably in a range of 2 to 4, and particularly preferably 3. Examples of linear alkenyl groups include a vinyl group, a propenyl group (an allyl group) and a butynyl group. Examples of branched alkenyl groups include a 1-methylvinyl group, a 2-methylvinyl group, a 1-methylpropenyl group and a 2-methylpropenyl group.

Among these examples, as the chain-like alkenyl group, a linear alkenyl group is preferable, a vinyl group or a propenyl group is more preferable, and a vinyl group is most preferable.

As the substituent for the chain-like alkyl group or alkenyl group as $Rx^1$ to $Rx^4$, $Ry^1$, $Ry^2$ and $Rz^1$ to $Rz^4$, an alkoxy group, a halogen atom (a fluorine atom, a chlorine atom, a bromine atom, an iodine atom etc.), a halogenated alkyl group, a hydroxyl group, a carbonyl group, a nitro group, an amino group, a cyclic group as $Rx^1$ to $Rx^4$, $Ry^1$, $Ry^2$ and $Rz^1$ to $Rz^4$ or the like may be used. Among these, as the substituent in the chain alkyl group or alkenyl group as $Rx^1$ to $Rx^4$, $Ry^1$, $Ry^2$ and $Rz^1$ to $Rz^4$, a halogen atom, a halogenated alkyl group, groups exemplified as the cyclic group as $Rx^1$ to $Rx^4$, $Ry^1$, $Ry^2$ and $Rz^1$ to $Rz^4$, and the like are preferable, and the groups exemplified as the cyclic group as $Rx^1$ to $Rx^4$, $Ry^1$, $Ry^2$ and $Rz^1$ to $Rz^4$ are more preferable from the viewpoint of compatibility with the component (A).

Among those hydrocarbon groups, as the group as $Rx^1$ to $Rx^4$, $Ry^1$, $Ry^2$ and $Rz^1$ to $Rz^4$, an aromatic hydrocarbon group which may have a substituent, a cyclic group which may have a substituent and a chain alkyl group which may have a substituent are preferable.

In formula (bd1), $Ry^1$ and $Ry^2$ may be bonded to each other to form a ring structure.

The ring structure formed by $Ry^1$ and $Ry^2$ shares one side of the six-membered ring in Formula (bd1) (bond between carbon atoms to which $Ry^1$ and $Ry^2$ are respectively bonded). This ring structure may be an alicyclic hydrocarbon or an aromatic hydrocarbon. Additionally, the ring structure may be a polycyclic structure composed of other ring structures.

The alicyclic hydrocarbon formed by $Ry^1$ and $Ry^2$ may be polycyclic or monocyclic. As a monocyclic alicyclic hydrocarbon, a monocycloalkane is preferable. The monocycloalkane preferably has 3 to 6 carbon atoms, and specific examples thereof include cyclopentane and cyclohexane. As a polycyclic alicyclic hydrocarbon, a polycycloalkane is preferable.

The polycycloalkane preferably has 7 to 30 carbon atoms. Specific examples of the polycycloalkane include a polycycloalkane having a polycyclic skeleton with a bridged ring, such as adamantane, norbornane, isobornane, tricyclodecane or tetracyclododecane; and a polycycloalkane having a polycyclic skeleton with a condensed ring, such as a cyclic ring having a steroid skeleton.

Examples of the aromatic hydrocarbon ring formed by $Ry^1$ and $Ry^2$ include benzene, fluorene, naphthalene, anthracene, phenanthrene, biphenyl, an aromatic heterocyclic ring in which some carbon atoms constituting any of these aromatic rings have been substituted with hetero atoms, and the like. The aromatic hydrocarbon ring formed by $Ry^1$ and $Ry^2$ preferably contains no hetero atom from the viewpoint of compatibility with the component (A), and an aromatic ring such as benzene, fluorene, naphthalene, anthracene, phenanthrene, biphenyl or the like is more preferable.

The ring structure (alicyclic hydrocarbon, aromatic hydrocarbon) formed by $Ry^1$ and $Ry^2$ may have a substituent. Examples of the substituent include the same substituents as those for the cyclic group as $Rx^1$ to $Rx^4$, $Ry^1$, $Ry^2$ and $Rz^1$ to $Rz^4$ (for example, an alkyl group, an alkoxy group, a halogen atom, a halogenated alkyl group, a hydroxyl group, a nitro group, a carbonyl group, and the like). Among these, the substituent in the ring structure formed by $Ry^1$ and $Ry^2$ is preferably an alkyl group, a halogen atom, a halogenated alkyl group or the like, and an alkyl group is more preferable, from the viewpoint of compatibility with the component (A).

Among the ring structures formed by $Ry^1$ and $Ry^2$, an aromatic hydrocarbon which may have a substituent is more preferable in terms of short diffusion and diffusion controllability of an acid generated upon exposure.

In formula (bd1), $Rz^1$ to $Rz^4$ may be bonded to each other to form a ring structure. For example, $Rz^1$ may form a ring structure with any of $Rz^2$ to $Rz^4$. Specific examples of the ring structure include a ring structure sharing one side of a six-membered ring in formula (bd1) (bond between a carbon atom to which $Rz^1$ and $Rz^2$ are bonded and a carbon atom to which $Rz^3$ and $Rz^4$ are bonded), a ring structure formed by bonding $Rz^1$ and $Rz^2$, a ring structure formed by bonding $Rz^3$ and $Rz^4$, and the like.

The ring structure formed by two or more of $Rz^1$ to $Rz^4$ may be an alicyclic hydrocarbon or an aromatic hydrocarbon, and is particularly preferably an aromatic hydrocarbon.

Additionally, the ring structure may be a polycyclic structure composed of other ring structures.

The alicyclic hydrocarbon formed by two or more of $Rz^1$ to $Rz^4$ may be polycyclic or monocyclic. As a monocyclic alicyclic hydrocarbon, a monocycloalkane is preferable. The monocycloalkane preferably has 3 to 6 carbon atoms, and specific examples thereof include cyclopentane and cyclohexane. As a polycyclic alicyclic hydrocarbon, a polycycloalkane is preferable. The polycycloalkane preferably has 7 to 30 carbon atoms. Specific examples of the polycycloalkane include a polycycloalkane having a polycyclic skeleton with a bridged ring, such as adamantane, norbornane, isobornane, tricyclodecane or tetracyclododecane; and a polycycloalkane having a polycyclic skeleton with a condensed ring, such as a cyclic ring having a steroid skeleton.

It may be a heterocyclic structure in which a part of carbon atoms is substituted with hetero atoms. A nitrogen-containing heterocyclic ring is particularly preferable, and specific examples thereof include cyclic imide and the like.

Examples of the aromatic hydrocarbon ring formed by two or more of $Rz^1$ to $Rz^4$ include benzene, fluorene, naphthalene, anthracene, phenanthrene, biphenyl, an aromatic heterocyclic ring in which some carbon atoms constituting any of these aromatic rings have been substituted with hetero atoms, and the like. The aromatic hydrocarbon ring formed by two or more of $Rz^1$ to $Rz^4$ preferably contains no hetero atom from the viewpoint of compatibility with the component (A), and an aromatic ring such as benzene, fluorene, naphthalene, anthracene, phenanthrene, biphenyl or the like is more preferable.

The ring structure (alicyclic hydrocarbon, aromatic hydrocarbon) formed by $Rz^1$ to $Rz^4$ may have a substituent. Examples of the substituent include the same substituents as those for the cyclic group as $Rx^1$ to $Rx^4$, $Ry^1$, $Ry^2$ and $Rz^1$ to $Rz^4$ (for example, an alkyl group, an alkoxy group, a halogen atom, a halogenated alkyl group, a hydroxyl group, a nitro group, a carbonyl group, and the like). Among these examples, the substituent in the ring structure formed by $Rz^1$ to $Rz^4$ is preferably an alkyl group, a halogen atom, a halogenated alkyl group or the like, and an alkyl group is more preferable, from the viewpoint of compatibility with the component (A).

Among the ring structures formed by two or more of $Rz^1$ to $Rz^4$, a ring structure sharing one side of a six-membered ring in formula (bd1) (bond between a carbon atom to which $Rz^1$ and $Rz^2$ are bonded and a carbon atom to which $Rz^3$ and $Rz^4$ are bonded) is preferable, and an aromatic ring structure is more preferable in terms of diffusion controllability of an acid generated upon exposure.

In formula (bd1), the phase "where valence allows" is defined as follows.

That is, in a case where a bond between a carbon atom to which $Rz^1$ and $Rz^2$ are bonded and a carbon atom to which $Rz^3$ and $Rz^4$ are bonded is a single bond, all of $Rz^1$, $Rz^2$, $Rz^3$ and $Rz^4$ are presents. In a case where a bond between a carbon atom to which $Rz^1$ and $Rz^2$ are bonded and a carbon atom to which $Rz^3$ and $Rz^4$ are bonded is a double bond, only one of $Rz^1$ and $Rz^2$, and only one of $Rz^3$ and $Rz^4$ are present. For example, in a case where $Rz^1$ and $Rz^3$ are bonded to form an aromatic ring structure, $Rz^2$ and $Rz^4$ are not present.

In formula (bd1), two or more of $Rx^1$ to $Rx^4$ may be bonded to each other to form a ring structure. For example, $Rx^1$ may form a ring structure with any of $Rx^2$ to $Rx^4$.

A ring structure formed by two or more of $Rx^1$ to $Rx^4$ may be an alicyclic hydrocarbon or an aromatic hydrocarbon. Additionally, the ring structure may be a polycyclic structure composed of other ring structures.

The alicyclic hydrocarbon formed by two or more of $Rx^1$ to $Rx^4$ may be polycyclic or monocyclic. As a monocyclic alicyclic hydrocarbon, a monocycloalkane is preferable. The monocycloalkane preferably has 3 to 6 carbon atoms, and specific examples thereof include cyclopentane and cyclohexane. As a polycyclic alicyclic hydrocarbon, a polycycloalkane is preferable. The polycycloalkane preferably has 7 to 30 carbon atoms. Specific examples of the polycycloalkane include a polycycloalkane having a polycyclic skeleton with a bridged ring, such as adamantane, norbomane, isobomane, tricyclodecane or tetracyclododecane; and a polycycloalkane having a polycyclic skeleton with a condensed ring, such as a cyclic ring having a steroid skeleton.

Examples of the aromatic hydrocarbon ring formed by two or more of $Rx^1$ to $Rx^4$ include benzene, fluorene, naphthalene, anthracene, phenanthrene, biphenyl, an aromatic heterocyclic ring in which some carbon atoms constituting any of these aromatic rings have been substituted with hetero atoms, and the like. The aromatic hydrocarbon ring formed by two or more of $Rx^1$ to $Rx^4$ preferably contains no hetero atom from the viewpoint of compatibility with the component (A), and an aromatic ring such as benzene, fluorene, naphthalene, anthracene, phenanthrene, biphenyl or the like is more preferable.

The ring structure (alicyclic hydrocarbon, aromatic hydrocarbon) formed by $Rx^1$ to $Rx^4$ may have a substituent. Examples of the substituent include the same substituents as those for the cyclic group as $Rx^1$ to $Rx^4$, $Ry^1$, $Ry^2$ and $Rz^1$ to $Rz^4$ (for example, an alkyl group, an alkoxy group, a halogen atom, a halogenated alkyl group, a hydroxyl group, a nitro group, a carbonyl group, and the like). Among these examples, the substituent in the ring structure formed by $Rx^1$ to $Rx^4$ is preferably an alkyl group, a halogen atom, a halogenated alkyl group or the like, and an alkyl group is more preferable, from the viewpoint of compatibility with the component (A).

Among the ring structures formed by two or more of $Rx^1$ to $Rx^4$, an alicylic hydrocarbon is preferable in terms of diffusion controllability of an acid.

Further, in terms of diffusion controllability of an acid, the ring structure formed by two or more of $Rx^1$ to $Rx^4$ is preferably a bridged ring structure in which at least one of $Rx^1$ and $Rx^2$ and at least one of $Rx^3$ and $Rx^4$ are bonded to each other, and more preferably a bridged ring structure which is an alicyclic hydrocarbon group.

In a case where at least one of $Rx^1$ and $Rx^2$ and at least one of $Rx^3$ and $Rx^4$ are bonded to each other to form a ring structure, the number of carbon atoms of a bicyclic structure (ring structure containing carbon atoms to which $Ry^1$, $Ry^2$, $Rz^1$ and $Rz^2$, and $Rz^3$ and $Rz^4$ are respectively bonded) is preferably in a range of 7 to 16.

In formula (bd1), at least one of $Rx^1$ to $Rx^4$, $Ry^1$, $Ry^2$ and $Rz^1$ to $Rz^4$ has an anionic group, and the whole anion moiety is an n-valent anion. n represents an integer of 1 or more;

The component (BD1) acts as the acid generator component (B) which generates an acid acting on the base material component (A) in the resist composition by selecting an anionic group in the molecule, or acts as the base component (D) that traps an acid generated from the component (B) upon exposure (i.e. controlling acid diffusion).

In the component (BD1), each of $Rx^1$ to $Rx^4$, $Ry^1$, $Ry^2$ and $Rz^1$ to $Rz^4$ may be the anionic groups described above. Alternatively, in a case where two or more of $Rx^1$ to $Rx^4$ are bonded to each other to form a ring structure, a carbon atom forming the ring structure or a hydrogen atom bonded to this carbon atom may be substituted by the anionic group in the component (BD1). In a case where two or more of $Ry^1$ and $Ry^2$ are bonded to each other to form a ring structure, a carbon atom forming the ring structure or a hydrogen atom bonded to this carbon atom may be substituted by the anionic group. In a case where two or more of $Rz^1$ to $Rz^4$ are bonded to each other to form a ring structure, a carbon atom forming the ring structure or a hydrogen atom bonded to this carbon atom may be substituted by the anionic group.

Examples of the anionic group contained in any of $Rx^1$ to $Rx^4$, $Ry^1$, $Ry^2$ and $Rz^1$ to $Rz^4$ include a sulfonate anion structure, a carboxylate anion structure, an imide anion structure, a methide anion structure, a carbanion structure, a borate anion structure, a halogen anion structure, a phosphate anion structure, an antimonate anion structure, an arsinate anion structure and the like.

Among these examples, those having a sulfonate anion structure or a carboxylate anion structure are preferable.

Suitable examples of the anionic group having a carboxylate anion structure include $*-V^{10}-COO^-$ ($V^{10}$ is a single bond or an alkylene group having 1 to 20 carbon atoms).

Suitable examples of the anionic group having a sulfonate anion structure include anionic groups represented by $*-V^{11}-SO_3^-$ ($V^{11}$ is a single bond or an alkylene group having 1 to 20 carbon atoms) and an anion represented by general formula (bd1-r-an1) shown below.

In formula (bd1-r-an1), * represents a bond. The symbol * indicates a bond to a carbon atom to which each of $Rx^1$ to $Rx^4$, $Ry^1$, $Ry^2$ and $Rz^1$ to $Rz^4$ is bonded.

[Chemical Formula 53.]

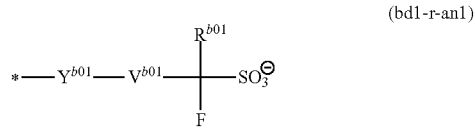

(bd1-r-an1)

In the formula, $R^{b01}$ represents a fluorinated alkyl group of 1 to 5 carbon atoms or a fluorine atom; $V^{b01}$ represents an alkylene group, a fluorinated alkylene group or a single bond; and $Y^{b10}$ represents a divalent linking group or a single bond.

In formula (bd1-r-an1), $R^{b01}$ represents a fluorinated alkyl group of 1 to 5 carbon atoms or a fluorine atom. $R^{b01}$ is preferably a perfluoroalkyl group of 1 to 5 carbon atoms or a fluorine atom, and is more preferably a fluorine atom.

In formula (bd1-r-an1), $V^{b01}$ represents an alkylene group, a fluorinated alkylene group or a single bond.

The alkylene group or the fluorinated alkylene group for $V^{b01}$ preferably has 1 to 4 carbon atoms, and more preferably 1 to 3 carbon atoms. Examples of the fluorinated alkyl group for $V^{b01}$ include a group in which part or all of the hydrogen atoms within an alkylene group have been substituted with fluorine. Among these examples, as $V^{b01}$, an alkylene group having 1 to 4 carbon atoms, a fluorinated alkylene group having 1 to 4 carbon atoms or a single bond is preferable.

In formula (bd1-r-an1), $Y^{b01}$ represents a divalent linking group or a single bond.

As the divalent linking group for $Y^{b01}$, a divalent linking group containing an oxygen atom may be given as a preferable example.

In the case where $Y^{b01}$ is a divalent linking group containing an oxygen atom, $Y^{b01}$ may contain an atom other than an oxygen atom. Examples of atoms other than an oxygen atom include a carbon atom, a hydrogen atom, a sulfur atom and a nitrogen atom.

Examples of divalent linking groups containing an oxygen atom include non-hydrocarbon, oxygen atom-containing linking groups such as an oxygen atom (an ether bond; —O—), an ester bond (—C(=O)—O—), an oxycarbonyl group (—O—C(=O)—), an amido bond (—C(=O)—NH—), a carbonyl group (—C(=O)—) and a carbonate bond (—O—C(=O)—O—); and combinations of the aforementioned non-hydrocarbon, hetero atom-containing linking groups with an alkylene group. Furthermore, the combinations may have a sulfonyl group (—SO$_2$—) bonded thereto.

Examples of the divalent linking group containing an oxygen atom include divalent linking groups represented by general formula (y-a1-1) to (y-a1-8) shown below.

[Chemical Formul 54.]

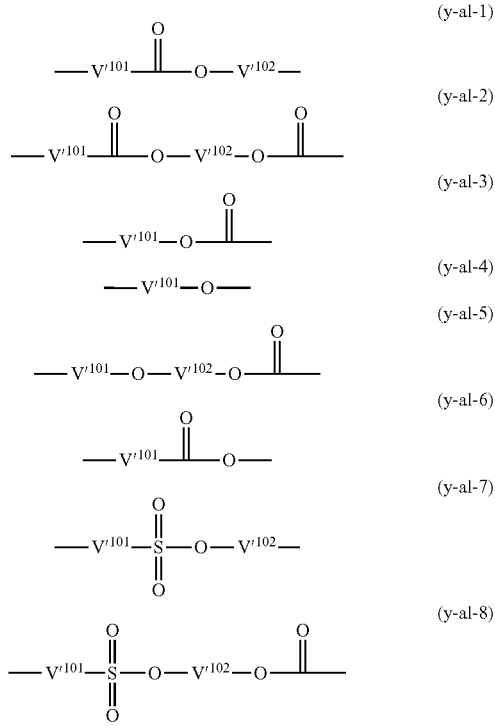

In the formulae, $V'^{101}$ represents a single bond or an alkylene group of 1 to 5 carbon atoms; $V'^{102}$ represents a divalent saturated hydrocarbon group of 1 to 30 carbon atoms.

The divalent saturated hydrocarbon group for $V'^{102}$ is preferably an alkylene group of 1 to 30 carbon atoms, more preferably an alkylene group of 1 to 10 carbon atoms, and still more preferably an alkylene group of 1 to 5 carbon atoms.

The alkylene group for $V'^{101}$ and $V'^{102}$ may be a linear alkylene group or a branched alkylene group, and a linear alkylene group is preferable.

Specific examples of the alkylene group for $V'^{101}$ and $V'^{102}$ include a methylene group [—CH$_2$—]; an alkylmethylene group, such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$CH$_3$)$_2$—; an ethylene group [—CH$_2$CH$_2$—]; an alkylethylene group, such as —CH(CH$_3$)CH$_2$—, —CH(CH$_3$)CH(CH$_3$)—, —C(CH$_3$)$_2$CH$_2$— and —CH(CH$_2$CH$_3$)CH$_2$—; a trimethylene group (n-propylene group) [—CH$_2$CH$_2$CH$_2$—]; an alkyltrimethylene group, such as —CH(CH$_3$)CH$_2$CH$_2$— and —CH$_2$CH(CH$_3$)CH$_2$—; a tetramethylene group [—CH$_2$CH$_2$CH$_2$CH$_2$—]; an alkyltetramethylene group, such as —CH(CH$_3$)CH$_2$CH$_2$CH$_2$—, —CH$_2$CH(CH$_3$)CH$_2$CH$_2$—; and a pentamethylene group [—CH$_2$CH$_2$CH$_2$CH$_2$CH$_2$—].

Further, part of methylene group within the alkylene group for $V'^{101}$ and $V'^{102}$ may be substituted with a divalent aliphatic cyclic group of 5 to 10 carbon atoms. The aliphatic cyclic group is preferably a cyclohexylene group, a 1,5-adamantylene group or a 2,6-adamantylene group.

$Y^{b10}$ is preferably a divalent linking group containing an ether bond or a divalent linking group containing an ester bond, and groups represented by the aforementioned formulas (y-a1-1) to (y-a1-6) are preferable.

Specific examples of the anionic group represented by formula (bd1-r-an1) include:

in a case where $Y^{b01}$ is a single bond, a fluorinated alkyl sulfonate anion such as —CH$_2$CF$_2$SO$_3^-$, —CF$_2$CF$_2$SO$_3^-$, trifluoromethane sulfonate anion, perfluorobutane sulfonate anion or the like.

in the case where $Y^{b10}$ represents a divalent linking group containing an oxygen atom, anions represented by general formulae (bd1-r-an11) to (bd1-r-an13) shown below.

[Chemical Formula 55.]

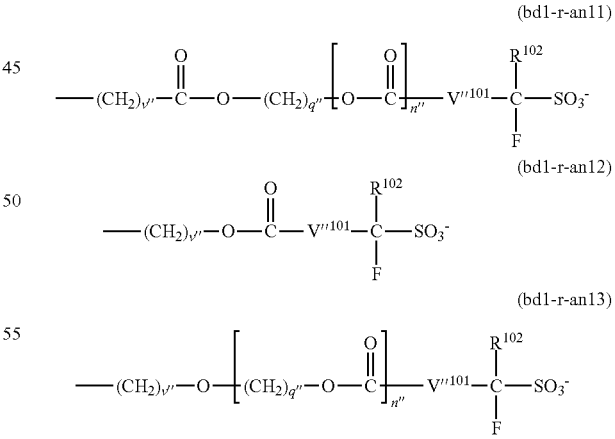

In the formulae, $V'''^{101}$ represents a single bond, an alkylene group having 1 to 4 carbon atoms or a fluorinated alkylene group having 1 to 4 carbon atoms; $R^{102}$ represents a fluorine atom or a fluorinated alkyl group having 1 to 5 carbon atoms; each v'' independently represents an integer of 0 to 3; each q'' independently represents an integer of 1 to 20; and n'' is 0 or 1.

In formulae (bd1-r-an11) to (bd1-r-an13), $V'''^{101}$ represents a single bond, an alkylene group having 1 to 4 carbon atoms, or a fluorinated alkylene group having 1 to 4 carbon atoms. $V'''^{101}$ is preferably a single bond, an alkylene group having 1 carbon atom (methylene group), or a fluorinated alkylene group having 1 to 3 carbon atoms.

In formulae (bd1-r-an11) to (bd1-r-an13), $R^{102}$ represents a fluorine atom or a fluorinated alkyl group having 1 to 5 carbon atoms. $R^{102}$ is preferably a perfluoroalkyl group having 1 to 5 carbon atoms or a fluorine atom, and more preferably a fluorine atom.

In formulae (bd1-r-an11) to (bd1-r-an13), v" represents an integer of 0 to 3, preferably 0 or 1.

q" represents an integer of 1 to 20, preferably an integer of 1 to 10, more preferably an integer of 1 to 5, still more preferably 1, 2 or 3, and most preferably 1 or 2.

n" is 0 or 1, preferably 0.

The number of anionic groups in the component (BD1) may be 1, or 2 or more, and preferably 1.

The component (BD1) has an n-valent anion for the whole anion moiety. n represents an integer of 1 or more; m represents an integer of 1 or more, preferably 1 or 2, and more preferably 1.

As the anion moiety in the component (BD1), an anion represented by the following formula (bd1-an1) is preferable from the viewpoint of acid diffusion controllability.

[Chemical Formula 56.]

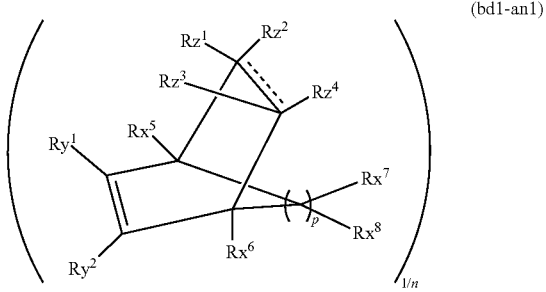

(bd1-an1)

In the formula, $Rx^5$ and $Rx^6$ each independently represents a hydrocarbon group which may have a substituent or a hydrogen atom; $Rx^7$ and $Rx^8$ each independently represents a hydrocarbon group which may have a substituent or a hydrogen atom, or alternatively, may be bonded to each other to form a ring structure; p is 1 or 2, and when p is 2, a plurality of $Rx^7$s and $Rx^8$s may be different from each other; $Ry^1$ and $Ry^2$ each independently represents a hydrogen atom or a hydrocarbon group which may have a substituent, or $Ry^1$ and $Ry^2$ may be mutually bonded to form a ring structure;

[Chemical Formula 57.]

----- represents a double bond or a single bond; $Rz^1$ to $Rz^4$ each independently represents, where valence allows, a hydrogen atom or a hydrocarbon group which may have a substituent, or two or more of $Rz^1$ to $Rz^4$ may be mutually bonded to form a ring structure; provided that at least one of $Rx^5$ to $Rx^8$, $Ry^1$, $Ry^2$ and $Rz^1$ to $Rz^4$ has an anionic group, and the whole anion moiety is an n-valent anion; and n represents an integer of 1 or more.

In formula (bd1-an1), $Rx^5$ and $Rx^6$ each independently represents a hydrocarbon group which may have a substituent or a hydrogen atom. The hydrocarbon group which may have a substituent as $Rx^5$ and $Rx^6$ is the same as the hydrocarbon group which may have a substituent as $Rx^1$ to $Rx^4$ in the aforementioned formula (bd1).

In formula (bd1-an1), $Rx^7$ and $Rx^8$ each independently represents a hydrocarbon group which may have a substituent or a hydrogen atom, or alternatively, may be bonded to each other to form a ring structure. $Rx^7$ and $Rx^8$ are the same as defined for Rx to $Rx^4$ in the aforementioned formula (bd1), respectively.

In formula (bd1-an1), p is 1 or 2, and when p is 2, a plurality of $Rx^7$s and $Rx^8$s may be different from each other. The anion represented by Formula (bd1-an1) has a bicycloheptane ring structure when p is 1, and a bicyclooctane ring structure when p is 2.

In formula (bd1-an1), $Ry^1$ and $Ry^2$ each independently represents a hydrocarbon group which may have a substituent or a hydrogen atom, or alternatively, may be bonded to each other to form a ring structure. $Ry^1$ and $Ry^2$ are the same as defined for $Ry^1$ and $Ry^2$ in the aforementioned formula (bd1), respectively.

$Rz^1$ to $Rz^4$ each independently represents, where valence allows, a hydrogen atom or a hydrocarbon group which may have a substituent, or two or more of $Rz^1$ to $Rz^4$ may be mutually bonded to form a ring structure. $Rz^1$ to $Rz^4$ are the same as defined for $Rz^1$ to $Rz^4$ in the aforementioned formula (bd1), respectively.

In formula (bd1-an1), at least one of $Rx^5$ to $Rx^8$, $Ry^1$, $Ry^2$ and $Rz^1$ to $Rz^4$ has an anionic group, and the whole anion moiety is an n-valent anion. n represents an integer of 1 or more;

Among these examples, as the anion moiety in the component (BD1), an anion represented by formula (bd1-an1) and p is 2, i.e. an anion represented by the following Formula (bd1-an2) is more preferable from the viewpoint of acid diffusion controllability.

[Chemical Formula 58.]

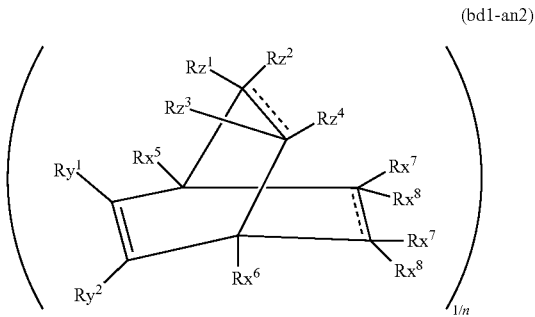

(bd1-an2)

In the formula, $Rx^5$ and $Rx^6$ each independently represents a hydrocarbon group which may have a substituent or a hydrogen atom; a plurality of $Rx^7$s and $Rx^8$s each independently represents a hydrocarbon group which may have a substituent or a hydrogen atom, or alternatively, two or more of $Rx^7$ and $Rx^8$ may be bonded to each other to form a ring structure; $Ry^1$ and $Ry^2$ each independently represents a hydrocarbon group which may have a substituent or a hydrogen atom, or alternatively, may be bonded to each other to form a ring structure;

[Chemical Formula 59.]

----- represents a double bond or a single bond; $Rz^1$ to $Rz^4$ each independently represents, where valence allows, a hydrogen atom or a hydrocarbon group which may have a substituent, or two or more of $Rz^1$ to $Rz^4$ may be mutually bonded to form a ring structure; provided that at least one of $Rx^5$ to $Rx^8$, $Ry^1$, $Ry^2$ and $Rz^1$ to $Rz^4$ has an anionic group, and the whole anion moiety is an n-valent anion; and n represents an integer of 1 or more.

In formula (bd1-an2), $Rx^5$, $Rx^6$, $Rx^7$, $Rx^8$, $Ry^1$, $Ry^2$ and $Rz^1$ to $Rz^4$ are the same as defined for $Rx^5$, $Rx^6$, $Rx^7$, $Rx^8$, $Ry^1$, $Ry^2$ and $Rz^1$ to $Rz^4$ in the aforementioned formula (bd1), respectively.

In formula (bd1-an2), at least one of $Rx^5$ to $Rx^8$, $Ry^1$, $Ry^2$ and $Rz^1$ to $Rz^4$ has an anionic group, and the whole anion moiety is an n-valent anion. n represents an integer of 1 or more. n represents an integer of 1 or more;

In Formulae (bd1), (bd1-an1) and (bd1-an2), $Ry^1$ and $Ry^2$ are preferably bonded to each other to form a ring structure, in terms of short diffusion and diffusion controllability of an acid generated upon exposure. The ring structure formed by $Ry^1$ and $Ry^2$ is more preferably an aromatic hydrocarbon (aromatic ring or aromatic heterocyclic ring) which may have a substituent, and still more preferably an aromatic hydrocarbon (aromatic ring or aromatic heterocyclic ring) which may have an alkyl group as a substituent.

In formulae (bd1), (bd1-an1) and (bd1-an2), $Rz^1$ to $Rz^4$ are preferably bonded to each other to form a ring structure, in terms of diffusion controllability of an acid generated upon exposure. The ring structure formed by $Rz^1$ to $Rz^4$ is preferably a ring structure sharing one side of a six-membered ring in the formulae (bond between a carbon atom to which $Rz^1$ and $Rz^2$ are bonded and a carbon atom to which $Rz^3$ and $Rz^4$ are bonded), more preferably an aromatic hydrocarbon (aromatic ring or aromatic heterocyclic ring) which may have a substituent, and still more preferably an aromatic hydrocarbon (aromatic ring or aromatic heterocyclic ring) which may have an alkyl group as a substituent.

In formulae (bd1-an1) and (bd1-an2), $Rx^7$ and $Rx^8$ are preferably bonded to each other to form a ring structure, in terms of short diffusion and diffusion controllability of an acid generated upon exposure. The ring structure formed by $Rx^7$ and $Rx^8$ is more preferably an aromatic hydrocarbon (aromatic ring or aromatic heterocyclic ring) which may have a substituent, and still more preferably an aromatic hydrocarbon (aromatic ring or aromatic heterocyclic ring) which may have an alkyl group as a substituent.

In formula (bd1-an2), the ring structure formed by $Rx^7$ and $Rx^8$ is preferably a ring structure sharing one side of a six-membered ring in Formula (bd1-an2) (bond between the same carbon atoms to which $Rx^7$ and $Rx^8$ are bonded), more preferably an aromatic hydrocarbon (aromatic ring or aromatic heterocyclic ring) which may have a substituent, and still more preferably an aromatic hydrocarbon (aromatic ring or aromatic heterocyclic ring) which may have an alkyl group as a substituent.

In the whole anion represented by Formula (bd1-an2), the number of ring structures formed by any of $Rx^7$ and $Rx^8$, $Ry^1$ and $Ry^2$, and $Rz^1$ to $Rz^4$ being bonded to each other may be 1, or 2 or more, and preferably 2 or 3.

In particular, suitable examples of the anion moiety in the component (BD1) include an anion represented by the following formula (bd1-an3).

[Chemical Formula 60.]

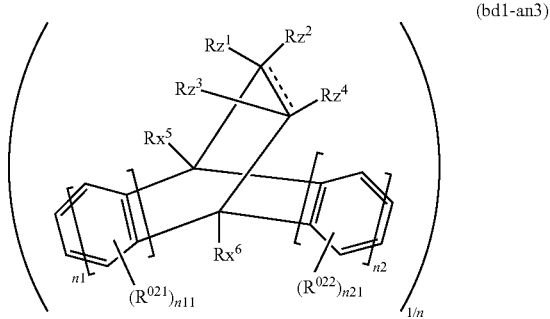

(bd1-an3)

In the formula, $Rx^5$ and $Rx^6$ each independently represents a hydrocarbon group which may have a substituent or a hydrogen atom;

[Chemical Formula 61.]

- - - - - represents a double bond or a single bond; $Rz^1$ to $Rz^4$ each independently represents, where valence allows, a hydrogen atom or a hydrocarbon group which may have a substituent, or two or more of $Rz^1$ to $Rz^4$ may be mutually bonded to form a ring structure; provided that at least one of $Rx^5$ and $Rx^6$ and $Rz^1$ to $Rz^4$ has an anionic group, and the whole anion moiety is an n-valent anion; n represents an integer of 1 or more; $R^{021}$ represents an alkyl group, an alkoxy group, a halogen atom, a halogenated alkyl group, a hydroxyl group, a carbonyl group, and a nitro group; n represents an integer of 1 to 3; n11 represents an integer of 0 to 8; $R^{022}$ represents an alkyl group, an alkoxy group, a halogen atom, a halogenated alkyl group, a hydroxyl group, a carbonyl group, and a nitro group; n2 represents an integer of 1 to 3; and n21 represents an integer of 0 to 8.

In formula (b1-an3), $Rx^5$, $Rx^6$ and $Rz^1$ to $Rz^4$ are the same as defined for $Rx^5$, $Rx^6$ and $Rz^1$ to $Rz^4$ in the aforementioned formula (b1-an1), respectively.

In formula (b1-an3), $R^{021}$ represents an alkyl group, an alkoxy group, a halogen atom, a halogenated alkyl group, a hydroxyl group, a carbonyl group, and a nitro group.

The alkyl group as $R^{021}$ is preferably an alkyl group having 1 to 5 carbon atoms, and a methyl group, an ethyl group, a propyl group, an n-butyl group, or a tert-butyl group is most preferable.

The alkoxy group as $R^{021}$ is preferably an alkoxy group having 1 to 5 carbon atoms, more preferably a methoxy group, an ethoxy group, an n-propoxy group, an iso-propoxy group, an n-butoxy group, or a tert-butoxy group, and most preferably a methoxy group or an ethoxy group.

The halogen atom as $R^{021}$ is preferably a fluorine atom, a chlorine atom, a bromine atom and an iodine atom, and a fluorine atom is preferable.

Examples of the halogenated alkyl group as $R^{021}$ include a group in which some or all hydrogen atoms in an alkyl group having 1 to 5 carbon atoms such as a methyl group, an ethyl group, a propyl group, an n-butyl group, or a tert-butyl group have been substituted with the halogen atoms.

Among these examples, $R^{021}$ is preferably an alkyl group, a halogen atom, a halogenated alkyl group or the like, and more preferably an alkyl group, from the viewpoint of compatibility with the component (A).

In formula (bd1-an3), n1 represents an integer of 1 to 3, preferably 1 or 2, and particularly preferably 1.

In formula (bd1-an3), n11 represents an integer of 0 to 8, preferably an integer of 0 to 4, more preferably 0, 1 and 2, and particularly preferably 0 or 1.

In formula (bd1-an3), $R^{022}$ represents an alkyl group, an alkoxy group, a halogen atom, a halogenated alkyl group, a hydroxyl group, a carbonyl group, and a nitro group, and examples thereof include the same as described above as $R^{021}$. Among these examples, $R^{022}$ is preferably an alkyl group, a halogen atom, a halogenated alkyl group or the like, and more preferably an alkyl group, from the viewpoint of compatibility with the component (A).

In formula (bd1-an3), n2 represents an integer of 1 to 3, preferably 1 or 2, and particularly preferably 1.

In formula (bd1-an3), n21 represents an integer of 0 to 8, preferably an integer of 0 to 4, more preferably 0, 1 and 2, and particularly preferably 0 or 1.

In formula (bd1-an3), at least one of $Rx^5$, $Rx^6$ and $Rz^1$ to $Rz^4$ has an anionic group, and the whole anion moiety is an n-valent anion. n represents an integer of 1 or more; Suitable examples of the anionic group include anionic groups represented by *—$V'^{10}$—COO— ($V'^{10}$ is a single bond or an alkylene group having 1 to 5 carbon atoms), and an anionic group represented by general formula (bd1-r-an1).

In Formulae (bd1), (bd1-an1), (bd1-an2) and (bd1-an3), at least one of $Rz^1$ to $Rz^4$ preferably has an anionic group since it allows to obtain the excellent advantageous effect of the present embodiment. In a case where two or more of $Rz^1$ to $Rz^4$ are bonded to each other to form a ring structure, a carbon atom forming the ring structure or a hydrogen atom bonded to this carbon atom may be substituted by the anionic group.

Alternatively, in Formulae (bd1-an1), (bd1-an2) and (bd1-an3), at least one of $Rx^5$ and $Rx^6$ preferably has an anionic group since it allows to obtain the excellent advantageous effect of the present embodiment.

Alternatively, in Formulae (bd1-an1), (bd1-an2) and (bd1-an3), at least one of $Rx^5$, $Rx^6$ and $Rz^1$ to $Rz^4$ preferably has an anionic group since it allows to obtain the excellent advantageous effect of the present embodiment.

Specific examples of the anion moiety in the compound (BD1) are shown below.

[Chemical Formula 62.]

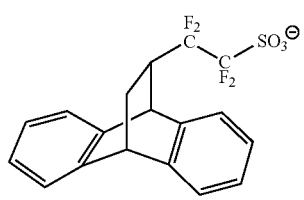
(bd1-an3-1)

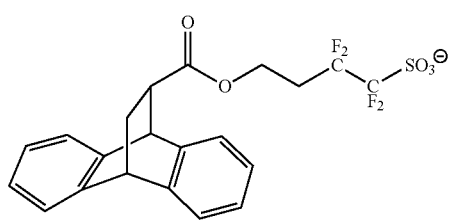
(bd1-an3-2)

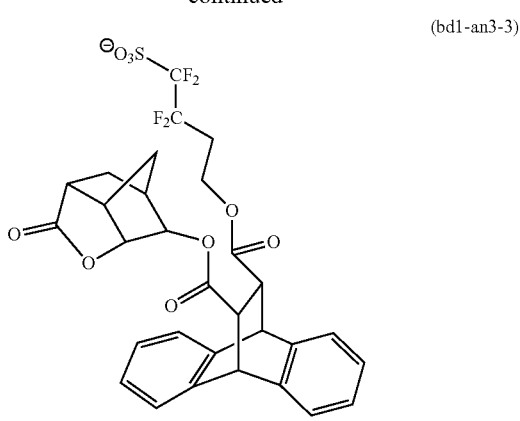
(bd1-an3-3)

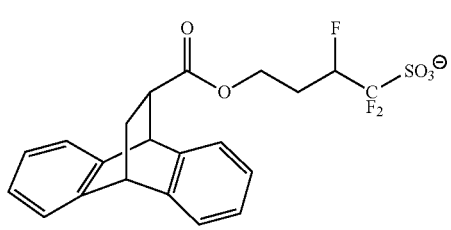
(bd1-an3-4)

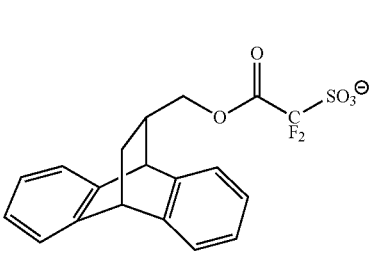
(bd1-an3-5)

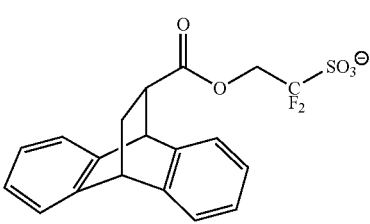
(bd1-an3-6)

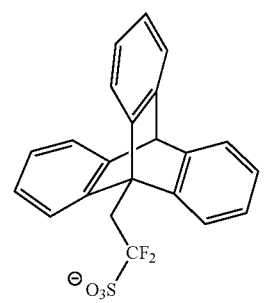
(bd1-an3-7)

(bd1-an3-8)
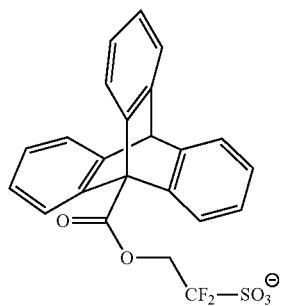
[Chemical Formula 63.]
(bd1-an3-9)
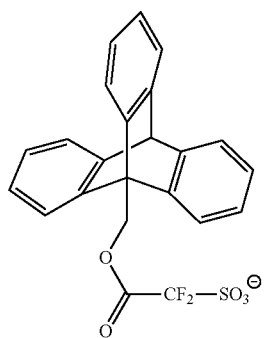
(bd1-an3-10)
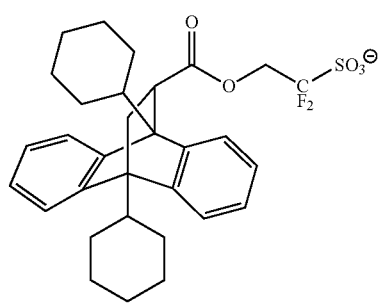
(bd1-an3-11)
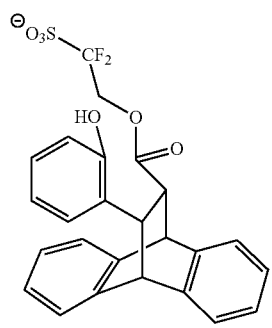
(bd1-an3-12)
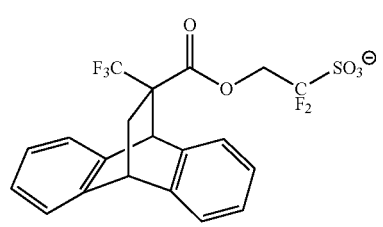
(bd1-an3-13)
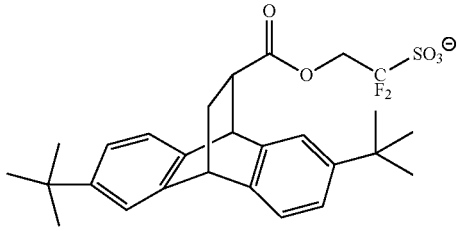
(bd1-an3-14)
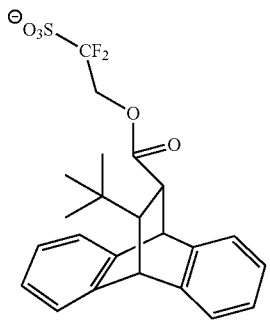
(bd1-an3-15)
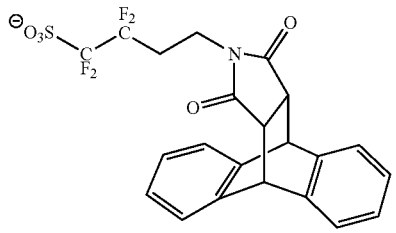
[Chemical Formula 64.]
(bd1-an3-21)
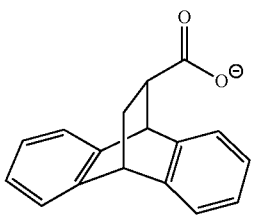
(bd1-an3-22)
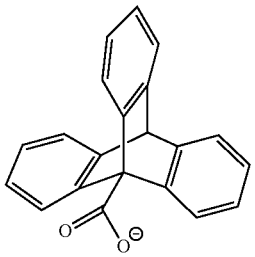
(bd1-an3-23a)
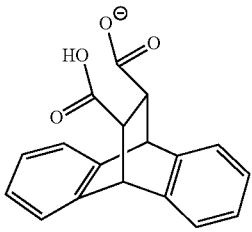

-continued

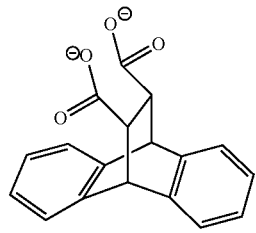

(bd1-an3-23b)

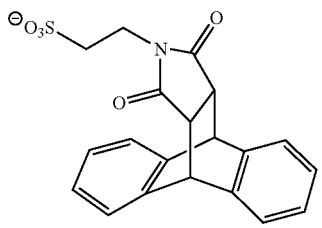

(bd1-an3-24)

Cation Moiety $((M^{m+})_{1/m})$

In formula (bd1), $M^{m+}$ represents an m-valent organic cation. m represents an integer of 1 or more.

As the organic cation for $M^{m+}$, a sulfonium cation or an iodonium cation is preferable. In a case where the component (BD1) is used as the base component (D), an ammonium cation can be employed as the organic cation.

As preferable examples of the cation moiety $((M^{m+})_{1/m})$, organic cations represented by general formulae (ca-1) to (ca-4) shown below may be given.

[Chemical Formula 65.]

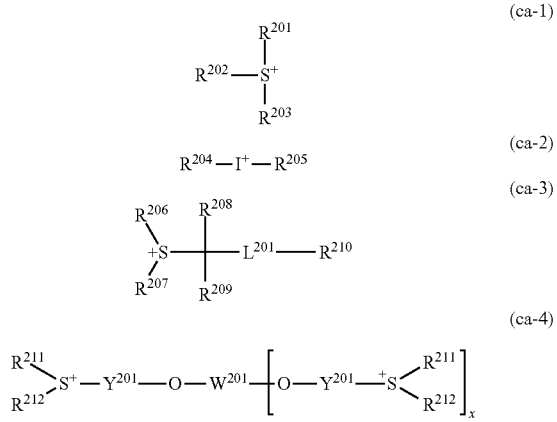

(ca-1)
(ca-2)
(ca-3)
(ca-4)

In the formula, $R^{201}$ to $R^{207}$, $R^{211}$ and $R^{212}$ each independently represents an aryl group which may have a substituent, an alkyl group which may have a substituent or an alkenyl group which may have a substituent. $R^{201}$ to $R^{203}$, $R^{206}$ and $R^{207}$, and $R^{211}$ and $R^{212}$ may be mutually bonded to form a ring with the sulfur atom. $R^{208}$ and $R^{209}$ each independently represents a hydrogen atom or an alkyl group of 1 to 5 carbon atoms, or $R^{208}$ and $R^{209}$ may be mutually bonded to form a ring with the sulfur atom. $R^{210}$ represents an aryl group which may have a substituent, an alkyl group which may have a substituent, an alkenyl group which may have a substituent, or an —$SO_2$-containing cyclic group which may have a substituent. $L^{201}$ represents —C(=O)— or —C(=O)—O—. Each of the plurality of $Y^{201}$ independently represents an arylene group, an alkylene group or an alkenylene group. x represents 1 or 2. $W^{201}$ represents an (x+1) valent linking group.

As the aryl group for $R^{201}$ to $R^{207}$ and $R^{211}$ to $R^{212}$, an aryl group of 6 to 20 carbon atoms may be mentioned, and a phenyl group or a naphthyl group is preferable.

The alkyl group for $R^{201}$ to $R^{207}$, $R^{211}$ and $R^{212}$ is preferably a chain-like or cyclic alkyl group having 1 to 30 carbon atoms.

The alkenyl group for $R^{201}$ to $R^{207}$ and $R^{211}$ to $R^{212}$ preferably has 2 to 10 carbon atoms.

Specific examples of the substituent which $R^{201}$ to $R^{207}$ and $R^{211}$ to $R^{212}$ may have include an alkyl group, a halogen atom, a halogenated alkyl group, a carbonyl group, a cyano group, an amino group, an aryl group, and groups represented by general formulae (ca-r-1) to (ca-r-7) shown below.

[Chemical Formula 66.]

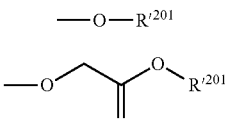

[ca-r-1]

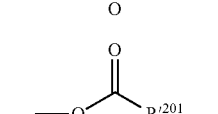

[ca-r-2]

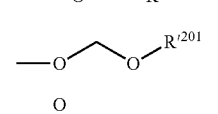

[ca-r-3]

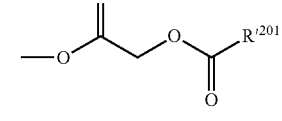

[ca-r-4]

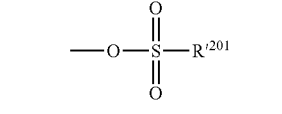

[ca-r-5]

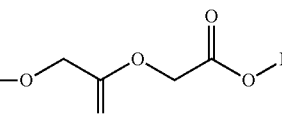

[ca-r-6]

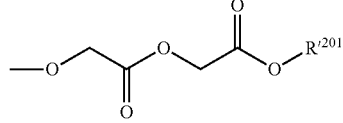

[ca-r-7]

In the formulae, each $R'^{201}$ independently represents a hydrogen atom, a cyclic group which may have a substituent, a chain-like alkyl group which may have a substituent, or a chain-like alkenyl group which may have a substituent.

Examples of the cyclic group which may have a substituent, the chain-like alkyl group which may have a substituent, and the chain-like alkenyl group which may have a substituent as $R'^{201}$ are the same as defined as $Rx^1$ to $Rx^4$, $Ry^1$, $Ry^2$ and $Rz^1$ to $Rz^4$ in formula (bd1), and additionally, as those defined as the acid dissociable group represented by formula (a1-r-2) as a cyclic group which may have a substituent or a chain-like alkyl group which may have a substituent.

Each of $R^{201}$ to $R^{203}$, $R^{206}$, $R^{207}$, $R^{211}$ and $R^{212}$ may be bonded to each other to form a ring together with a sulfur atom in the formulae.

When $R^{201}$ to $R^{203}$, $R^{206}$, $R^{207}$, $R^{211}$ and $R^{212}$ are mutually bonded to form a ring with the sulfur atom, these groups may be mutually bonded via a hetero atom such as a sulfur atom, an oxygen atom or a nitrogen atom, or a functional group such as a carbonyl group, —SO—, —SO$_2$—, —SO$_{03}$—, —COO—, —CONH— or —N(R$_N$)— (wherein R$_N$ represents an alkyl group of 1 to 5 carbon atoms). The ring containing the sulfur atom in the skeleton thereof is preferably a 3 to 10-membered ring, and most preferably a 5 to 7-membered ring. Specific examples of the ring formed include a thiophene ring, a thiazole ring, a benzothiophene ring, a thianthrene ring, a benzothiophene ring, a dibenzothiophene ring, a 9H-thioxanthene ring, a thioxanthone ring, a phenoxathiin ring, a tetrahydrothiophenium ring, and a tetrahydrothiopyranium ring.

R$^{208}$ and R$^{209}$ each independently represents a hydrogen atom or an alkyl group having 1 to 5 carbon atoms and preferably a hydrogen atom or an alkyl group having 1 to 3 carbon atoms.

R$^{210}$ represents an aryl group which may have a substituent, an alkyl group which may have a substituent, an alkenyl group which may have a substituent, or a —SO$_2$-containing cyclic group which may have a substituent.

Examples of the aryl group for R$^{210}$ include an unsubstituted aryl group of 6 to 20 carbon atoms, and a phenyl group or a naphthyl group is preferable.

As the alkyl group for R$^{210}$, a chain-like or cyclic alkyl group having 1 to 30 carbon atoms is preferable.

The alkenyl group for R$^{210}$ preferably has 2 to 10 carbon atoms.

As the —SO$_2$— containing cyclic group for R$^{210}$ which may have a substituent, an "—SO$_2$— containing polycyclic group" is preferable, and a group represented by the aforementioned general formula (a5-r-1) is more preferable.

Each Y$^{201}$ independently represents an arylene group, an alkylene group or an alkenylene group.

Examples of the arylene group as Y$^{201}$ include groups in which one hydrogen atom has been removed from an aryl group exemplified as the aromatic hydrocarbon group as Rx$^1$ to Rx$^4$, Ry$^1$, Ry$^2$ and Rz$^1$ to Rz$^4$ in formula (bd1).

Examples of the alkylene group and alkenylene group as Y$^{201}$ include groups in which one hydrogen atom has been removed from a group exemplified as Rx$^1$ to Rx$^4$, Ry$^1$, Ry$^2$ and Rz$^1$ to Rz$^4$ in formula (bd1) as the chain-like alkyl group or the chain-like alkenyl group.

In the formula (ca-4), x represents 1 or 2.

W$^{201}$ represents a linking group having a valency of (x+1), i.e., a divalent or trivalent linking group.

As the divalent linking group represented by W$^{201}$, a divalent hydrocarbon group which may have a substituent is preferable, and as examples thereof, the same divalent hydrocarbon groups which may have a substituent as those described above represented by Ya$^{x1}$ may be exemplified. The divalent linking group for W$^{201}$ may be linear, branched or cyclic, and cyclic is more preferable. Among these, an arylene group having two carbonyl groups, each bonded to the terminal thereof is preferable. Examples of the arylene group include a phenylene group and a naphthylene group, and a phenylene group is particularly desirable.

As the trivalent linking group for W$^{201}$, a group in which one hydrogen atom has been removed from the aforementioned divalent linking group for W$^{201}$ and a group in which the divalent linking group has been bonded to another divalent linking group can be mentioned. The trivalent linking group for W$^{201}$ is preferably a group in which 2 carbonyl groups are bonded to an arylene group.

Specific examples of suitable cations represented by Formula (ca-1) include cations represented by formulae (ca-1-1) to (ca-1-78) and (ca-1-101) to (ca-1-169) shown below.

In the following chemical formulae, g1 represents a repeating number, and g1 is an integer of 1 to 5. g2 represents a repeating number, and g2 is an integer of 0 to 20. g3 represents a repeating number, and g3 is an integer of 0 to 20.

[Chemical Formula 67.]

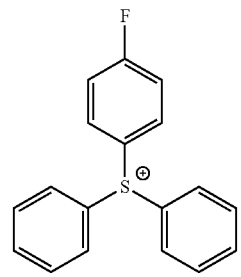

(ca-1-1)

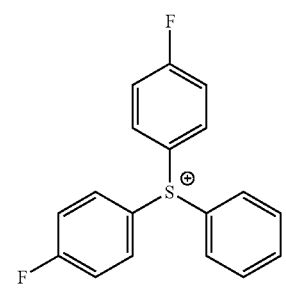

(ca-1-2)

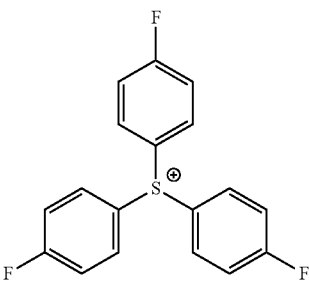

(ca-1-3)

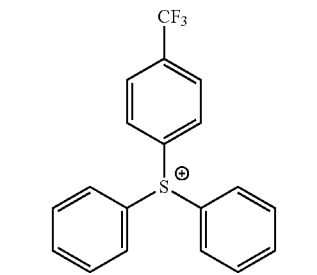

(ca-1-4)

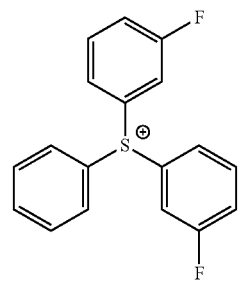

(ca-1-5)

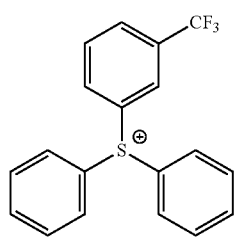
(ca-1-6)
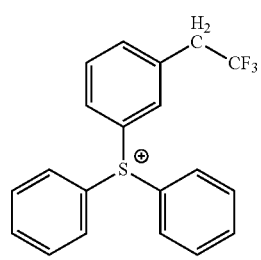
(ca-1-7)
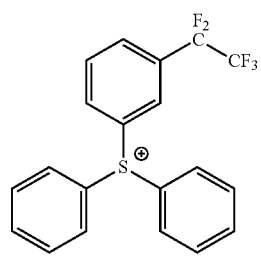
(ca-1-8)
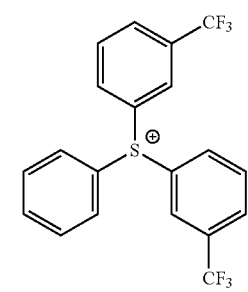
(ca-1-9)
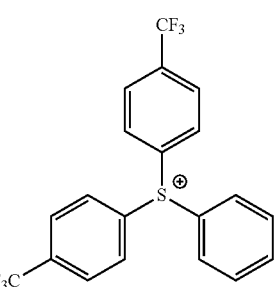
(ca-1-10)
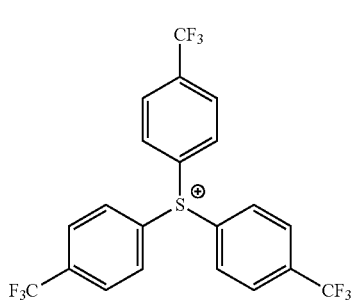
(ca-1-11)
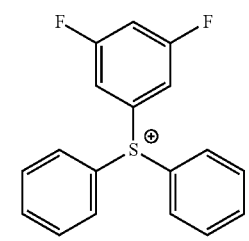
(ca-1-12)
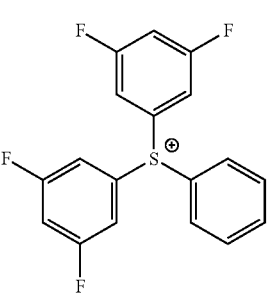
(ca-1-13)
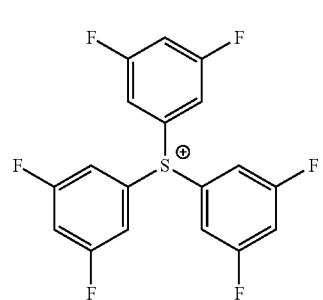
(ca-1-14)
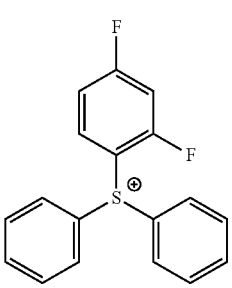
(ca-1-15)
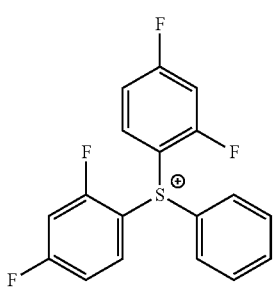
(ca-1-16)

(ca-1-17)
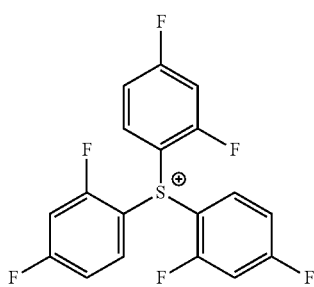
[Chemical Formula 68.]
(ca-1-18)
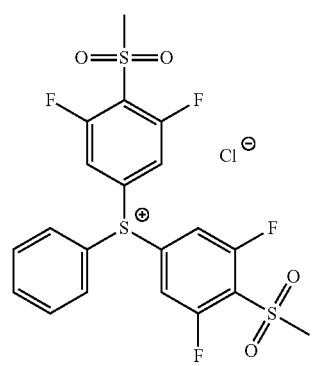
(ca-1-19)
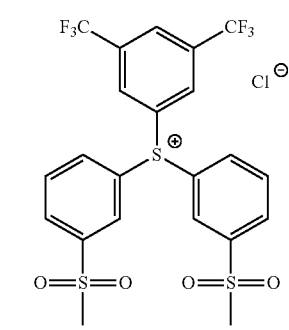
(ca-1-20)
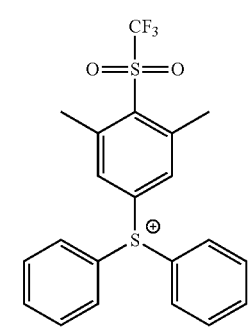
(ca-1-21)
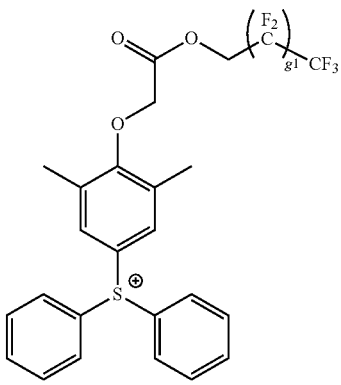
(ca-1-22)
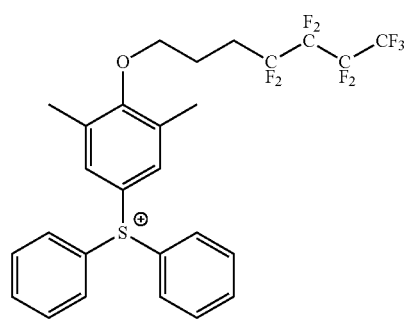
(ca-1-23)
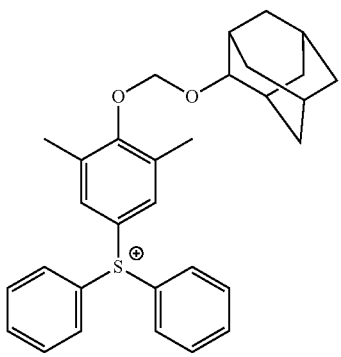
(ca-1-24)
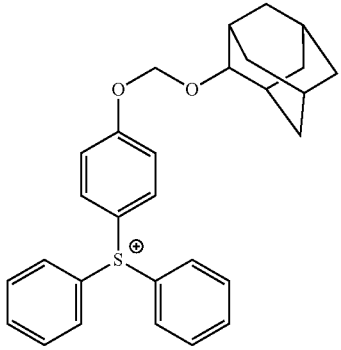

(ca-1-25)
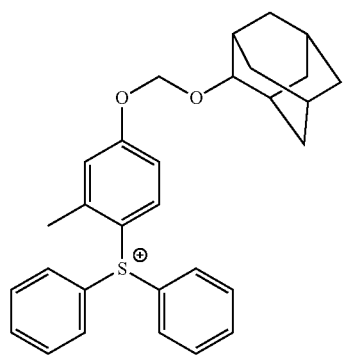
(ca-1-26)
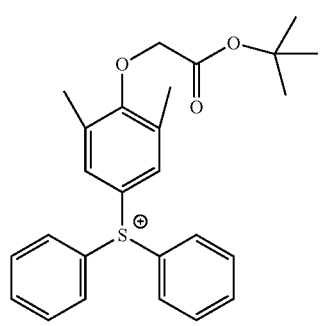
(ca-1-27)
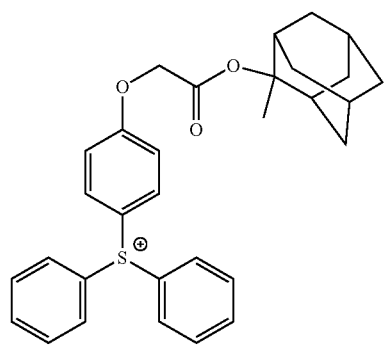
(ca-1-28)
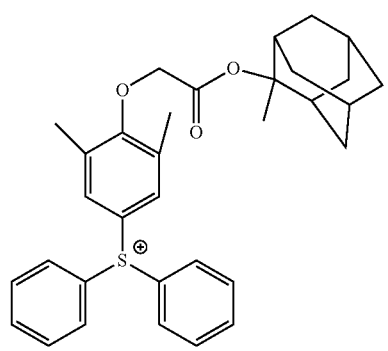
(ca-1-29)
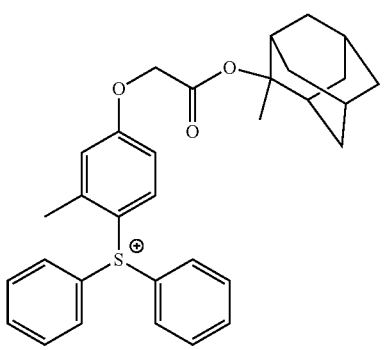
[Chemical Formula 69.]
(ca-1-30)
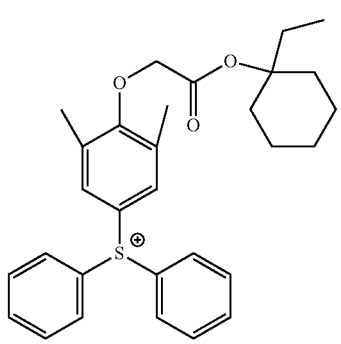
(ca-1-31)
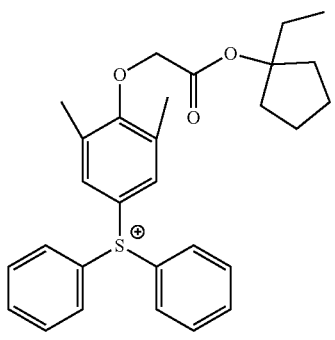
(ca-1-32)
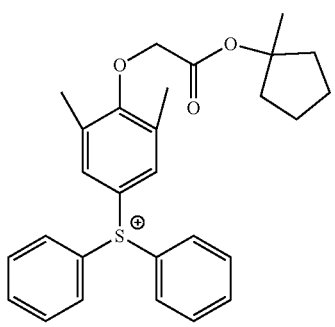

-continued
(ca-1-33)
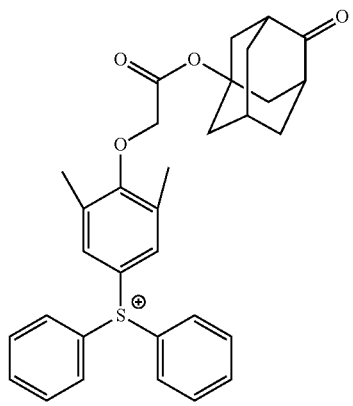
(ca-1-34)
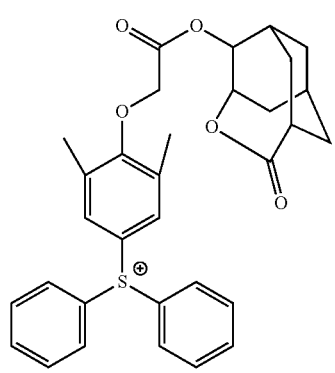
(ca-1-35)
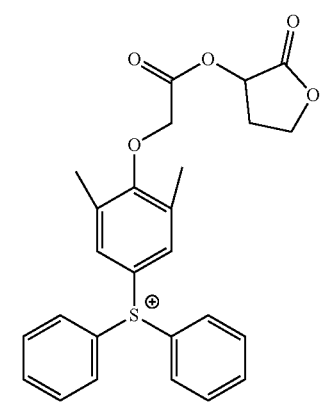
(ca-1-36)
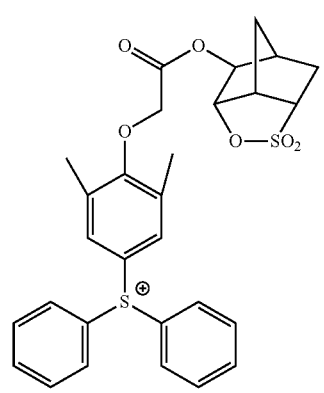
-continued
(ca-1-37)
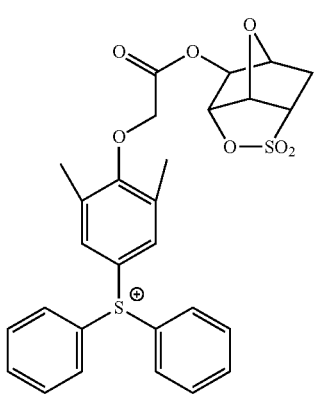
(ca-1-38)
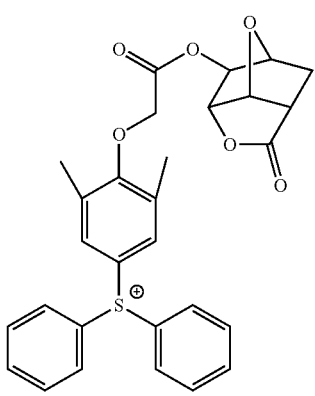
(ca-1-39)
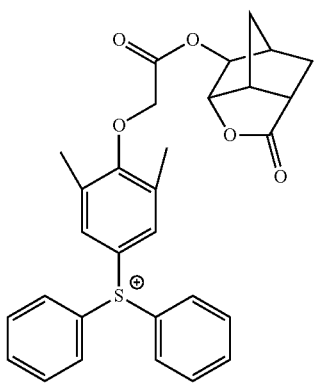
(ca-1-40)
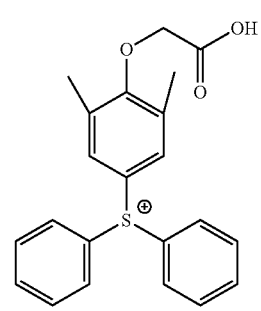

(ca-1-41)
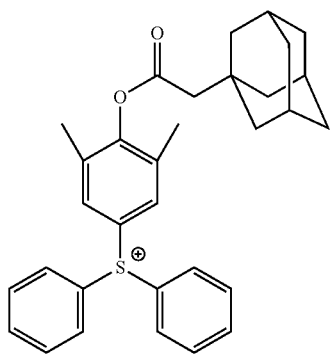
(ca-1-45)
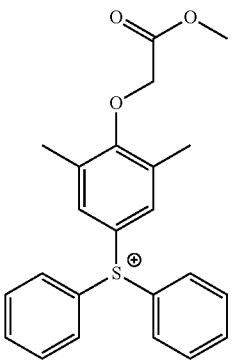
(ca-1-42)
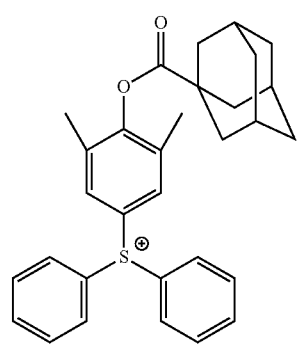
[Chemical Formula 70.]
(ca-1-46)
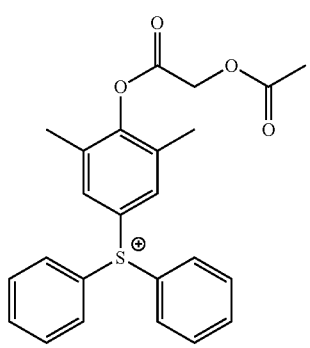
(ca-1-43)
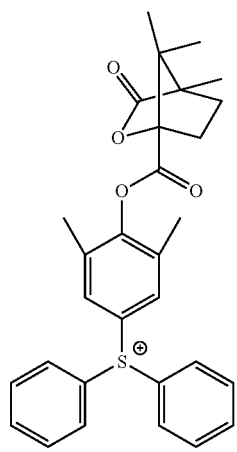
(ca-1-47)
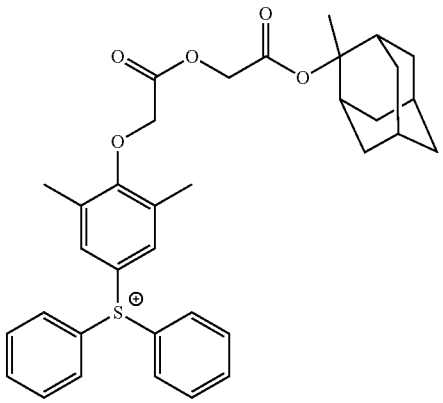
(ca-1-44)
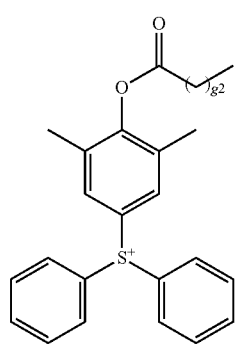
(ca-1-48)
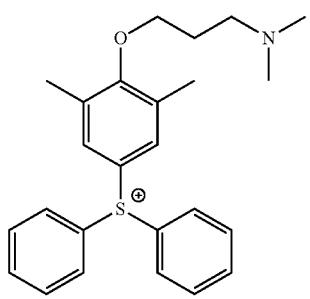

(ca-1-49)
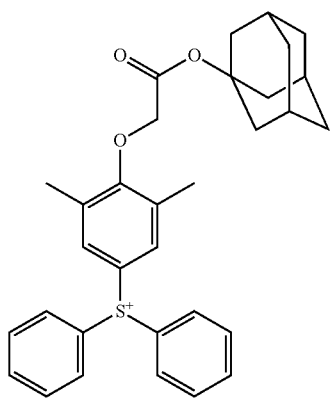
(ca-1-50)
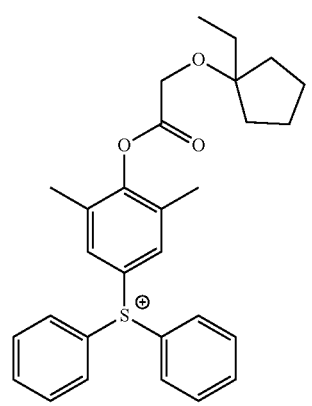
(ca-1-51)
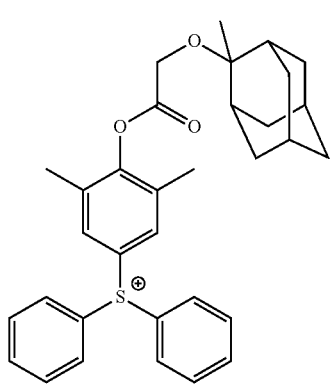
(ca-1-52)
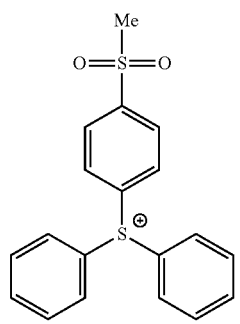
(ca-1-53)
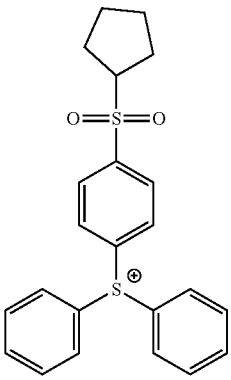
(ca-1-54)
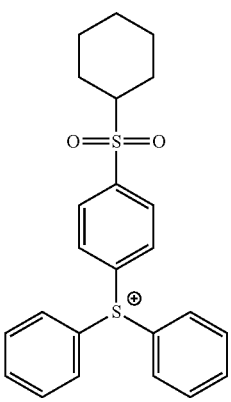
[Chemical Formula 71.]
(ca-1-55)
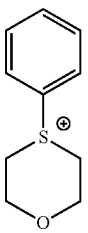
(ca-1-56)
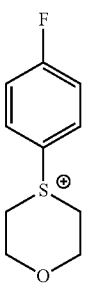

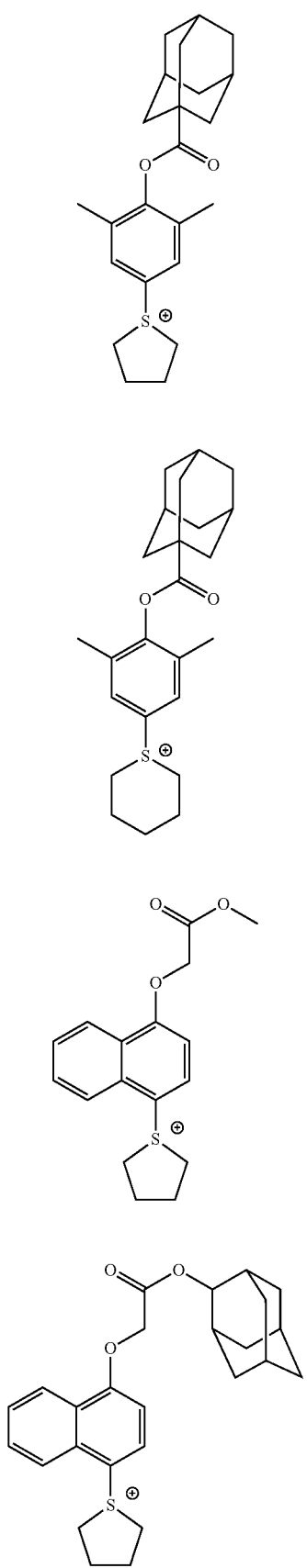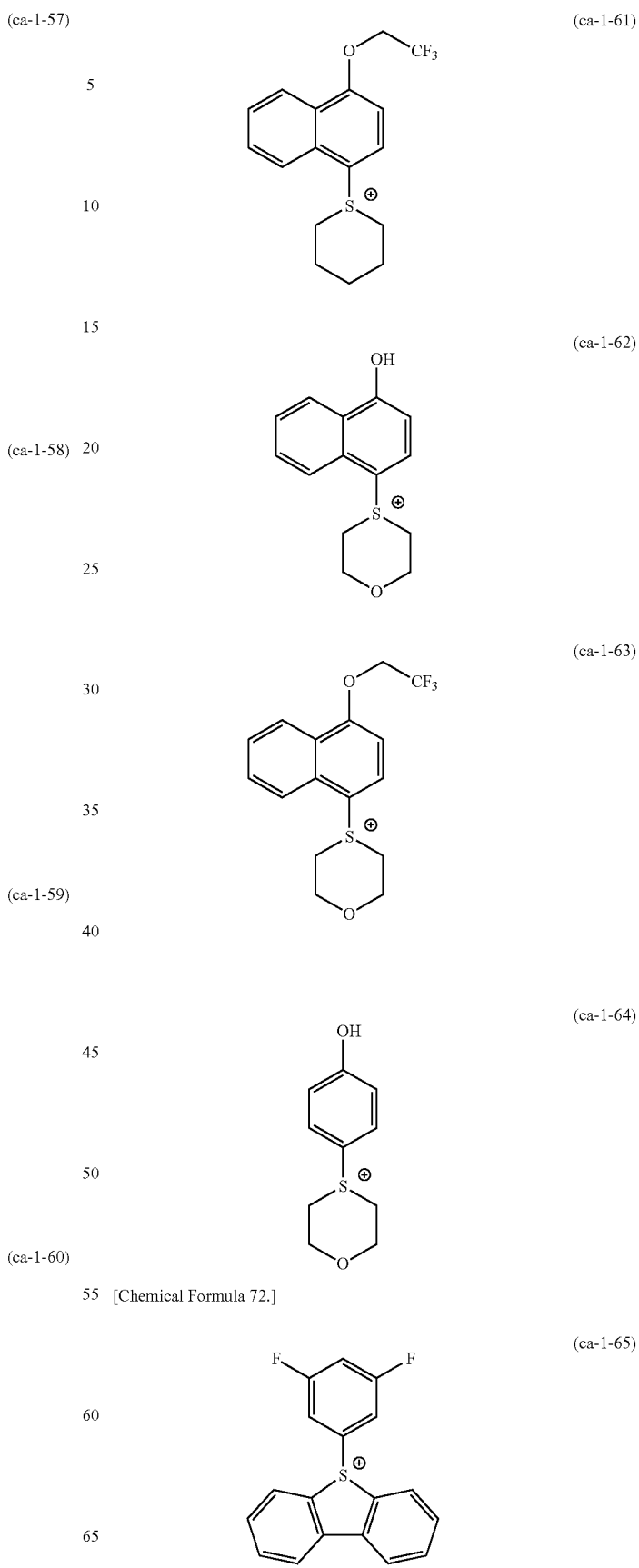
[Chemical Formula 72.]

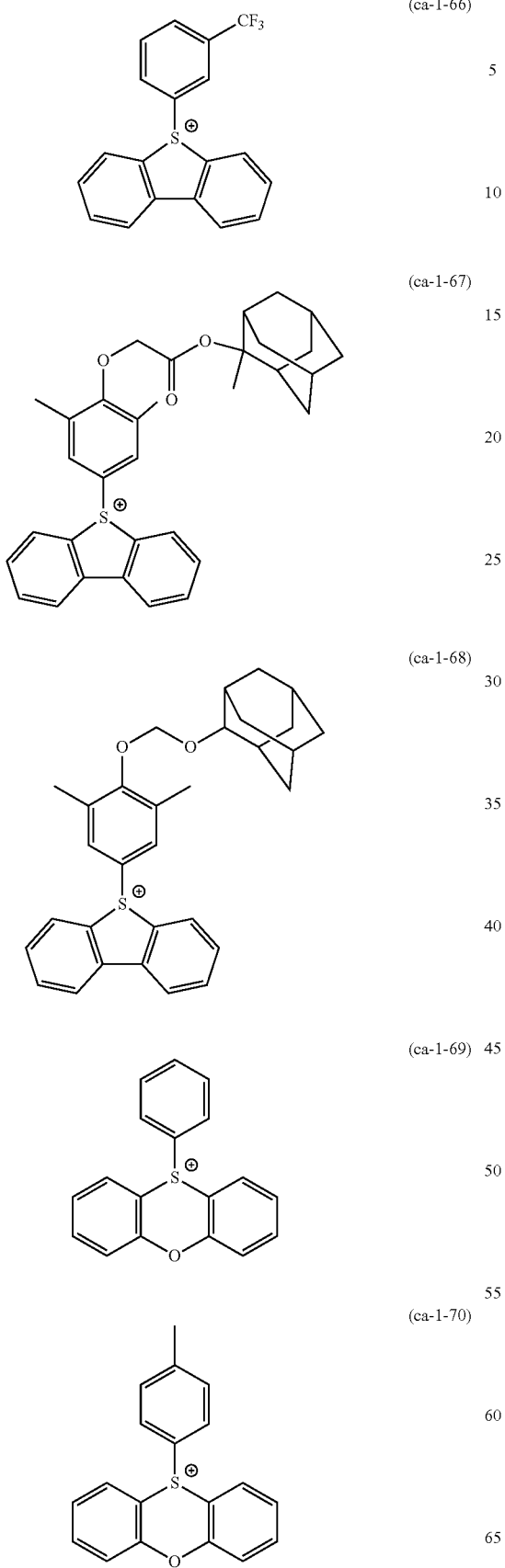
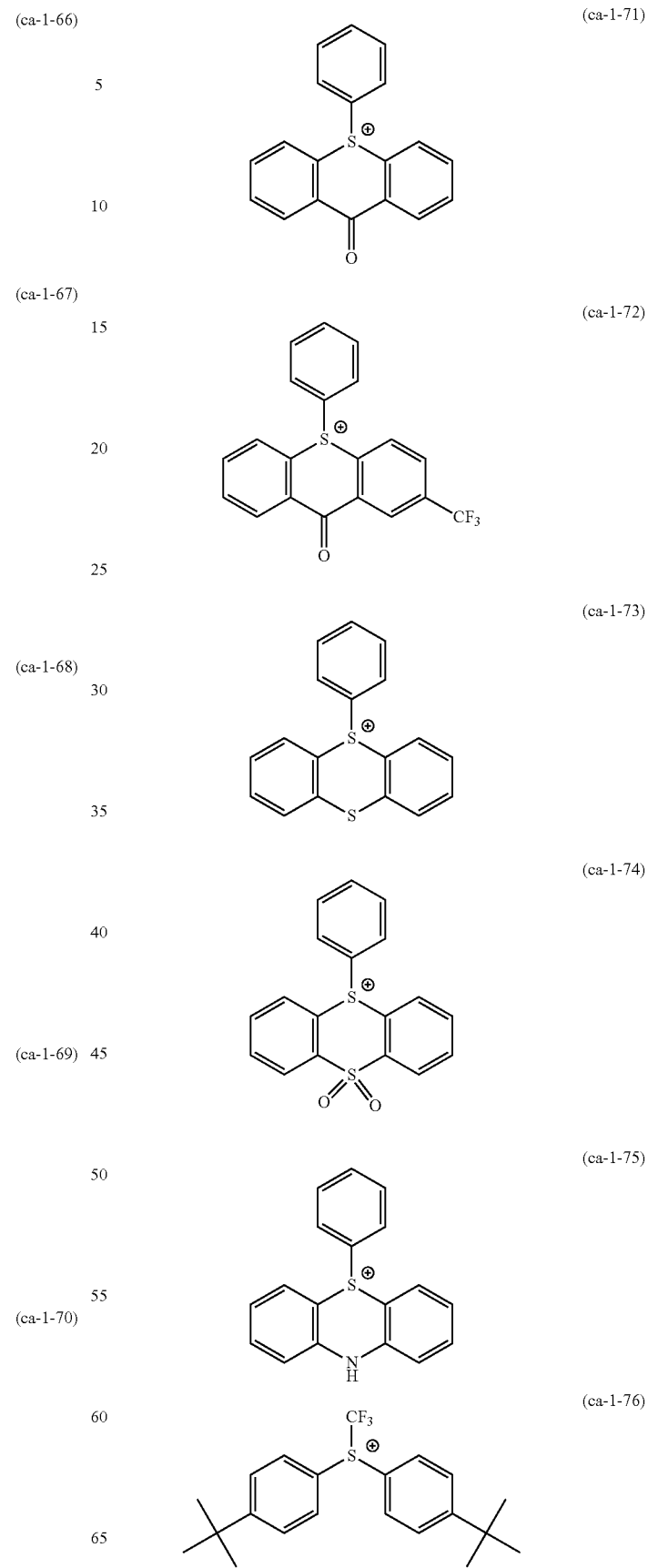

(ca-1-77)
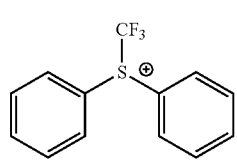
(ca-1-78)
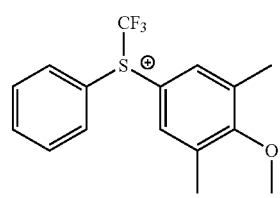
[Chemical Formula 73.]
(ca-1-101)
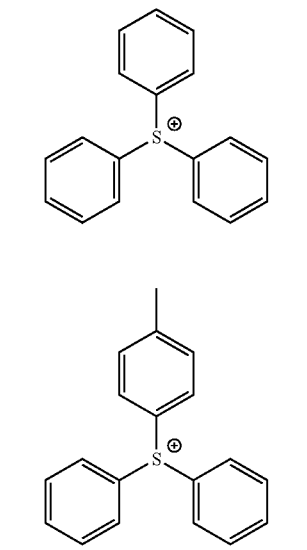
(ca-1-102)
(ca-1-103)
(ca-1-104)
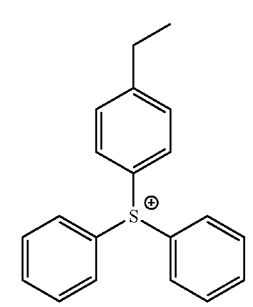
(ca-1-105)
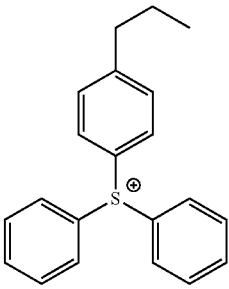
(ca-1-106)
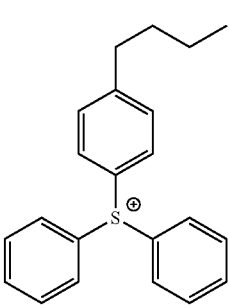
(ca-1-107)
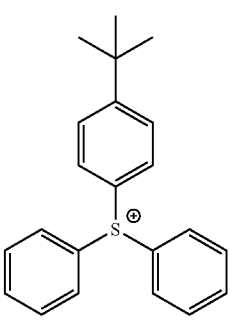
(ca-1-108)
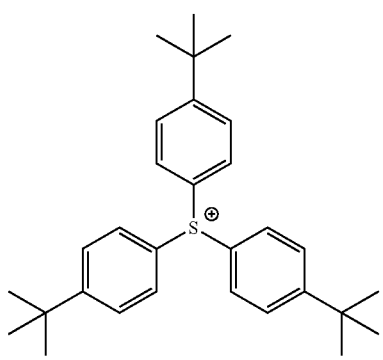
(ca-1-109)
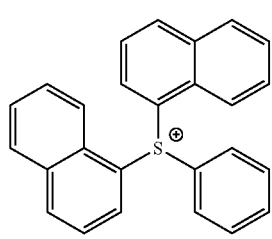

(ca-1-110)
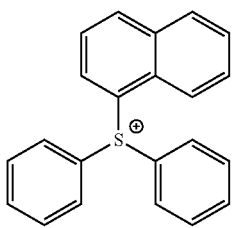
(ca-1-111)
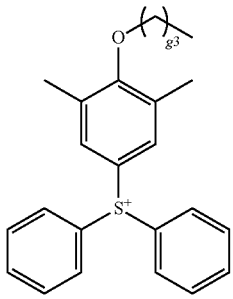
[Chemical Formula 74.]
(ca-1-112)
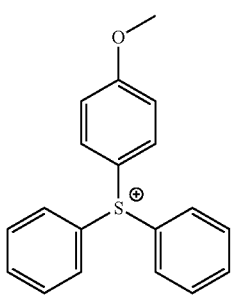
(ca-1-113)
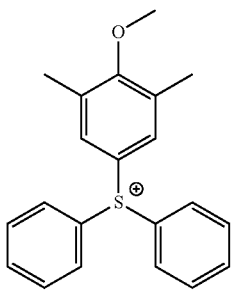
(ca-1-114)
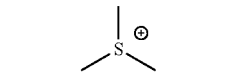
(ca-1-115)
(ca-1-116)
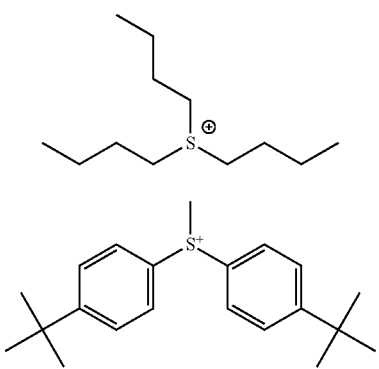
(ca-1-117)
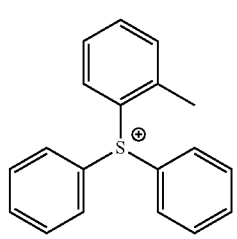
(ca-1-118)
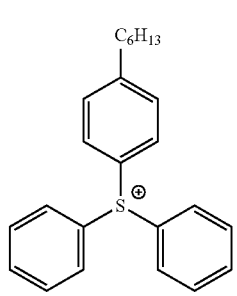
(ca-1-119)
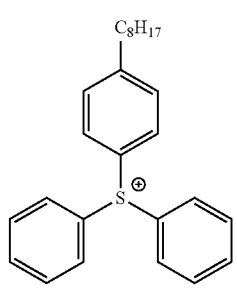
(ca-1-120)
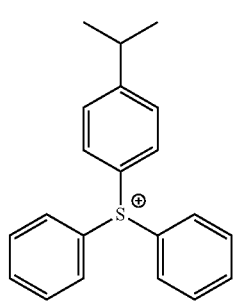
(ca-1-121)
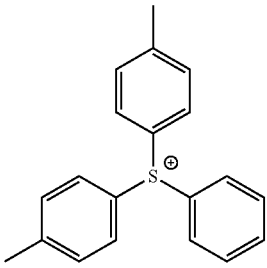

[Chemical Formula 75.]
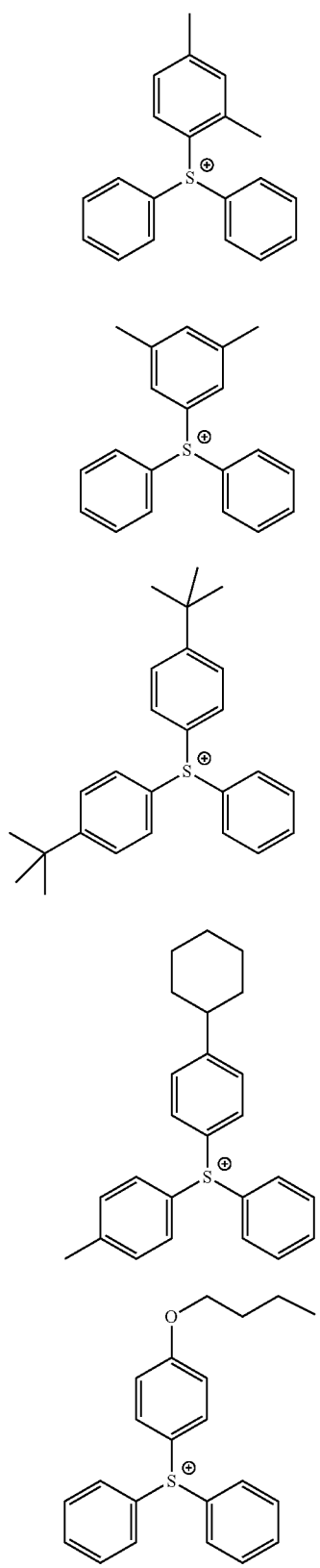
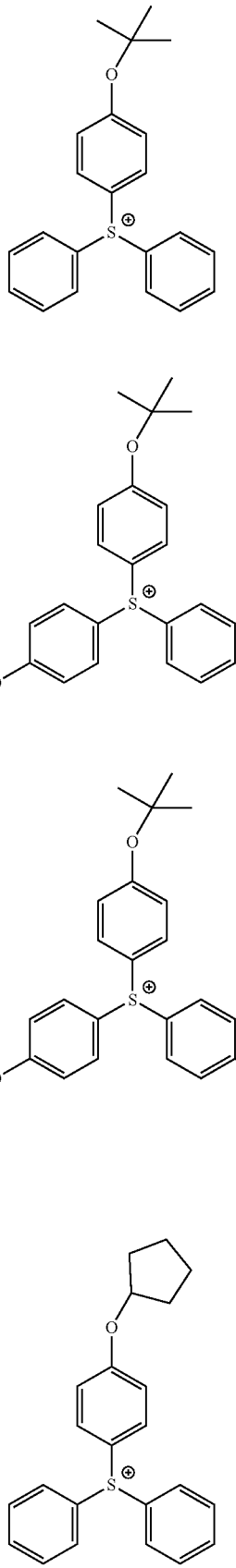

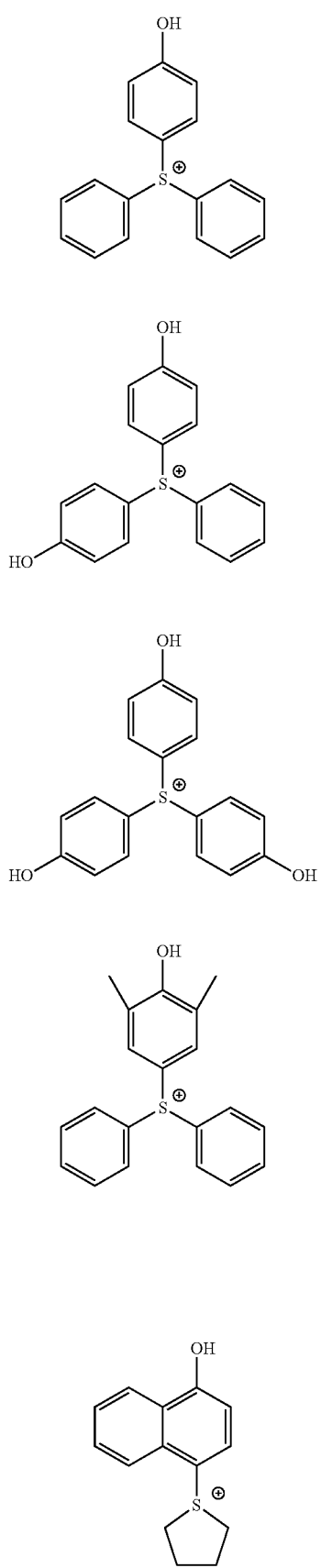

(ca-1-141)
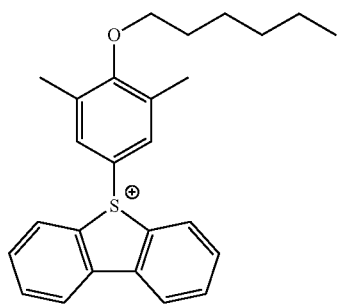
(ca-1-142)
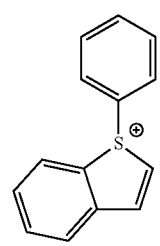
(ca-1-143)
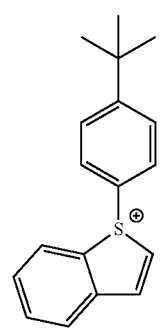
(ca-1-144)
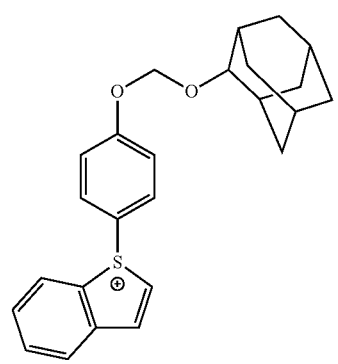
(ca-1-145)
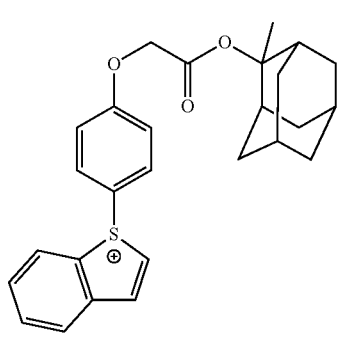
(ca-1-146)
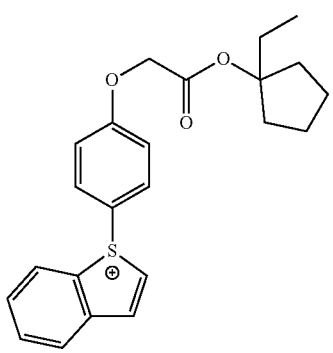
(ca-1-147)
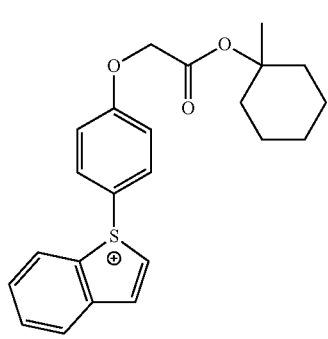
[Chemical Formula 77.]
(ca-1-148)
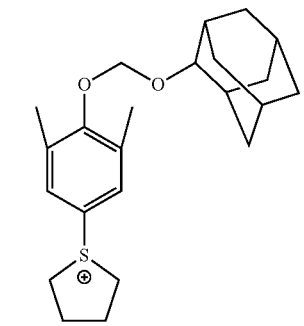
(ca-1-149)
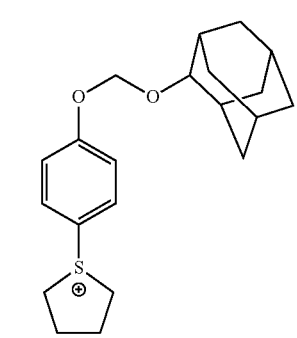

(ca-1-150) 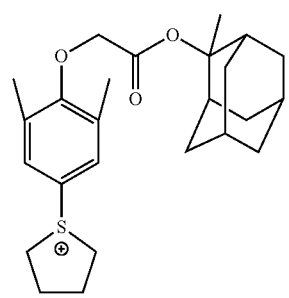
(ca-1-151) 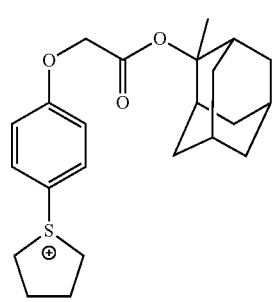
(ca-1-152) 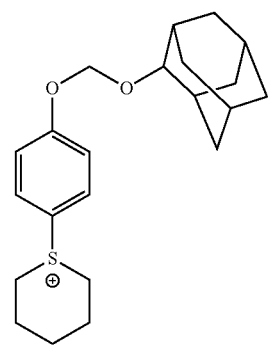
(ca-1-153) 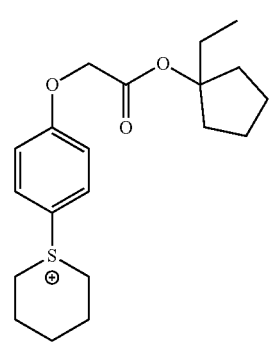
(ca-1-154) 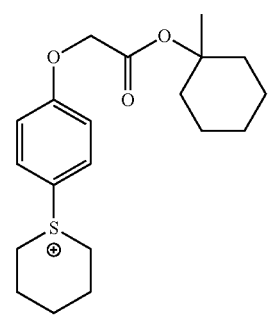
(ca-1-155) 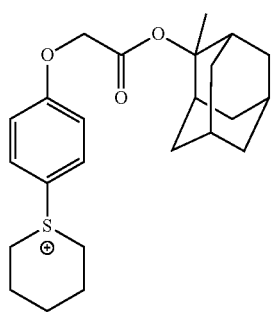
[Chemical Formula 78.]
(ca-1-156) 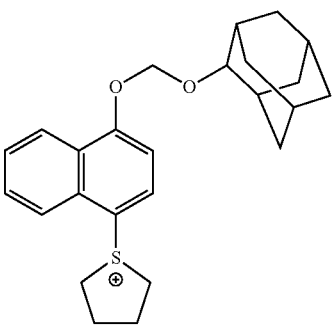
(ca-1-157) 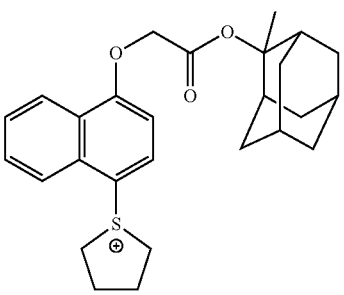
(ca-1-158) 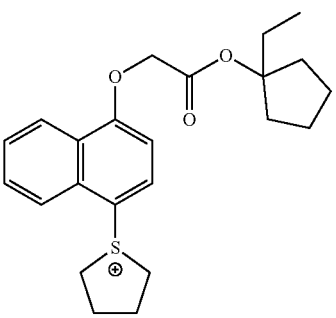
(ca-1-159) 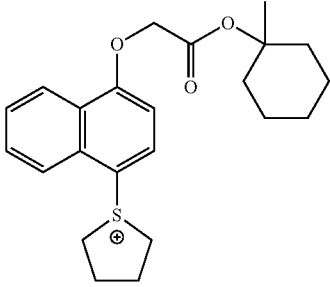

(ca-1-160)
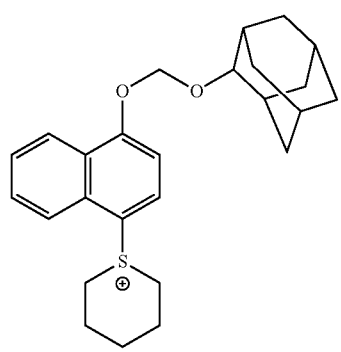
(ca-1-161)
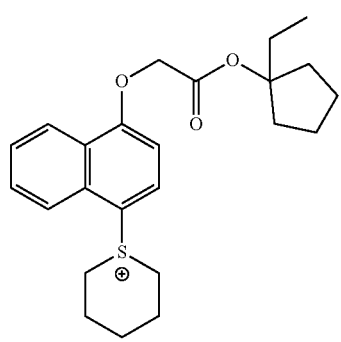
(ca-1-162)
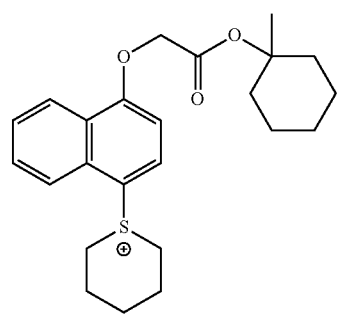
(ca-1-163)
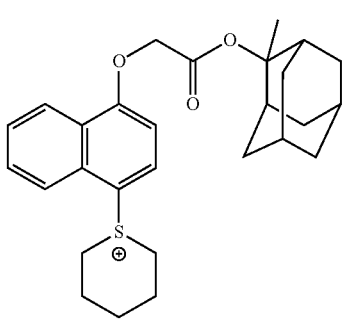
(ca-1-164)
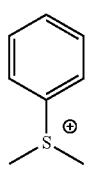
(ca-1-165)
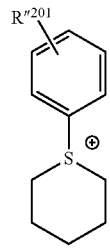
(ca-1-166)
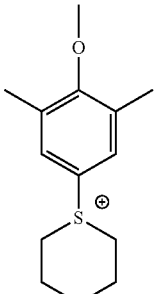
(ca-1-167)
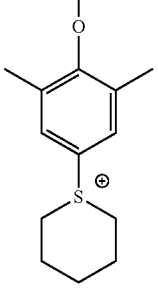
(ca-1-168)
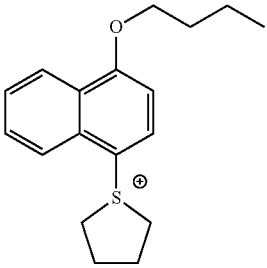
(ca-1-169)
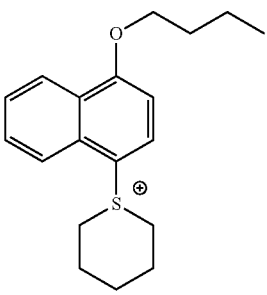
In the formulae, $R''^{201}$ represents a hydrogen atom or a substituent. Examples of the substituent which $R^{201}$ to $R^{207}$, $R^{211}$ and $R^{212}$ may have include an alkyl group, a halogen atom, a halogenated alkyl group, a carbonyl group, a cyano group, an amino group, an aryl group, and groups respectively represented by formulae (ca-r-1) to (ca-r-7).

Specific examples of suitable cations represented by formula (ca-2) include cations respectively represented by the following formulae (ca-2-1) to (ca-2-2), a dihphenyliodonium cation and a bis(4-tert-butylphenyl)iodonium cation.

[Chemical Formul 79.]

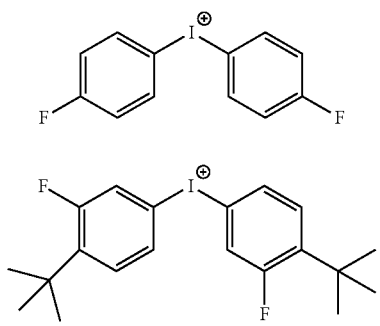

(ca-2-1)

(ca-2-2)

Specific examples of suitable cations represented by formula (ca-3) include cations respectively represented by formulae (ca-3-1) to (ca-3-7) shown below.

[Chemical Formula 80.]

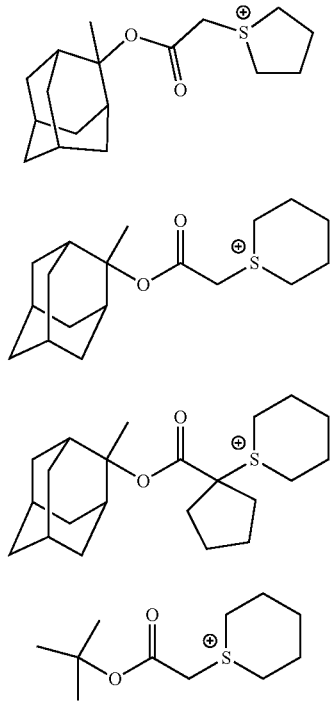

(ca-3-1)

(ca-3-2)

(ca-3-3)

(ca-3-4)

(ca-3-5)

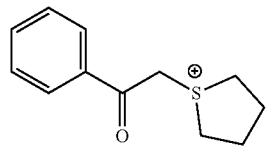

(ca-3-6)

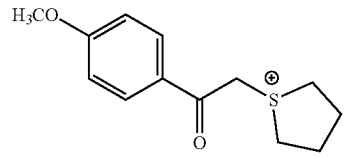

(ca-3-7)

Specific examples of preferable cations represented by formula (ca-4) include cations represented by formulae (ca-4-1) and (ca-4-2) shown below.

[Chemical Formula 81.]

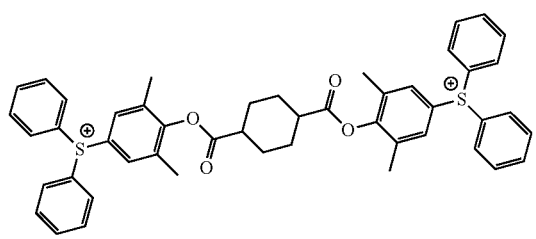

(ca-4-1)

(ca-4-2)

Further, examples of the ammonium cation in a case where the component (BD1) is used as the base component (D) include a cation represented by general formula (b1-0c) shown below.

[Chemical Formula 82.]

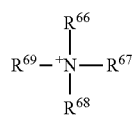

(b1-0c)

In the formula, $R^{66}$ to $R^{69}$ each independently represents a hydrogen atom or a hydrocarbon group which may have a substituent; provided that at least one of $R^{66}$ to $R^{69}$ is a hydrocarbon group which may have a substituent; at least two of $R^{66}$ to $R^{69}$ may be mutually bonded to form a ring.

In formula (b1-0c), $R^{66}$ to $R^{69}$ each independently represents a hydrogen atom or a hydrocarbon group which may have a substituent. At least one of $R^{66}$ to $R^{69}$ is a hydrocarbon group which may have a substituent.

The hydrocarbon group for $R^{66}$ to $R^{69}$ may be an aliphatic hydrocarbon group or an aromatic hydrocarbon group.

Examples of the aliphatic hydrocarbon group and the aromatic hydrocarbon group as $R^{66}$ to $R^{69}$ include the aryl group which may have a substituent and the alkyl group which may have a substituent described above for $R^{201}$ to $R^{207}$, $R^{211}$ and $R^{212}$. When the hydrocarbon group is an aliphatic hydrocarbon group, it is particularly desirable that the hydrocarbon group is an alkyl group of 1 to 12 carbon atoms which may have a substituent.

At least one of $R^{66}$ to $R^{69}$ is the aforementioned hydrocarbon group, and preferably two or three of $R^{66}$ to $R^{69}$ are the aforementioned hydrocarbon groups.

At least two of $R^{66}$ to $R^{69}$ may be mutually bonded to form a ring.

For example, two of $R^{66}$ to $R^{69}$ may be bonded to form one ring, three of $R^{66}$ to $R^{69}$ may be bonded to form one ring, or two of $R^{66}$ to $R^{69}$ may be bonded to form one ring, and the remaining two of $R^{66}$ to $R^{69}$ may be bonded to form another ring.

The ring which is formed by at least two of $R^{66}$ to $R^{69}$ bonded together with the nitrogen atom (i.e., the hetero ring containing nitrogen as a hetero atom) may be either an aliphatic hetero ring, or an aromatic hetero ring. Further, the hetero ring may be either a monocyclic group or a polycyclic group.

Specific examples of the ammonium ion represented by general formula (b1-0c) include ammonium ions derived from an amine.

An "ammonium ion derived from an amine" refers to a cation in which a hydrogen atom is bonded to the nitrogen atom of an amine, or a quaternary ammonium cation in which one substituent is bonded to the nitrogen atom of an amine.

The amine from which the ammonium ion is derived may be either an aliphatic amine or an aromatic amine.

As the aliphatic amine, an amine in which at least one hydrogen atom of ammonia ($NH_3$) has been substituted with an alkyl group or hydroxyalkyl group of no more than 12 carbon atoms (i.e., alkylamines or alkylalcoholamines), or a cyclic amine is particularly desirable.

Specific examples of alkylamines and alkylalcoholamines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decylamine, and tri-n-dodecylamine; and alkyl alcohol amines such as diethanolamine, triethanolamine, diisopropanolamine, triisopropanolamine, di-n-octanolamine, and tri-n-octanolamine.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine, and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of aromatic amines include aniline, pyridine, 4-dimethylaminopyridine (DMAP), pyrrole, indole, pyrazole, and imidazole.

Preferable examples of the tertiary ammonium ion include a tetramethylammonium ion, a tetraethylammonium ion and a tetrabutylammonium ion.

Among the above examples, as the cation moiety $((M^{m+})_{1/m})$, a cation represented by general formula (ca-1) is preferable, and a cation represented by any one of chemical formulae (ca-1-1) to (ca-1-78) and (ca-1-101) to (ca-1-169) is more preferable.

[Method for Producing Compound (BD1)]

The component (BD1) can be produced according to a known method.

Examples of a method for producing the component (BD1) include a method in which the Diels-Alder reaction is used, as shown in the following reaction formula, that an alkene or alkyne ("Starting Material 2") in the following reaction formula is added to a conjugated diene (starting material 1) to form a ring structure ("Intermediate" in the following reaction formula). Specifically, a desired anionic group is introduced into a product (intermediate) by the Diels-Alder reaction to obtain a precursor, and then a desired cation is introduced by the salt exchange reaction, thereby obtaining the target component (BD1). Alternatively, the target component (BD1) may be obtained as follows: the Diels-Alder reaction is carried out using an alkene, an alkyne or a conjugated diene, which contains a substituent derived from a desired anionic group (substituent capable of introducing a desired anionic group) to obtain an intermediate; a precursor is obtained by introducing the desired anionic group; and a desired cation is introduced by the salt exchange reaction.

The conjugated diene is appropriately selected in accordance with the target compound (component (BD1)), and for example, anthracene or a derivative thereof, or triptycene or a derivative thereof may be employed.

Examples of a method for introducing an anionic group include a method using the esterification reaction; a method using a reaction between an ammonium salt having an anionic group into which a tosyl group is introduced, and a lithium compound having a ring structure of an anion skeleton (derived from the Diels-Alder reaction); a method in which an intermediate containing a halogen atom is sulfinized to obtain a sulfinate and then oxidized the sulfinate to obtain a sulfonate; and the like.

In a case where the esterification reaction is used to introduce the anionic group, examples of a method for producing a compound represented by Formula (bd1) [compound having an anionic group represented by formula (bd1-r-an1), wherein $Y^{b10}$ is —C(=O)—O—] include a production method of an embodiment including first and second steps as shown below.

An anionic group represented by Formula (bd1-r-an1) in which $Y^{b01}$ is —C(=O)—O— is denoted as an "anionic group represented by formula (b1-r-an10)". The target compound produced by the production method of the embodiment including the first and second steps is referred to as a compound (B1-0).

As the compounds used in each step, commercially available compounds may be used, or the compounds may be synthesized.

As the organic solvent used in steps 1 and 2, any solvent capable of dissolving compounds used in each step and which does not react with the compounds may be used. Examples of the solvent include dichloromethane, dichloroethane, chloroform, tetrahydrofuran, N,N-dimethylformamide, dimethylacetamide, dimethylsulfoxide, acetonitrile, and propionitrile.

First Step

In a first step, an intermediate and a compound (I) are dissolved in an organic solvent (such as dichloromethane), and the reaction is carried out in the presence of a base. Then, filtration, concentration or the like is conducted to obtain a precursor (Bpre).

[Chemical Formula 83.]

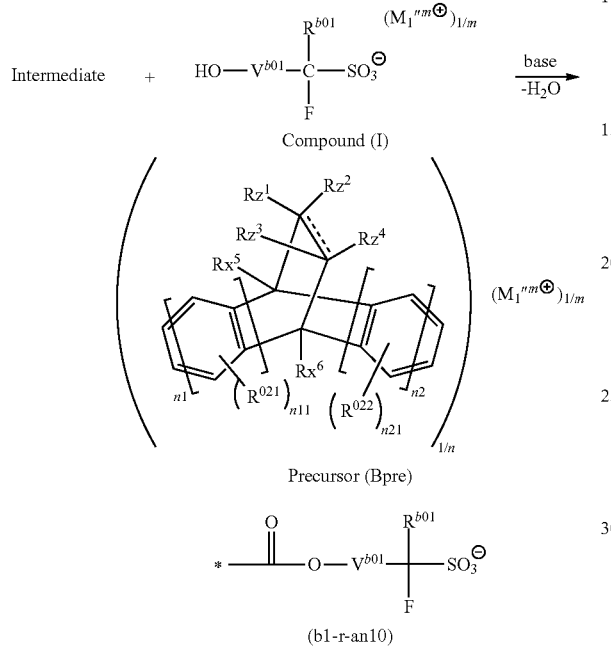

Precursor (Bpre)

(b1-r-an10)

In the formula, $R^{b01}$ and $V^{b01}$ are the same as defined for $R^{b01}$ and $V^{b01}$ in the aforementioned formula (bd1-r-an1), respectively; $(M_1^{nm+})_{1/m}$ represents an ammonium cation; $Rx^5$, $Rx^6$, $Rz^1$ to $Rz^4$, $R^{021}$, n1, n11, $R^{022}$, n2 and n21 are the same as defined for $Rx^5$, $Rx^6$, $Rz^1$ to $Rz^4$, $R^{021}$, n1, n11, $R^{022}$, n2 and n21 in the aforementioned formula (bd1-an3), respectively; provided that at least one of $Rx^5$, $Rx^6$ and $Rz^1$ to $Rz^4$ has an anionic group represented by formula (b1-r-an10), and the whole anion moiety is an n-valent anion; and n represents an integer of 1 or more.

Examples of the base added in step 1 include an organic base, such as triethylamine, 4-dimethylaminopyridine, pyridine, ethyldiisopropylaminocarbodiimide hydrochloride (EDCI), dicyclohexylcarboxyimide (DCC), diisopropylcarbodiimide and carbodiimidazole; and organic base, such as sodium hydride, $K_2CO_3$, and $Cs_2CO_3$.

The cation moiety of the compound (I) may be an ammonium cation derived from an aliphatic amine, or an ammonium cation derived from an aromatic amine.

The amount of the compound (I) used, relative to the intermediate product is preferably within a range from 1 to 3 equivalents, and more preferably from 1 to 2 equivalents.

The reaction temperature is preferably within the range of 0 to 50° C., and more preferably 5 to 40° C.

Second Step

In a second step, the precursor (Bpre) and a compound (II) for salt exchange are reacted in a solvent such as water, dichloromethane, acetonitrile, chloroform or the like. Salt exchange is carried out between the precursor (Bpre) and an organic cation in the compound (II), thereby obtaining a target compound (B1-0).

[Chemical Formula 84.]

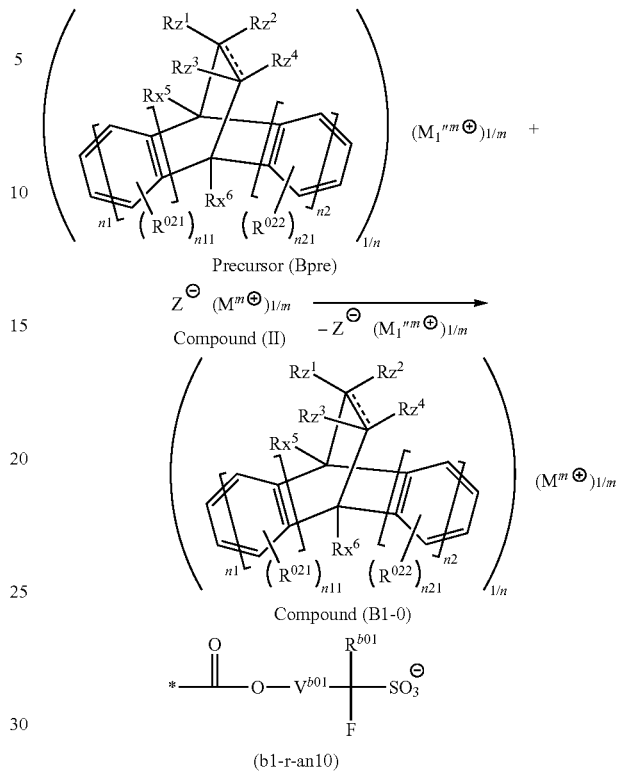

Compound (B1-0)

(b1-r-an10)

In the formula, $R^{b01}$ and $V^{b01}$ are the same as defined for $R^{b01}$ and $V^{b01}$ is the aforementioned formula (b1-r-an10), respectively; $(M_1^{nm+})_{1/m}$ represents an ammonium cation; $Rx^5$, $Rx^6$, $Rz^1$ to $Rz^4$, $R^{021}$, n1, n11, $R^{022}$, n2 and n21 are the same as defined for $Rx^5$, $Rx^6$, $Rz^1$ to $Rz^4$, $R^{021}$, n1, n11, $R^{022}$, n2 and n21 in the aforementioned formula (bd1-an3), respectively; provided that at least one of $Rx^5$, $Rx^6$ and $Rz^1$ to $Rz^4$ has an anionic group represented by formula (b1-r-an10), and the whole anion moiety is an n-valent anion; n represents an integer of 1 or more; $Z^-$ represents a non-nucleophilic ion; $(M^{m+})_{1/m}$ represents an m-valent organic cation, and is the same as defined above.

Examples of $Z^-$ include a halogen ion such as a bromine ion, a chloride ion or the like; an ion which can be an acid having a lower acidity than that of the precursor (Bpre); $BF_4^-$; $AsF_6^-$; $SbF_6^-$; $PF_6^-$; $ClO_4^-$; and the like.

The reaction temperature is preferably 0 to 100° C., and more preferably 0 to 50° C.

The reaction time varies, depending on the reactivity of the precursor (Bpre) and the compound (II) for salt exchange, the reaction temperature, and the like. However, in general, the reaction time is preferably 10 minutes to 24 hours, more preferably 10 minutes to 12 hours.

After the salt exchange reaction, the compound in the reaction liquid may be separated and purified. The separation and purification can be conducted by a conventional method. For example, any of concentration, solvent extraction, distillation, crystallization, re-crystallization and chromatography may be used.

The structure of the compound obtained in the manner described above can be identified by a general organic analysis method such as $^1H$-nuclear magnetic resonance (NMR) spectrometry, $^{13}C$-NMR spectrometry, $^{19}F$-NMR spectrometry, infrared absorption (IR) spectrometry, mass spectrometry (MS), elementary analysis and X-ray diffraction analysis.

The intermediate is appropriately selected in accordance with the target compound (B1-0), and examples thereof include a product of the Diels-Alder reaction represented by the following reaction formula. Anthracene or a derivative thereof may be used as the "Starting Material 1" in the following reaction formula. A compound having an ethylenic double bond such as an acrylic ester can be used as the "Starting Material 2" in the following reaction formula.

Examples of the intermediates also include triptycene or derivatives thereof.

[Chemical Formula 85.]

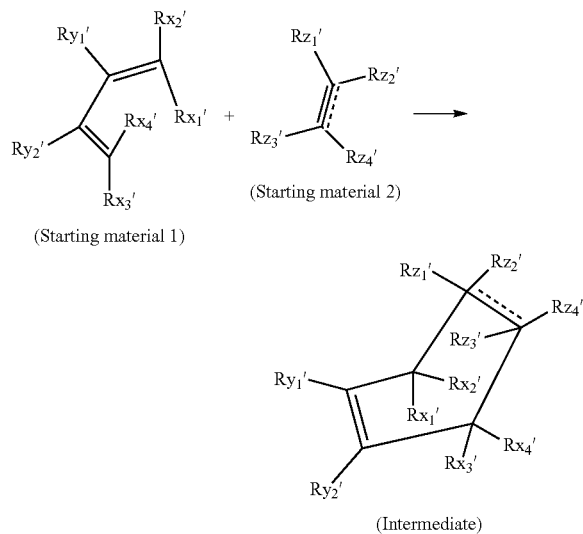

In the formula, $Rx_1'$ to $Rx_4'$ are the same as defined for $Rx^1$ to $Rx^4$, respectively; $Ry_1'$ and $Ry_2'$ are the same as defined for $Ry^1$ and $Ry^2$, respectively;

[Chemical Formula 86.]

- - - - - represents a triple bond or a double bond;

[Chemical Formula 87.]

- - - - - represents a double bond or a single bond; $Rz_1'$ to $Rz_4'$ are the same as defined for $Rz^1$ to $Rz^4$, respectively; provided that at least one of $Rx_1'$ to $Rx_4'$, $Ry_1'$, $Ry_2'$ and $Rz_1'$ to $Rz_4'$ is a leaving group-containing group capable of introducing an anionic group.

Examples of the leaving group-containing group capable of introducing an anionic group include a halogen atom, a group containing a halogen atom, and a group having a dehydratable/condensable substituent (such as a hydroxyl group, a carboxy group or the like).

In a case where the esterification reaction is used as a method for introducing an anionic group, examples of the leaving group-containing group include dehydratable/condensable substituents. For example, the intermediate in the reaction formula shown in the first step preferably has a dehydratable/condensable substituent (such as a hydroxyl group, a carboxy group or the like). The esterification reaction is carried out in the first step to obtain a sulfinate ammonium salt, which is the precursor (Bpre).

In a case where a reaction between an ammonium salt having an anionic group into which a tosyl group is introduced and a lithium compound having a ring structure of an anion skeleton (derived from the Diels-Alder reaction) is used as a method for introducing an anionic group, examples of the leaving group-containing group include a halogen atom or a group containing a halogen atom, and preferred is a bromine atom. An intermediate containing a halogen atom (preferably a bromine atom) is lithiated to form a Li-compound, which is then reacted with an ammonium salt having an anionic group into which a tosyl group is introduced, thereby obtaining a sulfonate ammonium salt which is a precursor.

In a case where a method in which an intermediate containing a halogen atom is sulfinized to obtain a sulfinate and then oxidized the sulfinate to obtain a sulfonate is used as a method for introducing an anionic group, examples of the leaving group-containing group include a halogen atom or a group containing a halogen atom, and preferred is a bromine atom. An intermediate containing a halogen atom (preferably a bromine atom) is converted to a sulfinate ammonium salt by using a sulfinating agent in the presence of an amine, and is further reacted with an oxidizing agent, thereby obtaining a sulfonate ammonium salt which is a precursor.

The target compound (component (BD1)) can be obtained by carrying out the salt exchange of second step for the sulfonate ammonium salt which is the precursor.

<Component (B)>

In the resist composition according to the present embodiment, the component (B) is an acid generator component which generates acid upon exposure. As the component (B), the aforementioned component (BD1) may be used by appropriately selecting the anionic group. Alternatively, as the component (B), an acid-generator component other than the component (BD1) may be used.

<<Component (B1)>>

As described above, the component (BD1) may be used as an acid-generator component (component (B)) which generates acid that acts on the component (A) upon exposure. Hereafter, the component (BD1) which is used as the component (B) is referred to as "component (B 1)".

Among the aforementioned component (BD1), as the acid-generator component which generates acid that acts on the component (A) upon exposure (component (B1)), a combination of an anion represented by any one of the aforementioned formulae (b1-an1) to (b1-an3) and having an anionic group represented by the aforementioned general formula (bd1-r-an1) (preferably an anionic group represented by any one of the aforementioned formulae (bd1-r-an11) to (bd1-r-an13), more preferably an anion represented by any one of the aforementioned formulae (b1-an3-1) to (b1-an3-15)) with a cation represented by any one of the aforementioned formulae (ca-1) to (ca-4) (preferably a cation represented by any one of the aforementioned formulae (ca-1-1) to (ca-1-78), (ca-1-101) to (ca-1-169), (ca-2-1), (ca-2-2), (ca-3-1) to (ca-3-7), (ca-4-1) and (ca-4-2)) may be mentioned. Specific examples of the component (B1) are shown below, although the component (B1) is not limited to these examples.

[Chemical Formula 88.]
(B1-1)
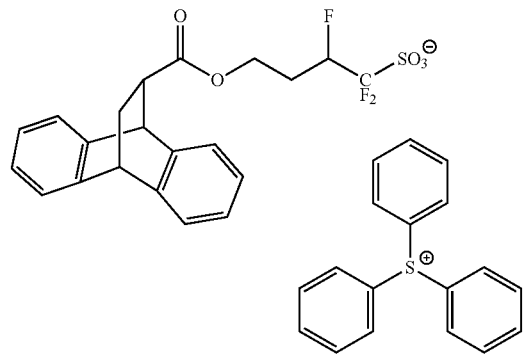
(B1-2)
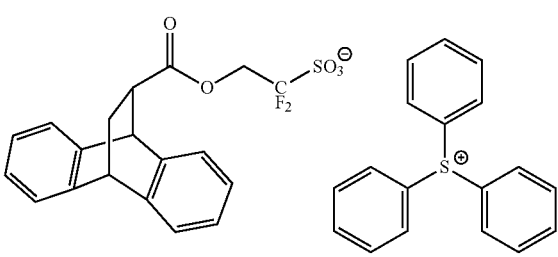
(B1-3)
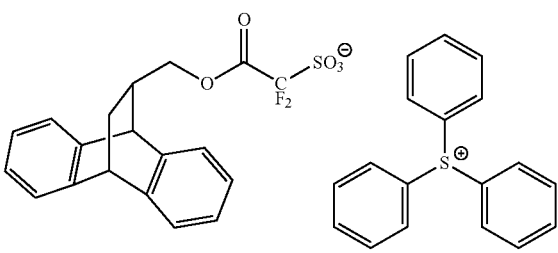
(B1-4)
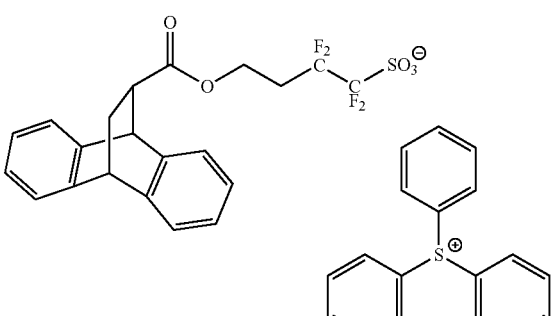
(B1-5)
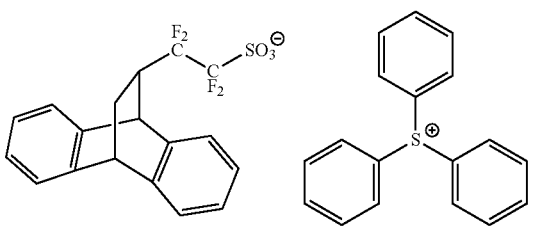
(B1-6)
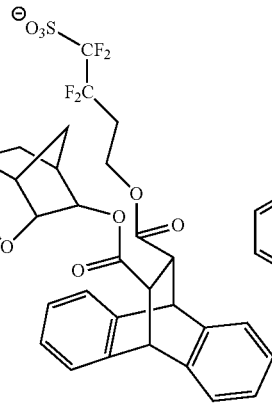
(B1-7)
(B1-8)
(B1-9)
In the resist composition of the present embodiment, as the component (B1), one kind of compound may be used, or two or more kinds of compounds may be used in combination.
<<Component (B2)>>
The resist composition of the present embodiment may contain an acid generator other than the component (B1)

(hereafter, referred to as "component (B2)"), as long as the effects of the present invention are not impaired.

As the component (B2), there is no particular limitation, and any of the known acid generators used in conventional chemically amplified resist compositions may be used.

Examples of these acid generators are numerous, and include onium salt acid generators such as iodonium salts and sulfonium salts; oxime sulfonate acid generators; diazomethane acid generators such as bisalkyl or bisaryl sulfonyl diazomethanes and poly(bis-sulfonyl)diazomethanes; nitrobenzylsulfonate acid generators; iminosulfonate acid generators; and disulfone acid generators.

As the onium salt acid generator, a compound represented by general formula (b-1) below (hereafter, sometimes referred to as "component (b-1)"), a compound represented by general formula (b-2) below (hereafter, sometimes referred to as "component (b-2)") or a compound represented by general formula (b-3) below (hereafter, sometimes referred to as "component (b-3)") may be mentioned. However, the component (b-1) does not include compounds which fall under the category of the component (B1).

[Chemical Formula 89.]

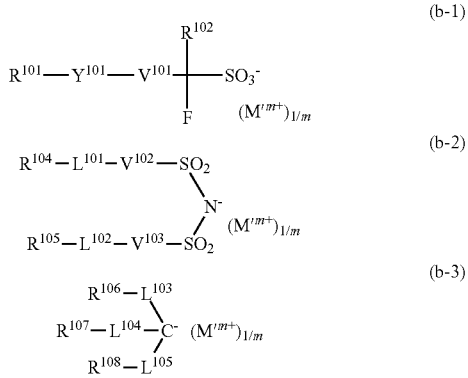

In the formulae, $R^{101}$ and $R^{104}$ to $R^{108}$ each independently represents a cyclic group which may have a substituent, a chain-like alkyl group which may have a substituent or a chain-like alkenyl group which may have a substituent, provided that $R^{104}$ and $R^{105}$ may be mutually bonded to form a ring; $R^{102}$ represents a fluorine atom or a fluorinated alkyl group of 1 to 5 carbon atoms; $Y^{101}$ represents a single bond or a divalent linking group containing an oxygen atom; $V^{101}$ to $V^{103}$ each independently represents a single bond, an alkylene group or a fluorinated alkylene group; $L^{01}$ and $L^{102}$ each independently represents a single bond or an oxygen atom; $L^{103}$ to $L^{105}$ each independently represents a single bond, —CO— or —SO$_2$—; and m represents an integer of 1 or more; and $M^{'m+}$ represents an m-valent onium cation.

{Anion Moiety}

Anion Moiety of Component (b-1)

In the formula (b-1), $R^{101}$ represents a cyclic group which may have a substituent, a chain-like alkyl group which may have a substituent or a chain-like alkenyl group which may have a substituent. The explanation of $R^{101}$ is the same as described for the "hydrocarbon group which may have a substituent (cyclic group which may have a substituent, chain-like alkyl group which may have a substituent or chain-like alkenyl group which may have a substituent)" in relation to $Rx^1$ to $Rx^4$, $Ry^1$, $Ry^2$ and $Rz^1$ to $Rz^4$ (hereafter, referred to as "$Rx^1$ to $Rx^{4"}$" and the like") in the aforementioned formula (bd1).

Among these examples, as $R^{101}$, a cyclic group which may have a substituent is preferable, and a cyclic hydrocarbon group which may have a substituent is more preferable. Specifically, a phenyl group, a naphthyl group, a group in which one or more hydrogen atoms have been removed from a polycycloalkane, a lactone-containing cyclic group represented by any one of the aforementioned formula (a2-r-1), (a2-r-3) to (a2-r-7), and an —SO$_2$— containing cyclic group represented by any one of the aforementioned formula (a5-r-1) to (a5-r-4).

In formula (b-1), $Y^{101}$ represents a single bond or a divalent linking group containing an oxygen atom.

In the case where $Y^{101}$ is a divalent linking group containing an oxygen atom, $Y^{101}$ may contain an atom other than an oxygen atom. Examples of atoms other than an oxygen atom include a carbon atom, a hydrogen atom, a sulfur atom and a nitrogen atom.

Examples of the divalent linking group containing an oxygen atom include divalent linking groups represented by the aforementioned general formula (y-a1-1) to (y-a1-8).

$Y^{101}$ is preferably a divalent linking group containing an ether bond or a divalent linking group containing an ester bond, and groups represented by the aforementioned formulas (y-a1-1) to (y-a1-5) are preferable.

In formula (b-1), $V^{101}$ represents a single bond, an alkylene group or a fluorinated alkylene group. The alkylene group and the fluorinated alkylene group for $V^{101}$ preferably has 1 to 4 carbon atoms. Examples of the fluorinated alkylene group for $V^{101}$ include a group in which part or all of the hydrogen atoms within the alkylene group for $V^{101}$ have been substituted with fluorine. Among these examples, as $V^{101}$, a single bond or a fluorinated alkylene group of 1 to 4 carbon atoms is preferable.

In formula (b-1), $R^{102}$ represents a fluorine atom or a fluorinated alkyl group of 1 to 5 carbon atoms. $R^{102}$ is preferably a fluorine atom or a perfluoroalkyl group of 1 to 5 carbon atoms, and more preferably a fluorine atom.

As a specific example of the anion moiety for the component (b-1), in the case where $Y^{101}$ a single bond, a fluorinated alkylsulfonate anion such as a trifluoromethanesulfonate anion or a perfluorobutanesulfonate anion can be mentioned; and in the case where $Y^{101}$ represents a divalent linking group containing an oxygen atom, anions represented by formulae (an-1) to (an-3) shown below can be mentioned.

[Chemical Formula 90.]

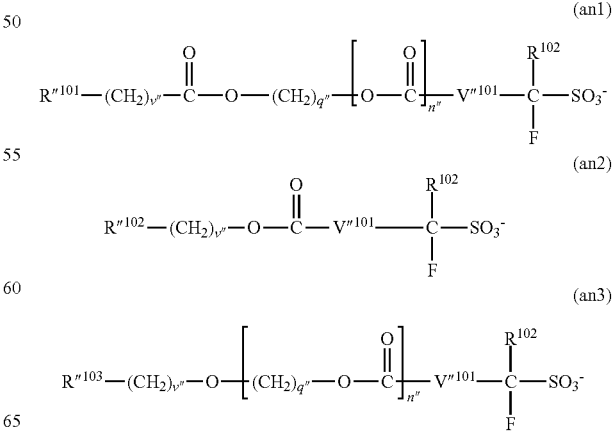

In the formulae, $R'''^{101}$ represents an aliphatic cyclic group which may have a substituent, a monovalent heterocyclic group represented by any of Formulae (r-hr-1) to (r-hr-6), or a chain-like alkyl group which may have a substituent; $R'''^{102}$ represents an aliphatic cyclic group which may have a substituent, a lactone-containing cyclic group represented by any of Formulae (a2-r-1) and (a2-r-3) to (a2-r-7), or a —SO$_2$-containing cyclic group represented by any of formulae (a5-r-1) to (a5-r-4); $R'''^{103}$ represents an aromatic cyclic group which may have a substituent, an aliphatic cyclic group which may have a substituent, or a chain-like alkenyl group which may have a substituent;

$V'''^{101}$ represents an alkylene group having 1 to 4 carbon atoms, or a fluorinated alkylene group having 1 to 4 carbon atoms; $R^{102}$ represents a fluorine atom or a fluorinated alkyl group having 1 to 5 carbon atoms; each v'' independently represents an integer of 0 to 3; each q'' independently represents an integer of 1 to 20; and n'' represents 0 or 1.

As the aliphatic cyclic group for $R'''^{101}$, $R'''^{102}$ and $R'''^{103}$ which may have a substituent, the same groups as the cyclic aliphatic hydrocarbon group for $Rx^1$ to $Rx^4$ in formula (bd1) described above are preferable. Examples of the substituent include the same substituents as those described above for the cyclic aliphatic hydrocarbon group for $Rx^1$ to $R^4$ in formula (bd1).

As the aromatic cyclic group for $R'''^{103}$ which may have a substituent, the same groups as the aromatic hydrocarbon group for the cyclic hydrocarbon group represented by $Rx^1$ to $Rx^4$ in formula (bd1) described above are preferable. As the substituent, the same groups as the substituents with which the aromatic hydrocarbon group as $Rx^1$ to $Rx^4$ in formula (bd1) may be substituted may be exemplified.

As the chain-like alkyl group for $R'''^{101}$ which may have a substituent, the same groups as those described above for $Rx^1$ to $Rx^4$ in the aforementioned formula (bd1) are preferable. As the chain-like alkenyl group as $R'''^{103}$ which may have a substituent, the same groups exemplified as the chain-like alkenyl group as $Rx^1$ to $Rx^4$ in Formula (bd1) are preferable.

Anion Moiety of Component (b-2)

In formula (b-2), $R^{104}$ and $R^{105}$ each independently represents a cyclic group which may have a substituent, a chain-like alkyl group which may have a substituent or a chain-like alkenyl group which may have a substituent, and is the same as defined for the a cyclic group which may have a substituent, a chain-like alkyl group which may have a substituent or a chain-like alkenyl group which may have a substituent for $Rx^1$ to $Rx^4$ in the aforementioned formula (bd1). $R^{104}$ and $R^{105}$ may be mutually bonded to form a ring.

As $R^{104}$ and $R^{105}$, a chain-like alkyl group which may have a substituent is preferable, and a linear or branched alkyl group or a linear or branched fluorinated alkyl group is more preferable.

The chain-like alkyl group preferably has 1 to 10 carbon atoms, more preferably 1 to 7 carbon atoms, and still more preferably 1 to 3 carbon atoms. The smaller the number of carbon atoms of the chain-like alkyl group for $R^{104}$ and $R^{105}$, the more the solubility in a resist solvent is improved. Further, in the chain-like alkyl group for $R^{104}$ and $R^{105}$, it is preferable that the number of hydrogen atoms substituted with fluorine atoms is as large as possible because the acid strength increases. The fluorination ratio of the chain-like alkyl group is preferably from 70 to 100%, more preferably from 90 to 100%, and it is particularly desirable that the chain-like alkyl group be a perfluoroalkyl group in which all hydrogen atoms are substituted with fluorine atoms.

In formula (b-2), $V^{102}$ and $V^{103}$ each independently represents a single bond, an alkylene group or a fluorinated alkylene group, and is the same as defined for $V^{101}$ in formula (b-1).

In formula (b-2), $L^{101}$ and $L^{102}$ each independently represents a single bond or an oxygen atom.

Anion Moiety of Component (b-3)

In formula (b-3), $R^{106}$ to $R^{108}$ each independently represents a cyclic group which may have a substituent, a chain-like alkyl group which may have a substituent or a chain-like alkenyl group which may have a substituent, and is the same as defined for the a cyclic group which may have a substituent, a chain-like alkyl group which may have a substituent or a chain-like alkenyl group which may have a substituent for $Rx^1$ to $Rx^4$ in the aforementioned formula (bd1).

$L^{103}$ to $L^{105}$ each independently represents a single bond, —CO— or —SO$_2$—.

{Cation Moiety}

In formulae (b-1), (b-2), and (b-3), m represents an integer of 1 or greater, $M'^{m+}$ represents an m-valent onium cation. Preferable examples of $M'^{m+}$ include a sulfonium cation or an iodonium cation. For example, an organic cation represented by any of formulae (ca-1-1) to (ca-1-78) and (ca-1-101) to (ca-1-169) is preferable.

Moreover, examples of $M'^{m+}$ in formulae (b-1), (b-2) and (b-3) also include diphenyliodonium cation, bis(4-tert-butylphenyl) iodonium cation, cations represented by formulae (ca-2-1) and (ca-2-2), cations represented by formulae (ca-3-1) to (ca-3-7), and cations respectively represented by the formulae (ca-4-1) and (ca-4-2).

Among the examples, as the cation moiety $[(M'^{m+})_{1/m}]$, an organic cation represented by any of formulae (ca-1-1) to (ca-1-78) and (ca-1-101) to (ca-1-169) is more preferable.

In the resist composition of the present embodiment, as the component (B2), one kind of compound may be used, or two or more kinds of compounds may be used in combination.

<Component (D)>

In the resist composition of the present embodiment, the component (D) is a basic component which traps acid generated from the component (B) upon exposure.

As the component (D), the aforementioned component (BD1) may be used by appropriately selecting the anionic group. Alternatively, as the component (D), a basic component other than the component (BD1) (a photodecomposable base or any other nitrogen-containing organic compound) may be used.

<<Component (D1)>>

As described above, the component (BD1) may be used as a basic component (component (D)) which is capable of trapping acid generated from the component (B) upon exposure (i.e., capable of controlling diffusion of acid).

Hereafter, the component (BD1) which is used as the component (D) is referred to as "component (D1)".

Among the component (BD1), as the basic component (component (D1)) which is capable of trapping acid generated from the component (B), a combination of an anion represented by any of the aforementioned formulae (b1-an1) to (b1-an3) and which has an anionic group represented by the formula: *—$V'^{10}$—COO$^-$ (wherein $V'^{10}$ represents a single bond or an alkylene group having 1 to 20 carbon atoms) or the aforementioned formula *—$V'^{11}$—SO$_3^-$ (wherein $V'^{11}$ represents a single bond or an alkylene group having 1 to 20 carbon atoms) (preferably an anion represented by any of formulae (b1-an3-21) to (b1-an3-24)) with a cation represented by any of formulae (ca-1) to (ca-4)

(preferably a cation represented by any of formulae (ca-1-1) to (ca-1-78), (ca-1-101) to (ca-1-169), (ca-2-1), (ca-2-2), (ca-3-1) to (ca-3-7), (ca-4-1) and (ca-4-2). Specific examples of the component (D1) are shown below, although the component (D1) is not limited to these examples.

[Chemical Formula 91.]

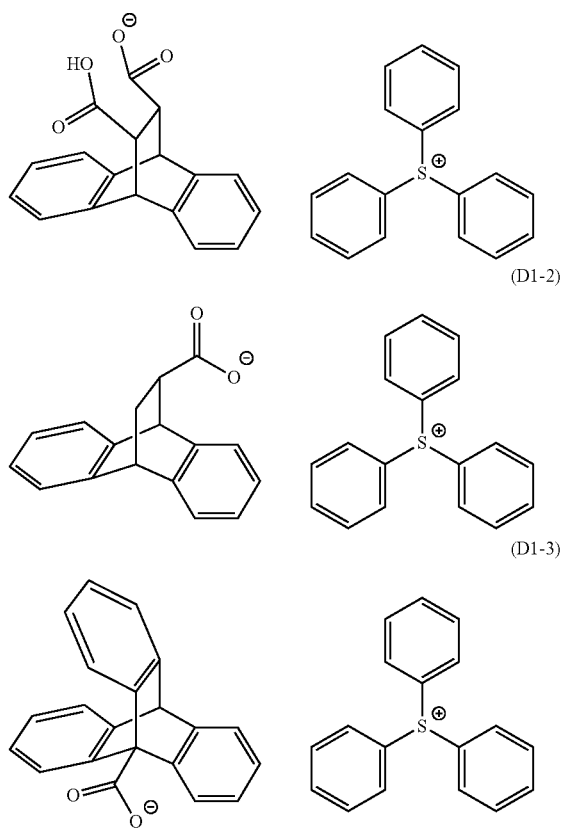

In the resist composition of the present embodiment, as the component (D1), one kind of compound may be used, or two or more kinds of compounds may be used in combination.

<<Component (D2)>>

The component (D2) is a photodecomposable base which is decomposed upon exposure and then loses the ability of controlling of acid diffusion (provided that the component (D1) is excluded).

When a resist pattern is formed using a resist composition containing the component (D2), the contrast between exposed portions and unexposed portions of the resist film is further improved.

The component (D2) is not particularly limited, as long as it is decomposed upon exposure and then loses the ability of controlling of acid diffusion. As the component (D2), at least one compound selected from the group consisting of a compound represented by general formula (d2-1) shown below (hereafter, referred to as "component (d2-1)"), a compound represented by general formula (d2-2) shown below (hereafter, referred to as "component (d2-2)") and a compound represented by general formula (d2-3) shown below (hereafter, referred to as "component (d2-3)") is preferably used.

At exposed portions of the resist film, the components (d2-1) to (d2-3) are decomposed and then lose the ability of controlling of acid diffusion (i.e., basicity), and therefore the components (d2-1) to (d2-3) cannot function as a quencher, whereas at unexposed portions, the components (d2-1) to (d2-3) functions as a quencher.

[Chemical Formula 92.]

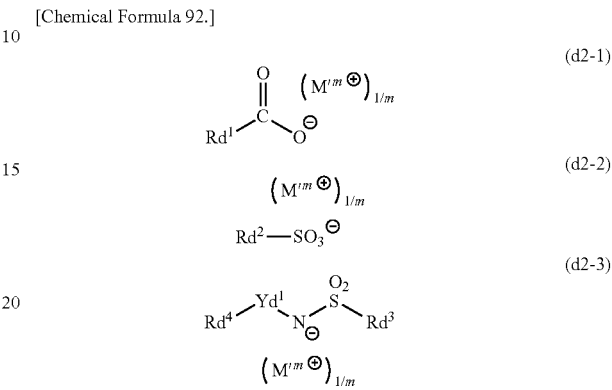

In the formulae, $Rd^1$ to $Rd^4$ represent a cyclic group which may have a substituent, a chain-like alkyl group which may have a substituent or a chain-like alkenyl group which may have a substituent, provided that, the carbon atom adjacent to the sulfur atom within the $Rd^2$ in general formula (d2-2) has no fluorine atom bonded thereto; $Yd^1$ represents a single bond or a divalent linking group; m represents an integer of 1 or more, and each $M'^{m+}$ independently represents an onium cation having a valency of m.

{Component (d2-1)}
Anion Moiety

In formula (d1-2), $Rd^1$ represents a cyclic group which may have a substituent, a chain-like alkyl group which may have a substituent or a chain-like alkenyl group which may have a substituent, and is the same groups as those defined above for $Rx^1$ to $Rx^4$ in the aforementioned formula (bd1).

Among these, as the group for $Rd^1$, an aromatic hydrocarbon group which may have a substituent, an aliphatic cyclic group which may have a substituent and a chain-like alkyl group which may have a substituent are preferable.

Examples of the substituent for these groups include a hydroxy group, an oxo group, an alkyl group, an aryl group, a fluorine atom, a fluorinated alkyl group, a lactone-containing cyclic group represented by any one of the aforementioned formulae (a2-r-1) to (a2-r-7), an ether bond, an ester bond, and a combination thereof. In the case where an ether bond or an ester bond is included as the substituent, the substituent may be bonded via an alkylene group, and a linking group represented by any one of the aforementioned formulae (y-a1-1) to (y-a1-5) is preferable as the substituent.

Preferable examples of the aromatic hydrocarbon group include a phenyl group, a naphthyl group, and a polycyclic structure (for example, a polycyclic structure formed of a ring structure having a bicyclooctane skeleton and a ring structure other than the bicyclooctane skeleton) containing a bicyclooctane skeleton.

Examples of the aliphatic cyclic group include groups in which one or more hydrogen atoms have been removed from a polycycloalkane such as adamantane, norbornane, isobornane, tricyclodecane or tetracyclododecane.

The chain-like alkyl group preferably has 1 to 10 carbon atoms, and specific examples thereof include a linear alkyl group such as a methyl group, an ethyl group, a propyl group, a butyl group, a pentyl group, a hexyl group, a heptyl group, an octyl group, a nonyl or a decyl group, and a branched alkyl group such as a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group or a 4-methylpentyl group.

In the case where the chain-like alkyl group is a fluorinated alkyl group having a fluorine atom or a fluorinated alkyl group, the fluorinated alkyl group preferably has 1 to 11 carbon atoms, more preferably 1 to 8 carbon atoms, and still more preferably 1 to 4 carbon atoms. The fluorinated alkyl group may contain an atom other than fluorine. Examples of the atom other than fluorine include an oxygen atom, a sulfur atom and a nitrogen atom.

As $Rd^1$, a fluorinated alkyl group in which part or all of the hydrogen atoms constituting a linear alkyl group have been substituted with fluorine atom(s) is preferable, and a fluorinated alkyl group in which all of the hydrogen atoms constituting a linear alkyl group have been substituted with fluorine atoms (i.e., a linear perfluoroalkyl group) is particularly desirable.

Specific examples of preferable anion moieties for the component (d2-1) are shown below.

[Chemical Formula 93.]

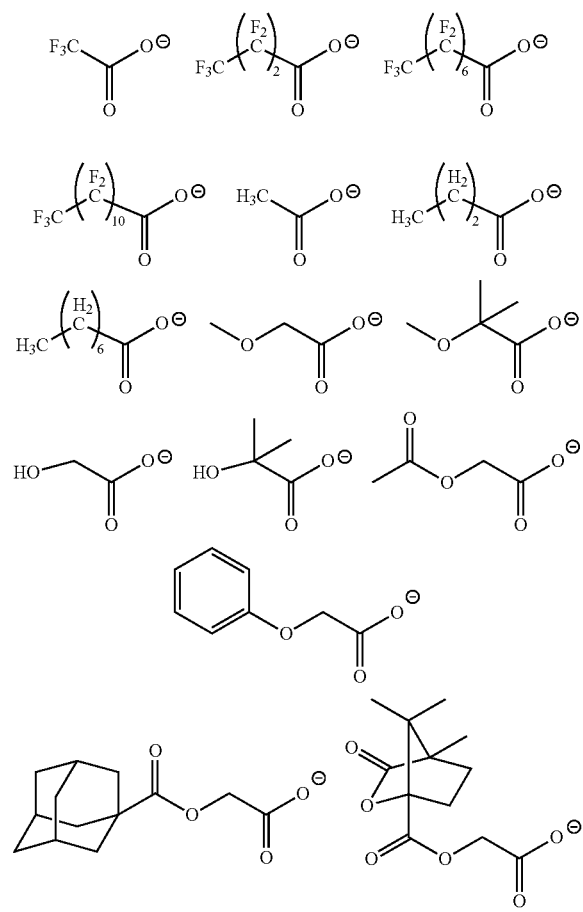

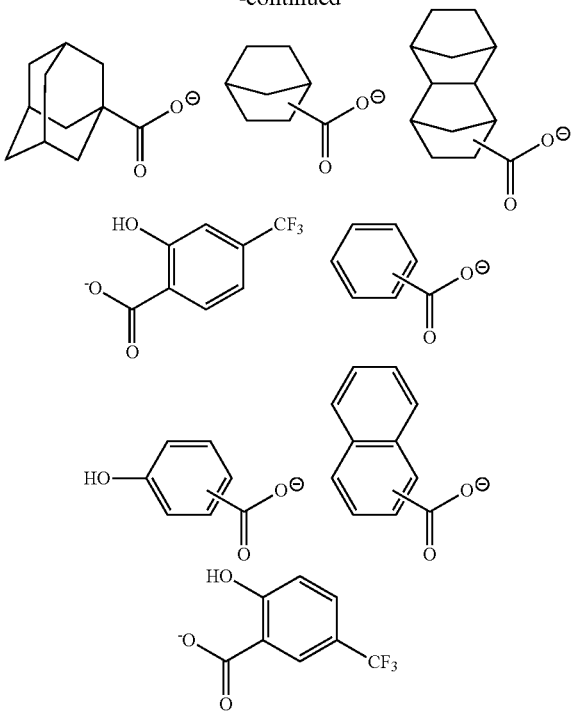

Cation Moiety

In formula (d2-1), $M'^{m+}$ represents an m-valent organic cation

The onium cation of $M'^{m+}$ may be appropriately selected from the same cations exemplified as $M'^{m+}$ in the Formulae (b-1) to (b-3).

As the component (d2-1), one kind of compound may be used, or two or more kinds of compounds may be used in combination.

{Component (d2-2)}

Anion Moiety

In formula (d2-2), $Rd^2$ represents a cyclic group which may have a substituent, a chain-like alkyl group which may have a substituent or a chain-like alkenyl group which may have a substituent, and is the same groups as those defined above for $Rx^1$ to $Rx^4$ in the aforementioned formula (bd1).

However, the carbon atom adjacent to the sulfur atom within the $Rd^2$ has no fluorine atom bonded thereto. As a result, the anion of the component (d2-2) becomes an appropriately weak acid anion, thereby improving the quenching ability of the component (D2).

As $Rd^2$, a chain-like alkyl group which may have a substituent or an aliphatic cyclic group which may have a substituent is preferable. The chain-like alkyl group preferably has 1 to 10 carbon atoms, and more preferably 3 to 10 carbon atoms. As the aliphatic cyclic group, a group in which one or more hydrogen atoms have been removed from adamantane, norbornane, isobornane, tricyclodecane, tetracyclododecane or camphor (which may have a substituent) is more preferable.

The hydrocarbon group for $Rd^2$ may have a substituent. As the substituent, the same groups as those described above for substituting the hydrocarbon group (e.g., aromatic hydrocarbon group, aliphatic cyclic group, chain-like alkyl group) for $Rd^1$ in the formula (d2-1) can be mentioned.

Specific examples of preferable anion moieties for the component (d2-2) are shown below.

[Chemical Formula 94.]

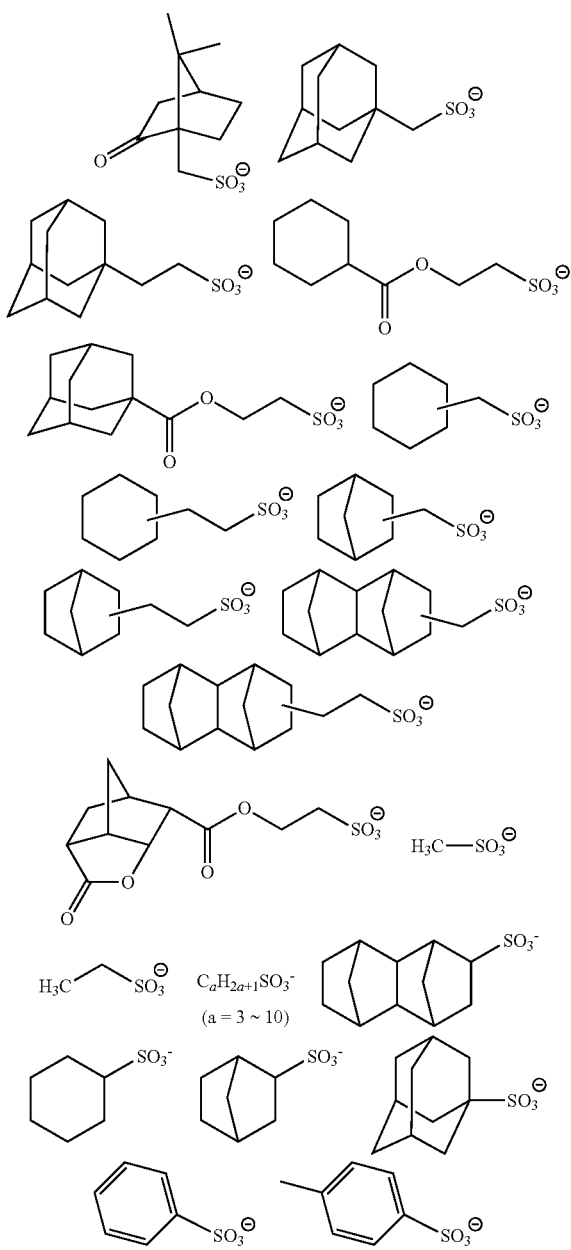

Cation Moiety

In formula (d2-2), $M'^{m+}$ is an m-valent onium cation, and is the same as defined for $M'^{m+}$ in the aforementioned formula (d2-1).

As the component (d2-2), one kind of compound may be used, or two or more kinds of compounds may be used in combination.

{Component (d2-3)}

Anion Moiety

In formula (d2-3), $Rd^3$ represents a cyclic group which may have a substituent, a chain-like alkyl group which may have a substituent or a chain-like alkenyl group which may have a substituent, and is the same groups as those defined above for $Rx^1$ to $Rx^4$ in the aforementioned formula (bd1), and a cyclic group containing a fluorine atom, a chain-like alkyl group or a chain-like alkenyl group is preferable.

Among these, a fluorinated alkyl group is preferable, and more preferably the same fluorinated alkyl groups as those described above for $Rd^1$.

In formula (d2-3), $Rd^4$ represents a cyclic group which may have a substituent, a chain-like alkyl group which may have a substituent or a chain-like alkenyl group which may have a substituent, and is the same groups as those defined above for $Rx^1$ to $Rx^4$ in the aforementioned formula (bd1).

Among these, an alkyl group which may have substituent, an alkoxy group which may have substituent, an alkenyl group which may have substituent or a cyclic group which may have substituent is preferable.

The alkyl group for $Rd^4$ is preferably a linear or branched alkyl group of 1 to 5 carbon atoms, and specific examples include a methyl group, an ethyl group, a propyl group, an isopropyl group, an n-butyl group, an isobutyl group, a tert-butyl group, a pentyl group, an isopentyl group, and a neopentyl group. Part of the hydrogen atoms within the alkyl group for $Rd^4$ may be substituted with a hydroxy group, a cyano group or the like.

The alkoxy group for $Rd^4$ is preferably an alkoxy group of 1 to 5 carbon atoms, and specific examples thereof include a methoxy group, an ethoxy group, an n-propoxy group, an iso-propoxy group, an n-butoxy group and a tert-butoxy group. Among these, a methoxy group and an ethoxy group are preferable.

As the alkenyl group for $Rd^4$, the same groups as those described above for $Rx^1$ to $Rx^4$ in the aforementioned formula (bd1) can be mentioned, and a vinyl group, a propenyl group (an allyl group), a 1-methylpropenyl group and a 2-methylpropenyl group are preferable. These groups may have an alkyl group of 1 to 5 carbon atoms or a halogenated alkyl group of 1 to 5 carbon atoms as a substituent.

As the cyclic group for $Rd^4$, the same groups as those described above for $Rx^1$ to $Rx^4$ in the aforementioned formula (bd1) can be mentioned. Among these, as the cyclic group, an alicyclic group (e.g., a group in which one or more hydrogen atoms have been removed from a cycloalkane such as cyclopentane, cyclohexane, adamantane, norbomane, isobomane, tricyclodecane or tetracyclododecane) or an aromatic group (e.g., a phenyl group or a naphthyl group) is preferable. In the case where $Rd^4$ is an aliphatic cyclic group, the resist composition satisfactorily dissolves in an organic solvent, and the lithography properties are improved.

In formula (d2-3), $Yd^1$ represents a single bond or a divalent linking group.

The divalent linking group for $Yd^1$ is not particularly limited, and examples thereof include a divalent hydrocarbon group (aliphatic hydrocarbon group, or aromatic hydrocarbon group) which may have a substituent and a divalent linking group containing a hetero atom. The divalent linking groups are the same as defined for the divalent hydrocarbon group which may have a substituent and the divalent linking group containing a hetero atom explained above as the divalent linking group for the aforementioned $Ya^{x1}$.

As $Yd^1$, a carbonyl group, an ester bond, an amide bond, an alkylene group or a combination of these is preferable. As the alkylene group, a linear or branched alkylene group is more preferable, and a methylene group or an ethylene group is still more preferable.

Specific examples of preferable anion moieties for the component (d2-3) are shown below.

[Chemical Formula 95.]
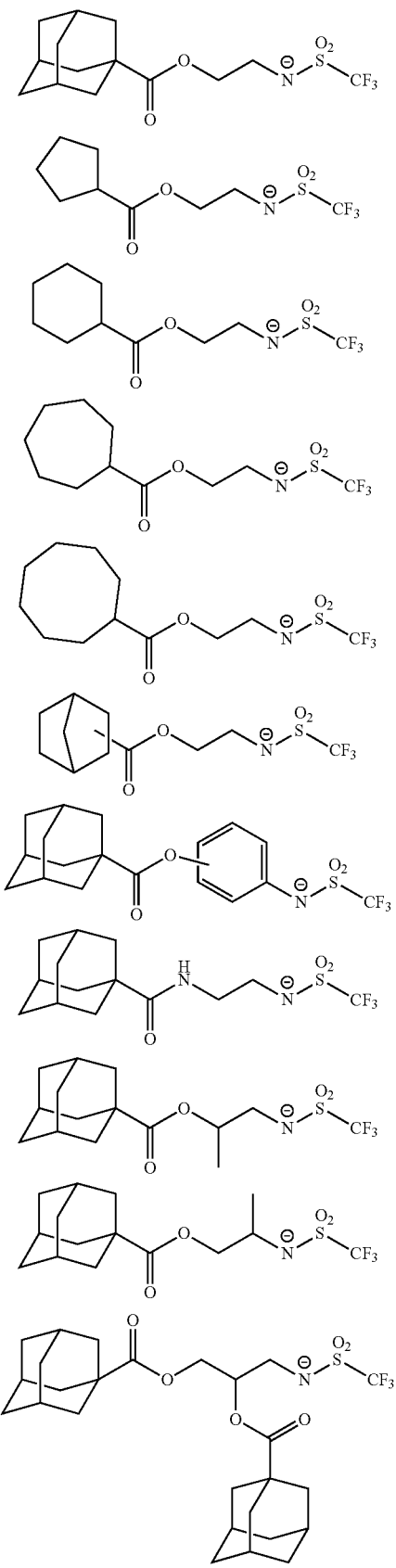
-continued
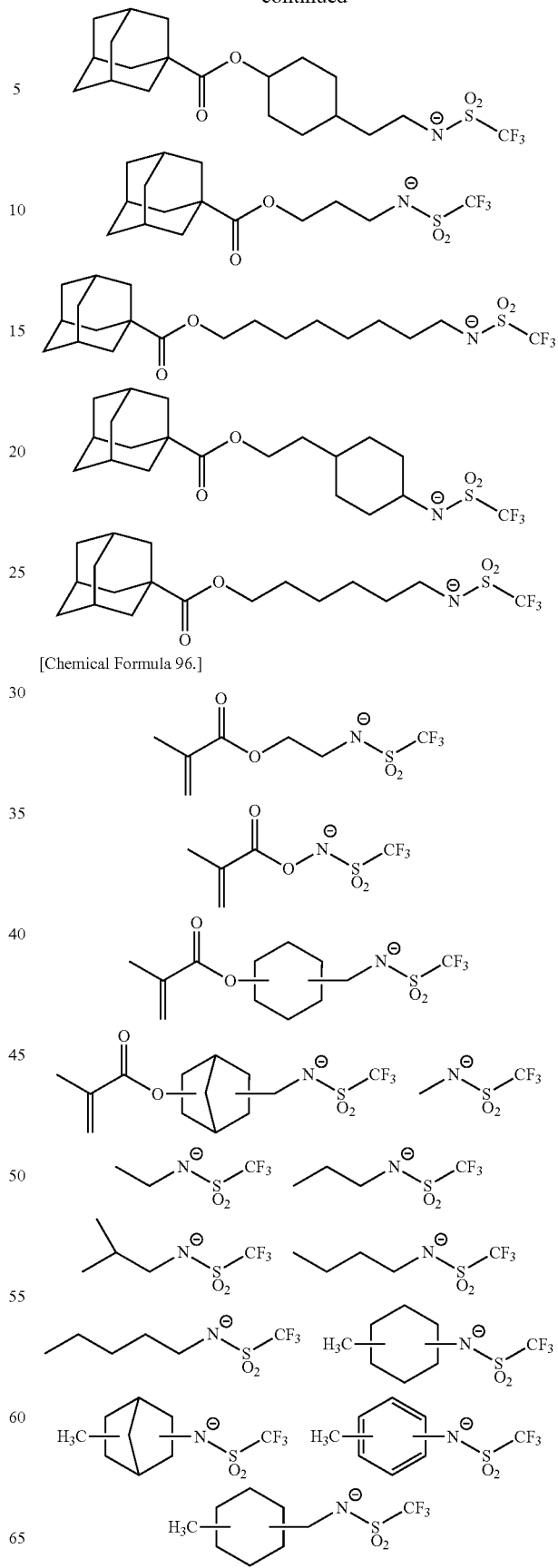
[Chemical Formula 96.]

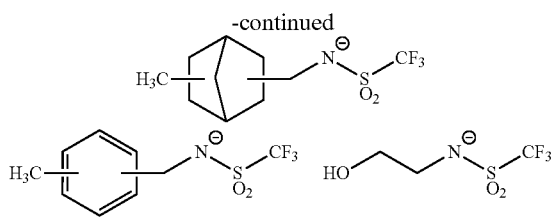

Cation Moiety

In formula (d2-3), $M'^{m+}$ is an m-valent onium cation, and is the same as defined for $M^{m+}$ in the aforementioned formula (d2-1).

As the component (d2-3), one kind of compound may be used, or two or more kinds of compounds may be used in combination.

As the component (D2), one kind of the aforementioned components (d2-1) to (d2-3) may be used, or at least two kinds of the aforementioned components (d2-1) to (d2-3) may be used.

Production Method of Component (D2):

The production methods of the components (d2-1) and (d2-2) are not particularly limited, and the components (d2-1) and (d2-2) can be produced by conventional methods.

Further, the production method of the component (d2-3) is not particularly limited, and the component (d2-3) can be produced in the same manner as disclosed in US2012-0149916.

<<Component (D3)>>

The component (D3) is a base component and is a nitrogen-containing organic compound component (here, a component corresponding to the component (D1) or (D2) is excluded) that acts as an acid diffusion control agent in the resist composition.

The component (D3) is not particularly limited as long as it acts as an acid diffusion control agent and does not correspond to the components (D1) and (D2). Examples thereof include compounds including an anion moiety and a cation moiety, aliphatic amines and the like.

Examples of the compound including the anion moiety and the cation moiety as the component (D3) include those in which the cation moiety is an ammonium cation as the components (d2-1) to (d2-3). Examples of the ammonium cation include a cation (primary to quaternary ammonium cations) in which $NH_4$, or H bonded to its nitrogen atom is substituted with a hydrocarbon group which may have a hetero atom, or a cyclic cation forming a ring with the nitrogen atom thereof.

Among the aliphatic amines, secondary aliphatic amines and tertiary aliphatic amines are preferable.

An aliphatic amine is an amine having one or more aliphatic groups, and the aliphatic groups preferably have 1 to 12 carbon atoms.

Examples of these aliphatic amines include amines in which at least one hydrogen atom of ammonia ($NH_3$) has been substituted with an alkyl group or hydroxyalkyl group of no more than 12 carbon atoms (i.e., alkylamines or alkylalcoholamines), and cyclic amines.

Specific examples of alkylamines and alkylalcoholamines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decylamine, and tri-n-dodecylamine; and alkyl alcohol amines such as diethanolamine, triethanolamine, diisopropanolamine, triisopropanolamine, di-n-octanolamine, and tri-n-octanolamine. Among these, trialkylamines of 5 to 10 carbon atoms are preferable, and tri-n-pentylamine and tri-n-octylamine are particularly desirable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine, and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of other aliphatic amines include tris(2-methoxymethoxyethyl)amine, tris {2-(2-methoxyethoxy)ethyl}amine, tris {2-(2-methoxyethoxymethoxy)ethyl}amine, tris {2-(1-methoxyethoxy)ethyl}amine, tris {2-(1-ethoxyethoxy)ethyl}amine, tris {2-(1-ethoxypropoxy)ethyl}amine, tris[2-{2-(2-hydroxyethoxy)ethoxy}ethyl]amine and triethanolamine triacetate, and triethanolamine triacetate is preferable.

Further, as the component (D3), an aromatic amine may be used.

Examples of aromatic amines include 4-dimethylaminopyridine, pyrrole, indole, pyrazole, imidazole and derivatives thereof, as well as tribenzylamine, 2,6-diisopropylaniline and N-tert-butoxycarbonylpyrrolidine.

As the component (D3), one kind of compound may be used, or two or more kinds of compounds may be used.

In the resist composition of the present embodiment, at least one of the component (B) and the component (D) contains the component (BD1). That is, the resist composition of the present embodiment contains at least one of the component (B1) and the component (D1).

Specific examples of the combination of the component (B) and the component (D) include a combination of the component (B1) with at least one of the component (D2) and the component (D3); a combination of the component (B2) with the component (D1); and a combination of the component (B1) with the component (D1). Among these examples, in terms of reducing roughness of the resist pattern, a combination in which the component (B) contains the component (B1) is preferable.

In the resist composition of the present embodiment, the total amount of the component (B) and the component (D) relative to 100 parts by weight of the component (A) is 20 to 70 parts by weight, preferably 20 to 60 parts by weight, and more preferably 25 to 55 parts by weight.

When the total amount of the component (B) and the component (D) is at least as large as the lower limit of the above-mentioned range, in the formation of a resist pattern, various lithography properties such as sensitivity, reduction of roughness and pattern shape may be improved. On the other hand, when the total amount of the component (B) and the component (D) is no more than the upper limit of the above-mentioned range, film thickness loss of the resist pattern may be more reliably suppressed.

In the resist composition of the present embodiment, the amount of the component (BD1) contained in the component (B), i.e., the amount of the component (B1) relative to 100 parts by weight of the component (A) is preferably 20 parts by weight or more, more preferably 20 to 60 parts by weight, and more preferably 25 to 50 parts by weight.

In the resist composition, the amount of the component (B1) within the entire component (B) capable of generating acid which acts on the component (A) is, for example, 50% by weight or more, preferably 70% by weight or more, and more preferably 95% by weight or more. The amount of the component (B1) within the component (B) may be even 100% by weight.

When the amount of the component (B1) is at least as large as the lower limit of the above-mentioned preferable range, in the formation of a resist pattern, various lithography properties such as sensitivity, resolution, LWR (line width roughness) and pattern shape are improved. On the other hand, when the amount of the component (B1) is no more than the upper limit of the above-mentioned preferable range, film thickness loss of the resist pattern may be more reliably suppressed.

Further, in terms of enhancing the effects of the present invention, in the resist composition, the ratio of the amount of the component (B1) to the amount of the component (D) ((B1)/(D) molar ratio) is preferably more than 1, more preferably 1.2 to 15, and still more preferably 1.5 to 9.

When the resist composition contains the component (B2), the amount of the component (B2) relative to 100 parts by weight of the component (A) is preferably 50 parts by weight or less, more preferably 1 to 40 parts by weight, and still more preferably 5 to 30 parts by weight.

In the case where the resist composition contains the component (B2), in the resist composition, the amount of the component (B2) within the entire component (B) capable of generating acid which acts on the component (A) is, for example, 50% by weight or less, more preferably 30% by weight or less, and still more preferably 0 to 5% by weight.

When the amount of the component (B2) is within the above-mentioned range, formation of a resist pattern may be satisfactorily performed.

In the resist composition of the present embodiment, the amount of the component (BD1) contained in the component (D), i.e., the amount of the component (D1) relative to 100 parts by weight of the component (A) is preferably 4 to 30 parts by weight, more preferably 5 to 20 parts by weight or more, and still more preferably 6 to 15 parts In the resist composition, the amount of the component (D1) within the component (D) capable of trapping acid generated from the component (B) upon exposure is not particularly limited, and may be appropriately adjusted within the range of 0 to 100% by weight.

When the amount of the component (D1) is at least as large as the lower limit of the above-mentioned preferable range, satisfactory lithography properties and satisfactory pattern shape may be more reliably obtained. On the other hand, when the amount of the component (D1) is no more than the upper limit of the above-mentioned preferable range, a good balance may be achieved with the other structural units, and the lithography properties may be improved.

Further, in terms of enhancing the effects of the present invention, in the resist composition, the ratio of the amount of the component (B) to the amount of the component (D1) ((B)/(D1) molar ratio) is preferably more than 1, more preferably 1.2 to 15, and still more preferably 1.5 to 9.

In the case where the resist composition contains the component (D2), the amount of the component (D2) relative to 100 parts by weight of the component (A) is preferably within a range from 0.1 to 30 parts by weight, more preferably from 0.5 to 20 parts by weight, and still more preferably from 1 to 15 parts by weight.

In the resist composition, the amount of the component (D2) within the component (D) capable of trapping acid generated from the component (B) upon exposure is not particularly limited, and may be appropriately adjusted within the range of 0 to 100% by weight.

When the amount of the component (D2) is at least as large as the lower limit of the above-mentioned range, excellent lithography properties and excellent resist pattern shape can be more reliably obtained. On the other hand, when the amount of the component (D2) is no more than the upper limit of the above-mentioned preferable range, a good balance may be achieved with the other structural units, and the lithography properties may be improved.

When the resist composition contains the component (D3), the amount of the component (D3) is typically used in an amount within a range from 0.01 to 5 parts by weight, relative to 100 parts by weight of the component (A). When the amount of the component (D3) is within the above-mentioned preferable range, a good balance may be achieved with the other structural units, and the lithography properties may be improved.

<Component (BD1-1)>

In the resist composition of the present embodiment, the component (BD1) may be a compound including a cation moiety and an anion moiety represented by general formula (bd1-1) shown below (hereafter, sometimes referred to as "component (BD1-1)").

[Chemical Formula 97.]

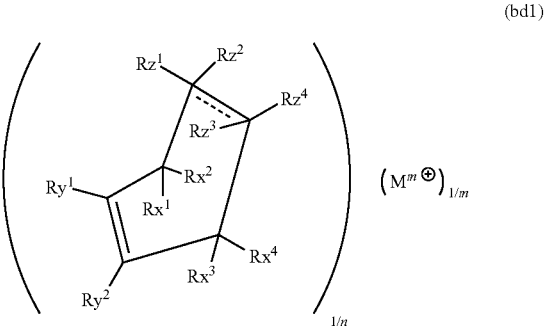

(bd1)

In the formula, $Rx^1$ to $Rx^4$ each independently represents a hydrogen atom or a hydrocarbon group which may have a substituent, or two or more of $Rx^1$ to $Rx^4$ may be mutually bonded to form a ring structure; $Ry^1$ and $Ry^2$ each independently represents a hydrogen atom or a hydrocarbon group which may have a substituent, or $Ry^1$ and $Ry^2$ may be mutually bonded to form a ring structure;

[Chemical Formula 98.]

----- represents a double bond or a single bond; $Rz^1$ to $Rz^4$ each independently represents, where valence allows, a hydrogen atom or a hydrocarbon group which may have a substituent, or two or more of $Rz^1$ to $Rz^4$ may be mutually bonded to form a ring structure; provided that at least one of $Rx^1$ to $Rx^4$, $Ry^1$, $Ry^2$ and $Rz^1$ to $Rz^4$ has an anionic group, and the whole anion moiety is an n-valent anion; n represents an integer of 1 or more; m represents an integer of 1 or more; and $M_1^{m+}$ is a cation represented by general formula (ca-0-1) or (ca-0-2) shown below; provided that the number of benzene rings contained in the cation is 0 to 2.

[Chemical Formula 99.]

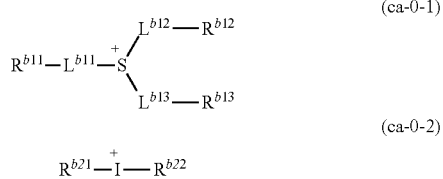

In the formulae, $R^{b11}$ to $R^{b13}$, $R^{b21}$ and $R^{b22}$ each independently represents a hydrocarbon group which may have a substituent; $R^{b12}$ and $R^{b13}$ may be mutually bonded to form a ring; and $L^{b11}$ to $L^{b13}$ each independently represents a divalent linking group or a single bond.

Anion Moiety

The anion moiety of the compound (BD1-1) is the same as defined for the anion moiety of the compound (BD1).

That is, in formula (bd1-1), $Rx^1$ to $Rx^4$, $Ry^1$, $Ry^2$, $Rz^1$ to $Rz^4$ and n are the same as defined for $Rx^1$ to $Rx^4$, $Ry^1$, $Ry^2$, $Rz^1$ to $Rz^4$ and n, respectively.

Cation Moiety $((M_1^{m+})_{1/m})$

In formula (bd1-1), $M_1^{m+}$ is a cation represented by general formula (ca-0-1) or (ca-0-2) shown below. However, the number of benzene rings contained in the cation is 0 to 2. By virtue of the number of benzene rings contained in the cation being 0 to 2, OoB resistance becomes satisfactory.

[Chemical Formula 100.]

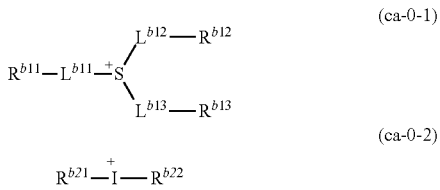

In the formulae, $R^{b11}$ to $R^{b13}$, $R^{b21}$ and $R^{b22}$ each independently represents a hydrocarbon group which may have a substituent; $R^{b12}$ and $R^{b13}$ may be mutually bonded to form a ring; and $L^{b11}$ to $L^{b13}$ each independently represents a divalent linking group or a single bond.

In formulae (ca-0-1) and (ca-0-2), examples of the hydrocarbon group for $R^{b11}$ to $R^{b13}$, $R^{b21}$ and $R^{b22}$ which may have a substituent include a cyclic group which may have a substituent, a chain-like alkyl group which may have a substituent, and a chain-like alkenyl group which may have a substituent.

The cyclic group which may have a substituent, the chain-like alkyl group which may have a substituent, and the chain-like alkenyl group which may have a substituent for $R^{b11}$ to $R^{b13}$, $R^{b21}$ and $R^{b22}$ are the same as defined for the cyclic group which may have a substituent, the chain-like alkyl group which may have a substituent, and the chain-like alkenyl group which may have a substituent for $Rx^1$ to $Rx^4$, $Ry^1$, $Ry^2$ and $Rz^1$ to $Rz^4$ in the aforementioned formula (bd1).

Examples of the substituent for $R^{b11}$ to $R^{b13}$ include an alkyl group, a halogen atom, a halogenated alkyl group, a carbonyl group, a cyano group, an amino group, an aryl group, and groups represented by the aforementioned general formulae (ca-r-1) to (ca-r-7).

In formula (ca-0-1), $R^{b12}$ and $R^{b13}$ may be mutually bonded to form a ring.

In the case where $R^{b12}$ and $R^{b13}$ are mutually bonded to form a ring with the sulfur atom, the ring may be formed through a hetero atom such as a sulfur atom, an oxygen atom or a nitrogen atom, or a functional group such as a carbonyl group, —SO—, —SO$_2$—, —SO$_{03}$—, —COO—, —CONH— or —N(R$_N$)— (R$_N$ represents an alkyl group having 1 to 5 carbon atoms). The ring containing the sulfur atom in the skeleton thereof is preferably a 3 to 10-membered ring, and most preferably a 5 to 7-membered ring. Specific examples of the ring formed include a thiophene ring, a thiazole ring, a benzothiophene ring, a thianthrene ring, a benzothiophene ring, a dibenzothiophene ring, a 9H-thioxanthene ring, a thioxanthone ring, a phenoxathiin ring, a tetrahydrothiophenium ring, and a tetrahydrothiopyranium ring.

In formula (ca-0-1), $L^{b11}$ to $L^{b13}$ each independently represents a divalent linking group or a single bond.

The divalent linking group for $L^{b11}$ to $L^{b13}$ is the same as defined for the divalent linking group for $Ya^{x1}$ in the aforementioned formula (a10-1).

Among these examples, as $L^{b11}$ to $L^{b13}$, a single bond, an ester bond [—C(=O)—O—], an ether bond (—O—), —C(=O)—NH—, a linear or branched alkylene group or a combination of these groups is preferable, and a single bond or an ester bond [—C(=O)—O—] is preferable.

In formula (bd1-1), as the cation moiety for $M_1^{m+}$, a cation represented by the aforementioned formula (ca-0-1) is preferable, a cation represented by the aforementioned formula (ca-0-1) in which $R^{b11}$ is a cyclic group which may have a substituent and $R^{b12}$ and $R^{b13}$ are mutually bonded to form a ring is more preferable, and a cation represented by any one of general formulae (ca-0-11) to (ca-0-13) shown below is still more preferable.

[Chemical Formula 101.]

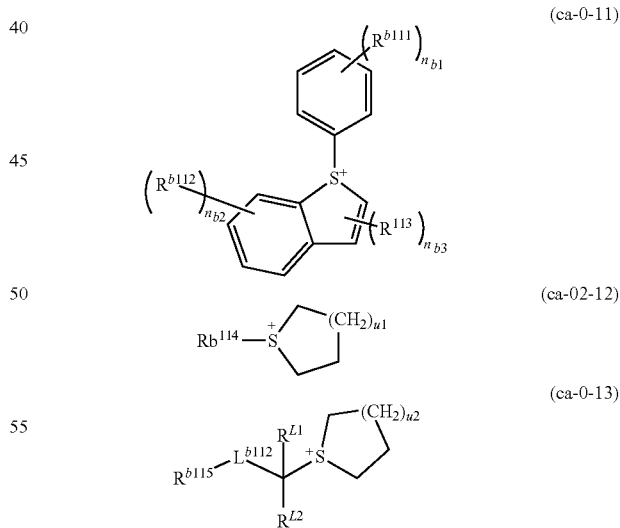

wherein $R^{b111}$ to $R^{b113}$ each independently represents an alkyl group, an acetyl group, an alkoxy group, a carboxy group, a hydroxy group or a hydroxyalkyl group; $n_{b1}$ and $n_{b2}$ each independently represents an integer of 0 to 3; $n_{b3}$ represents an integer of 0 to 2; $R^{b114}$ and $R^{b115}$ each independently represents a cyclic group which may have a substituent; $L^{b112}$ represents —C(=O)— or —C(=O)—

O—; $R^{L1}$ and $R^{L2}$ each independently represents an alkyl group having 1 to 5 carbon atoms; $R^{L1}$ and $R^{L2}$ may be mutually bonded to form a ring;

and u1 and u2 each independently represents an integer of 1 to 3.

In formula (ca-0-11), the alkyl group for $R^{b111}$ to $R^{b113}$ is preferably an alkyl group having 1 to 5 carbon atoms, more preferably a linear or branched alkyl group, an still more preferably a methyl group, an ethyl group, a propyl group, an isopropyl group, an n-butyl group or a tert-butyl group.

The alkoxy group for $R^{b111}$ to $R^{b113}$ is preferably an alkoxy group of 1 to 5 carbon atoms, more preferably a linear or branched alkoxy group, and most preferably a methoxy group or an ethoxy group.

The hydroxyalkyl group for $R^{b111}$ to $R^{b113}$ is preferably the aforementioned alkyl group in which one or more hydrogen atoms have been substituted with a hydroxy group, and examples thereof include a hydroxymethyl group, a hydroxyethyl group and a hydroxypropyl group.

$n_{b1}$ and $n_{b2}$ each independently represents an integer of 0 to 3, preferably an integer of 0 to 2, and more preferably 0 or 1.

In formula (ca-0-12), the cyclic group (which may have a substituent) for $R^{b114}$ is the same as defined for the cyclic group (which may have a substituent) for $Rx^1$ to $Rx^4$, $Ry^1$, $Ry^2$ and $Rz^1$ to $Rz^4$ in the aforementioned formula (bd1). Among these examples, as $R^{b114}$, an aromatic hydrocarbon group which may have a substituent is preferable, and a phenyl group which may have a substituent or a naphthyl group which may have a substituent is more preferable.

As the substituent which the cyclic group for $R^{b114}$ may have, an alkyl group, a halogen atom, a halogenated alkyl group, a carbonyl group, a cyano group, an amino group, an aryl group or a group represented by any one of the aforementioned formulae (ca-r-1) to (ca-r-7) is preferable, an alkyl group or a group represented by any one of the aforementioned formulae (ca-r-1) to (ca-r-3) is more preferable, and a group represented by the aforementioned formula (ca-r-2) is still more preferable.

In formula (ca-0-12), u1 is preferably 1 or 2.

In formula (ca-0-13), the cyclic group (which may have a substituent) for $R^{b115}$ is the same as defined for the cyclic group (which may have a substituent) for $Rx^1$ to $Rx^4$, $Ry^1$, $Ry^2$ and $Rz^1$ to $Rz^4$ in the aforementioned formula (bd1). Among these examples, as $R^{b115}$, an aromatic hydrocarbon group which may have a substituent or an alicyclic hydrocarbon group which may have a substituent is preferable, and a phenyl group which may have a substituent, a naphthyl group which may have a substituent, an adamantyl group which may have a substituent or an —$SO_2$-containing cyclic group is more preferable.

As the substituent which the cyclic group for $R^{b115}$ may have, an alkyl group, a halogen atom, a halogenated alkyl group, a carbonyl group, a cyano group, an amino group, an aryl group or a group represented by any one of the aforementioned formulae (ca-r-1) to (ca-r-7) is preferable, an alkyl group or a group represented by any one of the aforementioned formulae (ca-r-1) to (ca-r-3) is more preferable, and an alkyl group is still more preferable.

In formula (ca-0-13), u2 is preferably 1 or 2.

In formula (ca-0-13), the alkyl group for $R^{L1}$ and $R^{L2}$ is preferably a linear or branched alkyl group, more preferably a methyl group, an ethyl group, a propyl group, an isopropyl group, an n-butyl group or a tert-butyl group, and still more preferably a methyl group.

In the case where $R^{L1}$ and $R^{L2}$ are mutually bonded to form a ring, the ring is preferably a cyclopentyl group, a cyclohexyl group or a cycloheptyl group, and more preferably a cyclopentyl group or a cyclohexyl group.

Specific examples of preferable cations represented by formula (ca-0-11) include cations represented by formulae (ca-01-1) to (ca-01-5) shown below.

[Chemical Formula 102.]

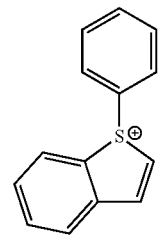

(ca-01-1)

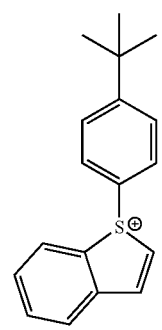

(ca-01-2)

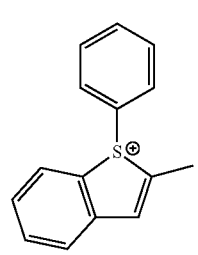

(ca-01-3)

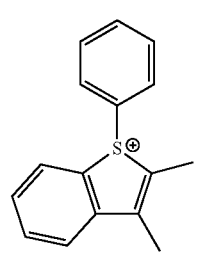

(ca-01-4)

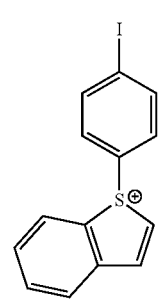

(ca-01-5)

Specific examples of preferable cations represented by formula (ca-0-12) include cations represented by formulae (ca-02-1) to (ca-02-15) shown below.

[Chemical Formula 103.]
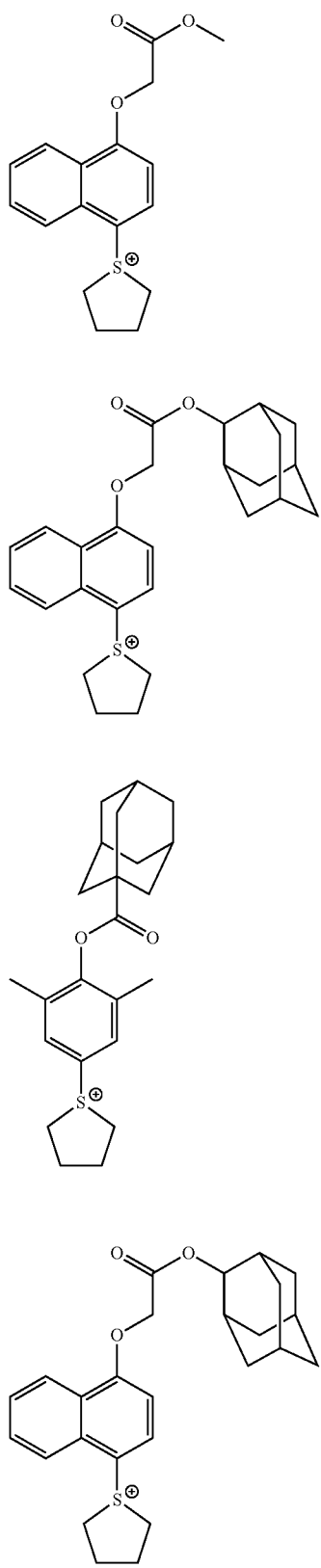
(ca-02-1)
(ca-02-2)
(ca-02-3)
(ca-02-4)
-continued
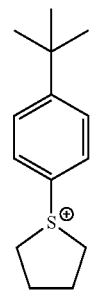
(ca-02-5)
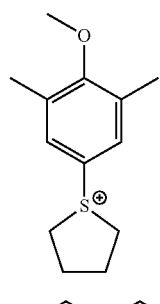
(ca-02-6)
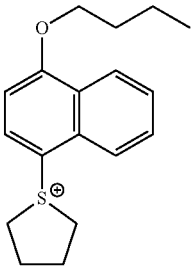
(ca-02-7)
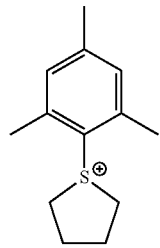
(ca-02-8)
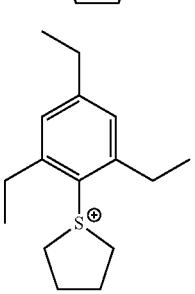
(ca-02-9)
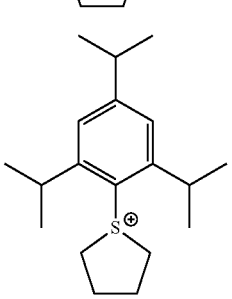
(ca-02-10)

(ca-02-10) 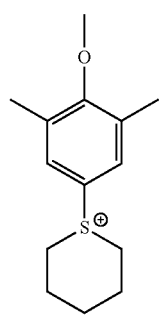
(ca-02-11) 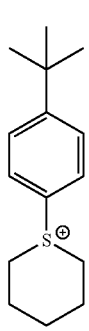
(ca-02-12) 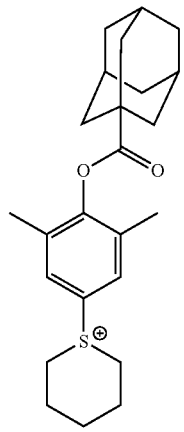
(ca-02-13) 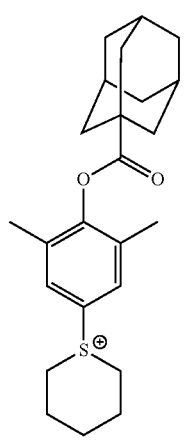
(ca-02-14) 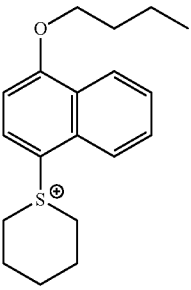
(ca-02-15) 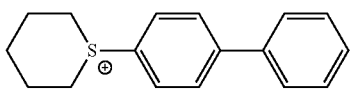
Specific examples of preferable cations represented by formula (ca-0-13) include cations represented by formulae (ca-03-1) to (ca-03-6) shown below.
[Chemical Formula 104.]
(ca-03-1) 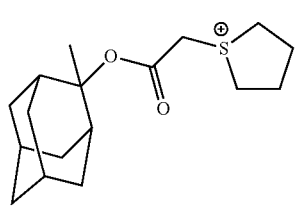
(ca-03-2) 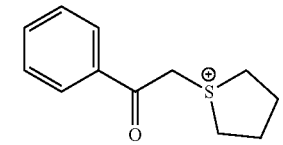
(ca-03-3) 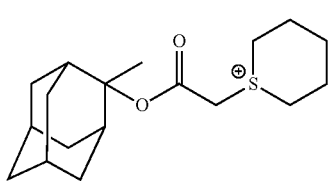
(ca-03-4) 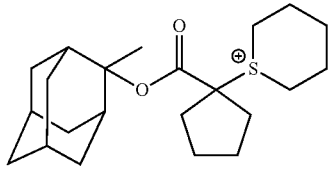
(ca-03-5) 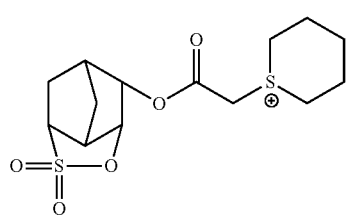

(ca-03-6)
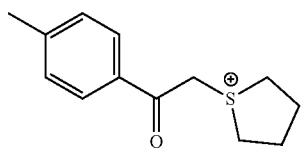
Specific examples of preferable cations represented by formula (ca-0-2) include cations represented by formulae (ca-2-1) to (ca-2-4) shown below.
[Chemical Formula 105.]
(ca-2-1)
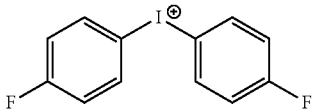
(ca-2-2)
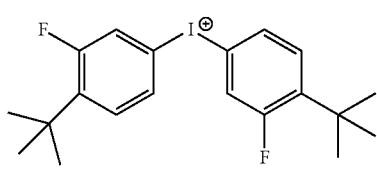
(ca-2-3)
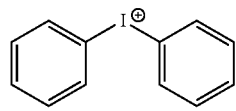
(ca-2-4)
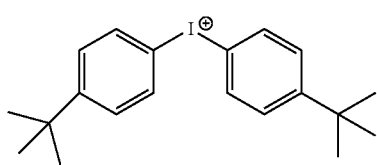
Further, other specific examples of preferable cations represented by formula (ca-0-1) include cations represented by formulae (ca-04-1) to (ca-04-11) shown below.
[Chemical Formula 106.]
(ca-04-1)
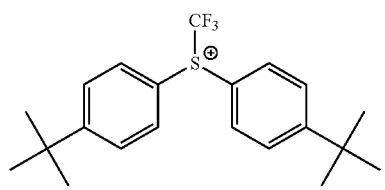
(ca-04-2)
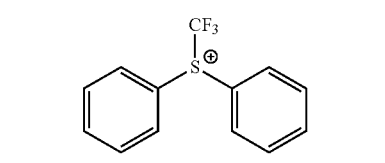
(ca-04-3)
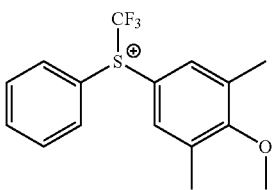
(ca-04-4)
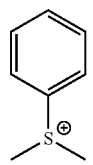
(ca-04-5)
(ca-04-6)
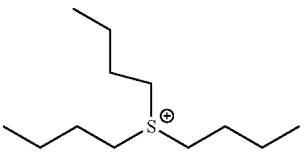
(ca-04-7)
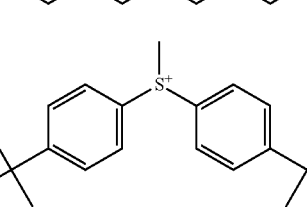
(ca-04-8)
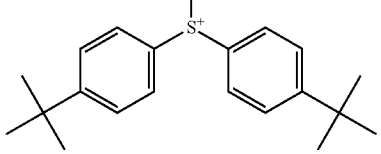
(ca-04-9)
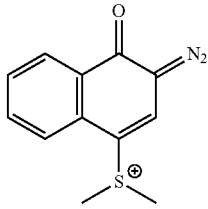
(ca-04-10)
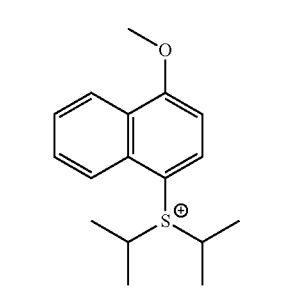

(ca-04-11)

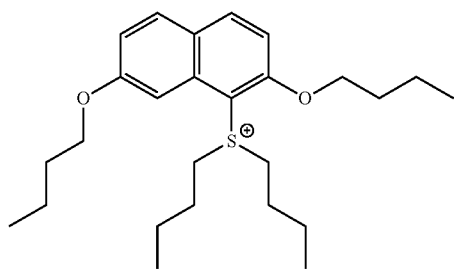

Among the aforementioned (BD1-1) component, as the acid-generator component (B) which generates acid that acts on the component (A) upon exposure (hereafter, sometimes refers to as "component (B1-1)", a combination of an anion represented by any one of the aforementioned formulae (bd1-an3-1) to (bd1-an3-15) with a cation represented by any one of the aforementioned formulae (ca-01-1) to (ca-01-05), (ca-02-1) to (ca-02-15), (ca-03-1) to (ca-03-6), (ca-2-1) to (ca-2-4) and (ca-04-1) to (ca-04-11) is preferable, and a combination of an anion represented by any one of the aforementioned formulae (bd1-an3-1) to (bd1-an3-15) with a cation represented by any one of the aforementioned formulae (ca-01-1) to (ca-01-05), (ca-02-1) to (ca-02-15) and (ca-03-1) to (ca-03-6) is more preferable.

Specific examples of the component (B1-1) are shown below, although the component (B1-1) is not limited to these examples.

[Chemical Formula 107.]

(B1-1a)

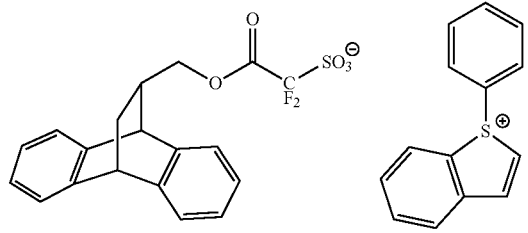

(B1-2a)

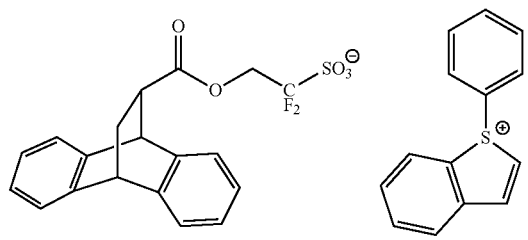

(B1-3a)

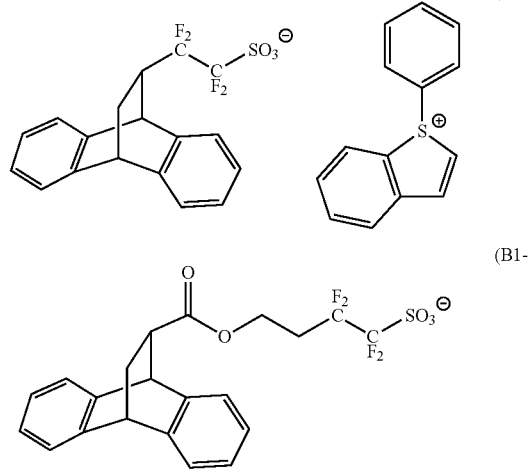

(B1-4a)

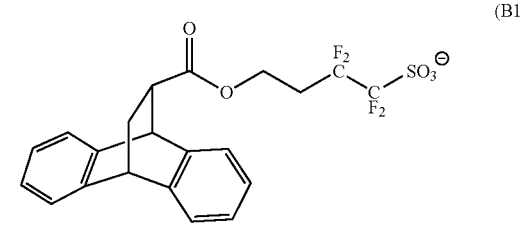

(B1-5a)

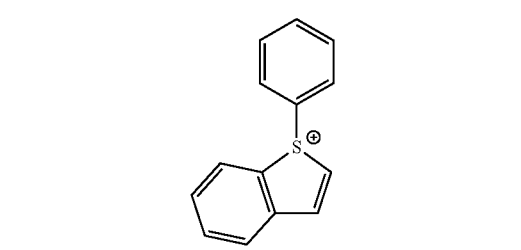

(B1-6a)

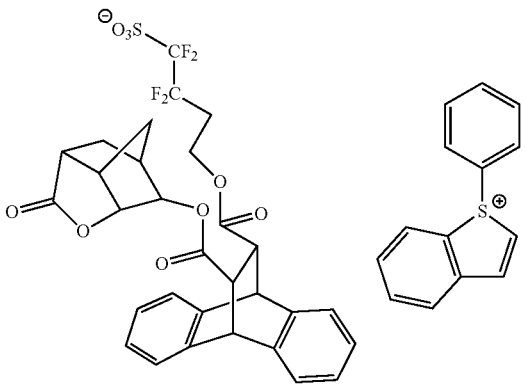

(B1-7a)

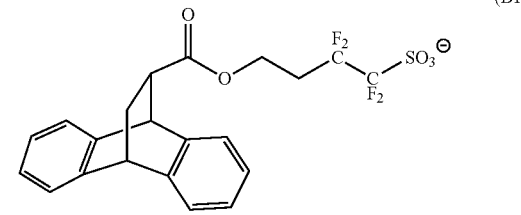

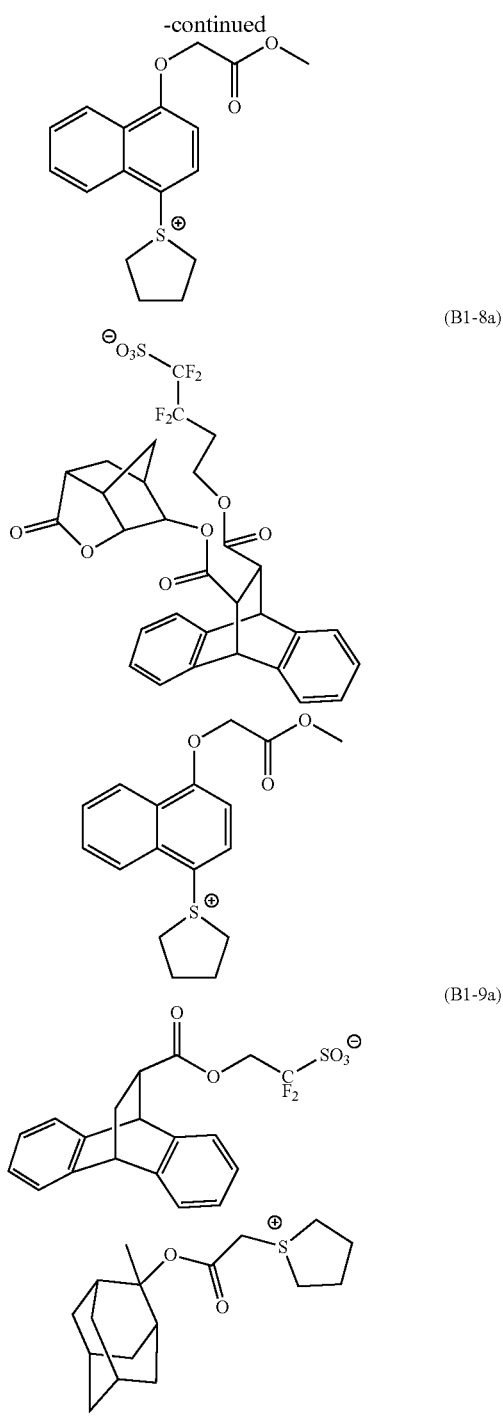

(B1-8a)

(B1-9a)

In the resist composition of the present embodiment, as the component (B1-1), one kind of compound may be used, or two or more kinds of compounds may be used in combination.

In the resist composition of the present embodiment, the amount of the component (B1-1) relative to 100 parts by weight of the component (A) is preferably within a range from 5 to 65 parts by weight, more preferably from 5 to 55 parts by weight, still more preferably from 10 to 45 parts by weight, and most preferably 10 to 40 parts by weight.

In the resist composition, the amount of the component (B1-1) within the entire component (B) capable of generating acid which acts on the component (A) is, for example, 50% by weight or more, preferably 70% by weight or more, and more preferably 95% by weight or more. The amount of the component (B1-1) within the component (B) may be even 100% by weight.

When the amount of the component (B1-1) is at least as large as the lower limit of the above-mentioned preferable range, in the formation of a resist pattern, various lithography properties such as sensitivity, resolution, LWR (line width roughness) and pattern shape are improved. On the other hand, in the case where the amount of the component (B1-1) is no more than the upper limit of the above-mentioned preferable range, when each of the components of the resist composition are dissolved in an organic solvent, a homogeneous solution may be more reliably obtained and the storage stability of the resist composition becomes satisfactory.

Further, in the case where the resist composition contains both the component (B1-1) and the component (D) (at least one of the components (D1) to (D3)), in terms of reliably obtaining satisfactory lithography properties and pattern shape, the molar ratio is, for example, (B1-1):(D)=100:0 to 50:50, more preferably (B1-1):(D)=99:1 to 51:49, and still more preferably (B1-1):(D)=90:10 to 60:40.

Further, among the component (BD1), as the basic component (component (D1)) which is capable of trapping acid generated from the component (B) (hereafter, sometimes referred to as "component (D1-1)"), a combination of an anion represented by any of the aforementioned formulae (bd1-an3-21) to (bd1-an3-24) with a cation represented by any of the aforementioned formulae (ca-01-1) to (ca-01-05), (ca-02-1) to (ca-02-15), (ca-03-1) to (ca-03-6), (ca-2-1) to (ca-2-4) and (ca-04-1) to (ca-04-11) is preferable, and a combination of an anion represented by any of the aforementioned formulae (bd1-an3-21) to (bd1-an3-24) with a cation represented by any of the aforementioned formulae (ca-01-1) to (ca-01-05), (ca-02-1) to (ca-02-15) and (ca-03-1) to (ca-03-6) is more preferable.

Specific examples of the component (D1-1) are shown below, although the component (D1-1) is not limited to these examples.

[Chemical Formula 108.]

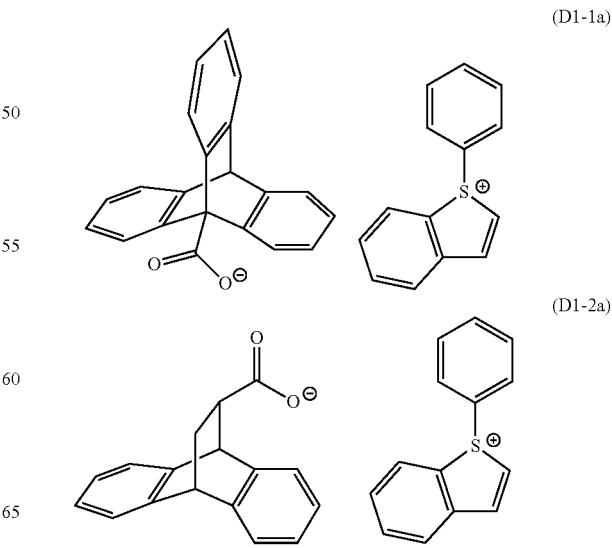

(D1-1a)

(D1-2a)

-continued (D1-3a)

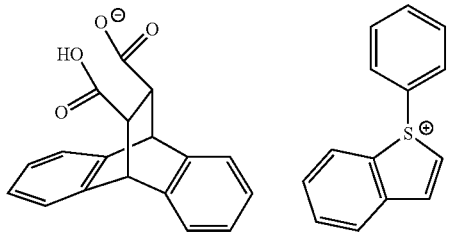

In the resist composition of the present embodiment, as the component (D1-1), one kind of compound may be used, or two or more kinds of compounds may be used in combination.

In the resist composition of the present embodiment, the amount of the component (D1-1) relative to 100 parts by weight of the component (A) is preferably within a range from 1 to 35 parts by weight, more preferably from 2 to 25 parts by weight, still more preferably from 3 to 20 parts by weight, and most preferably 4 to 15 parts by weight.

In the resist composition, the amount of the component (D1-1) within the component (D) capable of trapping acid generated from the component (B) upon exposure is not particularly limited, and may be appropriately adjusted within the range of 0 to 100% by weight.

When the amount of the component (D1-1) is at least as large as the lower limit of the above-mentioned preferable range, excellent lithography properties and excellent resist pattern shape may be more reliably obtained. On the other hand, when the amount of the component (D1-1) is no more than the upper limit of the above-mentioned preferable range, satisfactory sensitivity may be maintained, and throughput may be improved.

Alternatively, in the case where the resist composition contains both the component (D1-1) and the component (B) (at least one of the components (B1-1) and (B2)), in terms of reliably obtaining satisfactory lithography properties and pattern shape, the molar ratio is, for example, (B):(D1-1) =100:0 to 50:50, more preferably (B):(D1-1)=99:1 to 51:49, and still more preferably (B):(D1-1)=90:10 to 60:40.

The component (BD1-1) has a cation represented by general formula (ca-0-1) or (ca-0-2). Since the number of benzene rings contained in the cation represented by general formula (ca-0-1) or (ca-0-2) is 0 to 2, OoB light such as DUV having a wavelength of 150 to 300 nm is absorbed, and generation of acid is suppressed.

By virtue of containing the component (BD1-1) having the cation moiety and the anion moiety, according to the resist composition of the present embodiment, a contrast between the unexposed portions of the resist pattern and the exposed portions of the resist pattern may be improved, lithography properties (such as reduction of roughness) may be improved, and sensitivity may be enhanced.

<Optional Components>

The resist composition of the present embodiment may contain, in addition to the component (A), the component (B) (component (B1), component (B2)) and the component (D) (component (D1), component (D2) and component (D3)), any other optional components.

Examples of optional components include the component (E), the component (F) and the component (S) described below.

<<Component (E): At Least One Compound Selected from the Group Consisting of Organic Carboxylic Acids, and Phosphorus Oxo Acids and Derivatives Thereof>>

In the resist composition of the present embodiment, for preventing any deterioration in sensitivity, and improving the resist pattern shape and the post exposure stability of the latent image formed by the pattern-wise exposure of the resist layer, at least one compound (E) (hereafter referred to as the component (E)) selected from the group consisting of an organic carboxylic acid, or a phosphorus oxo acid or derivative thereof may be added.

Examples of suitable organic carboxylic acids include acetic acid, malonic acid, citric acid, malic acid, succinic acid, benzoic acid, and salicylic acid.

Examples of phosphorus oxo acids include phosphoric acid, phosphonic acid and phosphinic acid. Among these, phosphonic acid is particularly desirable.

Examples of oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters and phenylphosphinic acid.

In the resist composition of the present embodiment, as the component (E), one kind of compound may be used, or two or more kinds of compounds may be used in combination.

When the resist composition contains the component (E), the amount of the component (E) is typically used in an amount within a range from 0.01 to 5 parts by weight, relative to 100 parts by weight of the component (A).

<<Component (F): Fluorine Additive>>

In the present embodiment, the resist composition may further include a fluorine additive (hereafter, referred to as "component (F)") for imparting water repellency to the resist film, or improving lithography properties.

As the component (F), for example, a fluorine-containing polymeric compound described in Japanese Unexamined Patent Application, First Publication No. 2010-002870, Japanese Unexamined Patent Application, First Publication No. 2010-032994, Japanese Unexamined Patent Application, First Publication No. 2010-277043, Japanese Unexamined Patent Application, First Publication No. 2011-13569, and Japanese Unexamined Patent Application, First Publication No. 2011-128226 can be used.

Specific examples of the component (F) include polymers having a structural unit (f1) represented by general formula (f1-1) shown below. As the polymer, a polymer (homopolymer) consisting of a structural unit (f1) represented by formula (f1-1) shown below; a copolymer of the structural unit (f1) and the aforementioned structural unit (a1); and a copolymer of the structural unit (f1), a structural unit derived from acrylic acid or methacrylic acid and the aforementioned structural unit (a1) are preferable. As the structural unit (a1) to be copolymerized with the structural unit (f1), a structural unit derived from 1-ethyl-1-cyclooctyl (meth) acrylate or a structural unit derived from 1-methyl-1-adamantyl (meth)acrylate is preferable.

[Chemical Formula 109.]

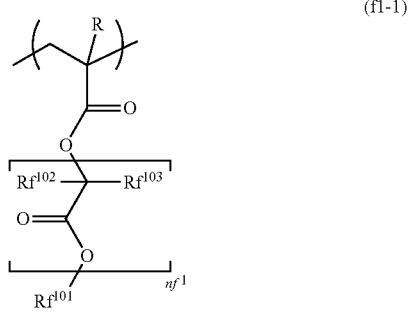

(f1-1)

In the formula, R is the same as defined above; $Rf^{102}$ and $Rf^{103}$ each independently represents a hydrogen atom, a halogen atom, an alkyl group of 1 to 5 carbon atoms, or a halogenated alkyl group of 1 to 5 carbon atoms, provided that $Rf^{102}$ and $Rf^{103}$ may be the same or different; $nf^1$ represents an integer of 1 to 5; and $Rf^{101}$ represents an organic group containing a fluorine atom.

In formula (f1-1), R bonded to the carbon atom on the α-position is the same as defined for R above. As R, a hydrogen atom or a methyl group is preferable.

In formula (f1-1), examples of the halogen atom for $Rf^{102}$ and $Rf^{103}$ include a fluorine atom, a chlorine atom, a bromine atom and an iodine atom, and a fluorine atom is particularly desirable. Examples of the alkyl group of 1 to 5 carbon atoms for $Rf^{102}$ and $Rf^{103}$ include the same alkyl group of 1 to 5 carbon atoms as those described above for R, and a methyl group or an ethyl group is preferable. Specific examples of the halogenated alkyl group of 1 to 5 carbon atoms represented by $Rf^{102}$ or $Rf^{103}$ include groups in which part or all of the hydrogen atoms of the aforementioned alkyl groups of 1 to 5 carbon atoms have been substituted with halogen atoms.

Examples of the halogen atom include a fluorine atom, a chlorine atom, a bromine atom and an iodine atom, and a fluorine atom is particularly desirable. Among these examples, as $Rf^{102}$ and $Rf^{103}$, a hydrogen atom, a fluorine atom or an alkyl group of 1 to 5 carbon atoms is preferable, and a hydrogen atom, a fluorine atom, a methyl group or an ethyl group is more preferable.

In formula (f1-1), $nf^1$ represents an integer of 1 to 5, preferably an integer of 1 to 3, and more preferably 1 or 2.

In formula (f1-1), $Rf^{101}$ represents an organic group containing a fluorine atom, and is preferably a hydrocarbon group containing a fluorine atom.

The hydrocarbon group containing a fluorine atom may be linear, branched or cyclic, and preferably has 1 to 20 carbon atoms, more preferably 1 to 15 carbon atoms, and most preferably 1 to 10 carbon atoms.

It is preferable that the hydrocarbon group having a fluorine atom has 25% or more of the hydrogen atoms within the hydrocarbon group fluorinated, more preferably 50% or more, and most preferably 60% or more, as the hydrophobicity of the resist film during immersion exposure is enhanced.

Among these, as $Rf^{101}$, a fluorinated hydrocarbon group of 1 to 6 carbon atoms is preferable, and a trifluoromethyl group, $-CH_2-CF_3$, $-CH_2-CF_2-CF_3$, $-CH(CF_3)_2$, $-CH_2-CH_2-CF_3$, and $-CH_2-CH_2-CF_2-CF_2-CF_2-CF_3$ are most preferable.

The weight average molecular weight (Mw) (the polystyrene equivalent value determined by gel permeation chromatography) of the component (F) is preferably 1,000 to 50,000, more preferably 5,000 to 40,000, and most preferably 10,000 to 30,000. When the Mw of the component (F) is no more than the upper limit of the above-mentioned range, the resist composition exhibits a satisfactory solubility in a resist solvent. On the other hand, when the Mw is at least as large as the lower limit of the above-mentioned range, water repellency of the resist surface becomes satisfactory.

Further, the dispersity (Mw/Mn) of the component (F) is preferably 1.0 to 5.0, more preferably 1.0 to 3.0, and most preferably 1.2 to 2.5.

In the resist composition of the present embodiment, as the component (F), one kind of compound may be used, or two or more kinds of compounds may be used in combination.

When the resist composition contains the component (F), the component (F) is used in an amount within a range from 0.5 to 10 parts by weight, relative to 100 parts by weight of the component (A).

<<Component (S): Organic Solvent>>

The resist composition of the present embodiment may be prepared by dissolving the resist materials for the resist composition in an organic solvent (hereafter, referred to as "component (S)").

The component (S) may be any organic solvent which can dissolve the respective components to give a homogeneous solution, and any organic solvent can be appropriately selected from those which have been conventionally known as solvents for a chemically amplified resist composition.

Examples thereof include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene; and dimethylsulfoxide (DMSO).

In the resist composition of the present embodiment, as the component (S), one kind of solvent may be used, or two or more kinds of compounds may be used as a mixed solvent.

Among these, PGMEA, PGME, γ-butyrolactone, EL and cyclohexanone are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2.

Specifically, when EL or cyclohexanone is mixed as the polar solvent, the PGMEA:EL or cyclohexanone weight ratio is preferably from 1:9 to 9:1, and more preferably from 2:8 to 8:2. Alternatively, when PGME is mixed as the polar solvent, the PGMEA:PGME weight ratio is preferably from 1:9 to 9:1, more preferably from 2:8 to 8:2, and still more preferably 3:7 to 7:3. Furthermore, a mixed solvent of PGMEA, PGME and cyclohexanone is also preferable.

Further, as the component (S), a mixed solvent of at least one of PGMEA and EL with γ-butyrolactone is also preferable. The mixing ratio (former:latter) of such a mixed solvent is preferably from 70:30 to 95:5.

The amount of the component (S) is not particularly limited, and is appropriately adjusted to a concentration which enables coating of a coating solution to a substrate. In general, the component (S) is used in an amount such that the solid content of the resist composition becomes within the range from 0.1 to 20% by weight, and preferably from 0.2 to 10% by weight.

If desired, other miscible additives can also be added to the resist composition of the present invention. Examples of such miscible additives include additive resins for improving the performance of the resist film, dissolution inhibitors, plasticizers, stabilizers, colorants, halation prevention agents, and dyes.

After dissolving the resist materials in the organic solvent (S), the resist composition of the present embodiment may have impurities or the like removed by using a polyimide porous film, a polyamide-imide porous film, or the like. For example, the resist composition may be subjected to filtration using a filter formed of a polyimide porous membrane, a filter formed of a polyamide-imide porous film, or a filter formed of a polyimide porous membrane and a polyamide-imide porous film. Examples of the polyimide porous membrane and the polyamide-imide porous film include those described in Japanese Unexamined Patent Application, First Publication No. 2016-155121.

The resist composition of the present embodiment includes the component (A), the component (B), the component (D) and any other optional component, wherein at least one of the component (B) and the component (D) contains the component (BD1).

For example, in the case where the component (B1) is used as the component (BD1), the resist composition preferably includes the component (A1), the component (B1), and the component (D2) or (D3). On the other hand, for example, in the case where the component (D1) is used as the component (BD1), the resist composition preferably includes the component (A1), the component (B2), and the component (D1).

Alternatively, for example, in the case where the components (B1) and (D1) are used as the component (BD1), the resist composition preferably includes the component (A1), the component (B1), and the component (D1).

The resist composition of the present embodiment as described above contains, as an acid-generator component or a basic component, 20 to 70 parts by weight of the compound (BD1) represented by general formula (bd1), relative to 100 parts by weight of the base material component (A). By virtue of the anion moiety having a specific structure (bulky structure) mainly formed of hydrocarbon, the hydrophobicity of the component (BD1) is relatively enhanced. As a result, the compatibility of the component (BD1) with the resin component (A1) is enhanced, and diffusion of acid within the resist film is appropriately controlled. In addition, for example, the solubility of the component (BD1) in an alkali developing solution is lowered. As a result, even when the component (BD1) is blended in the resist composition in a large amount, film loss (loss of film thickness) which was conventionally a problem is unlikely to occur. Therefore, it is presumed that, according to the resist composition of the present embodiment, it becomes possible to improve lithography properties such as reduced roughness, as well as improving sensitivity, and forming a pattern which is unlikely to have occurrence of film thickness loss, and a high film retention ratio.

Further, by using the resist composition of the present embodiment, since the uniformity of the compound (BD1) within the formed resist film is enhanced, a resist pattern with high resolution, reduced roughness and excellent shape can be reliably formed.

(Method of Forming a Resist Pattern)

The method of forming a resist pattern according to the second aspect of the present invention includes: using a resist composition according to the first aspect to form a resist film on a substrate; exposing the resist film; and developing the exposed resist film to form a resist pattern.

The method for forming a resist pattern according to the present embodiment can be performed, for example, as follows.

Firstly, a resist composition of the first aspect is applied to a substrate using a spinner or the like, and a bake treatment (post applied bake (PAB)) is conducted at a temperature of 80 to 150° C. for 40 to 120 seconds, preferably 60 to 90 seconds, to form a resist film.

Following selective exposure of the thus formed resist film, either by exposure through a mask having a predetermined pattern formed thereon (mask pattern) using an exposure apparatus such an electron beam lithography apparatus or an EUV exposure apparatus, or by patterning via direct irradiation with an electron beam without using a mask pattern, baking treatment (post exposure baking (PEB)) is conducted under temperature conditions of 80 to 150° C. for 40 to 120 seconds, and preferably 60 to 90 seconds.

Next, the resist film is subjected to a developing treatment. The developing treatment is conducted using an alkali developing solution in the case of an alkali developing process, and a developing solution containing an organic solvent (organic developing solution) in the case of a solvent developing process.

After the developing treatment, it is preferable to conduct a rinse treatment. The rinse treatment is preferably conducted using pure water in the case of an alkali developing process, and a rinse solution containing an organic solvent in the case of a solvent developing process.

In the case of a solvent developing process, after the developing treatment or the rinsing, the developing solution or the rinse liquid remaining on the pattern can be removed by a treatment using a supercritical fluid.

After the developing treatment or the rinse treatment, drying is conducted. If desired, bake treatment (post bake) can be conducted following the developing.

In this manner, a resist pattern can be formed.

The substrate is not specifically limited and a conventionally known substrate can be used. For example, substrates for electronic components, and such substrates having wiring patterns formed thereon can be used. Specific examples of the material of the substrate include metals such as silicon wafer, copper, chromium, iron and aluminum; and glass. Suitable materials for the wiring pattern include copper, aluminum, nickel, and gold.

Further, as the substrate, any one of the above-mentioned substrates provided with an inorganic and/or organic film on the surface thereof may be used. As the inorganic film, an inorganic antireflection film (inorganic BARC) can be used. As the organic film, an organic antireflection film (organic BARC) and an organic film such as a lower-layer organic film used in a multilayer resist method can be used.

Here, a "multilayer resist method" is method in which at least one layer of an organic film (lower-layer organic film) and at least one layer of a resist film (upper resist film) are provided on a substrate, and a resist pattern formed on the upper resist film is used as a mask to conduct patterning of the lower-layer organic film. This method is considered as being capable of forming a pattern with a high aspect ratio. More specifically, in the multilayer resist method, a desired thickness can be ensured by the lower-layer organic film, and as a result, the thickness of the resist film can be reduced, and an extremely fine pattern with a high aspect ratio can be formed.

The multilayer resist method is broadly classified into a method in which a double-layer structure consisting of an upper-layer resist film and a lower-layer organic film is formed (double-layer resist method), and a method in which a multilayer structure having at least three layers consisting of an upper-layer resist film, a lower-layer organic film and at least one intermediate layer (thin metal film or the like) provided between the upper-layer resist film and the lower-layer organic film (triple-layer resist method).

The wavelength to be used for exposure is not particularly limited and the exposure can be conducted using radiation such as ArF excimer laser, KrF excimer laser, F2 excimer laser, extreme ultraviolet rays (EUV), vacuum ultraviolet rays (VUV), electron beam (EB), X-rays, and soft X-rays. The resist composition of the present embodiment is effective to KrF excimer laser, ArF excimer laser, EB and EUV, and more effective to ArF excimer laser, EB and EUV, and most effective to EB and EUV. That is, the method of forming a resist pattern according to the present embodiment is effective in the case where the step of exposing the resist film includes exposing the resist film with extreme ultraviolet rays (EUV) or electron beam (EB).

The exposure of the resist film can be either a general exposure (dry exposure) conducted in air or an inert gas such as nitrogen, or immersion exposure (immersion lithography).

In immersion lithography, the region between the resist film and the lens at the lowermost point of the exposure apparatus is pre-filled with a solvent (immersion medium) that has a larger refractive index than the refractive index of air, and the exposure (immersion exposure) is conducted in this state.

The immersion medium preferably exhibits a refractive index larger than the refractive index of air but smaller than the refractive index of the resist film to be exposed. The refractive index of the immersion medium is not particularly limited as long as it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within a range from 70 to 180° C. and preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

As the immersion medium, water is preferable in terms of cost, safety, environment and versatility.

As an example of the alkali developing solution used in an alkali developing process, a 0.1 to 10% by weight aqueous solution of tetramethylammonium hydroxide (TMAH) can be given.

As the organic solvent contained in the organic developing solution used in a solvent developing process, any of the conventional organic solvents can be used which are capable of dissolving the component (A) (prior to exposure). Specific examples of the organic solvent include polar solvents such as ketone solvents, ester solvents, alcohol solvents, nitrile solvents, amide solvents and ether solvents, and hydrocarbon solvents.

A ketone solvent is an organic solvent containing C—C(=O)—C within the structure thereof. An ester solvent is an organic solvent containing C—C(=O)—O—C within the structure thereof. An alcohol solvent is an organic solvent containing an alcoholic hydroxy group in the structure thereof. An "alcoholic hydroxy group" refers to a hydroxy group bonded to a carbon atom of an aliphatic hydrocarbon group. A nitrile solvent is an organic solvent containing a nitrile group in the structure thereof. An amide solvent is an organic solvent containing an amide group within the structure thereof. An ether solvent is an organic solvent containing C—O—C within the structure thereof.

Some organic solvents have a plurality of the functional groups which characterizes the aforementioned solvents within the structure thereof. In such a case, the organic solvent can be classified as any type of the solvent having the characteristic functional group. For example, diethyleneglycol monomethylether can be classified as either an alcohol solvent or an ether solvent.

A hydrocarbon solvent consists of a hydrocarbon which may be halogenated, and does not have any substituent other than a halogen atom. Examples of the halogen atom include a fluorine atom, a chlorine atom, a bromine atom and an iodine atom, and a fluorine atom is preferable.

As the organic solvent contained in the organic developing solution, among these, a polar solvent is preferable, and ketone solvents, ester solvents and nitrile solvents are preferable.

Examples of ketone solvents include 1-octanone, 2-octanone, 1-nonanone, 2-nonanone, acetone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonylalcohol, acetylcarbinol, acetophenone, methyl naphthyl ketone, isophorone, propylenecarbonate, γ-butyrolactone and methyl amyl ketone (2-heptanone). Among these examples, as a ketone solvent, methyl amyl ketone (2-heptanone) is preferable.

Examples of ester solvents include methyl acetate, butyl acetate, ethyl acetate, isopropyl acetate, amyl acetate, isoamyl acetate, ethyl methoxyacetate, ethyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate and propyl-3-methoxypropionate. Among these examples, as an ester solvent, butyl acetate is preferable.

Examples of nitrile solvents include acetonitrile, propionitrile, valeronitrile, and butyronitrile.

If desired, the organic developing solution may have a conventional additive blended. Examples of the additive include surfactants. The surfactant is not particularly limited, and for example, an ionic or non-ionic fluorine and/or silicon surfactant can be used.

As the surfactant, a non-ionic surfactant is preferable, and a non-ionic fluorine surfactant or a non-ionic silicon surfactant is more preferable.

When a surfactant is added, the amount thereof based on the total amount of the organic developing solution is generally 0.001 to 5% by weight, preferably 0.005 to 2% by weight, and more preferably 0.01 to 0.5% by weight.

The developing treatment can be performed by a conventional developing method. Examples thereof include a method in which the substrate is immersed in the developing solution for a predetermined time (a dip method), a method in which the developing solution is cast up on the surface of the substrate by surface tension and maintained for a predetermined period (a puddle method), a method in which the developing solution is sprayed onto the surface of the substrate (spray method), and a method in which the developing solution is continuously ejected from a developing solution ejecting nozzle while scanning at a constant rate to apply the developing solution to the substrate while rotating the substrate at a constant rate (dynamic dispense method).

As the organic solvent contained in the rinse liquid used in the rinse treatment after the developing treatment in the case of a solvent developing process, any of the aforementioned organic solvents contained in the organic developing solution can be used which hardly dissolves the resist pattern. In general, at least one solvent selected from the group consisting of hydrocarbon solvents, ketone solvents, ester solvents, alcohol solvents, amide solvents and ether solvents is used. Among these, at least one solvent selected from the group consisting of hydrocarbon solvents, ketone solvents, ester solvents, alcohol solvents and amide solvents is preferable, more preferably at least one solvent selected from the group consisting of alcohol solvents and ester solvents, and an alcohol solvent is particularly desirable.

The alcohol solvent used for the rinse liquid is preferably a monohydric alcohol of 6 to 8 carbon atoms, and the monohydric alcohol may be linear, branched or cyclic. Specific examples thereof include 1-hexanol, 1-heptanol, 1-octanol, 2-hexanol, 2-heptanol, 2-octanol, 3-hexanol, 3-heptanol, 3-octanol, 4-octanol and benzyl alcohol. Among these, 1-hexanol, 2-heptanol and 2-hexanol are preferable, and 1 hexanol and 2-hexanol are more preferable.

As the organic solvent, one kind of solvent may be used alone, or two or more kinds of solvents may be used in combination. Further, an organic solvent other than the aforementioned examples or water may be mixed together. However, in consideration of the development characteristics, the amount of water within the rinse liquid, based on the total amount of the rinse liquid is preferably 30% by weight or less, more preferably 10% by weight or less, still more preferably 5% by weight or less, and most preferably 3% by weight or less.

If desired, the rinse solution may have a conventional additive blended. Examples of the additive include surfactants. Examples of the additive include surfactants. As the surfactant, the same surfactants as those described above can be mentioned, a non-ionic surfactant is preferable, and a non-ionic fluorine surfactant or a non-ionic silicon surfactant is more preferable.

When a surfactant is added, the amount thereof based on the total amount of the rinse liquid is generally 0.001 to 5% by weight, preferably 0.005 to 2% by weight, and more preferably 0.01 to 0.5% by weight.

The rinse treatment using a rinse liquid (washing treatment) can be conducted by a conventional rinse method. Examples of the rinse method include a method in which the rinse liquid is continuously applied to the substrate while rotating it at a constant rate (rotational coating method), a method in which the substrate is immersed in the rinse liquid for a predetermined time (dip method), and a method in which the rinse liquid is sprayed onto the surface of the substrate (spray method).

In the method forming a resist pattern according to the present embodiment described above, by virtue of using the resist composition according to the first embodiment, it becomes possible to enhance sensitivity in the formation of a resist pattern, and a resist pattern having improved lithography properties (such as reduced roughness) can be formed.

In addition, in the method of forming a resist pattern according to the present embodiment, even when the total amount of the acid-generator component (B) and the basic component (D) in the resist composition is increased, a resist pattern which is unlikely to have occurrence of film thickness loss, and a high film retention ratio can be formed.

EXAMPLES

As follows is a description of examples of the present invention, although the scope of the present invention is by no way limited by these examples.

In the following examples, a compound represented by a chemical formula (1) is denoted as "compound (1)", and the same applies for compounds represented by other chemical formulae.

<Production of Compound>

Production Example 1

Anthracene (5.0 g, 28 mmol), methyl acrylate (3.6 g, 42 mmol), aluminum chloride (0.37 g, 2.8 mmol) and toluene (50 g) were added to a 100 mL three-necked flask, and a reaction was conducted at 80° C. for 4 hours while stirring. After cooling, ultrapure water (50 g) and MTBE (74 g) were added. After stirring for 30 minutes, the aqueous phase was removed. The organic phase was washed with ultrapure water (50 g) 3 times, and the organic phase was concentrated using a rotary evaporator. The concentrate was recrystallized with 2-isopropanol, so as to obtain an intermediate product 1 (5.9 g, yield=79.6%).

Sodium hydroxide (3.8 g, 95 mmol) and ultrapure water (38 g) were added to a 100 mL three-necked flask, followed by dispersing intermediate 1 (5.0 g, 19 mmol), and conducting a reaction at 90° C. for 4 hours. After cooling to room temperature, hydrochloric acid was added until the solution was neutralized. Then, MTBE (50 g) was added, and stirred for 30 minutes, followed by removing the aqueous phase. The organic phase was washed 3 times with ultrapure water (50 g). Then, the organic phase was concentrated using a rotary evaporator, so as to obtain an intermediate product 2 (4.6 g, yield=97.2%).

[Chemical Formula 110.]

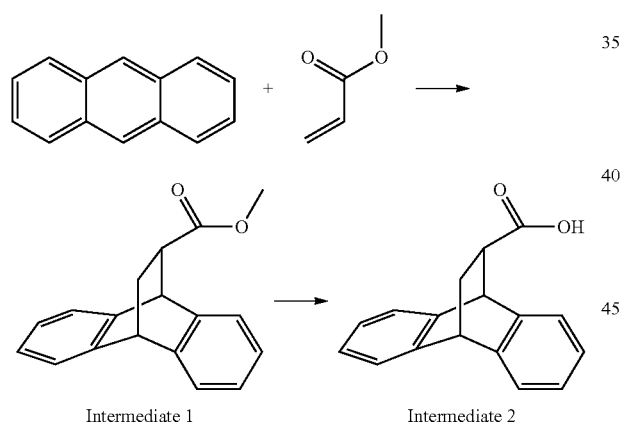

Intermediate 1    Intermediate 2

Intermediate product 2 (4.0 g, 16 mmol), compound (I-1) (5.7 g, 16 mmol) and dichloromethane (87 g) were added to a 100 mL three-necked flask, followed by stirring at room temperature to dissolve the contents.

Then, diisopropylcarbodiimide (2.2 g, 18 mmol) and dimethylaminopyridine (0.098 g, 0.8 mmol) were added, and reacted at room temperature for 5 hours. The reaction liquid was subjected to filtration, and the filtrate was concentrated using a rotary evaporator. The concentrate was dissolved in acetonitrile (17 g), and the resultant was dropwise added to MTBE (170 g), followed by subjecting the precipitated solid to filtration. The residue was dissolved in acetonitrile (17 g), and the resultant was dropwise added to MTBE (170 g), followed by subjecting the precipitated solid to filtration. This operation was conducted twice, and the residue was dried under reduced pressure, so as to obtain precursor (Bpre-1) (6.2 g, yield=65.4%).

[Chemical Formula 111.]

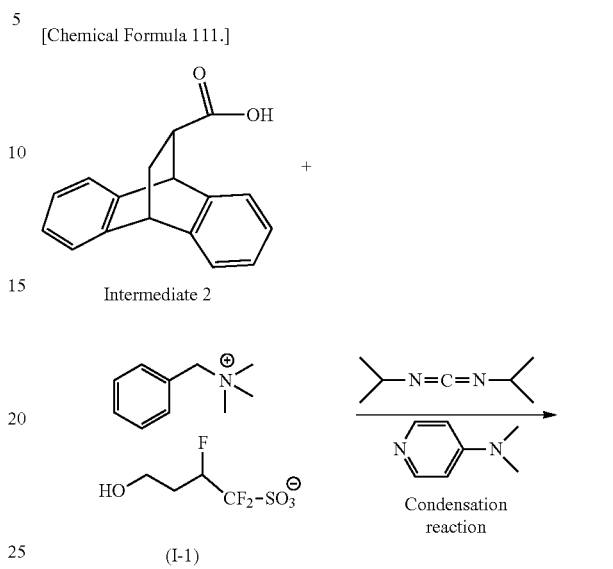

Production Example 2

Intermediate product 2 (4.0 g, 16 mmol), compound (1-2) (5.0 g, 16 mmol) and dichloromethane (87 g) were added to a 100 mL three-necked flask, followed by stirring at room temperature to dissolve the contents. Then, diisopropylcarbodiimide (2.2 g, 18 mmol) and dimethylaminopyridine (0.098 g, 0.8 mmol) were added, and reacted at room temperature for 5 hours. The reaction liquid was subjected to filtration, and the filtrate was concentrated using a rotary evaporator. The concentrate was dissolved in acetonitrile (17 g), and the resultant was dropwise added to MTBE (170 g), followed by subjecting the precipitated solid to filtration. The residue was dissolved in acetonitrile (17 g), and the resultant was dropwise added to MTBE (170 g), followed by subjecting the precipitated solid to filtration. After conducting this operation twice, the residue was dried under reduced pressure, so as to obtain precursor (Bpre-2) (5.8 g, yield=66.8%).

[Chemical Formula 112.]

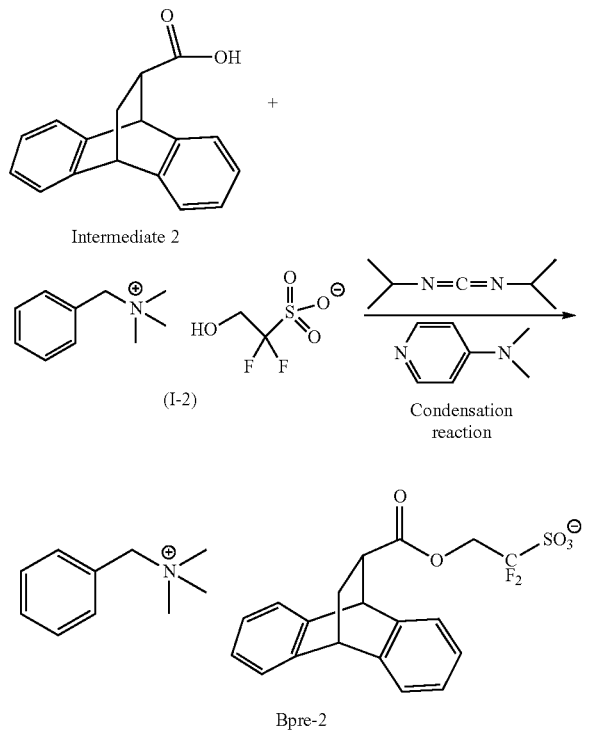

Production Example 3

Intermediate product 2 (4.8 g, 19 mmol) and tetrahydrofuran (THF) (50 g) were added to a 100 mL three-necked flask, followed by stirring at room temperature to dissolve the contents. Then, $LiAlH_4$ (0.86 g, 23 mmol) was added, and reacted at room temperature for 3 hours. Subsequently, ultrapure water (50 g) and MTBE (50 g) were added. After stirring for 30 minutes, the aqueous phase was removed. Thereafter, the organic phase was washed with ultrapure water (50 g) 3 times. The organic phase was concentrated using a rotary evaporator, so as to obtain an intermediate product 3 (4.1 g, yield=91.0%).

Intermediate product 3 (4.0 g, 19 mmol), compound (1-3) (3.6 g, 18 mmol), p-toluenesulfonic acid monohydrate (0.18 g, 0.9 mmol) and toluene (40 g) were added to a 100 mL three-necked flask, followed by reflux at 110° C. for 24 hours. After cooling, the resultant was subjected to filtration. Acetonitrile (160 g) was added to the residue, followed by stirring at room temperature for 30 minutes, and filtration. The filtrate was concentrated, and methyl ethyl ketone (78 g) was added to the residue, followed by stirring. Then, the resultant was subjected to filtration, and the residue was dried, so as to obtain precursor (Bpre-3) (4.9 g, yield=62.4%).

[Chemical Formula 113.]

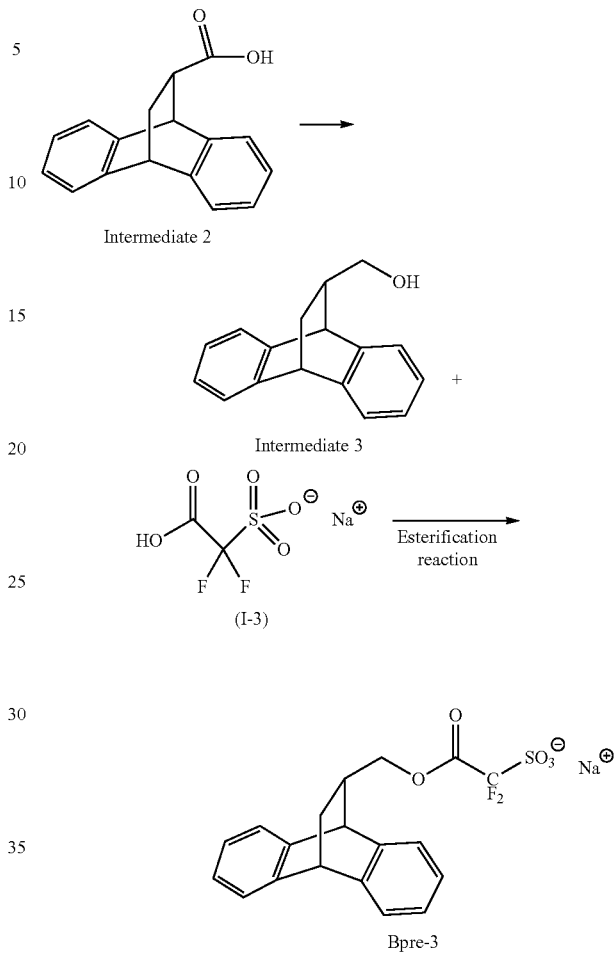

Production Example 4

Intermediate product 2 (4.0 g, 16 mmol), compound (1-4) (6.0 g, 16 mmol) and dichloromethane (87 g) were added to a 100 mL three-necked flask, followed by stirring at room temperature to dissolve the contents.

Then, diisopropylcarbodiimide (2.2 g, 18 mmol) and dimethylaminopyridine (0.098 g, 0.8 mmol) were added, and reacted at room temperature for 5 hours. The reaction liquid was subjected to filtration, and the filtrate was concentrated using a rotary evaporator. The concentrate was dissolved in acetonitrile (17 g), and the resultant was dropwise added to MTBE (170 g), followed by subjecting the precipitated solid to filtration. The residue was dissolved in acetonitrile (17 g), and the resultant was dropwise added to MTBE (170 g), followed by subjecting the precipitated solid to filtration. This operation was conducted twice, and the residue was dried under reduced pressure, so as to obtain precursor (Bpre-4) (7.6 g, yield=78.2%).

[Chemical Formula 114.]

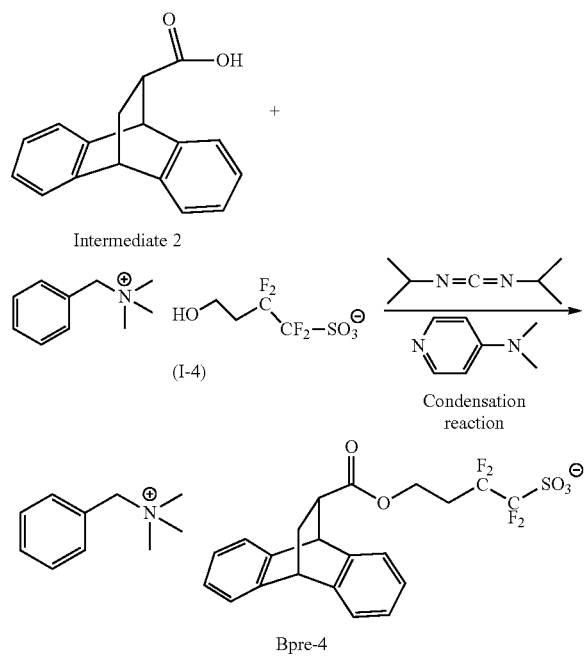

Bpre-4

Production Example 5

4-bromo-3,3,4,4-tetrafluoro-1-butene (8.7 g, 42 mmol), anthracene (5.0 g, 28 mmol) and toluene (100 g) were added to a 300 mL pressure-resistant reaction vessel, followed by conducting a reaction at 150° C. for 24 hours. Subsequently, after cooling to room temperature, the resultant was concentrated using a rotary evaporator. Methanol (50 g) was added to the concentrate, followed by stirring. The precipitated solid was subjected to filtration. Thereafter, the resultant was dried under reduced pressure, so as to obtain intermediate 4 (6.0 g, yield=55.6%).

[Chemical Formula 115.]

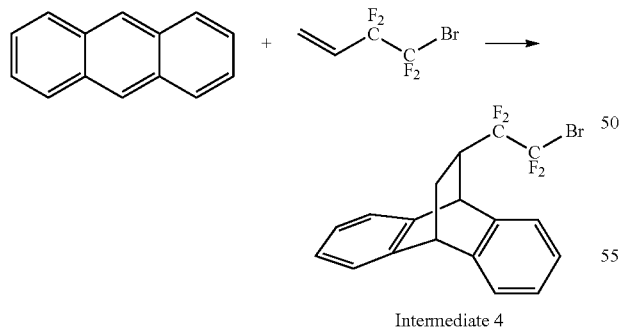

Intermediate product 4 (5.8 g, 15 mmol), benzyltrimethylammonium chloride (2.9 g, 16 mmol), sodium dithionite (6.7, 38 mmol), sodium hydrogen carbonate (3.8 g, 45 mmol), acetonitrile (16 g) and $H_2O$ (16 g) were added to a 200 mL three-necked flask, and a reaction was conducted at 65° C. for 4 hours while stirring. Subsequently, after cooling to room temperature, the reaction liquid was subjected to filtration. $H_2O$ (16 g) and dichloromethane (25 g) were added to the filtrate, followed by stirring for 30 minutes and removing the aqueous phase. Thereafter, the resultant was washed with ultrapure water (160 g) twice, and the organic phase was concentrated using a rotary evaporator. The concentrate was added to and dissolved in acetonitrile (77 g). 30% hydrogen peroxide solution (2.7 g, 24 mmol) was added, and a reaction was conducted at 45° C. for 7 hours. After cooling to room temperature, dichloromethane (78 g) and saturated aqueous solution of sodium sulfite (78 g) was added, followed by stirring for 30 minutes in ultrapure water, and removing the aqueous phase. The resultant was washed with ultrapure water (78 g) twice, and methyl tert-butyl ether (MTBE) (156 g) was added, followed by stirring for 30 minutes. The precipitate was subjected to filtration, followed by drying under reduced pressure, so as to obtain precursor (Bpre-5) (5.8 g, yield=66.8%).

[Chemical Formula 116.]

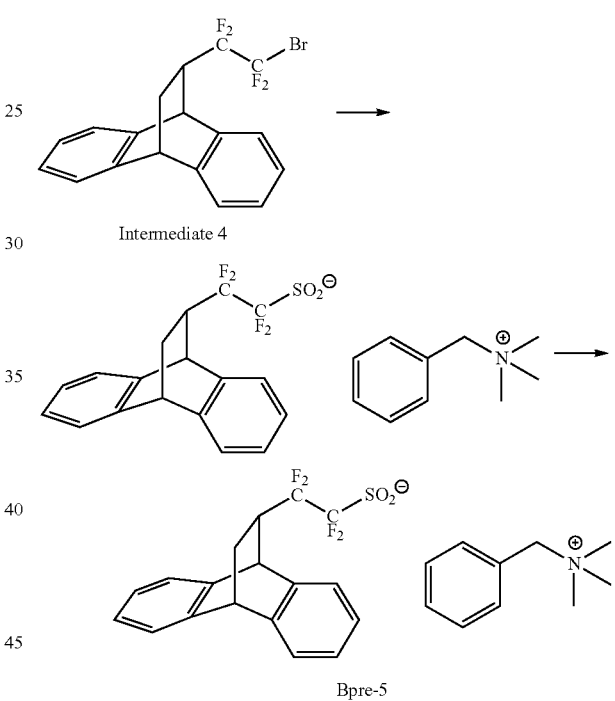

Bpre-5

Production Example 6

The same procedure as in the production example of intermediate 1 was conducted, except that methyl acrylate (3.6 g, 42 mmol) was changed to maleic anhydride (4.0 g, 42 mmol), so as to obtain intermediate 5 (6.4 g, yield=82.3%).

[Chemical Formula 117.]

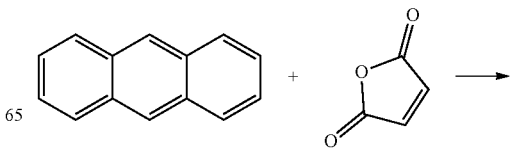

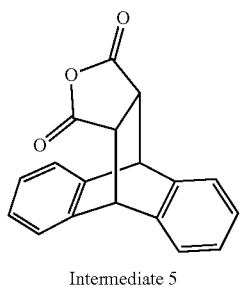

Intermediate 5

Intermediate product 5 (6.0 g, 22 mmol), 5-hydroxynorbomane-2,6-lactone (4.0 g, 26 mmol) and dichloromethane (120 g) were added to a 100 mL three-necked flask, followed by stirring at room temperature to dissolve the contents. Then, dimethylaminopyridine (0.13 g, 1 mmol) and triethylamine (5.5 g, 54 mmol) were added, and a reaction was conducted at room temperature for 24 hours. Ultrapure water (120 g) was added, followed by stirring. Hydrochloric acid was added until the aqueous layer became acidic to effect neutralization, followed by stirring for 30 minutes and removing the aqueous phase. The organic phase was washed 3 times with ultrapure water (120 g). Then, the organic phase was concentrated using a rotary evaporator, so as to obtain an intermediate product 6 (7.2 g, yield=77.1%).

[Chemical Formula 118.]

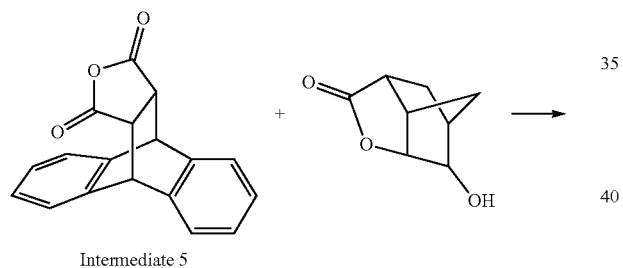

Intermediate 5

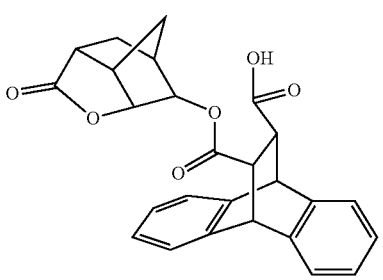

Intermediate 6

Precursor (Bpre-6) (6.6 g, yield=53.1%) was produced in the same manner as in the production example of precursor (Bpre-4), except that intermediate product 2 (4.0 g, 16 mmol) was changed to intermediate product 6 (6.8 g, 16 mmol).

[Chemical Formula 119.]

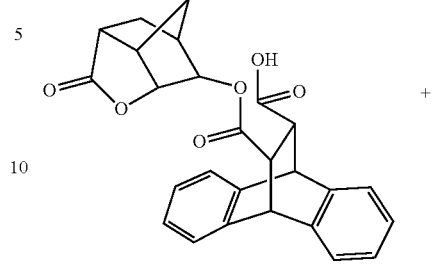

Intermediate 6

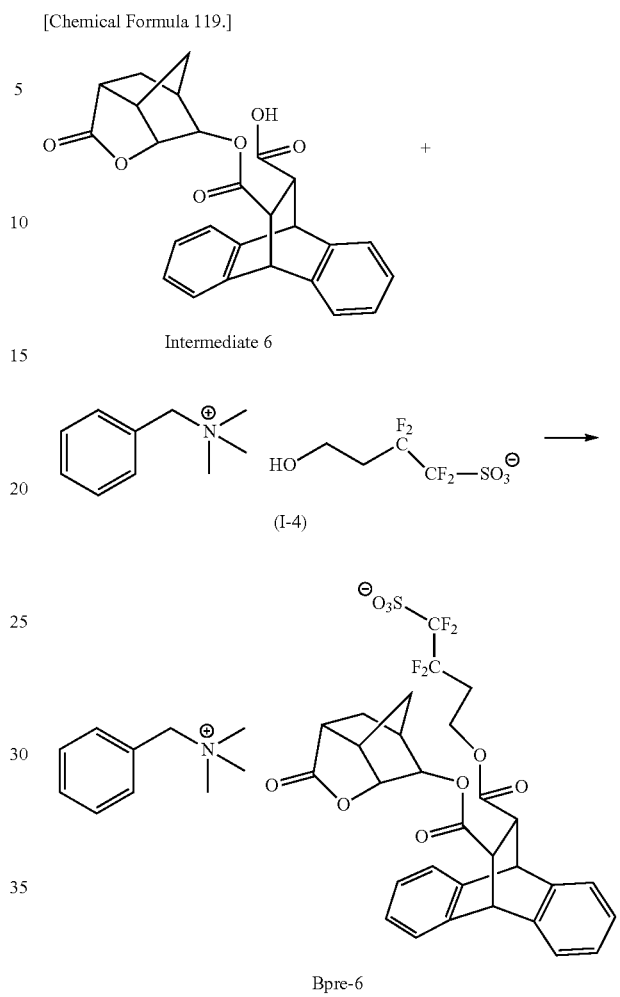

Bpre-6

Production Example 7

Compound (I-4) (12.5 g, 32 mmol), p-toluenesulfonyl chloride (6.7 g, 35 mmol) and dichloromethane (100 g) were added to a 100 mL three-necked flask, followed by stirring at room temperature to disperse the contents. Subsequently, pyridine (3.0 g, 39 mmol) was added over 30 minutes, and a reaction was conducted at room temperature for 6 hours. The reaction liquid was washed with ultrapure water (100 g) 4 times. Then, MTBE (150 g) was added to the organic phase, followed by stirring for 30 minutes. The precipitate was subjected to filtration, followed by drying under reduced pressure, so as to obtain intermediate 7 (8.0 g, yield=48.4%).

[Chemical Formula 120.]

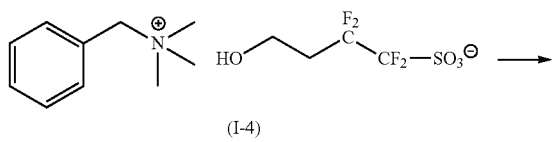

(I-4)

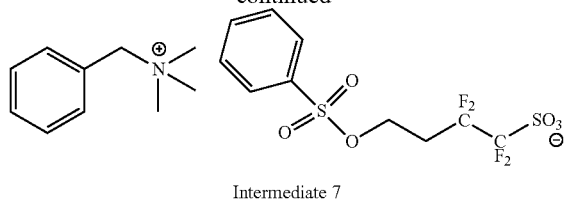

Intermediate 7

Intermediate product 8 (4.0 g, 15 mmol) and THF (100 g) were added to a 200 mL three-necked flask, followed by stirring to dissolve the contents. The resultant was cooled to −78° C., and 1.6M hexane solution of n-butyllithium (8.6 ml, 14 mmol) was added, followed by stirring at −78° C. for 1 hour. Subsequently, intermediate product 7 (7.5 g, 15 mmol) dissolved in THF (150 g) was added, and a reaction was conducted at −50° C. for 3 hours. The reaction liquid was added to ultrapure water (250 g) over 1 hour. Then, dichloromethane (180 g) was added, followed by stirring for 30 minutes and removing the aqueous phase.

After the organic phase was washed with ultrapure water (200 g) three times, the organic phase was dropwise added to MTBE (160 g), and the precipitated solid was subjected to filtration. The residue was dissolved in acetonitrile (70 g), and the resultant was dropwise added to MTBE (140 g). The precipitated solid was subjected to filtration. This operation was conducted twice, followed by drying the residue under reduced pressure, so as to obtain precursor (Bpre-7) (5.2 g, yield=56.5%).

[Chemical Formula 121.]

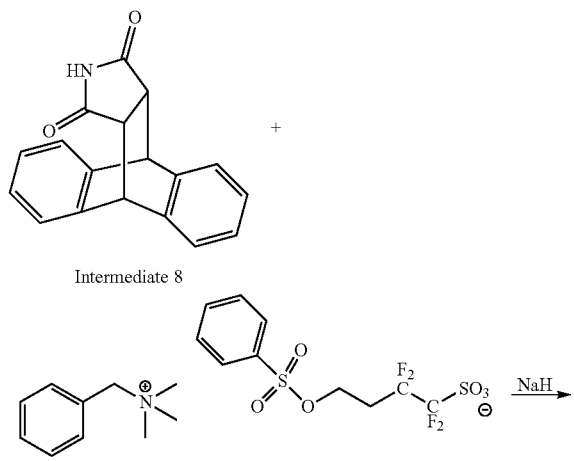

Production Example 8

Sodium hydroxide (3.6 g, 90 mmol) and ultrapure water (36 g) were added to a 100 mL three-necked flask, followed by stirring to dissolve the contents. Then, intermediate 5 (5.0 g, 18 mmol) was dispersed, and a reaction was conducted at 90° C. for 4 hours. After cooling to room temperature, 20% hydrochloric acid (13.2 g, 72.4 mmol) and benzyltrimethylammonium chloride (5.0 g, 27 mmol) were added, and MTBE (50 g) was added, followed by stirring for 30 minutes and removing the aqueous phase. The organic phase was washed 3 times with ultrapure water (50 g). Then, the organic phase was concentrated using a rotary evaporator, so as to obtain a precursor (Bpre-8) (5.7 g, yield=71.0%).

[Chemical Formula 122.]

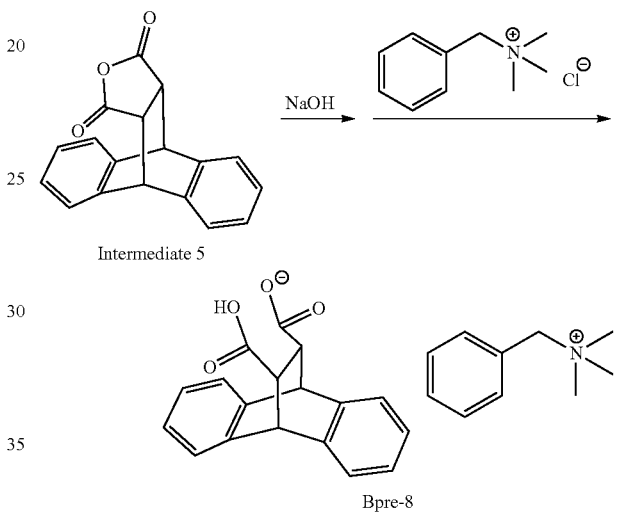

Production Example 9

Sodium hydroxide (3.6 g, 90 mmol) and ultrapure water (36 g) were added to 100 mL three-necked flask, followed by stirring to dissolve the contents. Then, intermediate 1 (4.8 g, 18 mmol) was dispersed, and a reaction was conducted at 90° C. for 4 hours. After cooling to room temperature, 20% hydrochloric acid (13.2 g, 72.4 mmol) and benzyltrimethylammonium chloride (5.0 g, 27 mmol) were added, and MTBE (50 g) was added, followed by stirring for 30 minutes and removing the aqueous phase. The organic phase was washed 3 times with ultrapure water (50 g). Then, the organic phase was concentrated using a rotary evaporator, so as to obtain a precursor (Bpre-9) (4.5 g, yield=62.3%).

[Chemical Formula 123.]

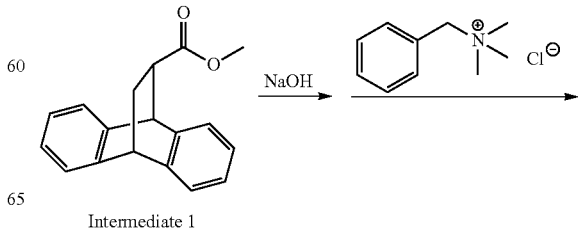

-continued

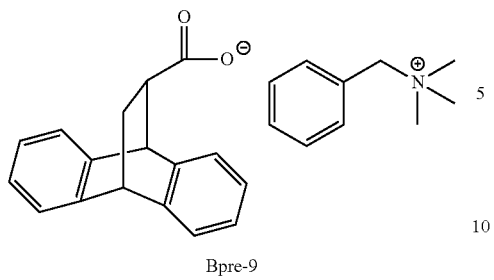

Bpre-9

(Production Method of Compound (B1-3))

Precursor (Bpre-3) (3.8 g, 9.2 mmol), salt exchange compound A (2.8 g, 9.2 mmol) and dichloromethane (60 g) were dissolved, and ultrapure water (60 g) was added, followed by conducting a reaction at room temperature for 30 minutes. After the reaction, the aqueous phase was removed, followed by washing the aqueous phase with ultrapure water (60 g) four times. The organic phase was concentrated and solidified using a rotary evaporator, so as to obtain compound (B1-3) (5.4 g, yield=89.0%).

[Chemical Formula 124.]

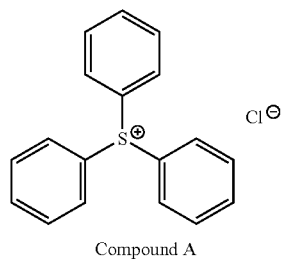

Compound A

+

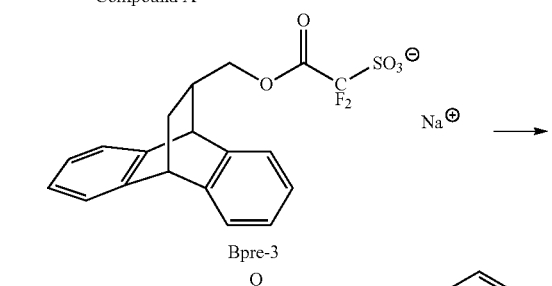

Bpre-3

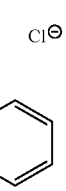

Na⊕ →

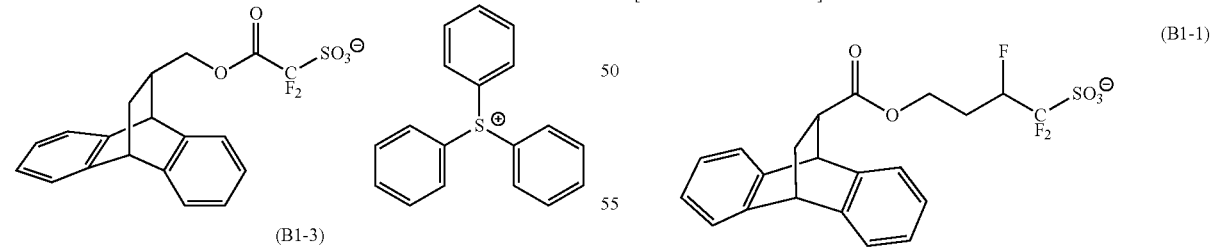

(B1-3)

Production Example of Other Compounds

Except for changing the combination of precursors (Bpre-1) to (Bpre-9) with salt exchange compound A to C, the same procedure as in the "Production Example of compound (B1-3)" was conducted, so as to obtain the following compounds (B1-1) to (B1-9), (D1-1) and (D1-2).

[Chemical Formula 125.]

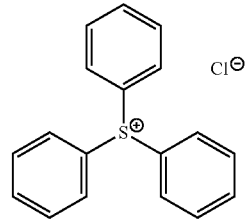

Compound A

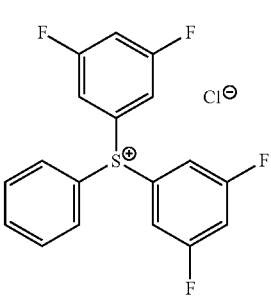

Compound B

Compound C

Each of the obtained compounds was analyzed by NMR, and the structure thereof was identified by the following analysis results.

[Chemical Formula 126.]

(B1-1)

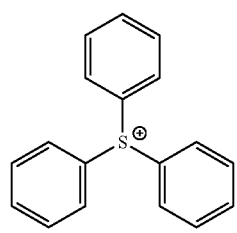

-continued
(B1-2)
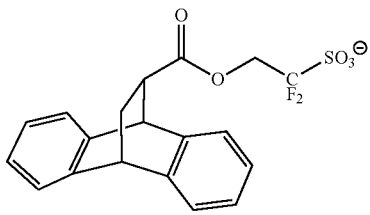
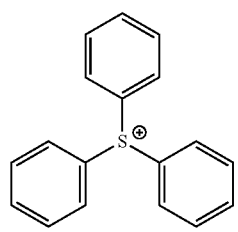
(B1-3)
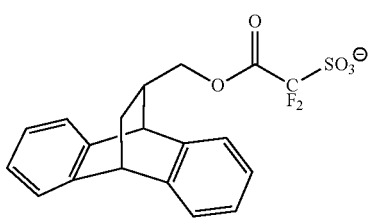
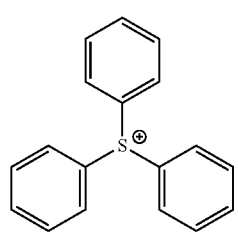
(B1-4)
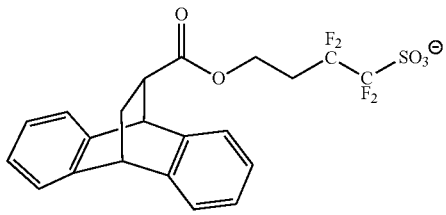
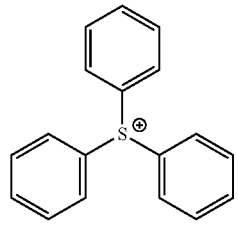
(B1-5)
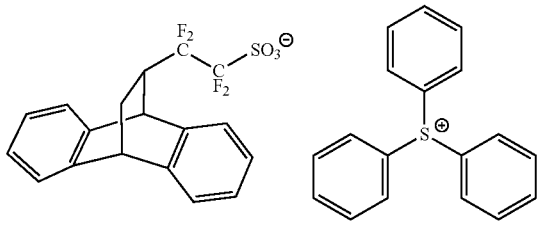
-continued
(B1-6)
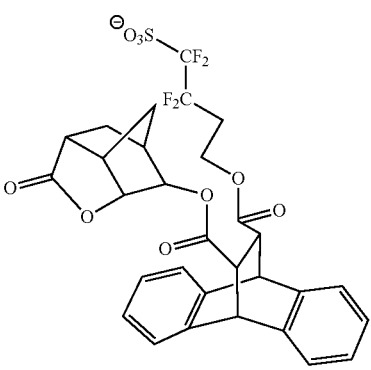
[Chemical Formula 127.]
(B1-7)
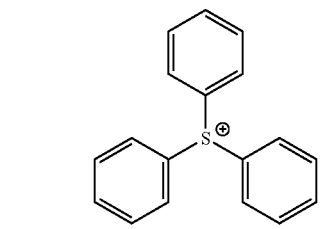
(B1-8)
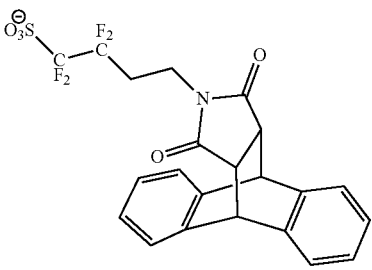

-continued

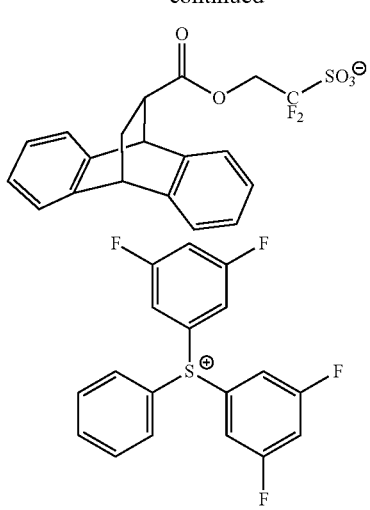

(B1-9)

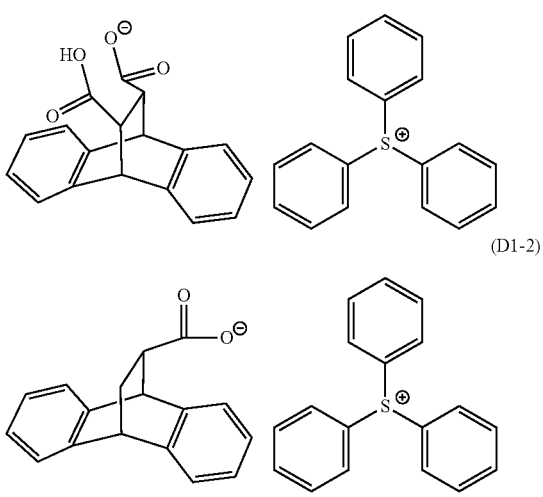

(D1-1)

(D1-2)

Compound (B1-1): Combination of Precursor (Bpre-1) with Salt Exchange Compound A
¹H-NMR (DMSO, 400 MHz): δ(ppm)=7.74-7.90 (m, 15H, ArH), 7.01-7.47 (m, ArH, 8H), 5.08 (m, CFCH, 1H), 4.71 (s, CH, 1H), 4.42 (s, CH, 1H), 4.23 (m, CH2, 2H), 2.90 (m, CH, 1H), 2.45 (m, CFCH, 1H), 1.82-2.07 (m, CH2, CFCH, 3H)
¹⁹F-NMR (DMSO, 376 MHz): δ(ppm)=−112.5, −121.2, −203.2

Compound (B1-2): Combination of Precursor (Bpre-2) with Salt Exchange Compound A
¹H-NMR (DMSO, 400 MHz): δ(ppm)=7.74-7.90 (m, 15H, ArH), 7.00-7.48 (m, ArH, 8H), 4.70 (s, CH, 1H), 4.31-4.58 (m, CH, CF2CH2, 3H), 2.95-3.02 (m, CH, 1H), 1.85-2.05 (m, CH2, 2H)
¹⁹F-NMR (DMSO, 376 MHz): δ(ppm)=−111.4

Compound (B1-3): Combination of Precursor (Bpre-3) with Salt Exchange Compound A
¹H-NMR (DMSO, 400 MHz): δ(ppm)=7.74-7.90 (m, 15H, ArH), 7.01-7.45 (m, ArH, 8H), 4.71 (s, CH, 1H), 4.44 (S, CH, 1H), 4.31 (S, CH2, 2H), 2.93-3.00 (m, CH, 1H), 1.87-2.07 (m, CH2, 1H), 0.98-1.03 (m, CH2, 1H)
¹⁹F-NMR (DMSO, 376 MHz): δ (ppm)=−107.9

Compound (B1-4): Combination of Precursor (Bpre-4) with Salt Exchange Compound A
¹H-NMR (DMSO, 400 MHz): δ(ppm)=7.74-7.90 (m, 15H, ArH), 7.01-7.47 (m, ArH, 8H), 4.72 (s, CH, 1H), 4.43 (S, CH, 1H), 4.23, (t, CH2, 2H), 2.95-3.02 (m, CH, 1H), 2.63-2.73, (m, CF2CH2, 2H), 1.86-2.07 (m, CH2, 2H)
¹⁹F-NMR (DMSO, 376 MHz): δ(ppm)=−111.3, −117.4

Compound (B1-5): Combination of Precursor (Bpre-5) with Salt Exchange Compound A
¹H-NMR (DMSO, 400 MHz): δ(ppm)=7.74-7.90 (m, 15H, ArH), 7.00-7.48 (m, ArH, 8H), 4.70 (s, CH, 1H), 4.40 (s, CH, 1H), 3.15-3.22 (m, CF2CH, 1H), 1.95-2.15 (m, CH2, 2H)
¹⁹F-NMR (DMSO, 376 MHz): δ(ppm)=−11.3, −117.4

Compound (B1-6): Combination of Precursor (Bpre-6) with Salt Exchange Compound A
¹H-NMR (DMSO, 400 MHz): δ(ppm)=7.74-7.90 (m, 15H, ArH), 7.01-7.47 (m, ArH, 8H), 4.70 (d, OCH (lactone), 1H), 4.58 (t, COOCH (lactone), 1H), 4.50 (d, CH, 2H), 4.22, (t, COOCH2, 2H), 3.32 (m, CH (lactone), 1H), 3.20 (t, COCH, 2H), 2.63-2.73, (m, CF2CH2, CH (lactone) 4H), 1.60-2.20 (m, CH2 (lactone), 4H)
¹⁹F-NMR (DMSO, 376 MHz): δ(ppm)=−111.3, −117.4

Compound (B1-7): Combination of Precursor (Bpre-7) with Salt Exchange Compound A
¹H-NMR (DMSO, 400 MHz): δ(ppm)=7.74-7.90 (m, 15H, ArH), 7.01-7.47 (m, ArH, 8H), 4.62 (d, CH, 2H), 3.56 (t, NCH2, 2H), 3.14 (t, COCH, 2H), 2.63-2.73 (m, CF2CH2, 2H)
¹⁹F-NMR (DMSO, 376 MHz): δ(ppm)=−111.3, −117.6

Compound (B1-8): Combination of Precursor (Bpre-2) with Salt Exchange Compound B
¹H-NMR (DMSO, 400 MHz): δ(ppm)=7.74-7.90 (m, 14H, ArH), 7.00-7.48 (m, ArH, 8H), 4.70 (s, CH, 1H), 4.31-4.58 (m, CH, CF2CH2, 3H), 2.95-3.02 (m, CH, 1H), 1.85-2.05 (m, CH2, 2H), 1.31 (s, CH3, 9H)
¹⁹F-NMR (DMSO, 376 MHz): δ(ppm)=−111.4

Compound (B1-9): Combination of Precursor (Bpre-2) with Salt Exchange Compound C
¹H-NMR (DMSO, 400 MHz): δ(ppm)=7.77-7.98 (m, 11H, ArH), 7.00-7.48 (m, ArH, 8H), 4.70 (s, CH, 1H), 4.31-4.58 (m, CH, CF2CH2, 3H), 2.95-3.02 (m, CH, 1H), 1.85-2.05 (m, CH2, 2H)
¹⁹F-NMR (DMSO, 376 MHz): δ (ppm)=−103.9, −111.4

Compound (D1-1): Combination of Precursor (Bpre-8) with Salt Exchange Compound A
¹H-NMR (DMSO, 400 MHz): δ(ppm)=7.74-7.90 (m, 15H, ArH), 7.00-7.48 (m, ArH, 8H), 4.85 (s, ArCH, 2H), 3.16 (s, CH, 2H)

Compound (D1-2): Combination of Precursor (Bpre-9) with Salt Exchange Compound A
¹H-NMR (DMSO, 400 MHz): δ(ppm)=7.74-7.90 (m, 15H, ArH), 7.00-7.48 (m, Ph, 8H), 4.68 (s, CH, 1H), 4.41 (s, CH, 1H), 2.95-3.02 (m, CH, 1H), 1.86-2.04 (m, CH2, 2H)

<Production of Resist Composition (1)>

Examples 1 to 18, Comparative Examples 1 to 10, Reference Examples 1 to 11

The components shown in Tables 1 to 3 were mixed together and dissolved to obtain each resist composition.

TABLE 1

|  | Component (A) | Component (B) | | Component (D) | | Component (B) + Component (D) | Component (S) |
|---|---|---|---|---|---|---|---|
|  |  | Component (B1) | Component (B2) | Component (D1) | Component (D2) |  |  |
| Ex. 1 | (A)-1 [100] | (B1)-1 [21.4] | — | — | (D2)-1 [4.0] | [25.4] | (S)-1 [6400] |
| Ex. 2 | (A)-1 [100] | (B1)-1 [32.1] | — | — | (D2)-1 [6.0] | [38.1] | (S)-1 [6400] |
| Ex. 3 | (A)-1 [100] | (B1)-1 [37.5] | — | — | (D2)-1 [7.0] | [44.5] | (S)-1 [6400] |
| Ex. 4 | (A)-1 [100] | (B1)-1 [42.8] | — | — | (D2)-1 [8.0] | [50.8] | (S)-1 [6400] |
| Ex. 5 | (A)-1 [100] | (B1)-2 [30.0] | — | — | (D2)-1 [6.0] | [36.0] | (S)-1 [6400] |
| Ex. 6 | (A)-1 [100] | (B1)-3 [30.0] | — | — | (D2)-1 [6.0] | [36.0] | (S)-1 [6400] |
| Ex. 7 | (A)-1 [100] | (B1)-4 [32.9] | — | — | (D2)-1 [6.0] | [38.9] | (S)-1 [6400] |
| Ex. 8 | (A)-1 [100] | (B1)-5 [29.6] | — | — | (D2)-1 [6.0] | [35.6] | (S)-1 [6400] |
| Ex. 9 | (A)-1 [100] | (B1)-6 [41.1] | — | — | (D2)-1 [6.0] | [47.1] | (S)-1 [6400] |
| Ex. 10 | (A)-1 [100] | (B1)-7 [34.1] | — | — | (D2)-1 [6.0] | [40.1] | (S)-1 [6400] |
| Ex. 11 | (A)-1 [100] | (B1)-8 [32.6] | — | — | (D2)-1 [6.0] | [38.6] | (S)-1 [6400] |
| Ex. 12 | (A)-1 [100] | (B1)-9 [33.3] | — | — | (D2)-1 [6.0] | [39.3] | (S)-1 [6400] |
| Ex. 13 | (A)-1 [100] | (B1)-6 [41.1] | — | (D1)-1 [8.3] | — | [49.4] | (S)-1 [6400] |
| Ex. 14 | (A)-1 [100] | (B1)-6 [41.1] | — | (D1)-2 [7.7] | — | [48.8] | (S)-1 [6400] |
| Ex. 15 | (A)-2 [100] | (B1)-4 [32.9] | — | — | (D2)-1 [6.0] | [38.9] | (S)-1 [6400] |
| Ex. 16 | (A)-3 [100] | (B1)-4 [32.9] | — | — | (D2)-1 [6.0] | [38.9] | (S)-1 [6400] |
| Ex. 17 | (A)-4 [100] | (B1)-4 [32.9] | — | — | (D2)-1 [6.0] | [38.9] | (S)-1 [6400] |
| Ex. 18 | (A)-5 [100] | (B1)-4 [32.9] | — | — | (D2)-1 [6.0] | [38.9] | (S)-1 [6400] |

TABLE 2

|  | Component (A) | Component (B) | | Component (D) | | Component (B) + Component (D) | Component (S) |
|---|---|---|---|---|---|---|---|
|  |  | Component (B1) | Component (B2) | Component (D1) | Component (D2) |  |  |
| Comp. Ex. 1 | (A)-1 [100] | — | (B2)-1 [17.9] | — | (D2)-1 [4.0] | [21.9] | (S)-1 [6400] |
| Comp. Ex. 2 | (A)-1 [100] | — | (B2)-2 [17.6] | — | (D2)-1 [4.0] | [21.6] | (S)-1 [6400] |
| Comp. Ex. 3 | (A)-1 [100] | — | (B2)-3 [18.6] | — | (D2)-1 [4.0] | [22.6] | (S)-1 [6400] |
| Comp. Ex. 4 | (A)-1 [100] | — | (B2)-4 [26.8] | — | (D2)-1 [4.0] | [30.8] | (S)-1 [6400] |
| Comp. Ex. 5 | (A)-1 [100] | — | (B2)-5 [22.7] | — | (D2)-1 [4.0] | [26.7] | (S)-1 [6400] |

TABLE 2-continued

|  | Component (A) | Component (B) | | Component (D) | | Component (B) + Component (D) | Component (S) |
|---|---|---|---|---|---|---|---|
|  |  | Component (B1) | Component (B2) | Component (D1) | Component (D2) |  |  |
| Comp. Ex. 6 | (A)-1 [100] | — | (B2)-1 [35.7] | — | (D2)-1 [8.0] | [43.7] | (S)-1 [6400] |
| Comp. Ex. 7 | (A)-1 [100] | — | (B2)-2 [35.2] | — | (D2)-1 [8.0] | [43.2] | (S)-1 [6400] |
| Comp. Ex. 8 | (A)-1 [100] | — | (B2)-3 [37.2] | — | (D2)-1 [8.0] | [45.2] | (S)-1 [6400] |
| Comp. Ex. 9 | (A)-1 [100] | — | (B2)-4 [53.7] | — | (D2)-1 [8.0] | [61.7] | (S)-1 [6400] |
| Comp. Ex. 10 | (A)-1 [100] | — | (B2)-5 [45.4] | — | (D2)-1 [8.0] | [53.4] | (S)-1 [6400] |

TABLE 3

|  | Component (A) | Component (B) | | Component (D) | | Component (B) + Component (D) | Component (S) |
|---|---|---|---|---|---|---|---|
|  |  | Component (B1) | Component (B2) | Component (D1) | Component (D2) |  |  |
| Ref. Ex. 1 | (A)-1 [100] | (B1)-1 [10.7] | — | — | (D2)-1 [2.0] | [12.7] | (S)-1 [6400] |
| Ref. Ex. 2 | (A)-1 [100] | (B1)-6 [13.7] | — | — | (D2)-1 [2.0] | [15.7] | (S)-1 [6400] |
| Ref. Ex. 3 | (A)-1 [100] | (B1)-1 [16.1] | — | — | (D2)-1 [3.0] | [19.1] | (S)-1 [6400] |
| Ref. Ex. 4 | (A)-1 [100] | (B1)-8 [10.9] | — | — | (D2)-1 [2.0] | [12.9] | (S)-1 [6400] |
| Ref. Ex. 5 | (A)-1 [100] | (B1)-9 [11.1] | — | — | (D2)-1 [2.0] | [13.1] | (S)-1 [6400] |
| Ref. Ex. 6 | (A)-1 [100] | (B1)-6 [13.7] | — | (D1)-1 [2.8] | — | [16.5] | (S)-1 [6400] |
| Ref. Ex. 7 | (A)-1 [100] | (B1)-6 [13.7] | — | (D1)-2 [2.6] | — | [16.3] | (S)-1 [6400] |
| Ref. Ex. 8 | (A)-2 [100] | (B1)-4 [11.0] | — | — | (D2)-1 [2.0] | [13.0] | (S)-1 [6400] |
| Ref. Ex. 9 | (A)-3 [100] | (B1)-4 [11.0] | — | — | (D2)-1 [2.0] | [13.0] | (S)-1 [6400] |
| Ref. Ex. 10 | (A)-4 [100] | (B1)-4 [11.0] | — | — | (D2)-1 [2.0] | [13.0] | (S)-1 [6400] |
| Ref. Ex. 11 | (A)-5 [100] | (B1)-4 [11.0] | — | — | (D2)-1 [2.0] | [13.0] | (S)-1 [6400] |

In Tables 1 to 3, the reference characters indicate the following. The values in brackets [ ] indicate the amount (in terms of parts by weight) of the component added.

(A)-1: Polymeric compound represented by chemical formula (A1)-1 shown below. Polymeric compound (A1)-1 was obtained by radical polymerization of monomers which derive the structural units constituting the polymeric compound, at a predetermined ratio. With respect to the polymeric compound (A1)-1, the weight average molecular weight (Mw) and the polydispersity (Mw/Mn) were determined by the polystyrene equivalent value as measured by gel permeation chromatography (GPC). As a result, it was found that the weight average molecular weight was 6,800, and the polydispersity was 1.65. The composition of the copolymer (ratio (molar ratio) of the respective structural units within the structural formula) as determined by $^{13}$C-NMR was l/m/n=30/60/10.

(A)-2: Polymeric compound represented by chemical formula (A1)-2 shown below. Polymeric compound (A1)-2 was obtained by radical polymerization of monomers which derive the structural units constituting the polymeric compound, at a predetermined ratio. With respect to the polymeric compound (A1)-2, the weight average molecular weight (Mw) and the polydispersity (Mw/Mn) were determined by the polystyrene equivalent value as measured by gel permeation chromatography (GPC). As a result, it was found that the weight average molecular weight was 6,900, and the polydispersity was 1.68. The composition of the copolymer (ratio (molar ratio) of the respective structural units within the structural formula) as determined by $^{13}$C-NMR was l/m/n=40/40/20.

(A)-3: Polymeric compound represented by chemical formula (A1)-3 shown below. Polymeric compound (A1)-3 was obtained by radical polymerization of monomers which derive the structural units constituting the polymeric compound, at a predetermined ratio. With respect to the polymeric compound (A1)-3, the weight average molecular weight (Mw) and the polydispersity (Mw/Mn) were determined by the polystyrene equivalent value as measured by gel permeation chromatography (GPC). As a result, it was found that the weight average molecular weight was 7,000, and the polydispersity was 1.64. The composition of the copolymer (ratio (molar ratio) of the respective structural units within the structural formula) as determined by $^{13}$C-NMR was l/m/n=30/60/10.

[Chemical Formula 128.]

(A1)-1

(A1)-2

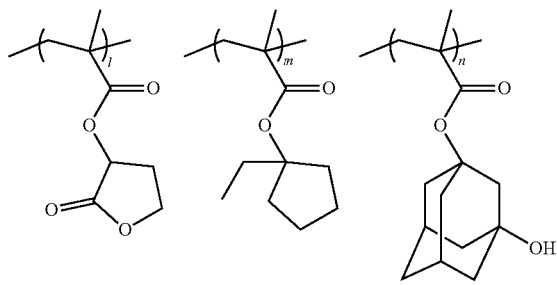

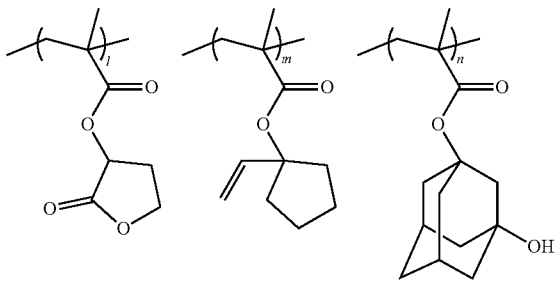

(A1)-3

(A)-4: Polymeric compound represented by chemical formula (A1)-4 shown below. Polymeric compound (A1)-4 was obtained by radical polymerization of monomers which derive the structural units constituting the polymeric compound, at a predetermined ratio. With respect to the polymeric compound (A1)-4, the weight average molecular weight (Mw) and the polydispersity (Mw/Mn) were determined by the polystyrene equivalent value as measured by gel permeation chromatography (GPC). As a result, it was found that the weight average molecular weight was 7,200, and the polydispersity was 1.67. The composition of the copolymer (ratio (molar ratio) of the respective structural units within the structural formula) as determined by $^{13}$C-NMR was l/m/n=30/60/10.

(A)-5: Polymeric compound represented by chemical formula (A1)-5 shown below. Polymeric compound (A1)-5 was obtained by radical polymerization of monomers which derive the structural units constituting the polymeric compound, at a predetermined ratio. With respect to the polymeric compound (A1)-5, the weight average molecular weight (Mw) and the polydispersity (Mw/Mn) were determined by the polystyrene equivalent value as measured by gel permeation chromatography (GPC). As a result, it was found that the weight average molecular weight was 7,200, and the polydispersity was 1.69. The composition of the copolymer (ratio (molar ratio) of the respective structural units within the structural formula) as determined by $^{13}$C-NMR was l/m=50/50.

[Chemical Formula 129.]

(A1)-4

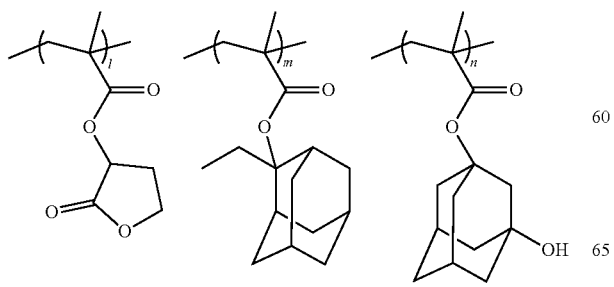

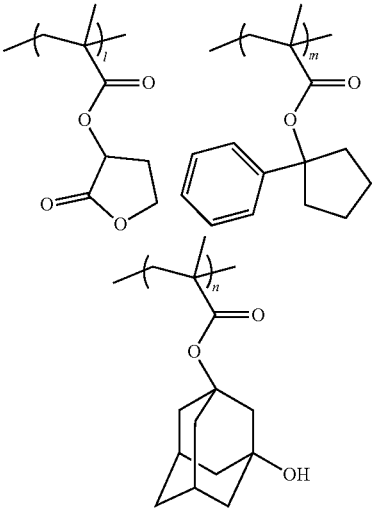

-continued (A1)-5

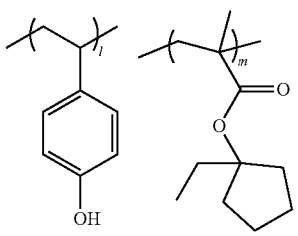

(B1)-1 to (B1)-9: Acid generators consisting of the aforementioned compounds (B1-1) to (B1-9).

(D1)-1: Acid diffusion control agent consisting of a compound represented by the aforementioned chemical formula (D1-1).

(D1)-2: Acid diffusion control agent consisting of a compound represented by the aforementioned chemical formula (D1-2).

(B2)-1 to (B2)-5: Acid generators consisting of compounds (B2-1) to (B2-5) shown below.

(D2)-1: Acid diffusion control agent consisting of a compound represented by chemical formula (D2-1) shown below.

(S)-1: a mixed solvent of propylene glycol monomethyl ether acetate/propylene glycol monomethyl ether=6/4 (weight ratio).

[Chemical Formula 130.]

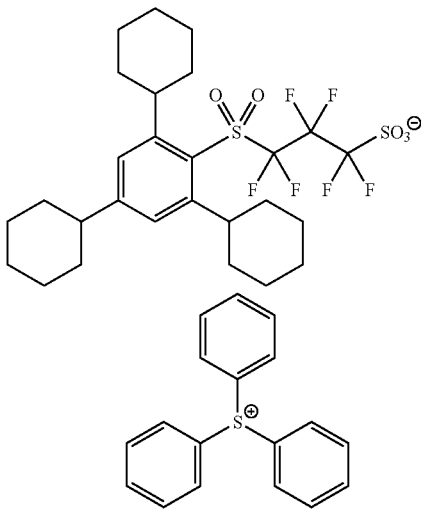

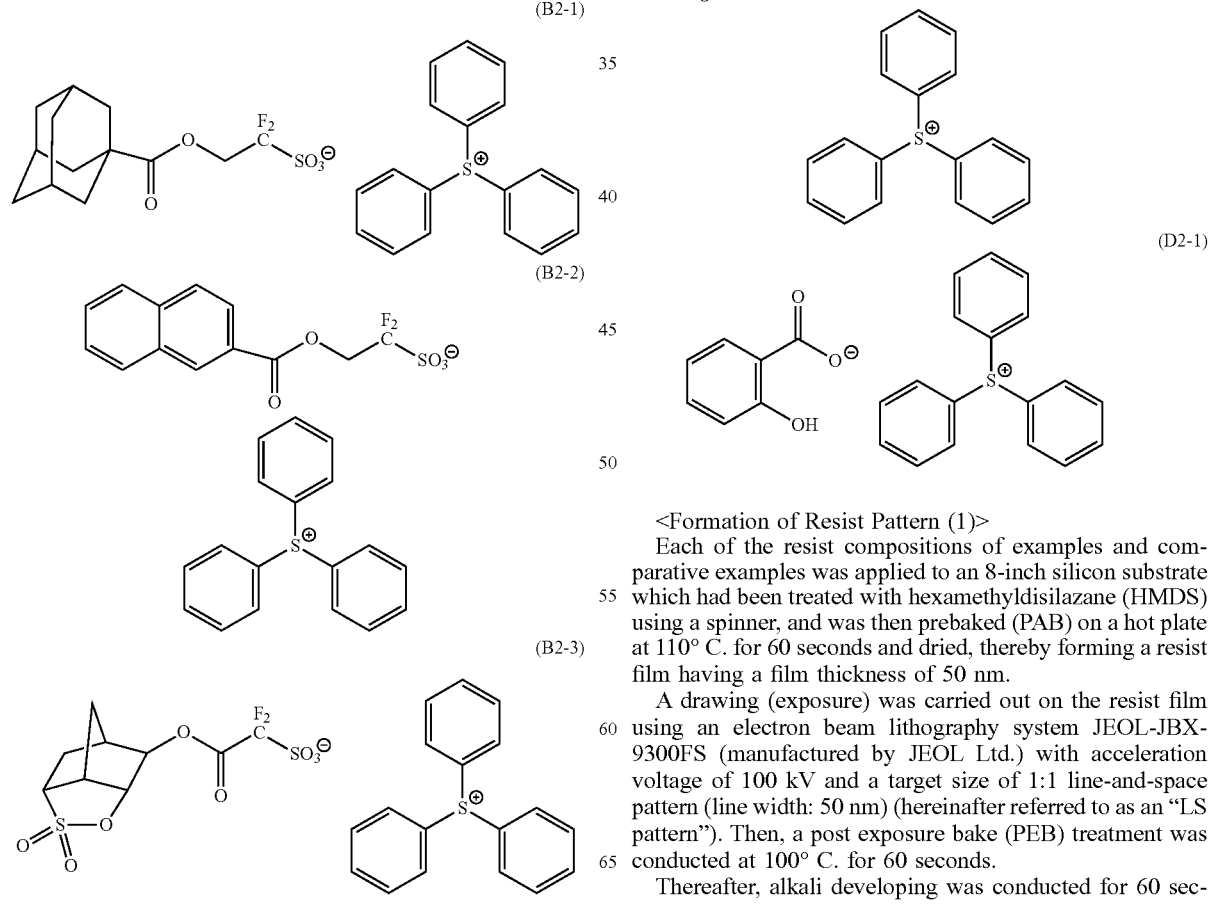

<Formation of Resist Pattern (1)>

Each of the resist compositions of examples and comparative examples was applied to an 8-inch silicon substrate which had been treated with hexamethyldisilazane (HMDS) using a spinner, and was then prebaked (PAB) on a hot plate at 110° C. for 60 seconds and dried, thereby forming a resist film having a film thickness of 50 nm.

A drawing (exposure) was carried out on the resist film using an electron beam lithography system JEOL-JBX-9300FS (manufactured by JEOL Ltd.) with acceleration voltage of 100 kV and a target size of 1:1 line-and-space pattern (line width: 50 nm) (hereinafter referred to as an "LS pattern"). Then, a post exposure bake (PEB) treatment was conducted at 100° C. for 60 seconds.

Thereafter, alkali developing was conducted for 60 seconds at 23° C. in a 2.38% by weight aqueous solution of tetramethylammonium hydroxide (TMAH) (product name: NMD-3; manufactured by Tokyo Ohka Kogyo Co., Ltd.).

Then, water rinsing was conducted for 15 seconds using pure water.

As a result, a 1:1 LS pattern having a line width of 50 nm was formed.

[Evaluation of Optimum Exposure Dose (Eop)]

The optimum exposure dose Eop ($\mu C/cm^2$) with which the LS pattern was formed in the above formation of resist pattern was determined. The results are indicated under "Eop ($\mu C/cm^2$)" in Tables 4 to 6.

[Evaluation of Line Width Roughness (LWR)]

With respect to the LS pattern formed in the above "formation of resist pattern (1)", 3σ was determined as a yardstick for indicating LWR. The results are indicated under "LWR (nm)" in Tables 4 to 6.

"3σ" indicates a value of 3 times the standard deviation (σ) (i.e., 3σ) (unit: nm) determined by measuring the line positions at 400 points in the lengthwise direction of the line using a scanning electron microscope (product name: S-9380, manufactured by Hitachi High-Technologies Corporation; acceleration voltage: 800V).

The smaller this 3σ value is, the lower the level of roughness on the side walls of the line, indicating that an LS pattern with a uniform width was obtained.

[Evaluation of Film Loss]

The film loss was evaluated as follows. The film thickness of the large area unexposed portion after PAB in the above "Formation of resist pattern (1)", and the film thickness of the large area unexposed portion after rinsing were measured. When the film thickness after rinsing was within 3% of the film thickness after PAB (film retention ratio was 97% or more), the film loss was evaluated A; when the film thickness after rinsing was more than 3% and no more than 5% of the film thickness after PAB (film retention ratio was 95% or more and less than 97%), the film loss was evaluated B; and when the film thickness after rinsing was more than 5% of the film thickness after PAB (film retention ratio was less than 95%), the film loss was evaluated C. The results are indicated under "Film loss (nm)" in Tables 4 to 6.

TABLE 4

|  | PAB (° C.) | PEB (° C.) | Eop (uC/cm$^2$) | LWR (nm) | Film loss (nm) |
|---|---|---|---|---|---|
| Ex. 1 | 110 | 100 | 145 | 5.0 | A |
| Ex. 2 | 110 | 100 | 140 | 4.6 | A |
| Ex. 3 | 110 | 100 | 140 | 4.4 | A |
| Ex. 4 | 110 | 100 | 135 | 4.2 | A |
| Ex. 5 | 110 | 100 | 140 | 4.7 | A |
| Ex. 6 | 110 | 100 | 140 | 4.6 | A |
| Ex. 7 | 110 | 100 | 140 | 4.5 | A |
| Ex. 8 | 110 | 100 | 140 | 4.4 | A |
| Ex. 9 | 110 | 100 | 145 | 5.2 | A |
| Ex. 10 | 110 | 100 | 145 | 5.0 | A |
| Ex. 11 | 110 | 100 | 155 | 4.5 | A |
| Ex. 12 | 110 | 100 | 125 | 4.5 | A |
| Ex. 13 | 110 | 100 | 145 | 4.7 | A |
| Ex. 14 | 110 | 100 | 140 | 4.5 | A |
| Ex. 15 | 110 | 100 | 150 | 5.8 | A |
| Ex. 16 | 110 | 100 | 125 | 4.2 | A |
| Ex. 17 | 110 | 100 | 120 | 4.1 | A |
| Ex. 18 | 110 | 100 | 90 | 4.4 | A |

TABLE 5

|  | PAB (° C.) | PEB (° C.) | Eop (uC/cm$^2$) | LWR (nm) | Film loss (nm) |
|---|---|---|---|---|---|
| Comp. Ex. 1 | 110 | 100 | 150 | 6.5 | B |
| Comp. Ex. 2 | 110 | 100 | 155 | 5.9 | B |
| Comp. Ex. 3 | 110 | 100 | 165 | 6.0 | B |
| Comp. Ex. 4 | 110 | 100 | 150 | 6.6 | A |
| Comp. Ex. 5 | 110 | 100 | 150 | 6.5 | B |
| Comp. Ex. 6 | 110 | 100 | 135 | 6.2 | C |
| Comp. Ex. 7 | 110 | 100 | 140 | 5.7 | C |
| Comp. Ex. 8 | 110 | 100 | Pattern could not be formed | | |
| Comp. Ex. 9 | 110 | 100 | 140 | 6.3 | A |
| Comp. Ex. 10 | 110 | 100 | 140 | 6.1 | C |

TABLE 6

|  | PAB (° C.) | PEB (° C.) | Eop (uC/cm$^2$) | LWR (nm) | Film loss (nm) |
|---|---|---|---|---|---|
| Ref. Ex. 1 | 110 | 100 | 155 | 6.1 | A |
| Ref. Ex. 2 | 110 | 100 | 160 | 6.5 | A |
| Ref. Ex. 3 | 110 | 100 | 150 | 5.7 | A |
| Ref. Ex. 4 | 110 | 100 | 170 | 5.9 | A |
| Ref. Ex. 5 | 110 | 100 | 140 | 5.8 | A |
| Ref. Ex. 6 | 110 | 100 | 165 | 6.2 | A |
| Ref. Ex. 7 | 110 | 100 | 160 | 6.0 | A |
| Ref. Ex. 8 | 110 | 100 | 170 | 7.0 | A |
| Ref. Ex. 9 | 110 | 100 | 140 | 5.5 | A |
| Ref. Ex. 10 | 110 | 100 | 135 | 5.4 | A |
| Ref. Ex. 11 | 110 | 100 | 110 | 5.8 | A |

As seen from the results shown in Tables 4 to 6, it was confirmed that, according to the resist compositions of Examples 1 to 18, sensitivity can be enhanced in the formation of a resist pattern, and a resist pattern having reduced roughness and good shape can be formed.

In addition, in the resist compositions of Examples 1 to 18, it can be confirmed that, even when the total amount of the component (B) and the component (D) is increased, film loss of the pattern is less likely to occur.

<Production of Resist Composition (2)>

Test Examples 1-1 to 1-9

Resist compositions were prepared by changing the amount of the compound (B1-1) used as the component (B) (in terms of parts by weight relative to 100 parts by weight of the component (A)) and the amount of the compound (D2-1) used as the component (D) (in terms of parts by weight relative to 100 parts by weight of the component (A)) in the resist composition of Example 1 as indicated in Table 7.

TABLE 7

|  | Test Example | | | | | | | | |
| --- | --- | --- | --- | --- | --- | --- | --- | --- | --- |
|  | 1-1 | 1-2 | 1-3 | 1-4 | 1-5 | 1-6 | 1-7 | 1-8 | 1-9 |
| Amount of compound (B1-1) (parts by weight) | 10.7 | 16.1 | 21.4 | 32.1 | 37.5 | 42.8 | 53.5 | 64.2 | 74.9 |
| Amount of compound (D2-1) (parts by weight) | 2.0 | 3.0 | 4.0 | 6.0 | 7.0 | 8.0 | 10.0 | 12.0 | 14.0 |
| Component (B) + Component (D) (parts by weight) | 12.7 | 19.1 | 25.4 | 38.1 | 44.5 | 50.8 | 63.5 | 76.2 | 88.9 |

<Production of Resist Composition (3)>

Test Examples 3-1 to 3-5

Resist compositions were prepared by changing the amount of the compound (B2-3) used as the component (B) (in terms of parts by weight relative to 100 parts by weight of the component (A)) and the amount of the compound (D2-1) used as the component (D) (in terms of parts by weight relative to 100 parts by weight of the component (A)) in the resist composition of Comparative Example 3 as indicated in Table 8.

TABLE 8

|  | Test Example | | | | |
| --- | --- | --- | --- | --- | --- |
|  | 3-1 | 3-2 | 3-3 | 3-4 | 3-5 |
| Amount of compound (B2-3) (parts by weight) | 9.3 | 14.0 | 18.6 | 27.9 | 32.6 |
| Amount of compound (D2-1) (parts by weight) | 2.0 | 3.0 | 4.0 | 6.0 | 7.0 |
| Component (B) + Connponent (D) (parts by weight) | 11.3 | 17.0 | 22.6 | 33.9 | 39.6 |

<Formation of Resist Pattern (2)>

Using each resist composition of test examples, a 1:1 LS pattern having a line width of 50 nm was formed in the same manner as in the aforementioned "Formation of resist pattern (1)".

3σ which is a yardstick for indicating LWR was determined in the same manner as in the aforementioned "Evaluation of line width roughness (LWR)". Further, regarding the film thickness after rinsing, the amount of change in the film thickness (film retention ratio) based on the film thickness after PAB was determined in the same manner as in the aforementioned "Evaluation of film loss". The results are shown in FIG. 1 to FIG. 4.

FIG. 1 is a graph showing the change in the film retention ratio relative to the total amount of the components (B) and (D).

Figure 2:
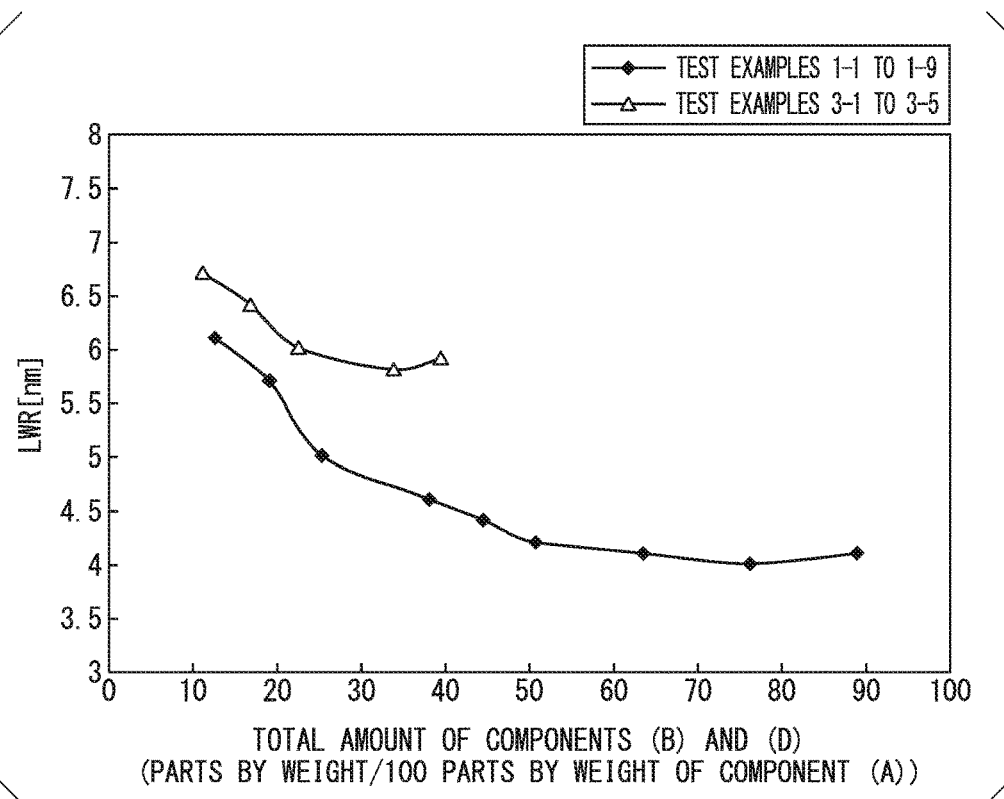
FIG. 2 is a graph showing the change in the LWR value (30 which is a yardstick for indicating LWR) relative to the total amount of the components (B) and (D).

FIG. 2 is a graph showing the change in the LWR value (3σ which is a yardstick for indicating LWR) relative to the total amount of the components (B) and (D).

Figure 3:
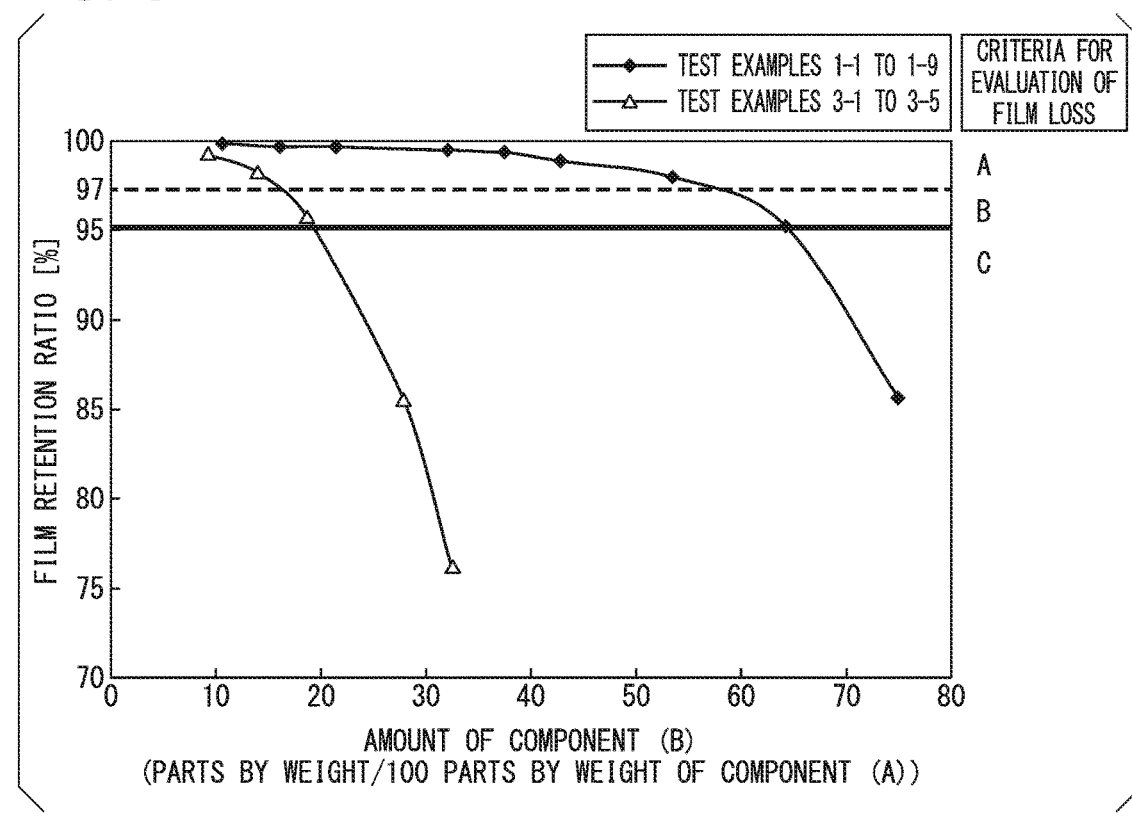
FIG. 3 is a graph showing the change in the film retention ratio relative to the amount of component (B).

FIG. 3 is a graph showing the change in the film retention ratio relative to the amount of component (B).

Figure 4:
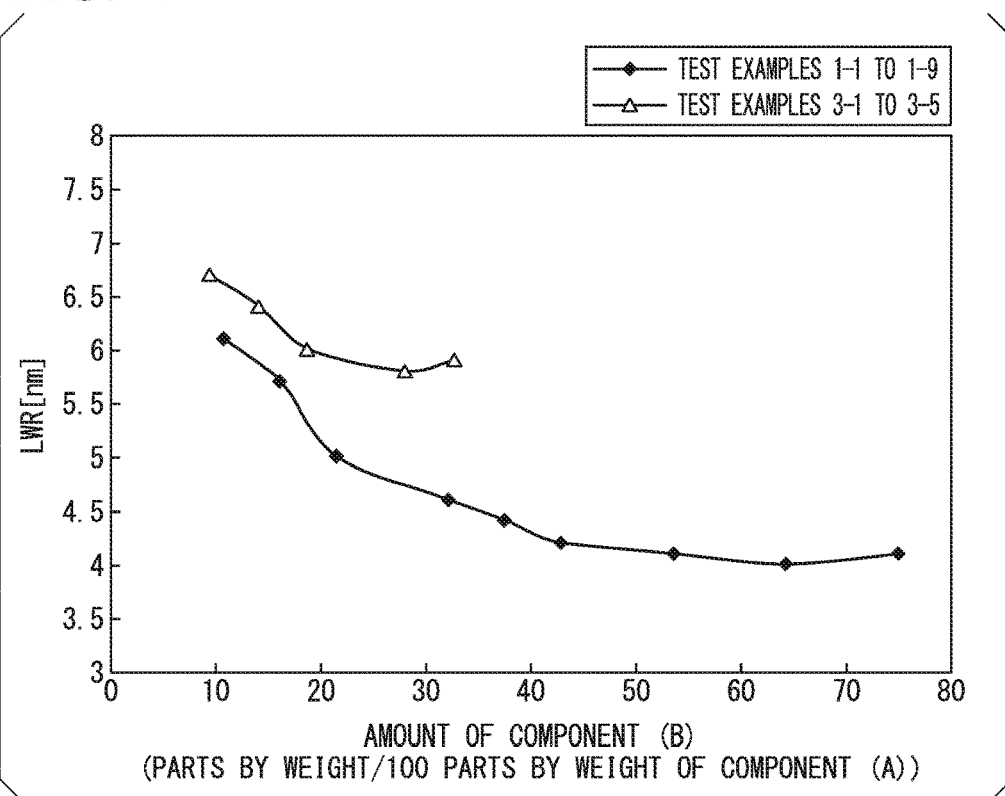
FIG. 4 is a graph showing the change in the LWR value (30 which is a yardstick for indicating LWR) relative to the amount of the component (B).

FIG. 4 is a graph showing the change in the LWR value (3σ which is a yardstick for indicating LWR) relative to the amount of the component (B).

As seen from the results shown in FIG. 1, in the case of a resist composition using the compound (B1-1) as the component (B), even when the total amount of the component (B) and the component (D) is increased to 70 parts by weight, it was confirmed that the film retention ratio is maintained as high as 95% or more.

On the other hand, in the case of a resist composition using the compound (B2-3) as the component (B), when the total amount of the component (B) and the component (D) exceeds 20 parts by weight, the film retention ratio was markedly decreased.

As seen from the results shown in FIG. 1 and FIG. 2, it was confirmed that, in the case of a resist composition using the compound (B1-1) as the component (B), by increasing the total amount of the component (B) and the component (D), lithography properties such as reduction of roughness may be significantly improved while suppressing film loss of the pattern.

On the other hand, it was confirmed that, in the case of a resist composition using the compound (B2-3) as the component (B), when the total amount of the component (B) and the component (D) is increased, although roughness may be reduced, film loss of the pattern is likely to occur.

As seen from the results shown in FIG. 3, in the case of a resist composition using the compound (B1-1) as the component (B), even when the amount of the compound (B1-1) is increased to 60 parts by weight, it was confirmed that the film retention ratio is maintained as high as 95% or more.

On the other hand, in the case of a resist composition using the compound (B2-3) as the component (B), the film retention ratio markedly dropped when the amount of the compound (B2-3) was near 20 parts by weight.

From the results shown in FIG. 3 and FIG. 4, it was confirmed that, by increasing the amount of the compound (B1-1), lithography properties such as reduction of roughness may be significantly improved while suppressing film loss of the pattern.

On the other hand, it was confirmed that, when the amount of the compound (B2-3) was increased, although roughness may be reduced, film loss of the pattern is likely to occur.

<Production of Compound>

Production Example 1a

Anthracene (5.0 g, 28 mmol), methyl acrylate (3.6 g, 42 mmol), aluminum chloride (0.37 g, 2.8 mmol) and toluene (50 g) were added to a 100 mL three-necked flask, and a reaction was conducted at 80° C. for 4 hours while stirring. After cooling, ultrapure water (50 g) and MTBE (74 g) were added. After stirring for 30 minutes, the aqueous phase was removed. The organic phase was washed with ultrapure water (50 g) 3 times, and the organic phase was concentrated using a rotary evaporator. The concentrate was subjected to recrystallization in 2-isopropanol, so as to obtain intermediate 1a (5.9 g, yield=79.6%).

Sodium hydroxide (3.8 g, 95 mmol) and ultrapure water (38 g) were added to a 100 mL three-necked flask, followed by dispersing intermediate 1a (5.0 g, 19 mmol), and conducting a reaction at 90° C. for 4 hours. After cooling to room temperature, hydrochloric acid was added until the solution was neutralized. Then, MTBE (50 g) was added, and stirred for 30 minutes, followed by removing the aqueous phase. The organic phase was washed 3 times with ultrapure water (50 g). Then, the organic phase was concentrated using a rotary evaporator, so as to obtain an intermediate product 2a (4.6 g, yield=97.2%).

[Chemical Formula 131.]

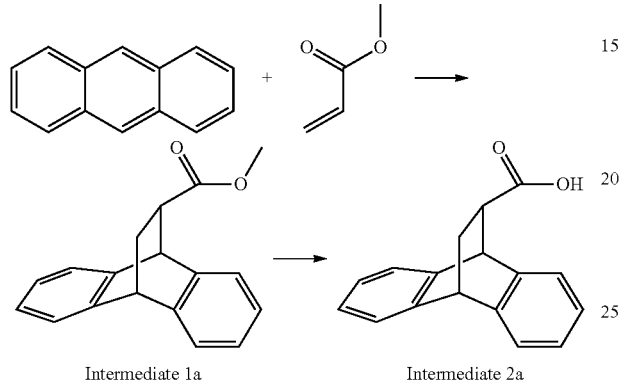

Intermediate 1a          Intermediate 2a

Intermediate product 2a (4.8 g, 19 mmol) and tetrahydrofuran (THF) (50 g) were added to a 100 mL three-necked flask, followed by stirring at room temperature to dissolve the contents. Then, LiAlH4 (0.86 g, 23 mmol) was added, and reacted at room temperature for 3 hours. Subsequently, ultrapure water (50 g) and MTBE (50 g) were added. After stirring for 30 minutes, the aqueous phase was removed. The organic phase was washed 3 times with ultrapure water (50 g). Then, the organic phase was concentrated using a rotary evaporator, so as to obtain an intermediate product 3a (4.1 g, yield=91.0%).

Intermediate product 3a (4.0 g, 19 mmol), compound (I-1a) (3.6 g, 18 mmol), p-toluenesulfonic acid monohydrate (0.18 g, 0.9 mmol) and toluene (40 g) were added to a 100 mL three-necked flask, followed by reflux at 110° C. for 24 hours. After cooling, the resultant was subjected to filtration. Acetonitrile (160 g) was added to the residue, followed by stirring at room temperature for 30 minutes, and filtration. The filtrate was concentrated, and methyl ethyl ketone (78 g) was added to the residue, followed by stirring. Then, the resultant was subjected to filtration, and the residue was dried, so as to obtain precursor (Bpre-1a) (4.9 g, yield=62.4%).

[Chemical Formula 132.]

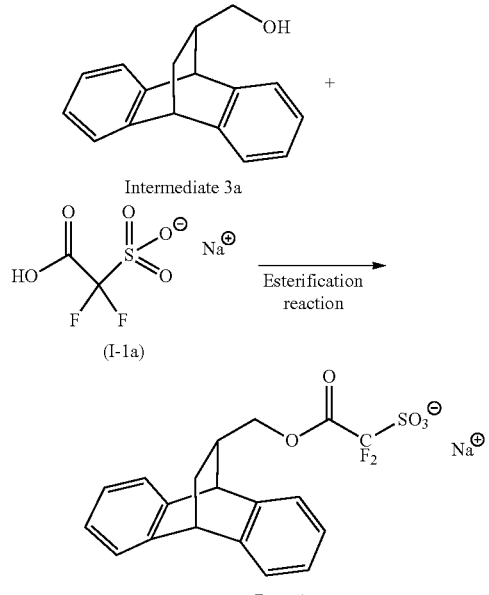

Production Example 2a

Intermediate product 2a (4.0 g, 16 mmol), compound (I-2a) (5.0 g, 16 mmol) and dichloromethane (87 g) were added to a 100 mL three-necked flask, followed by stirring at room temperature to dissolve the contents. Then, diisopropylcarbodiimide (2.2 g, 18 mmol) and dimethylaminopyridine (0.098 g, 0.8 mmol) were added, and reacted at room temperature for 5 hours. The reaction liquid was subjected to filtration, and the filtrate was concentrated using a rotary evaporator. The concentrate was dissolved in acetonitrile (17 g), and the resultant was dropwise added to MTBE (170 g), followed by subjecting the precipitated solid to filtration. The residue was dissolved in acetonitrile (17 g), and the resultant was dropwise added to MTBE (170 g), followed by subjecting the precipitated solid to filtration. After conducting this operation twice, the residue was dried under reduced pressure, so as to obtain precursor (Bpre-2a) (5.8 g, yield=66.8%).

[Chemical Formula 133.]

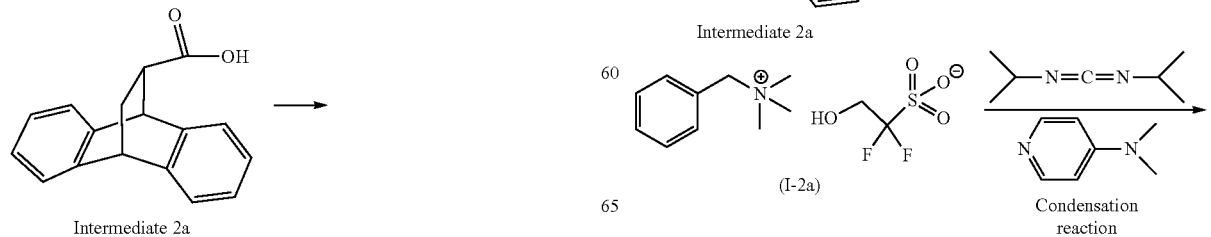

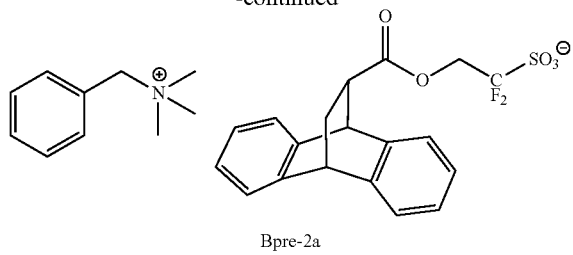

Bpre-2a

Production Example 3a

Intermediate product 2a (4.0 g, 16 mmol), compound (I-3a) (5.7 g, 16 mmol) and dichloromethane (87 g) were added to a 100 mL three-necked flask, followed by stirring at room temperature to dissolve the contents.

Then, diisopropylcarbodiimide (2.2 g, 18 mmol) and dimethylaminopyridine (0.098 g, 0.8 mmol) were added, and reacted at room temperature for 5 hours. The reaction liquid was subjected to filtration, and the filtrate was concentrated using a rotary evaporator. The concentrate was dissolved in acetonitrile (17 g), and the resultant was dropwise added to MTBE (170 g), followed by subjecting the precipitated solid to filtration. The residue was dissolved in acetonitrile (17 g), and the resultant was dropwise added to MTBE (170 g), followed by subjecting the precipitated solid to filtration. After conducting this operation twice, the residue was dried under reduced pressure, so as to obtain precursor (Bpre-3a) (6.2 g, yield=65.4%).

[Chemical Formula 134.]

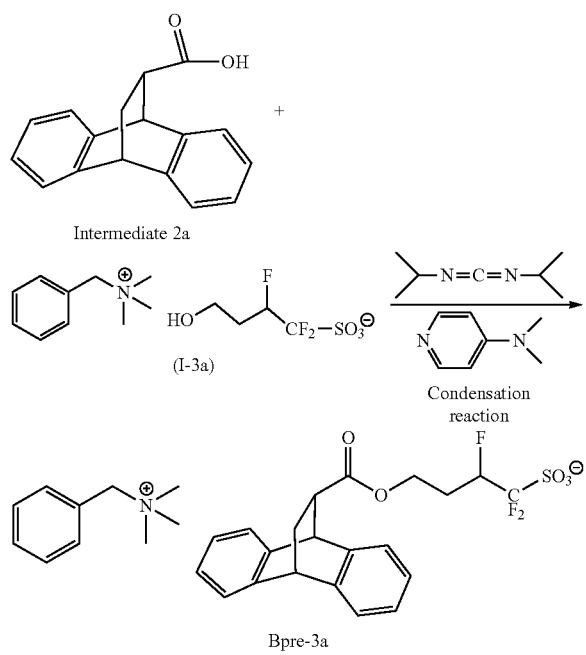

Production Example 4a

Intermediate product 2a (4.0 g, 16 mmol), compound (I-4a) (6.0 g, 16 mmol) and dichloromethane (87 g) were added to a 100 mL three-necked flask, followed by stirring at room temperature to dissolve the contents.

Then, diisopropylcarbodiimide (2.2 g, 18 mmol) and dimethylaminopyridine (0.098 g, 0.8 mmol) were added, and reacted at room temperature for 5 hours. The reaction liquid was subjected to filtration, and the filtrate was concentrated using a rotary evaporator. The concentrate was dissolved in acetonitrile (17 g), and the resultant was dropwise added to MTBE (170 g), followed by subjecting the precipitated solid to filtration. The residue was dissolved in acetonitrile (17 g), and the resultant was dropwise added to MTBE (170 g), followed by subjecting the precipitated solid to filtration. After conducting this operation twice, the residue was dried under reduced pressure, so as to obtain precursor (Bpre-4a) (7.6 g, yield=78.2%).

[Chemical Formula 135.]

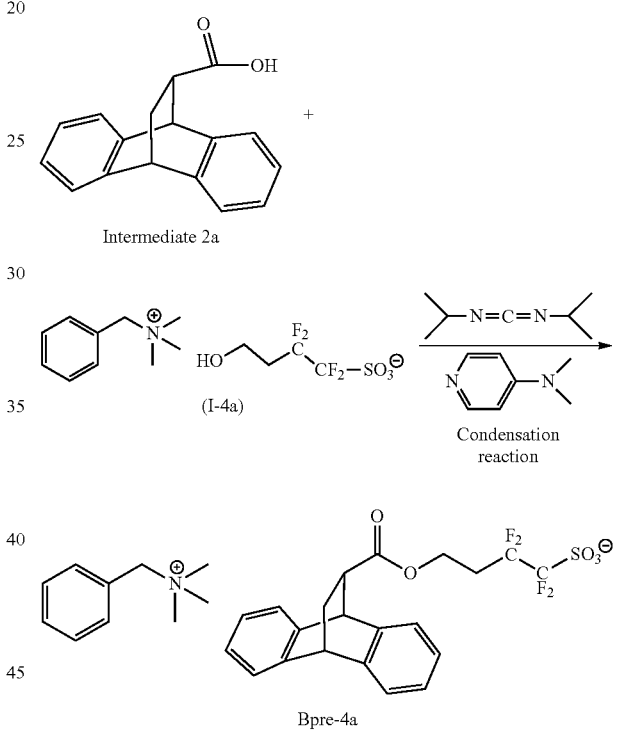

Production Example 5a

The same procedure as in the production example of intermediate 2a was conducted, except that methyl acrylate (3.6 g, 42 mmol) was changed to maleic anhydride (4.0 g, 42 mmol), so as to obtain intermediate 4a (6.4 g, yield=82.3%).

[Chemical Formula 136.]

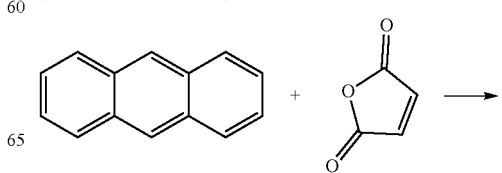

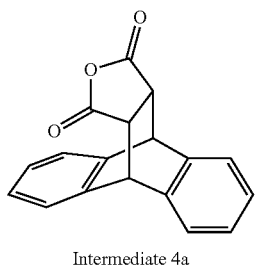

Intermediate 4a

Intermediate product 4a (6.0 g, 22 mmol), 5-hydroxynorbornane-2,6-lactone (4.0 g, 26 mmol) and dichloromethane (120 g) were added to a 100 mL three-necked flask, followed by stirring at room temperature to dissolve the contents. Then, dimethylaminopyridine (0.13 g, 1 mmol) and triethylamine (5.5 g, 54 mmol) were added, and a reaction was conducted at room temperature for 24 hours. Ultrapure water (120 g) was added, followed by stirring. Hydrochloric acid was added until the aqueous layer became acidic to effect neutralization, followed by stirring for 30 minutes and removing the aqueous phase. The organic phase was washed 3 times with ultrapure water (120 g). Then, the organic phase was concentrated using a rotary evaporator, so as to obtain an intermediate product 5a (7.2 g, yield=77.1%).

[Chemical Formula 137.]

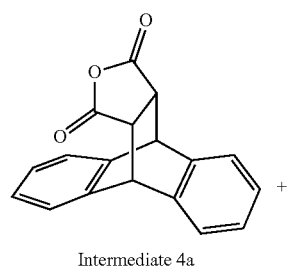

Intermediate 4a

Intermediate 5a

Precursor (Bpre-5a) (6.6 g, yield=53.1%) was produced in the same manner as in the production example of precursor (Bpre-4a), except that intermediate product 2a (4.0 g, 16 mmol) was changed to intermediate product 5a (6.8 g, 16 mmol).

[Chemical Formula 138.]

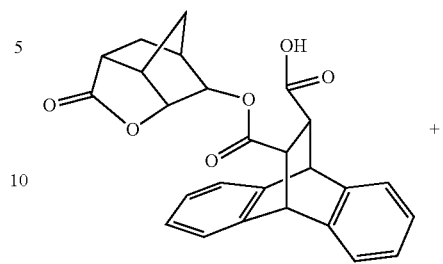

Intermediate 5a (1-4a)

Bpre-5a

Production Example 6a 4-bromo-3,3,4,4-tetrafluoro-1-butene (8.7 g, 42 mmol), anthracene (5.0 g, 28 mmol) and toluene (100 g) were added to a 300 mL pressure-resistant reaction vessel, followed by conducting a reaction at 150° C. for 24 hours. Subsequently, after cooling to room temperature, the resultant was concentrated using a rotary evaporator. Methanol (50 g) was added to the concentrate, followed by stirring. The precipitated solid was subjected to filtration. Then, the resultant was dried under reduced pressure, so as to obtain intermediate 6a (6.0 g, yield=55.6%).

[Chemical Formula 139.]

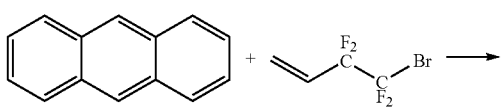

-continued

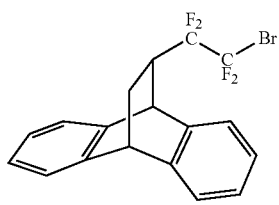

Intermediate 6a

Intermediate product 6a (5.8 g, 15 mmol), benzyltrimethylammonium chloride (2.9 g, 16 mmol), sodium dithionite (6.7, 38 mmol), sodium hydrogen carbonate (3.8 g, 45 mmol), acetonitrile (16 g) and H₂O (16 g) were added to a 200 mL three-necked flask, and a reaction was conducted at 65° C. for 4 hours while stirring. Subsequently, after cooling to room temperature, the reaction liquid was subjected to filtration. H₂O (16 g) and dichloromethane (25 g) were added to the filtrate, followed by stirring for 30 minutes and removing the aqueous phase. Thereafter, the resultant was washed with ultrapure water (160 g) twice, and the organic phase was concentrated using a rotary evaporator. The concentrate was added to and dissolved in acetonitrile (77 g). 30% hydrogen peroxide solution (2.7 g, 24 mmol) was added, and a reaction was conducted at 45° C. for 7 hours. After cooling to room temperature, dichloromethane (78 g) and saturated aqueous solution of sodium sulfite (78 g) was added, followed by stirring for 30 minutes in ultrapure water, and removing the aqueous phase. The resultant was washed with ultrapure water (78 g) twice, and methyl tert-butyl ether (MTBE) (156 g) was added, followed by stirring for 30 minutes. The precipitate was subjected to filtration, followed by drying under reduced pressure, so as to obtain precursor (Bpre-6a) (5.8 g, yield=66.8%).

[Chemical Formula 140.]

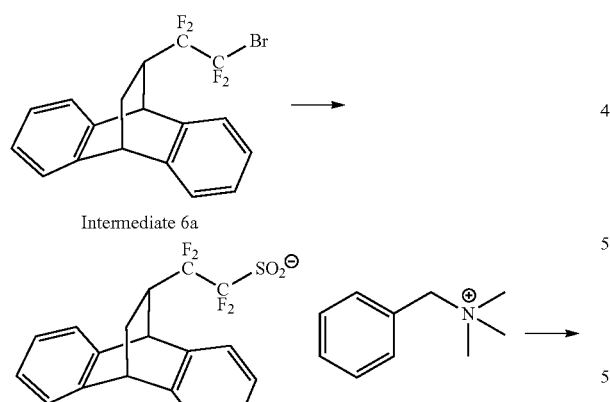

Production Example 7a

Sodium hydroxide (3.6 g, 90 mmol) and ultrapure water (36 g) were added to a 100 mL three-necked flask, followed by dispersing intermediate 4a (5.0 g, 18 mmol), and conducting a reaction at 90° C. for 4 hours. After cooling to room temperature, 20% hydrochloric acid (13.2 g, 72.4 mmol) and benzyltrimethylammonium chloride (5.0 g, 27 mmol) were added, and MTBE (50 g) was added, followed by stirring for 30 minutes and removing the aqueous phase. The organic phase was washed 3 times with ultrapure water (50 g). Then, the organic phase was concentrated using a rotary evaporator, so as to obtain a precursor (Bpre-7a) (5.7 g, yield=71.0%).

[Chemical Formula 141.]

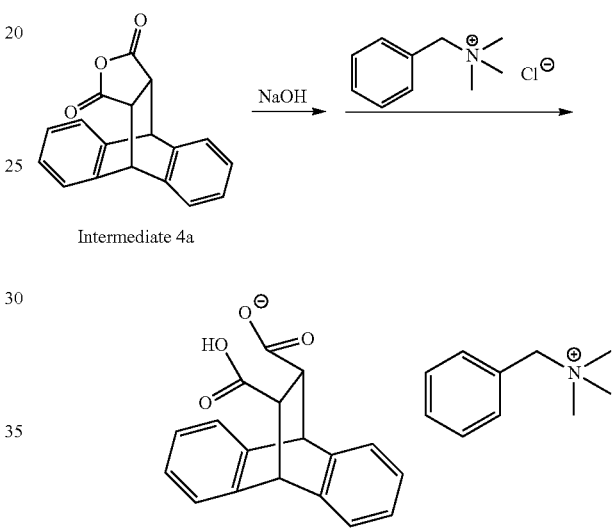

(Production Method of Compound (B1-1a))

Precursor (Bpre-1a) (3.8 g, 9.2 mmol) and salt exchange compound Aa (2.3 g, 9.2 mmol) were dissolved in dichloromethane (56 g), and ultrapure water (56 g) was added thereto, followed by conducting a reaction at room temperature for 30 minutes. After the reaction, the aqueous phase was removed, followed by washing the organic phase with ultrapure water (56 g) four times. The organic phase was concentrated and solidified using a rotary evaporator, so as to obtain compound (B1-1a) (4.2 g, yield=75.5%).

[Chemical Formula 142.]

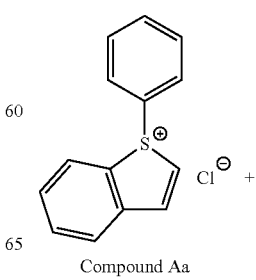

Compound Aa

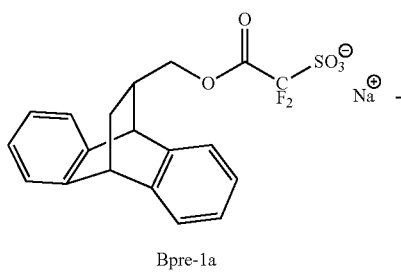

Bpre-1a

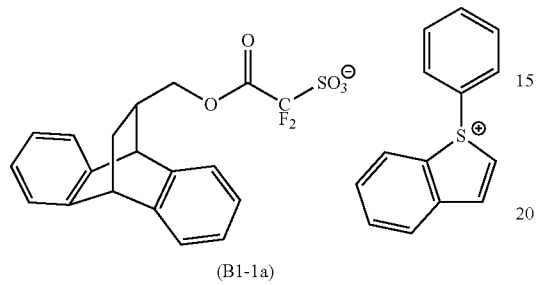

(B1-1a)

Production Example of Other Compounds

Except for changing the combination of precursors (Bpre-1a) to (Bpre-9a) with salt exchange compounds Aa to Da, the same procedure as in the "Production Example of compound (B1-1a)" was conducted, so as to obtain the following compounds (B1-1a) to (B1-9a), (B2-1a) to (B2-9a), (D1-3a) and (D2-2a).

[Chemical Formula 143.]

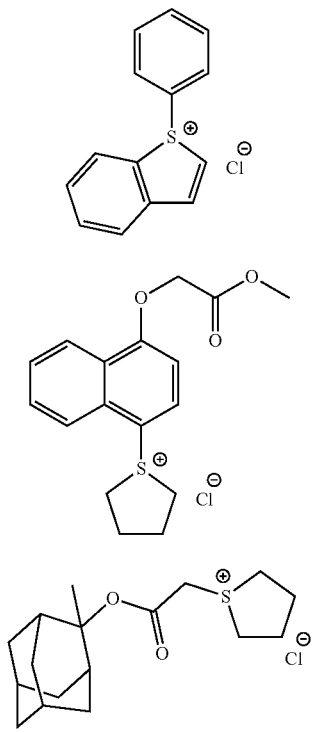

Compound Aa

Compound Ba

Compound Ca

Compound Da (Production Method of Compound (D1-1a))

Production Example 8a

Grignard reagent was prepared by a conventional method using 9-bromotriptycene (20.0 g, 60 mmol), magnesium (1.6 g, 66 mmol) and THF (400 g). To the Grignard reagent was introduced carbon dioxide at 25 to 35° C., and a reaction was conducted at room temperature for 2 hours. Ultrapure water (400 g) was added to the reaction liquid, followed by stirring for 1 hour. Then, hydrochloric acid was added until the solution was neutralized, and the precipitate was subjected to filtration. The residue was washed with ultrapure water (100 g) twice and with methanol (50 g) twice, followed by drying under reduced pressure, so as to obtain intermediate 7a (10.0 g, yield=55.8%).

[Chemical Formula 144.]

Intermediate 7a

Intermediate 7a (2.5 g, 8.4 mmol) and salt exchange compound Aa (2.1 g, 8.4 mmol) were dissolved in dichloromethane (43 g), and a 5% aqueous solution of tetramethylammonium hydroxide (TMAH) (16 g) was added, followed by conducting a reaction at room temperature for 30 minutes. After the reaction, the aqueous phase was removed, and the organic phase was washed with ultrapure water (15 g) 10 times. The organic phase was concentrated and solidified using a rotary evaporator, so as to obtain compound (D1-1a) (2.6 g, yield=60.9%).

[Chemical Formula 145.]

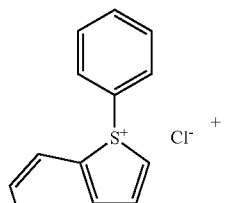

Compound Aa

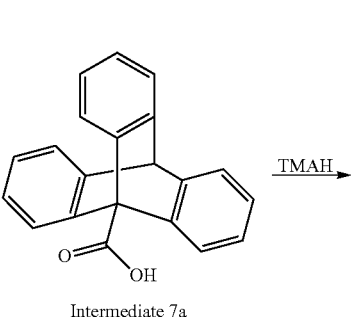

Intermediate 7a

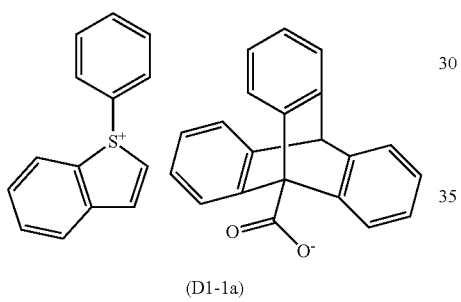

(D1-1a)

(Production Method of Compound (D1-2a))

Intermediate 2a (2.2 g, 8.4 mmol) and salt exchange compound Aa (2.1 g, 8.4 mmol) were dissolved in dichloromethane (39 g), and a 5% aqueous solution of tetramethylammonium hydroxide (TMAH) (16 g) was added, followed by conducting a reaction at room temperature for 30 minutes. After the reaction, the aqueous phase was removed, and the organic phase was washed with ultrapure water (10 g) 10 times. The organic phase was concentrated and solidified using a rotary evaporator, so as to obtain compound (D1-2a) (1.6 g, yield=42.1%).

[Chemical Formula 146.]

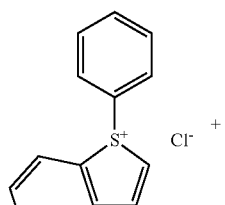

Compound Aa

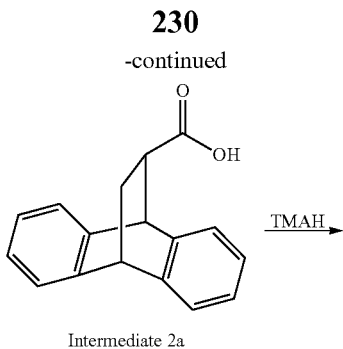

Intermediate 2a

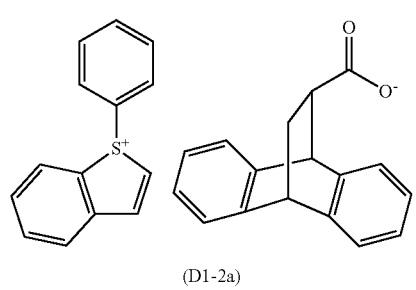

(D1-2a)

Each of the obtained compounds was analyzed by NMR, and the structure thereof was identified by the following analysis results.

[Chemical Formula 147.]

(B1-1a)

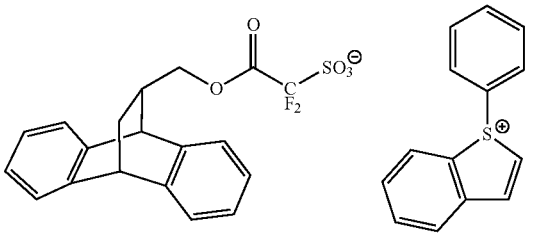

(B1-2a)

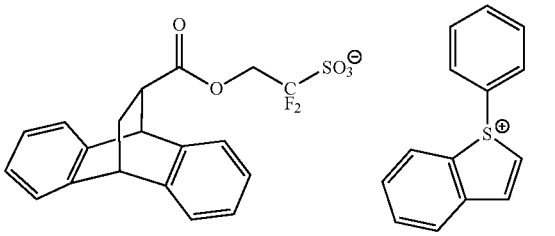

(B1-3a)

231
-continued
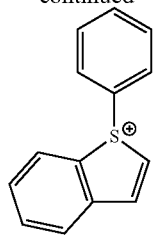
(B1-4a)
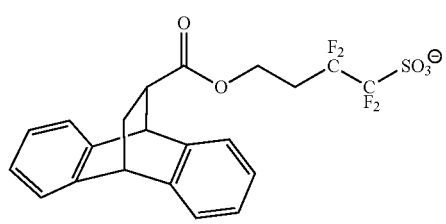
(B1-5a)
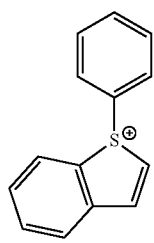
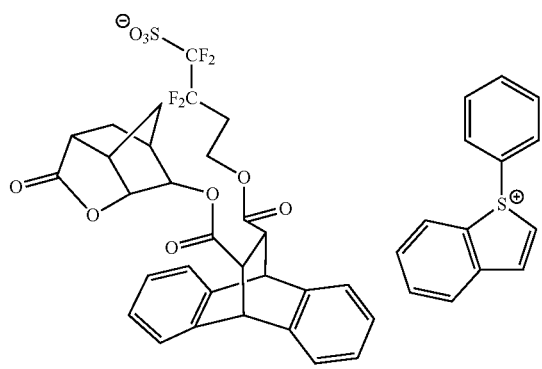
(B1-6a)
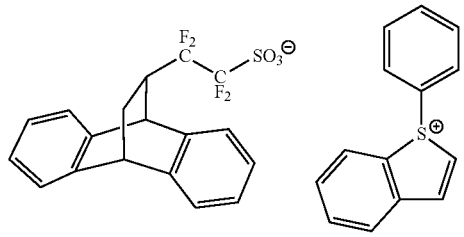
(B1-7a)
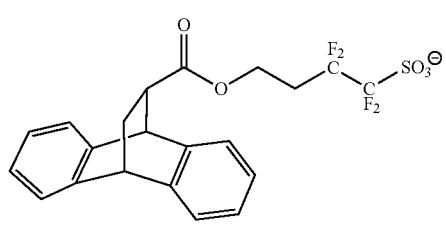
232
-continued
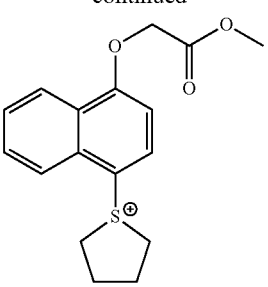
(B1-8a)
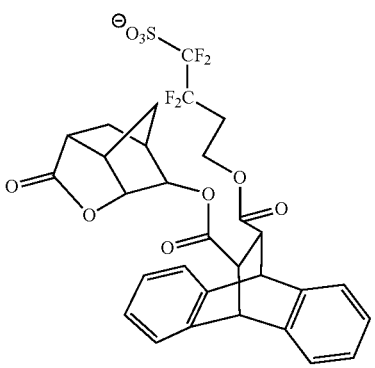
(B1-9a)
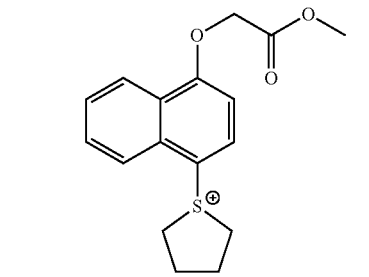
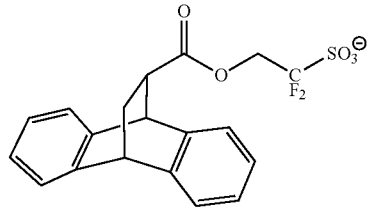
[Chemical Formula 148.]
(B2-5a)
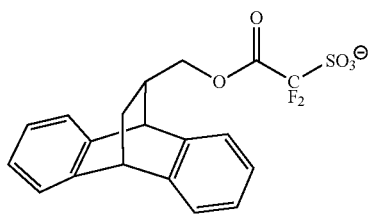

-continued

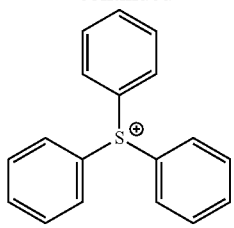

(B2-6a)

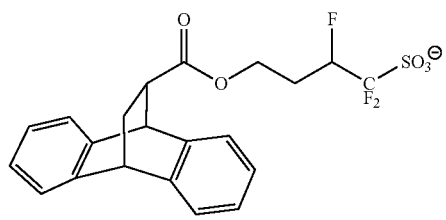

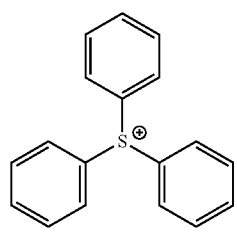

(B2-7a)

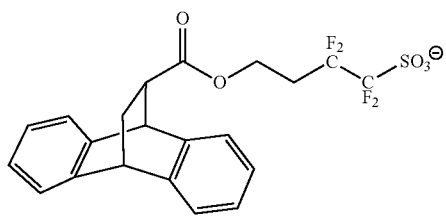

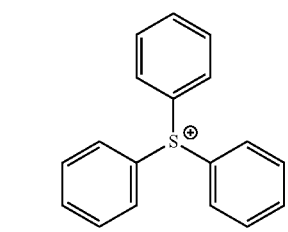

(B2-8a)

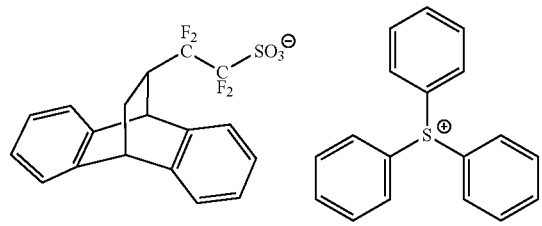

-continued (B2-9a)

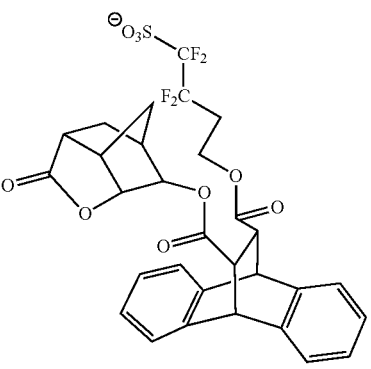

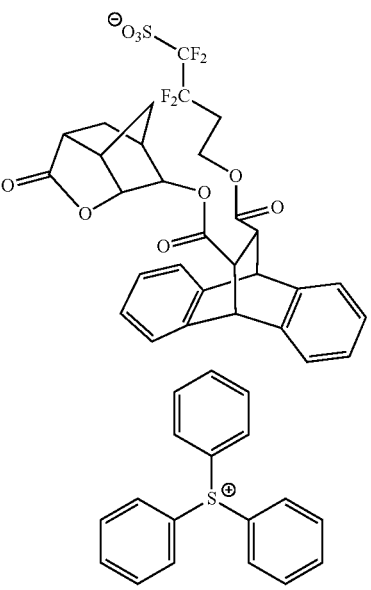

[Chemical Formula 149.]

(D1-3a)

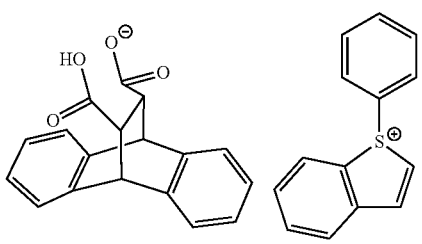

(D2-2a)

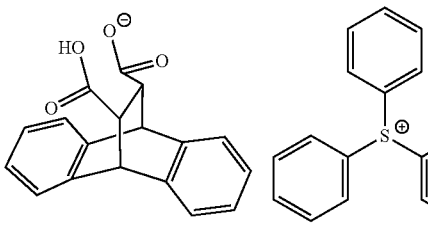

Compound (B1-1a): Combination of Precursor (Bpre-1a) with Salt Exchange Compound Aa $^1$H-NMR (DMSO, 400 MHz): δ(ppm)=8.28 (d, ArH, 2H), 8.11 (d, ArH, 1H), 7.86 (t, ArH, 1H), 7.63-7.81 (m, ArH, 7H), 7.01-7.45 (m, ArH, 8H), 4.71 (s, CH, 1H), 4.44 (S, CH, 1H), 4.31 (S, CH2, 2H), 2.93-3.00 (m, CH, 1H), 1.87-2.07 (m, CH2, 1H), 0.98-1.03 (m, CH, 1H)

$^{19}$F-NMR (DMSO, 376 MHz): δ (ppm)=−107.9

Compound (B1-2a): Combination of Precursor (Bpre-2a) with Salt Exchange Compound Aa $^1$H-NMR (DMSO, 400 MHz): δ(ppm)=8.28 (d, ArH, 2H), 8.11 (d, ArH, 1H), 7.86 (t, ArH, 1H), 7.63-7.81 (m, ArH, 7H), 7.00-7.48 (m, ArH, 8H), 4.70 (s, CH, 1H), 4.31-4.58 (m, CH, CF2CH2, 3H), 2.95-3.02 (m, CH, 1H), 1.85-2.05 (m, CH2, 2H)

$^{19}$F-NMR (DMSO, 376 MHz): δ(ppm)=−111.4

Compound (B1-3a): Combination of Precursor (Bpre-3a) with Salt Exchange Compound Aa $^1$H-NMR (DMSO, 400 MHz): δ(ppm)=8.28 (d, ArH, 2H), 8.11 (d, ArH, 1H), 7.86 (t, ArH, 1H), 7.63-7.81 (m, ArH, 7H), 7.01-7.47 (m, ArH, 8H), 5.08 (m, CFCH, 1H), 4.71 (s, CH, 1H), 4.42 (s, CH, 1H), 4.23 (m, CH2, 2H), 2.90 (m, CH, 1H), 2.45 (m, CFCH, 1H), 1.82-2.07 (m, CH2, CFCH, 3H)

$^{19}$F-NMR (DMSO, 376 MHz): δ(ppm)=−112.5, −121.2, −203.2

Compound (B1-4a): Combination of Precursor (Bpre-4a) with Salt Exchange Compound Aa $^1$H-NMR (DMSO, 400 MHz): δ(ppm)=8.28 (d, ArH, 2H), 8.11 (d, ArH, 1H), 7.86 (t, ArH, 1H), 7.63-7.81 (m, ArH, 7H), 7.01-7.47 (m, ArH, 8H), 4.72 (s, CH, 1H), 4.43 (S, CH, 1H), 4.23, (t, CH2, 2H), 2.95-3.02 (m, CH, 1H), 2.63-2.73, (m, CF2CH2, 2H), 1.86-2.07 (m, CH2, 2H)

$^{19}$F-NMR (DMSO, 376 MHz): δ(ppm)=−111.3, −117.4

Compound (B1-5a): Combination of Precursor (Bpre-5a) with Salt Exchange Compound Aa $^1$H-NMR (DMSO, 400 MHz): δ(ppm)=8.28 (d, ArH, 2H), 8.11 (d, ArH, 1H), 7.86 (t, ArH, 1H), 7.63-7.81 (m, ArH, 7H), 7.01-7.47 (m, ArH, 8H), 4.70 (d, OCH (lactone), 1H), 4.58 (t, COOCH (lactone), 1H), 4.50 (d, CH, 2H), 4.22, (t, COOCH2, 2H), 3.32 (m, CH (lactone), 1H), 3.20 (t, COCH, 2H), 2.63-2.73, (m, CF2CH2, CH (lactone) 4H), 1.60-2.20 (m, CH2 (lactone), 4H)

$^{19}$F-NMR (DMSO, 376 MHz): δ(ppm)=−111.3, −117.4

Compound (B1-6a): Combination of Precursor (Bpre-6a) with Salt Exchange Compound Aa $^1$H-NMR (DMSO, 400 MHz): δ(ppm)=8.28 (d, ArH, 2H), 8.11 (d, ArH, 1H), 7.86 (t, ArH, 1H), 7.63-7.81 (m, ArH, 7H), 7.00-7.48 (m, ArH, 8H), 4.70 (s, CH, 1H), 4.40 (s, CH, 1H), 3.15-3.22 (m, CF2CH, 1H), 1.95-2.15 (m, CH2, 2H)

$^{19}$F-NMR (DMSO, 376 MHz): δ(ppm)=−111.3, −117.4

Compound (B1-7a): Combination of Precursor (Bpre-4a) with Salt Exchange Compound Ba $^1$H-NMR (DMSO, 400 MHz): δ(ppm)=8.42 (m, ArH, 2H), 8.17 (d, ArH, 1H), 7.78-7.91 (m, ArH, 2H), 7.01-7.47 (m, ArH, 9H), 5.26 (s, ArOCH2, 2H), 4.72 (s, CH, 1H), 4.43 (S, CH, 1H), 3.75-4.23 (m, CH$_2$SCH2, OCH$_3$, (COO) CH2, 9H), 2.95-3.02 (m, CH, 1H), 2.65-2.73, (m, CF2CH2, 2H), 2.29-2.60 (m (SCH2)CH$_{2,4}$H), 1.86-2.07 (m, CH2, 2H)

$^{19}$F-NMR (DMSO, 376 MHz): δ(ppm)=−11.3, −117.4

Compound (B1-8a): Combination of Precursor (Bpre-5a) with Salt Exchange Compound Ba $^1$H-NMR (DMSO, 400 MHz): δ (ppm)=8.42 (m, ArH, 2H), 8.17 (d, ArH, 1H), 7.78-7.91 (m, ArH, 2H), 7.01-7.47 (m, ArH, 9H), 5.26 (s, ArOCH2, 2H), 4.70 (d, OCH (lactone)), H), 4.58 (t, COOCH (lactone)), H), 4.50 (d, CH, 2H), 3.75-4.22 (m, CH$_2$SCH2, OCH$_3$, COOCH2, 9H), 3.32 (m, CH (lactone), 1H), 3.20 (t, COCH, 2H), 2.63-2.73, (m, CF$_2$CH$_2$, CH (lactone), 4H), 2.29-2.60 (m, (SCH2) CH2, 4H), 1.60-2.20 (m, CH2 (lactone), 4H)

$^{19}$F-NMR (DMSO, 376 MHz): δ(ppm)=−111.3, −117.4

Compound (B1-9a): Combination of Precursor (Bpre-2a) with Salt Exchange Compound Ca $^1$H-NMR (DMSO, 400 MHz): δ(ppm)=7.00-7.48 (m, ArH, 8H), 4.70 (s, CH, 1H), 4.31-4.58 (m, CH, CF$_2$CH$_2$, CH$_2$(C=O), 5H), 3.38-3.58 (m, CH$_2$SCH2, 4H), 2.95-3.02 (m, CH, 1H), 1.56-2.33 (m, Adamantan, (SCH2)CH$_2$, CH2, 23H)

$^{19}$F-NMR (DMSO, 376 MHz): δ(ppm)=−111.4

Compound (B2-5a): Combination of Precursor (Bpre-1a) with Salt Exchange Compound Da $^1$H-NMR (DMSO, 400 MHz): δ(ppm)=7.74-7.90 (m, ArH, 15H), 7.01-7.45 (m, ArH, 8H), 4.71 (s, CH, 1H), 4.44 (S, CH, 1H), 4.31 (S, CH2, 2H), 2.93-3.00 (m, CH, 1H), 1.87-2.07 (m, CH2, 1H), 0.98-1.03 (m, CH, 1H)

$^{19}$F-NMR (DMSO, 376 MHz): δ (ppm)=−107.9

Compound (B2-6a): Combination of Precursor (Bpre-3a) with Salt Exchange Compound Da $^1$H-NMR (DMSO, 400 MHz): δ(ppm)=7.74-7.90 (m, ArH, 15H), 7.01-7.47 (m, ArH, 8H), 5.08 (m, CFCH, 1H), 4.71 (s, CH, 1H), 4.42 (s, CH, 1H), 4.23 (m, CH2, 2H), 2.90 (m, CH, 1H), 2.45 (m, CFCH, 1H), 1.82-2.07 (m, CH2, CFCH, 3H)

$^{19}$F-NMR (DMSO, 376 MHz): δ(ppm)=−112.5, −121.2, −203.2

Compound (B2-7a): Combination of Precursor (Bpre-4a) with Salt Exchange Compound Da $^1$H-NMR (DMSO, 400 MHz): δ(ppm)=7.74-7.90 (m, ArH, 15H), 7.01-7.47 (m, ArH, 8H), 4.72 (s, CH, 1H), 4.43 (S, CH, 1H), 4.23, (t, CH2, 2H), 2.95-3.02 (m, CH, 1H), 2.63-2.73, (m, CF$_2$CH2, 2H), 1.86-2.07 (m, CH2, 2H)

$^{19}$F-NMR (DMSO, 376 MHz): δ(ppm)=−11.3, −117.4

Compound (B2-8a): Combination of Precursor (Bpre-6a) with Salt Exchange Compound Da $^1$H-NMR (DMSO, 400 MHz): δ(ppm)=7.74-7.90 (m, ArH, 15H), 7.00-7.48 (m, ArH, 8H), 4.70 (s, CH, 1H), 4.40 (s, CH, 1H), 3.15-3.22 (m, CF$_2$CH, 1H), 1.95-2.15 (m, CH2, 2H)

$^{19}$F-NMR (DMSO, 376 MHz): δ(ppm)=−11.3, −117.4

Compound (B2-9a): Combination of Precursor (Bpre-5a) with Salt Exchange Compound Da $^1$H-NMR (DMSO, 400 MHz): δ(ppm)=7.74-7.90 (m, 15H, ArH), 7.01-7.47 (m, ArH, 8H), 4.70 (d, OCH (lactone), 1H), 4.58 (t, COOCH (lactone)), H), 4.50 (d, CH, 2H), 4.22, (t, COOCH2, 2H), 3.32 (m, CH (lactone), 1H), 3.20 (t, COCH, 2H), 2.63-2.73, (m, CF2CH2, CH (lactone) 4H), 1.60-2.20 (m, CH2 (lactone), 4H)

$^{19}$F-NMR (DMSO, 376 MHz): δ(ppm)=−11.3, −117.4

Compound (D1-1a): A Reaction Product of Compound Aa and Intermediate 7a $^1$H-NMR (DMSO, 400 MHz): δ(ppm)=8.28 (d, ArH, 2H), 8.11 (d, ArH, 1H), 7.63-7.86 (m, ArH, 14H), 6.60-6.80 (m, ArH, 6H), 5.47 (s, CH, 1H)

Compound (D1-2a): A Reaction Product of Compound Aa and Intermediate 2a $^1$H-NMR (DMSO, 400 MHz): δ(ppm)=8.28 (d, ArH, 2H), 8.11 (d, ArH, 1H), 7.86 (t, ArH, 1H), 7.63-7.81 (m, ArH, 7H), 7.00-7.48 (m, ArH, 8H), 4.68 (s, CH, 1H), 4.41 (s, CH, 1H), 2.95-3.02 (m, CH, 1H), 1.86-2.04 (m, CH2, 2H)

Compound (D1-3a): Combination of Precursor (Bpre-9a) with Salt Exchange Compound Da $^1$H-NMR (DMSO, 400 MHz): δ(ppm)=8.28 (d, ArH, 2H), 8.11 (d, ArH, 1H), 7.86 (t, ArH, 1H), 7.63-7.81 (m, ArH, 7H), 7.00-7.48 (m, ArH, 8H), 4.85 (s, CH, 2H), 3.16 (s, CHCOO, 2H)

Compound (D2-2a): Combination of Precursor (Bpre-7a) with Salt Exchange Compound Da $^1$H-NMR (DMSO, 400 MHz): δ(ppm)=7.74-7.90 (m, 15H, ArH), 7.00-7.48 (m, ArH, 8H), 4.85 (s, ArCH, 2H), 3.16 (s, CH, 2H)

<Production of Resist Composition>

Example 1a to 19a, Reference Examples 1a to 11a

The components shown in Tables 9 to 11 were mixed together and dissolved to obtain each resist composition.

TABLE 9

|  | Component (A) | Component (B) | | Component (D) | | Component (S) |
|---|---|---|---|---|---|---|
|  |  | Component (B1-1) | Component (B2) | Component (D1-1) | Component (D2) |  |
| Ref. Ex. 1a | (A)-1a [100] | — | (B2)-6a [20.0] | — | (D2)-1a [3.8] | (S)-1a [6400] |
| Ref. Ex. 2a | (A)-1a [100] | — | (B2)-2a [15.9] | — | (D2)-1a [3.8] | (S)-1a [6400] |
| Ref. Ex. 3a | (A)-1a [100] | — | (B1)-1a [17.4] | — | (D2)-2a [5.3] | (S)-1a [6400] |
| Ref. Ex. 4a | (A)-1a [100] | — | (B1)-3a [18.5] | — | (D2)-1a [3.8] | (S)-1a [6400] |
| Ref. Ex. 5a | (A)-1a [100] | — | (B2)-4a [18.3] | — | (D2)-1a [3.8] | (S)-1a [6400] |
| Ex. 1a | (A)-1a [100] | (B1)-1a [17.2] | — | — | (D2)-1a [3.8] | (S)-1a [6400] |
| Ex. 2a | (A)-1a [100] | (B1)-2a [17.2] | — | — | (D2)-1a [3.8] | (S)-1a [6400] |
| Ex. 3a | (A)-1a [100] | (B1)-3a [18.5] | — | — | (D2)-1a [3.8] | (S)-1a [6400] |
| Ex. 4a | (A)-1a [100] | (B1)-4a [19.0] | — | — | (D2)-1a [3.8] | (S)-1a [6400] |
| Ex. 5a | (A)-1a [100] | (B1)-5a [24.6] | — | — | (D2)-1a [3.8] | (S)-1a [6400] |
| Ex. 6a | (A)-1a [100] | (B1)-6a [17.0] | — | — | (D2)-1a [3.8] | (S)-1a [6400] |
| Ex. 7a | (A)-1a [100] | (B1)-7a [21.7] | — | — | (D2)-1a [3.8] | (S)-1a [6400] |
| Ex. 8a | (A)-1a [100] | (B1)-8a [26.8] | — | — | (D2)-1a [3.8] | (S)-1a [6400] |
| Ex. 9a | (A)-1a [100] | (B1)-9a [19.6] | — | — | (D2)-1a [3.8] | (S)-1a [6400] |
| Ex. 10a | (A)-1a [100] | — | (B2)-6a [20.0] | (D1)-3a [4.8] | — | (S)-1a [6400] |
| Ex. 11a | (A)-1a [100] | — | (B2)-2a [15.9] | (D1)-3a [4.8] | — | (S)-1a [6400] |
| Ex. 12a | (A)-1a [100] | — | (B2)-1a [17.4] | (D1)-3a [4.8] | — | (S)-1a [6400] |
| Ex. 13a | (A)-1a [100] | (B1)-2a [17.2] | — | (D1)-1a [4.8] | — | (S)-1a [6400] |

TABLE 10

|  | Component (A) | Component (B) | | Component (D) | | Component (S) |
|---|---|---|---|---|---|---|
|  |  | Component (B1-1) | Component (B2) | Component (D1-1) | Component (D2) |  |
| Ref. Ex. 6a | (A)-1a [100] | — | (B2)-5a [18.8] | — | (D2)-1a [3.8] | (S)-1a [6400] |
| Ref. Ex. 7a | (A)-2a [100] | — | (B2)-1a [17.4] | — | (D2)-1a [3.8] | (S)-1a [6400] |
| Ex. 14a | (A)-2a [100] | (B2)-1a [17.2] | — | — | (D2)-1a [3.8] | (S)-1a [6400] |
| Ex. 15a | (A)-2a [100] | — | (B2)-1a [17.4] | (D1)-2a [4.4] | — | (S)-1a [6400] |

TABLE 11

|  | Component (A) | Component (B) | | Component (D) | | Component (S) |
|---|---|---|---|---|---|---|
|  |  | Component (B1-1) | Component (B2) | Component (D1-1) | Component (D2) |  |
| Ref. Ex. 8a | (A)-3a [100] |  | (B2)-6a [20.0] | — | (D2)-1a [3.8] | (S)-1a [6400] |
| Ref. Ex. 9a | (A)-4a [100] |  | (B2)-7a [20.5] | — | (D2)-1a [3.8] | (S)-1a [6400] |
| Ref. Ex. 10a | (A)-5a [100] |  | (B2)-9a [25.6] | — | (D2)-1a [3.8] | (S)-1a [6400] |
| Ref. Ex. 11a | (A)-6a [100] |  | (B2)-8a [18.5] | — | (D2)-1a [3.8] | (S)-1a [6400] |
| Ex. 16a | (A)-3a [100] | (B1)-3a [18.5] | — | — | (D2)-1a [3.8] | (S)-1a [6400] |
| Ex. 17a | (A)-4a [100] | (B1)-4a [19.0] | — | — | (D2)-1a [3.8] | (S)-1a [6400] |
| Ex. 18a | (A)-5a [100] | (B1)-5a [24.6] | — | — | (D2)-1a [3.8] | (S)-1a [6400] |
| Ex. 19a | (A)-6a [100] | (B1)-6a [17.0] | — | — | (D2)-1a [3.8] | (S)-1a [6400] |

In Tables 9 to 11, the reference characters indicate the following. The values in brackets [ ] indicate the amount (in terms of parts by weight) of the component added.

(A)-1a: polymeric compound represented by chemical formula (A1)-1a shown below. Polymeric compound (A1)-1a was obtained by radical polymerization of monomers which derive the structural units constituting the polymeric compound, at a predetermined ratio. With respect to the polymeric compound (A1)-1a, the weight average molecular weight (Mw) and the polydispersity (Mw/Mn) were determined by the polystyrene equivalent value as measured by gel permeation chromatography (GPC). As a result, it was found that the weight average molecular weight was 6,900, and the polydispersity was 1.72. The composition of the copolymer (ratio (molar ratio) of the respective structural units within the structural formula) as determined by $^{13}$C-NMR was l/m/n=30/60/10.

(A)-2a: polymeric compound represented by chemical formula (A1)-2a shown below. Polymeric compound (A1)-2a was obtained by radical polymerization of monomers which derive the structural units constituting the polymeric compound, at a predetermined ratio. With respect to the polymeric compound (A1)-2a, the weight average molecular weight (Mw) and the polydispersity (Mw/Mn) were determined by the polystyrene equivalent value as measured by gel permeation chromatography (GPC). As a result, it was found that the weight average molecular weight was 7,000, and the polydispersity was 1.68. The composition of the copolymer (ratio (molar ratio) of the respective structural units within the structural formula) as determined by $^{13}$C-NMR was l/m/n=30/60/10.

(A)-3a: polymeric compound represented by chemical formula (A1)-3a shown below. Polymeric compound (A1)-3a was obtained by radical polymerization of monomers which derive the structural units constituting the polymeric compound, at a predetermined ratio. With respect to the polymeric compound (A1)-3a, the weight average molecular weight (Mw) and the polydispersity (Mw/Mn) were determined by the polystyrene equivalent value as measured by gel permeation chromatography (GPC). As a result, it was found that the weight average molecular weight was 7,100, and the polydispersity was 1.69. The composition of the copolymer (ratio (molar ratio) of the respective structural units within the structural formula) as determined by $^{13}$C-NMR was l/m=50/50.

[Chemical Formula 150.]

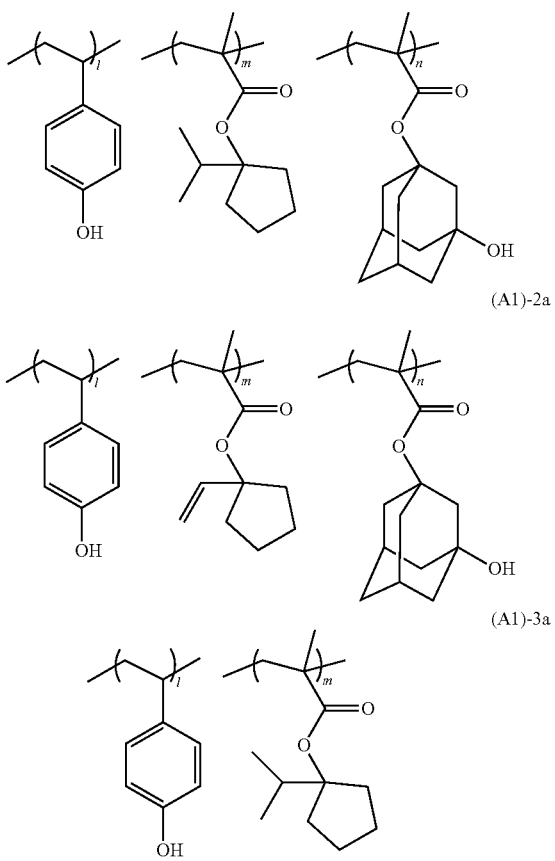

(A)-4a: polymeric compound represented by chemical formula (A1)-4a shown below. Polymeric compound (A1)-4a was obtained by radical polymerization of monomers which derive the structural units constituting the polymeric compound, at a predetermined ratio. With respect to the polymeric compound (A1)-4a, the weight average molecular weight (Mw) and the polydispersity (Mw/Mn) were determined by the polystyrene equivalent value as measured by gel permeation chromatography (GPC). As a result, it was found that the weight average molecular weight was 6,800, and the polydispersity was 1.73. The composition of the copolymer (ratio (molar ratio) of the respective structural units within the structural formula) as determined by $^{13}$C-NMR was l/m=50/50.

(A)-5a: polymeric compound represented by chemical formula (A1)-5a shown below. Polymeric compound (A1)-5a was obtained by radical polymerization of monomers which derive the structural units constituting the polymeric compound, at a predetermined ratio. With respect to the polymeric compound (A1)-5a, the weight average molecular weight (Mw) and the polydispersity (Mw/Mn) were determined by the polystyrene equivalent value as measured by gel permeation chromatography (GPC). As a result, it was found that the weight average molecular weight was 7,100, and the polydispersity was 1.72. The composition of the copolymer (ratio (molar ratio) of the respective structural units within the structural formula) as determined by $^{13}$C-NMR was l/m=50/50.

(A)-6a: polymeric compound represented by chemical formula (A1)-6a shown below. Polymeric compound (A1)-6a was obtained by radical polymerization of monomers which derive the structural units constituting the polymeric compound, at a predetermined ratio. With respect to the polymeric compound (A1)-6a, the weight average molecular weight (Mw) and the polydispersity (Mw/Mn) were determined by the polystyrene equivalent value as measured by gel permeation chromatography (GPC). As a result, it was found that the weight average molecular weight was 7,200, and the polydispersity was 1.70. The composition of the copolymer (ratio (molar ratio) of the respective structural units within the structural formula) as determined by $^{13}$C-NMR was l/m/n/o=15/30/50/5.

[Chemical Formula 151.]

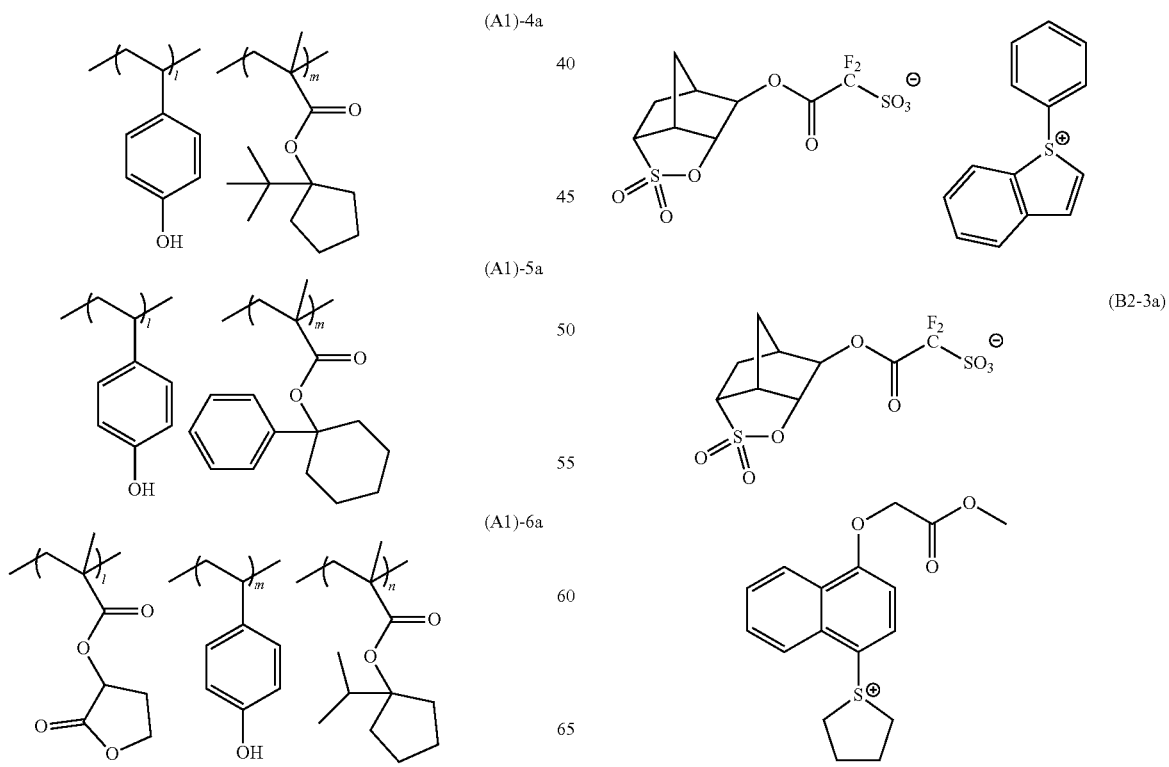

(A1)-4a (A1)-5a (A1)-6a

-continued

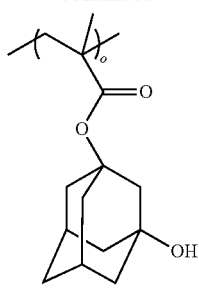

(B1)-1a to (B1)-9a: Acid generators consisting of the aforementioned compounds (B1-1a) to (B1-9a).

(B2)-1a to (B2)-4a: acid generators represented by chemical formulae (B2-1a) to (B2-4a) shown below.

(B2)-5a to (B2)-9a: Acid generators consisting of the aforementioned compounds (B2-5a) to (B2-9a).

[Chemical Formula 152.]

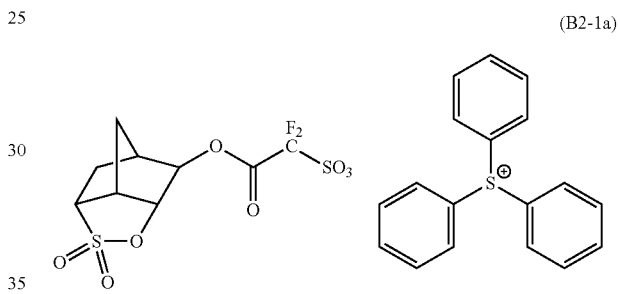

(B2-1a)

(B2-2a)

(B2-3a)

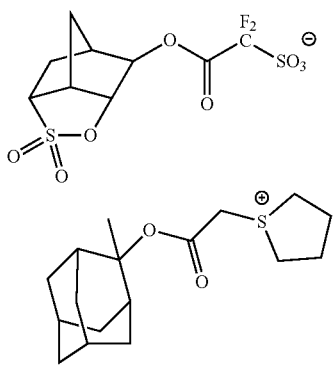
(B2-4a)

(D1)-1 to (D1)-3a: Acid diffusion control agent consisting of a compound represented by the aforementioned chemical formulae (D1-1a) to (D1)-3a.

(D2)-1a: Acid diffusion control agent consisting of a compound represented by chemical formula (D2-1a) shown below.

(D2)-2a: Acid diffusion control agent consisting of a compound represented by chemical formula (D2-2a) shown below.

(S)-1a: a mixed solvent of propylene glycol monomethyl ether acetate/propylene glycol monomethyl ether=60/40 (weight ratio).

[Chemical Formula 153.]

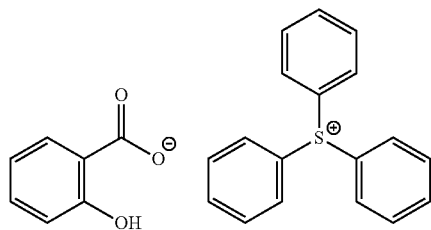
(D2-1a)

<Formation of Resist Pattern>

Each of the resist compositions of examples and comparative examples was applied to an 8-inch silicon substrate which had been treated with hexamethyldisilazane (HMDS) using a spinner, and was then prebaked (PAB) on a hot plate at 110° C. for 60 seconds and dried, thereby forming a resist film having a film thickness of 50 nm.

A drawing (exposure) was carried out on the resist film using an electron beam lithography system JEOL-JBX-9300FS (manufactured by JEOL Ltd.) with acceleration voltage of 100 kV and a target size of 1:1 line-and-space pattern (line width: 50 nm) (hereinafter referred to as an "LS pattern"). Then, a post exposure bake (PEB) treatment was conducted at 100° C. for 60 seconds.

Thereafter, alkali developing was conducted for 60 seconds at 23° C. in a 2.38% by weight aqueous solution of tetramethylammonium hydroxide (TMAH) (product name: NMD-3; manufactured by Tokyo Ohka Kogyo Co., Ltd.).

Then, water rinsing was conducted for 15 seconds using pure water.

As a result, a 1:1 LS pattern having a line width of 50 nm was formed.

[Evaluation of OoB Resistance]

When patterning is conducted by irradiating only electron beam (EB), the sensitivity at which a target pattern was obtained was defined E1.

Separately, using an KrF exposure apparatus NSR-S203-B (manufactured by Nikon), a KrF light of 5 mJ/cm$^2$ was irradiated on the entire wafer, followed by patterning with EB, and the sensitivity at which a target pattern was obtained was defined E2.

OoB resistance (K) was determined by the formula K=(E1/E2-1)×100, and evaluated in accordance with the following criteria. The results are shown in Tables 12 to 14.

OoB resistance was good (A): 0<K<10

OoB resistance was slightly good (B): 10<K<20

OoB resistance was poor (C): 20<K

[Evaluation of Line Width Roughness (LWR)]

With respect to the LS pattern formed in the above "formation of resist pattern", 3σ was determined as a yardstick for indicating LWR. The results are indicated under "LWR (nm)" in Tables 12 to 14.

"3σ" indicates a value of 3 times the standard deviation (σ) (i.e., 3σ) (unit: nm) determined by measuring the line positions at 400 points in the lengthwise direction of the line using a scanning electron microscope (product name: S-9380, manufactured by Hitachi High-Technologies Corporation; acceleration voltage: 800V).

The smaller this 3σ value is, the lower the level of roughness on the side walls of the line, indicating that an LS pattern with a uniform width was obtained.

TABLE 12

|  | OoB resistance | LWR [nm] |
| --- | --- | --- |
| Ref. Ex. 1a | C | 5.1 |
| Ref. Ex. 2a | A | 6.2 |
| Ref. Ex. 3a | C | 5.7 |
| Ref. Ex. 4a | A | 6.4 |
| Ref. Ex. 5a | A | 6.3 |
| Ex. 1a | A | 4.8 |
| Ex. 2a | A | 4.7 |
| Ex. 3a | A | 4.9 |
| Ex. 4a | A | 4.8 |
| Ex. 5a | A | 5.1 |
| Ex. 6a | A | 4.7 |
| Ex. 7a | A | 4.8 |
| Ex. 8a | A | 5.0 |
| Ex. 9a | A | 4.8 |
| Ex. 10a | B | 5.0 |
| Ex. 11a | A | 5.4 |
| Ex. 12a | B | 5.5 |
| Ex. 13a | A | 4.6 |

TABLE 13

|  | OoB resistance | LWR [nm] |
| --- | --- | --- |
| Ref. Ex. 6a | C | 5.0 |
| Ref. Ex. 7a | C | 6.2 |
| Ex. 14a | A | 5.0 |
| Ex. 15a | B | 5.4 |

TABLE 14

|  | OoB resistance | LWR [nm] |
|---|---|---|
| Ref. Ex. 8a | C | 5.0 |
| Ref. Ex. 9a | C | 5.2 |
| Ref. Ex. 10a | C | 5.3 |
| Ref. Ex. 11a | C | 5.1 |
| Ex. 16a | A | 4.8 |
| Ex. 17a | A | 4.8 |
| Ex. 18a | A | 5.1 |
| Ex. 19a | A | 4.9 |

As seen from the results shown in Tables 12 to 14, it was confirmed that, according to the resist compositions of Examples 1a to 19a, the OoB resistance was good, and a resist pattern having reduced roughness and good shape could be formed.

What is claimed is:

1. A resist composition which generates acid upon exposure and exhibits changed solubility in a developing solution under action of acid, the resist composition comprising:
    a base material component (A) which exhibits changed solubility m a developing solution under action of acid,
    an acid-generator component (B) which generates acid upon exposure, and
    a basic component (D),
    wherein at least one of the acid-generator component (B) and the basic component (D) comprises a compound (BD1) having an anion moiety and a cation moiety and being represented by general formula (bd1) shown below, wherein the compound (BD1) has only one anionic group, and
    a total amount of the acid-generator component (B) and the basic component (D) being 20 to 70 parts by weight, relative to 100 parts by weight of the base material component (A):

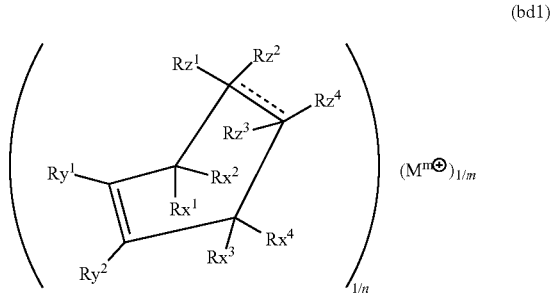

(bd1)

wherein $Rx^1$ to $Rx^4$ each independently represents a hydrogen atom or a hydrocarbon group which may have a substituent, or two or more of $Rx^1$ to $Rx^4$ may be mutually bonded to form a ring structure; $Ry^1$ and $Ry^2$ are mutually bonded to form an aromatic ring structure which may have a substituent;

----- represents a double bond or a single bond; $Rz^1$ to $Rz^4$ each independently represents, where valence allows, a hydrogen atom or a hydrocarbon group which may have a substituent, or two or more of $Rz^1$ to $Rz^4$ may be mutually bonded to form a ring structure; provided that $Rx^1$ to $Rx^4$, $Ry^1$, $Ry^2$ and $Rz^1$ to $Rz^4$ have only one anionic group, and the whole anion moiety is a monovalent anion; n represents 1; m represents 1; and $M^{m+}$ represents a monovalent organic cation.

2. The resist composition according to claim 1, wherein the acid-generator component (B) comprises the compound (BD1).

3. The resist composition according to claim 2, wherein the amount of the compound (BD1) contained in the acid-generator component (B) is 20 to 60 parts by weight, relative to 100 parts by weight of the base material component (A).

4. The resist composition according to claim 2, wherein the molar ratio of the amount of the compound (BD1) contained in the acid-generator component (B) to the amount of the basic component (D) is more than 1.

5. The resist composition according to claim 1, wherein at least one of $Rx^1$ and $Rx^2$ and at least one of $Rx^3$ to $Rx^4$ are bonded to each other to form a ring structure.

6. The resist composition according to claim 1, wherein the anion moiety of the compound (BD1) is an anion represented by general formula (bd1-an1) shown below:

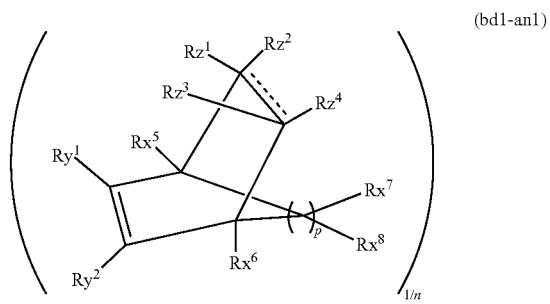

(bd1-an1)

wherein $Rx^5$ and $Rx^6$ each independently represents a hydrocarbon group which may have a substituent or a hydrogen atom; $Rx^7$ and $Rx^8$ each independently represents a hydrocarbon group which may have a substituent or a hydrogen atom, or alternatively, may be bonded to each other to form a ring structure; p is 1 or 2, and when p is 2, a plurality of $Rx^7$s and $Rx^8$s may be different from each other; $Ry^1$ and Ry2 are mutually bonded to form an aromatic ring structure which may have a substituent;

----- represents a double bond or a single bond; $Rz^1$ to $Rz^4$ each independently represents, where valence allows, a hydrogen atom or a hydrocarbon group which may have a substituent, or two or more of $Rz^1$ to $Rz^4$ may be mutually bonded to form a ring structure; provided that $Rx^5$ to $Rx^8$, $Ry^1$, $Ry^2$ and $Rz^1$ to $Rz^4$ have only one anionic group, and the whole anion moiety is a monovalent anion; and n represents 1.

7. The resist composition according to claim 6, wherein the anion moiety of the compound (BD1) is an anion represented by general formula (bd1-an2) shown below:

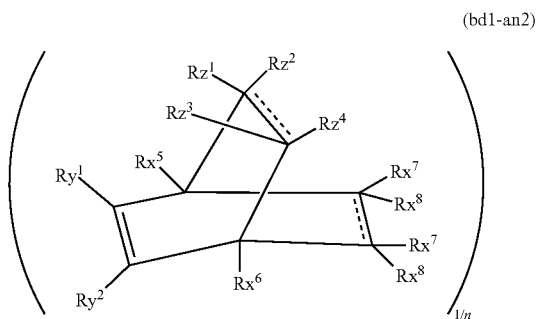

(bd1-an2)

wherein $Rx^5$ and $Rx^6$ each independently represents a hydrocarbon group which may have a substituent or a hydrogen atom; a plurality of $Rx^7$s and $Rx^8$s each independently represents a hydrocarbon group which may have a substituent or a hydrogen atom, or alternatively, two or more of $Rx^7$ and $Rx^8$ may be bonded to each other to form a ring structure; $Ry^1$ and $Ry^2$ are bonded to each other to form an aromatic ring structure which may have a substituent;

----- represents a double bond or a single bond; $Rz^1$ to $Rz^4$ each independently represents, where valence allows, a hydrogen atom or a hydrocarbon group which may have a substituent, or two or more of $Rz^1$ to $Rz^4$ may be mutually bonded to form a ring structure; provided that $Rx^5$ to $Rx^8$, $Ry^1$, $Ry^2$ and $Rz^1$ to $Rz^4$ have only one anionic group, and the whole anion moiety is an n-valent a monovalent anion; and n represents 1.

8. The resist composition according to claim 6, wherein $Rx^7$ and $Rx^8$ are bonded to each other to form a ring structure.

9. The resist composition according to claim 1, wherein two or more of $Rz^1$ to $Rz^4$ are bonded to each other to form a ring structure.

10. The resist composition according to claim 1, wherein one of $Rz^1$ to $Rz^4$ has one anionic group.

11. The resist composition according to claim 6, wherein at least one of $Rx^5$ and $Rx^6$ has one anionic group.

12. The resist composition according to claim 1, wherein the cation moiety of the compound (BD1) is a cation represented by any one of general formulae (ca-1) to (ca-4) shown below:

(ca-1)

(ca-2)

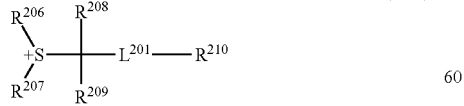

(ca-3)

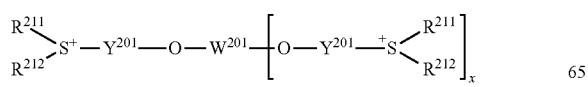

(ca-4)

wherein $R^{201}$ to $R^{207}$, $R^{211}$ and $R^{212}$ each independently represents an aryl group which may have a substituent, an alkyl group which may have a substituent or an alkenyl group which may have a substituent; $R^{201}$ to $R^{203}$, $R^{206}$ and $R^{207}$, and $R^{211}$ and $R^{212}$ may be mutually bonded to form a ring with the sulfur atom; $R^{208}$ and $R^{209}$ each independently represents a hydrogen atom or an alkyl group of 1 to 5 carbon atoms, or $R^{208}$ and $R^{209}$ may be mutually bonded to form a ring with the sulfur atom; $R^{210}$ represents an aryl group which may have a substituent, an alkyl group which may have a substituent, an alkenyl group which may have a substituent, or an —SO₂— containing cyclic group which may have a substituent; $L^{201}$ represents —C(=O)— or —C(=O)—O—; each of the plurality of $Y^{201}$ independently represents an arylene group, an alkylene group or an alkenylene group; x represents 1 or 2; $W^{201}$ represents an (x+1) valent linking group.

13. The resist composition according to claim 1, wherein the compound (BD1) is a compound represented by general formula (bd1-1) shown below:

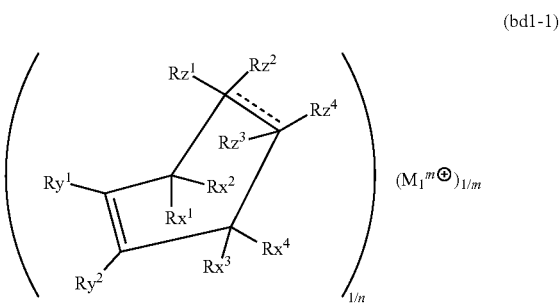

(bd1-1)

wherein $Rx^1$ to $Rx^4$ each independently represents a hydrogen atom or a hydrocarbon group which may have a substituent, or two or more of $Rx^1$ to $Rx^4$ may be mutually bonded to form a ring structure; $Ry^1$ and $Ry^2$ are mutually bonded to form an aromatic ring structure which may have a substituent;

----- represents a double bond or a single bond; $Rz^1$ to $Rz^4$ each independently represents, where valence allows, a hydrogen atom or a hydrocarbon group which may have a substituent, or two or more of $Rz^1$ to $Rz^4$ may be mutually bonded to form a ring structure; provided that $Rx^1$ to $Rx^4$, $Ry^1$, $Ry^2$ and $Rz^1$ to $Rz^4$ have only one anionic group, and the whole anion moiety is a monovalent anion; n represents 1; m represents 1; and $M_1^{m+}$ is a cation represented by general formula (ca-0-1) or (ca-0-2) shown below, provided that the number of benzene rings contained in the cation is 0 to 2;

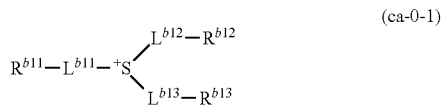

(ca-0-1)

(ca-0-2)

wherein $R^{b11}$ to $R^{b13}$, $R^{b21}$ and $R^{b22}$ each independently represents a hydrocarbon group which may have a substituent; $R^{b12}$ and $R^{b13}$ may be mutually bonded to form a ring; and $L^{b11}$ to $L^{b13}$ each independently represents a divalent linking group or a single bond.

14. A method of forming a resist pattern, comprising:

using a resist composition according to claim 1 to form a resist film on a substrate;

exposing the resist film; and developing the exposed resist film to form a resist pattern.

15. The resist pattern forming method according to claim 14, wherein the resist film is exposed to extreme ultraviolet (EUV) or electron beam (EB).

* * * * *